(12) United States Patent
Chang et al.

(10) Patent No.: US 12,150,374 B2
(45) Date of Patent: Nov. 19, 2024

(54) METHOD FOR PATTERNING A COATING ON A SURFACE AND DEVICE INCLUDING A PATTERNED COATING

(71) Applicant: OTI LUMIONICS INC., Mississauga (CA)

(72) Inventors: Yi-Lu Chang, Mississauga (CA); Qi Wang, Mississauga (CA); Michael Helander, Mississauga (CA); Jacky Qui, Mississauga (CA); Zhibin Wang, Mississauga (CA); Thomas Lever, Mississauga (CA)

(73) Assignee: OTI Lumionics Inc., Mississauga (CA)

( * ) Notice: Subject to any disclaimer, the term of this patent is extended or adjusted under 35 U.S.C. 154(b) by 71 days.

(21) Appl. No.: 18/118,068

(22) Filed: Mar. 6, 2023

(65) Prior Publication Data

US 2023/0232700 A1 Jul. 20, 2023

Related U.S. Application Data

(63) Continuation of application No. 17/318,961, filed on May 12, 2021, now Pat. No. 11,706,969, which is a
(Continued)

(51) Int. Cl.
*H10K 71/00* (2023.01)
*C09K 11/06* (2006.01)
(Continued)

(52) U.S. Cl.
CPC .......... *H10K 71/621* (2023.02); *C09K 11/06* (2013.01); *G02B 1/18* (2015.01); *H10K 30/82* (2023.02); *H10K 50/814* (2023.02); *H10K 50/824* (2023.02); *H10K 50/828* (2023.02); *H10K 59/12* (2023.02); *H10K 71/166* (2023.02); *H10K 30/81* (2023.02); *H10K 50/82* (2023.02); *H10K 50/822* (2023.02); *H10K 59/352* (2023.02);
(Continued)

(58) Field of Classification Search
None
See application file for complete search history.

(56) References Cited

U.S. PATENT DOCUMENTS 2,876,247 A 3/1959 Ratz et al.
3,169,933 A 2/1965 Kenney
(Continued)

FOREIGN PATENT DOCUMENTS

CA 2544380 C 1/2014
CA 2890253 A1 5/2014
(Continued)

OTHER PUBLICATIONS

"An Introduction to Thin Films", Year 1976, pp. 13.
(Continued)

*Primary Examiner* — Michelle Mandala
(74) *Attorney, Agent, or Firm* — Foley & Lardner LLP

(57) ABSTRACT

An opto-electronic device includes: a first electrode; an organic layer disposed over the first electrode; a nucleation promoting coating disposed over the organic layer; a nucleation inhibiting coating covering a first region of the opto-electronic device; and a conductive coating covering a second region of the opto-electronic device.

24 Claims, 101 Drawing Sheets

Related U.S. Application Data continuation of application No. 16/279,930, filed on Feb. 19, 2019, now Pat. No. 11,088,327, which is a continuation of application No. 15/527,702, filed as application No. PCT/IB2016/056442 on Oct. 26, 2016, now Pat. No. 10,270,033.

(60) Provisional application No. 62/377,429, filed on Aug. 19, 2016, provisional application No. 62/373,927, filed on Aug. 11, 2016, provisional application No. 62/277,989, filed on Jan. 13, 2016, provisional application No. 62/246,597, filed on Oct. 26, 2015.

(51) Int. Cl.
G02B 1/18 (2015.01)
H10K 30/82 (2023.01)
H10K 50/814 (2023.01)
H10K 50/824 (2023.01)
H10K 50/828 (2023.01)
H10K 59/12 (2023.01)
H10K 71/16 (2023.01)
*H10K 30/81* (2023.01)
*H10K 50/82* (2023.01)
*H10K 50/822* (2023.01)
*H10K 59/35* (2023.01)
*H10K 85/30* (2023.01)
*H10K 102/00* (2023.01)

(52) U.S. Cl.
CPC ......... *H10K 59/353* (2023.02); *H10K 85/324* (2023.02); *H10K 2102/3026* (2023.02); *H10K 2102/351* (2023.02)

(56) References Cited

U.S. PATENT DOCUMENTS

| | | | |
|---|---|---|---|
| 3,928,480 A | 12/1975 | Tabushi et al. | |
| 4,022,928 A | 5/1977 | Piwcyzk | |
| 4,119,635 A | 10/1978 | Omodei-Sale et al. | |
| 4,188,486 A | 2/1980 | Tsukamoto et al. | |
| 4,379,155 A | 4/1983 | Omodei-Sale et al. | |
| 4,832,983 A | 5/1989 | Nagatomi et al. | |
| 5,015,758 A | 5/1991 | Pilgrim et al. | |
| 5,399,936 A | 3/1995 | Namiki et al. | |
| 5,550,290 A | 8/1996 | Mizuta et al. | |
| 5,652,285 A | 7/1997 | Coggio et al. | |
| 6,016,033 A | 1/2000 | Jones et al. | |
| 6,171,715 B1 | 1/2001 | Sato et al. | |
| 6,171,752 B1* | 1/2001 | Baker | G03C 1/053 430/264 |
| 6,376,355 B1 | 4/2002 | Yoon et al. | |
| 6,391,769 B1 | 5/2002 | Lee et al. | |
| 6,407,408 B1 | 6/2002 | Zhou et al. | |
| 6,465,115 B2 | 10/2002 | Shi et al. | |
| 6,472,468 B1 | 10/2002 | Omura | |
| 6,538,374 B2 | 3/2003 | Hosokawa | |
| 6,608,009 B2 | 8/2003 | Akada et al. | |
| 6,787,468 B2 | 9/2004 | Kim et al. | |
| 6,835,950 B2 | 12/2004 | Brown et al. | |
| 6,878,469 B2 | 4/2005 | Yoon et al. | |
| 6,900,470 B2 | 5/2005 | Kobayashi et al. | |
| 6,927,270 B2 | 8/2005 | Lichtenhan et al. | |
| 6,995,035 B2 | 2/2006 | Cok et al. | |
| 7,018,713 B2 | 3/2006 | Padiyath | |
| 7,099,299 B2 | 8/2006 | Liang et al. | |
| 7,105,298 B2 | 9/2006 | Liu et al. | |
| 7,173,276 B2 | 2/2007 | Choi et al. | |
| 7,175,815 B2 | 2/2007 | Yamasaki et al. | |
| 7,193,015 B1 | 3/2007 | Mabry et al. | |
| 7,217,683 B1 | 5/2007 | Blanski et al. | |
| 7,319,129 B2 | 1/2008 | Yoshida et al. | |
| 7,341,882 B2* | 3/2008 | Wu | G02B 6/12004 438/32 |
| 7,363,308 B2 | 4/2008 | Dillon et al. | |
| 7,402,948 B2 | 7/2008 | Yamazaki et al. | |
| 7,427,783 B2 | 9/2008 | Lee et al. | |
| 7,449,539 B2 | 11/2008 | Morimoto et al. | |
| 7,491,975 B2 | 2/2009 | Kubota | |
| 7,495,389 B2 | 2/2009 | Noguchi et al. | |
| 7,579,304 B2 | 8/2009 | Liu et al. | |
| 7,670,695 B2 | 3/2010 | Wakabayashi et al. | |
| 7,701,132 B2 | 4/2010 | Oh | |
| 7,728,510 B2 | 6/2010 | Oh | |
| 7,816,861 B2 | 10/2010 | Choi et al. | |
| 7,839,074 B2 | 11/2010 | Ikeda et al. | |
| 7,839,083 B2 | 11/2010 | Kubota | |
| 7,851,071 B2 | 12/2010 | Yamamoto et al. | |
| 7,897,667 B2 | 3/2011 | Mabry et al. | |
| 7,910,687 B2 | 3/2011 | Busing et al. | |
| 7,947,519 B2 | 5/2011 | Lee et al. | |
| 7,956,351 B2 | 6/2011 | Choi | |
| 7,986,672 B2 | 7/2011 | Tiedemann et al. | |
| 8,004,180 B2 | 8/2011 | Seo | |
| 8,030,838 B2 | 10/2011 | Kwak et al. | |
| 8,044,580 B2 | 10/2011 | Yamazaki et al. | |
| 8,089,066 B2 | 1/2012 | Yamazaki et al. | |
| 8,097,349 B2 | 1/2012 | Yamamoto et al. | |
| 8,115,376 B2 | 2/2012 | Fujioka et al. | |
| 8,232,350 B2 | 7/2012 | Fujita et al. | |
| 8,237,351 B2 | 8/2012 | Sung et al. | |
| 8,310,149 B2 | 11/2012 | Lifka et al. | |
| 8,318,878 B2 | 11/2012 | Sudo et al. | |
| 8,343,637 B2 | 1/2013 | Parham et al. | |
| 8,362,469 B2 | 1/2013 | Suh | |
| 8,541,113 B2 | 9/2013 | Je et al. | |
| 8,586,703 B2 | 11/2013 | Yang et al. | |
| 8,679,647 B2 | 3/2014 | Pflumm et al. | |
| 8,679,656 B2 | 3/2014 | Kobayashi et al. | |
| 8,703,303 B2 | 4/2014 | Yamamoto et al. | |
| 8,766,306 B2 | 7/2014 | Lifka et al. | |
| 8,795,847 B2 | 8/2014 | Heil et al. | |
| 8,809,838 B2 | 8/2014 | Jeong et al. | |
| 8,852,756 B2 | 10/2014 | Vestweber et al. | |
| 8,872,206 B2 | 10/2014 | Chung et al. | |
| 8,883,324 B2 | 11/2014 | Yabunouchi et al. | |
| 8,895,972 B2 | 11/2014 | Chung et al. | |
| 8,940,568 B2 | 1/2015 | Mohan et al. | |
| 8,957,413 B2 | 2/2015 | Song et al. | |
| 8,963,137 B2 | 2/2015 | Lee et al. | |
| 8,986,852 B2 | 3/2015 | Stoessel et al. | |
| 8,994,010 B2 | 3/2015 | Choi et al. | |
| 8,999,534 B2 | 4/2015 | Shimokawa et al. | |
| 9,018,621 B2 | 4/2015 | Park et al. | |
| 9,024,307 B2 | 5/2015 | Lee | |
| 9,040,962 B2 | 5/2015 | Adamovich et al. | |
| 9,051,344 B2 | 6/2015 | Lin et al. | |
| 9,064,755 B2 | 6/2015 | Park et al. | |
| 9,076,993 B2 | 7/2015 | Kim et al. | |
| 9,088,004 B2 | 7/2015 | Chung et al. | |
| 9,093,403 B2 | 7/2015 | Kim et al. | |
| 9,093,669 B2 | 7/2015 | Park et al. | |
| 9,105,865 B2 | 8/2015 | Chung et al. | |
| 9,105,867 B2 | 8/2015 | Verschuuren et al. | |
| 9,113,536 B2 | 8/2015 | Oka et al. | |
| 9,126,970 B2 | 9/2015 | Pflumm | |
| 9,231,030 B2 | 1/2016 | Choi et al. | |
| 9,245,934 B2 | 1/2016 | Chung et al. | |
| 9,246,123 B2 | 1/2016 | Kim et al. | |
| 9,287,339 B2 | 3/2016 | Lee et al. | |
| 9,293,515 B2 | 3/2016 | Choi | |
| 9,331,308 B2 | 5/2016 | Choi et al. | |
| 9,444,064 B2 | 9/2016 | Kaiser et al. | |
| 9,450,027 B2 | 9/2016 | Pang et al. | |
| 9,478,591 B2 | 10/2016 | Nam et al. | |
| 9,487,724 B2 | 11/2016 | Xu et al. | |
| 9,570,471 B2 | 2/2017 | Heo et al. | |
| 9,583,716 B2 | 2/2017 | Ikeda | |
| 9,595,681 B2 | 3/2017 | Mujica-Fernaud | |
| 9,624,193 B2 | 4/2017 | Aihara | |
| 9,660,195 B2 | 5/2017 | Kawamura et al. | |

(56) References Cited

U.S. PATENT DOCUMENTS

| | | |
|---|---|---|
| 9,666,812 B2 | 5/2017 | Lee et al. |
| 9,711,751 B2 | 7/2017 | Prushinskiy et al. |
| 9,748,318 B2 | 8/2017 | Shim et al. |
| 9,776,983 B2 | 10/2017 | Marchionni et al. |
| 9,859,520 B2 | 1/2018 | Kim |
| 9,954,039 B2 | 4/2018 | Im et al. |
| 9,960,216 B2 | 5/2018 | Lee et al. |
| 9,966,554 B2 | 5/2018 | Lee et al. |
| 10,032,843 B2 | 7/2018 | Lee et al. |
| 10,062,850 B2 | 8/2018 | Jung et al. |
| 10,084,019 B2 | 9/2018 | Shim et al. |
| 10,084,150 B1 | 9/2018 | Lou |
| 10,090,370 B2 | 10/2018 | Lee et al. |
| 10,147,769 B2 | 12/2018 | Lee et al. |
| 10,177,206 B2 | 1/2019 | Jung et al. |
| 10,181,573 B2 | 1/2019 | Im |
| 10,186,568 B2 | 1/2019 | Kim et al. |
| 10,224,386 B2 | 3/2019 | Rieutort-Louis et al. |
| 10,240,084 B2 | 3/2019 | Molaire |
| 10,263,185 B2 | 4/2019 | Matsueda et al. |
| 10,269,879 B2 | 4/2019 | Shim et al. |
| 10,276,641 B2 | 4/2019 | Lou |
| 10,297,762 B2 | 5/2019 | Zeng et al. |
| 10,361,375 B2 | 7/2019 | Zeng et al. |
| 10,501,583 B2 | 12/2019 | Song et al. |
| 10,700,304 B2 | 6/2020 | Helander et al. |
| 2001/0053586 A1 | 12/2001 | Lee et al. |
| 2002/0090811 A1 | 7/2002 | Kim et al. |
| 2002/0189392 A1 | 12/2002 | Molstad |
| 2003/0196987 A1 | 10/2003 | Kung et al. |
| 2003/0222346 A1 | 12/2003 | Yun et al. |
| 2004/0152910 A1 | 8/2004 | Fukuoka et al. |
| 2006/0043858 A1 | 3/2006 | Ikeda et al. |
| 2006/0125390 A1 | 6/2006 | Oh |
| 2006/0182993 A1 | 8/2006 | Ogata et al. |
| 2007/0003785 A1 | 1/2007 | Slusarek et al. |
| 2007/0077349 A1 | 4/2007 | Newman et al. |
| 2007/0178405 A1 | 8/2007 | Kanda et al. |
| 2008/0001123 A1 | 1/2008 | Inoue et al. |
| 2008/0093986 A1 | 4/2008 | Inoue et al. |
| 2008/0286607 A1 | 11/2008 | Nomura et al. |
| 2009/0033208 A1 | 2/2009 | Nagayama et al. |
| 2009/0066239 A1 | 3/2009 | Yabunouchi |
| 2009/0199903 A1 | 8/2009 | Oyamada et al. |
| 2009/0286084 A1 | 11/2009 | Tennent et al. |
| 2010/0052526 A1 | 3/2010 | Je et al. |
| 2010/0078628 A1 | 4/2010 | Chi et al. |
| 2010/0117028 A1 | 5/2010 | Takeshima et al. |
| 2010/0193768 A1 | 8/2010 | Habib |
| 2010/0244197 A1 | 9/2010 | Arena et al. |
| 2011/0006289 A1 | 1/2011 | Mizuki et al. |
| 2011/0037058 A1* | 2/2011 | Buchholz .............. C08G 61/02 438/46 |
| 2011/0094889 A1 | 4/2011 | Shin et al. |
| 2011/0121302 A1 | 5/2011 | Lee et al. |
| 2011/0175031 A1 | 7/2011 | Matsunami et al. |
| 2011/0186820 A1 | 8/2011 | Kim et al. |
| 2011/0220886 A1 | 9/2011 | Takeshima et al. |
| 2011/0285276 A1 | 11/2011 | Kadoma et al. |
| 2011/0297923 A1 | 12/2011 | Mizuki et al. |
| 2011/0309307 A1 | 12/2011 | Zeika et al. |
| 2012/0003484 A1 | 1/2012 | Roehrig et al. |
| 2012/0018770 A1 | 1/2012 | Lu et al. |
| 2012/0043533 A1 | 2/2012 | Mizuki et al. |
| 2012/0056165 A1 | 3/2012 | Kawamura et al. |
| 2012/0104422 A1 | 5/2012 | Lee et al. |
| 2012/0112169 A1 | 5/2012 | Mizuki et al. |
| 2012/0146030 A1 | 6/2012 | You et al. |
| 2012/0181520 A1 | 7/2012 | Kim et al. |
| 2012/0181922 A1 | 7/2012 | Kawamura et al. |
| 2012/0187541 A1 | 7/2012 | Arena et al. |
| 2013/0049024 A1 | 2/2013 | Choi et al. |
| 2013/0056784 A1 | 3/2013 | Lee et al. |
| 2013/0112952 A1 | 5/2013 | Adamovich et al. |
| 2013/0153878 A1 | 6/2013 | Mizuki et al. |
| 2013/0175509 A1 | 7/2013 | Kim et al. |
| 2013/0221338 A1 | 8/2013 | Kawamura et al. |
| 2014/0070236 A1 | 3/2014 | Chen et al. |
| 2014/0103306 A1 | 4/2014 | Moon et al. |
| 2014/0110680 A1 | 4/2014 | Choe |
| 2014/0148877 A1 | 5/2014 | Pan et al. |
| 2014/0183500 A1 | 7/2014 | Ikeda et al. |
| 2014/0186983 A1 | 7/2014 | Kim et al. |
| 2014/0231761 A1 | 8/2014 | Kim et al. |
| 2014/0291653 A1 | 10/2014 | Ikeda et al. |
| 2014/0299866 A1 | 10/2014 | Ruske et al. |
| 2014/0319511 A1 | 10/2014 | Mizuki et al. |
| 2014/0326985 A1 | 11/2014 | Mizuki et al. |
| 2014/0346482 A1 | 11/2014 | Mizuki et al. |
| 2014/0353601 A1 | 12/2014 | Cho et al. |
| 2015/0090989 A1 | 4/2015 | Matsumoto et al. |
| 2015/0097171 A1 | 4/2015 | Kim et al. |
| 2015/0144902 A1 | 5/2015 | Do et al. |
| 2015/0171337 A1 | 6/2015 | Jung et al. |
| 2015/0184104 A1 | 7/2015 | Xu et al. |
| 2015/0284580 A1 | 10/2015 | Kawakami et al. |
| 2015/0287846 A1 | 10/2015 | Helander et al. |
| 2015/0376768 A1 | 12/2015 | Veres et al. |
| 2016/0005976 A1 | 1/2016 | Mizuki et al. |
| 2016/0013438 A1 | 1/2016 | Im et al. |
| 2016/0043153 A1 | 2/2016 | Min |
| 2016/0043325 A1 | 2/2016 | Gorohmaru et al. |
| 2016/0099411 A1 | 4/2016 | Kim et al. |
| 2016/0104859 A1 | 4/2016 | Kim et al. |
| 2016/0133846 A1 | 5/2016 | Ishii et al. |
| 2016/0149156 A1 | 5/2016 | Kim et al. |
| 2016/0155952 A1 | 6/2016 | Hwang et al. |
| 2016/0180763 A1 | 6/2016 | Park et al. |
| 2016/0181527 A1 | 6/2016 | Mizuki et al. |
| 2016/0181543 A1 | 6/2016 | Ito et al. |
| 2016/0211454 A1 | 7/2016 | Kim et al. |
| 2016/0211458 A1 | 7/2016 | Ito et al. |
| 2016/0211459 A1 | 7/2016 | Ito et al. |
| 2016/0260901 A1 | 9/2016 | Kim et al. |
| 2016/0268520 A1 | 9/2016 | Mizuki et al. |
| 2016/0284998 A1 | 9/2016 | Kawamura et al. |
| 2016/0293888 A1 | 10/2016 | Shim et al. |
| 2016/0351638 A1 | 12/2016 | Im et al. |
| 2016/0380198 A1 | 12/2016 | Mizuki et al. |
| 2017/0018733 A1 | 1/2017 | Jin et al. |
| 2017/0033166 A1 | 2/2017 | Shim et al. |
| 2017/0047546 A1 | 2/2017 | Choi et al. |
| 2017/0062755 A1 | 3/2017 | Im et al. |
| 2017/0100607 A1 | 4/2017 | Pan et al. |
| 2017/0104166 A1 | 4/2017 | Jeong et al. |
| 2017/0110521 A1 | 4/2017 | Park et al. |
| 2017/0117469 A1 | 4/2017 | Ito et al. |
| 2017/0125495 A1 | 5/2017 | Lee et al. |
| 2017/0125506 A1 | 5/2017 | Kim |
| 2017/0125687 A1 | 5/2017 | Ikeda et al. |
| 2017/0155078 A1 | 6/2017 | Lee |
| 2017/0170246 A1 | 6/2017 | Im et al. |
| 2017/0179397 A1 | 6/2017 | Kim et al. |
| 2017/0183291 A1 | 6/2017 | Ito et al. |
| 2017/0186831 A1 | 6/2017 | Nam et al. |
| 2017/0237023 A1 | 8/2017 | Kim et al. |
| 2017/0256722 A1 | 9/2017 | Shim et al. |
| 2017/0309822 A1 | 10/2017 | Mizuki et al. |
| 2017/0317154 A1 | 11/2017 | Heo |
| 2017/0317284 A1 | 11/2017 | Mizuki et al. |
| 2017/0324045 A1 | 11/2017 | Takahashi et al. |
| 2017/0330513 A1 | 11/2017 | Hong |
| 2017/0338438 A1 | 11/2017 | Kwon et al. |
| 2018/0006239 A1 | 1/2018 | Yokoyama et al. |
| 2018/0006264 A1 | 1/2018 | Lee et al. |
| 2018/0019398 A1 | 1/2018 | Mizuki et al. |
| 2018/0019408 A1 | 1/2018 | Ko |
| 2018/0040685 A1 | 2/2018 | Yeo et al. |
| 2018/0061323 A1 | 3/2018 | Kwon et al. |
| 2018/0062088 A1 | 3/2018 | Cho et al. |
| 2018/0083217 A1 | 3/2018 | Chung et al. |
| 2018/0090063 A1 | 3/2018 | Ying et al. |
| 2018/0102499 A1 | 4/2018 | Pyo et al. |
| 2018/0123054 A1 | 5/2018 | Gorohmaru et al. |

(56) References Cited

U.S. PATENT DOCUMENTS

| | | | |
|---|---|---|---|
| 2018/0123078 A1 | 5/2018 | Byun et al. |
| 2018/0127385 A1 | 5/2018 | Jung et al. |
| 2018/0158881 A1 | 6/2018 | Lim et al. |
| 2018/0166518 A1 | 6/2018 | Kim |
| 2018/0198076 A1 | 7/2018 | Takahashi et al. |
| 2018/0198080 A1 | 7/2018 | Noh et al. |
| 2018/0212060 A1 | 7/2018 | Kang et al. |
| 2018/0219058 A1 | 8/2018 | Xiang et al. |
| 2018/0226455 A1 | 8/2018 | Kim et al. |
| 2018/0261797 A1 | 9/2018 | Lee |
| 2018/0294436 A1 | 10/2018 | Choi et al. |
| 2018/0309085 A1 | 10/2018 | Park et al. |
| 2018/0323377 A1 | 11/2018 | Mizuki et al. |
| 2018/0337219 A1 | 11/2018 | Rhee et al. |
| 2018/0366678 A1 | 12/2018 | Chi et al. |
| 2019/0013342 A1 | 1/2019 | Kato et al. |
| 2019/0081111 A1 | 3/2019 | Lee et al. |
| 2019/0088204 A1 | 3/2019 | Zhang et al. |
| 2019/0130822 A1 | 5/2019 | Jung et al. |
| 2019/0237517 A1 | 8/2019 | Hack |
| 2019/0250450 A1 | 8/2019 | Li |
| 2019/0253591 A1 | 8/2019 | Chen et al. |
| 2019/0273125 A1 | 9/2019 | Takechi |
| 2019/0317629 A1 | 10/2019 | Jung et al. |
| 2019/0325805 A1 | 10/2019 | Moon et al. |
| 2019/0340980 A1 | 11/2019 | Yum et al. |
| 2019/0341435 A1 | 11/2019 | Chang et al. |
| 2019/0341575 A1 | 11/2019 | Chung et al. |
| 2019/0348627 A1 | 11/2019 | Lee et al. |
| 2020/0035951 A1 | 1/2020 | Cheon et al. |
| 2020/0044197 A1 | 2/2020 | Shedletsky et al. |
| 2020/0064968 A1 | 2/2020 | Kim et al. |
| 2020/0075683 A1 | 3/2020 | Polyakov et al. |
| 2020/0075693 A1 | 3/2020 | Polyakov et al. |
| 2020/0075864 A1 | 3/2020 | Helander et al. |
| 2020/0099836 A1 | 3/2020 | Chao |
| 2020/0105843 A1 | 4/2020 | Baek et al. |
| 2020/0111401 A1 | 4/2020 | Zhao et al. |
| 2020/0136077 A1 | 4/2020 | Lee et al. |
| 2020/0159284 A1 | 5/2020 | Mathew et al. |
| 2020/0194676 A1 | 6/2020 | Chang et al. |
| 2020/0194730 A1 | 6/2020 | Park et al. |
| 2020/0212130 A1 | 7/2020 | Kim et al. |
| 2020/0357871 A1 | 11/2020 | Chung et al. |

FOREIGN PATENT DOCUMENTS

| | | |
|---|---|---|
| CN | 1284508 A | 2/2001 |
| CN | 101292365 A | 10/2008 |
| CN | 101299419 A | 11/2008 |
| CN | 100526288 C | 8/2009 |
| CN | 101617064 A | 12/2009 |
| CN | 101730938 A | 6/2010 |
| CN | 1625552 B | 9/2011 |
| CN | 1784388 B | 2/2012 |
| CN | 101812021 B | 12/2012 |
| CN | 104037359 A | 9/2014 |
| CN | 104769149 A | 7/2015 |
| CN | 101503393 B | 8/2015 |
| CN | 105094451 A | 11/2015 |
| CN | 105097877 A | 11/2015 |
| CN | 105206650 A | 12/2015 |
| CN | 105206753 A | 12/2015 |
| CN | 106206995 A | 12/2016 |
| CN | 106317025 A | 1/2017 |
| CN | 103788087 B | 5/2017 |
| CN | 106992267 A | 7/2017 |
| CN | 107564945 A | 1/2018 |
| CN | 107808895 A | 3/2018 |
| CN | 108376019 A | 8/2018 |
| CN | 108389878 A | 8/2018 |
| CN | 108418928 A | 8/2018 |
| CN | 105359289 B | 9/2018 |
| CN | 108630830 A | 10/2018 |
| CN | 108767136 A | 11/2018 |
| CN | 108881531 A | 11/2018 |
| CN | 108900659 A | 11/2018 |
| CN | 109299631 A | 2/2019 |
| CN | 109461758 A | 3/2019 |
| CN | 109599030 A | 4/2019 |
| CN | 109742132 A | 5/2019 |
| CN | 109817672 A | 5/2019 |
| CN | 109817694 A | 5/2019 |
| CN | 109830495 A | 5/2019 |
| CN | 109920931 A | 6/2019 |
| CN | 109950293 A | 6/2019 |
| CN | 110112182 A | 8/2019 |
| CN | 110144551 A | 8/2019 |
| CN | 110265474 A | 9/2019 |
| CN | 110391348 A | 10/2019 |
| CN | 110416269 A | 11/2019 |
| CN | 110429117 A | 11/2019 |
| CN | 110444125 A | 11/2019 |
| CN | 110459175 A | 11/2019 |
| CN | 110473898 A | 11/2019 |
| CN | 110473988 A | 11/2019 |
| CN | 110491917 A | 11/2019 |
| CN | 110491918 A | 11/2019 |
| CN | 110492018 A | 11/2019 |
| CN | 110518034 A | 11/2019 |
| CN | 110570774 A | 12/2019 |
| CN | 110634930 A | 12/2019 |
| CN | 110718580 A | 1/2020 |
| CN | 110727142 A | 1/2020 |
| CN | 110752249 A | 2/2020 |
| CN | 110767662 A | 2/2020 |
| CN | 110767682 A | 2/2020 |
| CN | 110767708 A | 2/2020 |
| CN | 110767709 A | 2/2020 |
| CN | 110767713 A | 2/2020 |
| CN | 110767736 A | 2/2020 |
| CN | 110767830 A | 2/2020 |
| CN | 110767835 A | 2/2020 |
| CN | 110767836 A | 2/2020 |
| CN | 110767844 A | 2/2020 |
| CN | 110780375 A | 2/2020 |
| CN | 110783484 A | 2/2020 |
| CN | 110783485 A | 2/2020 |
| CN | 110783486 A | 2/2020 |
| CN | 110828699 A | 2/2020 |
| CN | 110867527 A | 3/2020 |
| CN | 110914891 A | 3/2020 |
| CN | 110923625 A | 3/2020 |
| CN | 110928453 A | 3/2020 |
| CN | 110956925 A | 4/2020 |
| CN | 110989861 A | 4/2020 |
| CN | 111009619 A | 4/2020 |
| CN | 111020489 A | 4/2020 |
| CN | 111029381 A | 4/2020 |
| CN | 111029382 A | 4/2020 |
| CN | 111046599 A | 4/2020 |
| CN | 111048564 A | 4/2020 |
| CN | 111142180 A | 5/2020 |
| CN | 111155055 A | 5/2020 |
| CN | 111180490 A | 5/2020 |
| CN | 111223908 A | 6/2020 |
| CN | 111261641 A | 6/2020 |
| CN | 111292617 A | 6/2020 |
| CN | 111293235 A | 6/2020 |
| CN | 111293236 A | 6/2020 |
| CN | 111312795 A | 6/2020 |
| CN | 111341936 A | 6/2020 |
| CN | 210668382 U | 6/2020 |
| CN | 111403621 A | 7/2020 |
| CN | 111524460 A | 8/2020 |
| CN | 111524469 A | 8/2020 |
| CN | 111584725 A | 8/2020 |
| CN | 111584748 A | 8/2020 |
| CN | 111640882 A | 9/2020 |
| CN | 111668240 A | 9/2020 |
| CN | 111682055 A | 9/2020 |
| CN | 111682120 A | 9/2020 |
| CN | 111725288 A | 9/2020 |
| CN | 111739921 A | 10/2020 |

(56) References Cited

FOREIGN PATENT DOCUMENTS

| | | |
|---|---|---|
| CN | 111739924 A | 10/2020 |
| CN | 111755493 A | 10/2020 |
| CN | 111755623 A | 10/2020 |
| CN | 111799374 A | 10/2020 |
| CN | 111834547 A | 10/2020 |
| CN | 111862875 A | 10/2020 |
| CN | 111863900 A | 10/2020 |
| EP | 1 465 874 A2 | 10/2004 |
| EP | 1 850 368 A1 | 10/2007 |
| EP | 1 873 162 A1 | 1/2008 |
| EP | 1 602 648 B1 | 4/2013 |
| EP | 1 834 945 B1 | 7/2014 |
| EP | 2 998 997 A1 | 3/2016 |
| EP | 2 197 979 B1 | 12/2016 |
| EP | 3 182 477 A1 | 6/2017 |
| EP | 3 185 325 A1 | 6/2017 |
| EP | 2 248 849 B1 | 7/2017 |
| EP | 3 240 036 A1 | 11/2017 |
| EP | 3 316 311 A1 | 5/2018 |
| EP | 3 331 045 A1 | 6/2018 |
| EP | 3 336 899 A1 | 6/2018 |
| EP | 2 434 558 B1 | 7/2018 |
| EP | 3 499 576 A1 | 6/2019 |
| GB | 1 096 600 A | 12/1967 |
| IN | 229083 B | 8/2007 |
| JP | 2002-220656 A | 8/2002 |
| JP | 2004-352815 A | 12/2004 |
| JP | 2005-213623 | 8/2005 |
| JP | 2007-188854 A | 7/2007 |
| JP | 4185097 B2 | 11/2008 |
| JP | 2008-291006 A | 12/2008 |
| JP | 4308663 B2 | 8/2009 |
| JP | 2010-258410 A | 11/2010 |
| JP | 2011-048962 A | 3/2011 |
| JP | 4972844 B2 | 7/2012 |
| JP | 5166961 B2 | 3/2013 |
| JP | 5198657 B2 | 5/2013 |
| JP | 5233074 B2 | 7/2013 |
| JP | 2013-219278 A | 10/2013 |
| JP | 2014-154404 A | 8/2014 |
| JP | 5572134 B2 | 8/2014 |
| KR | 100691543 B1 | 3/2007 |
| KR | 1020100054630 A | 5/2010 |
| KR | 1020100123735 A | 11/2010 |
| KR | 100998838 B1 | 12/2010 |
| KR | 101020350 B1 | 3/2011 |
| KR | 101036391 B1 | 5/2011 |
| KR | 10-2012-0044876 A | 5/2012 |
| KR | 1020140062258 A | 5/2014 |
| KR | 1020150127368 A | 11/2015 |
| KR | 101640772 B1 | 7/2016 |
| KR | 1020170030168 A | 3/2017 |
| KR | 1020170075865 A | 7/2017 |
| KR | 1020180115655 A | 10/2018 |
| KR | 1020180121304 A | 11/2018 |
| TW | 200810169 A | 2/2008 |
| TW | 363054 B | 5/2012 |
| TW | 485137 B | 5/2015 |
| TW | 499653 B | 9/2015 |
| TW | 201929219 A | 7/2019 |
| WO | WO-98/18804 A1 | 5/1998 |
| WO | WO-2006/070711 A1 | 7/2006 |
| WO | WO-2006/070712 A1 | 7/2006 |
| WO | WO-2008/069586 A1 | 6/2008 |
| WO | WO-2009/102054 A1 | 8/2009 |
| WO | WO-2010/094378 A1 | 8/2010 |
| WO | WO-2010/122810 A1 | 10/2010 |
| WO | WO-2010/134350 A1 | 11/2010 |
| WO | WO-2011/012212 A1 | 2/2011 |
| WO | WO-2011/049284 A1 | 4/2011 |
| WO | WO-2011/074252 A1 | 6/2011 |
| WO | WO-2011/074253 A1 | 6/2011 |
| WO | WO-2011/129096 A1 | 10/2011 |
| WO | WO-2013/180456 A1 | 12/2013 |
| WO | WO-2013/187007 A1 | 12/2013 |
| WO | WO-2014/024880 A1 | 2/2014 |
| WO | WO-2014/025317 A1 | 2/2014 |
| WO | WO-2014/071518 A1 | 5/2014 |
| WO | WO-2014/104144 A1 | 7/2014 |
| WO | WO-2015/005440 A1 | 1/2015 |
| WO | WO-2015/041352 A1 | 3/2015 |
| WO | WO-2016/042781 A1 | 3/2016 |
| WO | WO-2016/056364 A1 | 4/2016 |
| WO | WO-2017/072678 A1 | 5/2017 |
| WO | WO-2018/206575 A1 | 11/2018 |
| WO | WO-2019/002198 A1 | 1/2019 |
| WO | WO-2019/006749 A1 | 1/2019 |
| WO | WO-2019/047126 A1 | 3/2019 |
| WO | WO-2019/062221 A1 | 4/2019 |
| WO | WO-2019/062236 A1 | 4/2019 |
| WO | WO-2019/088594 A2 | 5/2019 |
| WO | WO-2019/141198 A1 | 7/2019 |
| WO | WO-2019/147012 A1 | 8/2019 |
| WO | WO-2019/178782 A1 | 9/2019 |
| WO | WO-2019/199131 A1 | 10/2019 |
| WO | WO-2019/199139 A1 | 10/2019 |
| WO | WO-2019/199693 A1 | 10/2019 |
| WO | WO-2019/200862 A1 | 10/2019 |
| WO | WO-2019/233298 A1 | 12/2019 |
| WO | WO-2019/242510 A1 | 12/2019 |
| WO | WO-2020/029559 A1 | 2/2020 |
| WO | WO-2020/029612 A1 | 2/2020 |
| WO | WO-2020/029621 A1 | 2/2020 |
| WO | WO-2020/045262 A1 | 3/2020 |
| WO | WO-2020/052232 A1 | 3/2020 |
| WO | WO-2020/057208 A1 | 3/2020 |
| WO | WO-2020/079456 A1 | 4/2020 |
| WO | WO-2020/105015 A1 | 5/2020 |
| WO | WO-2020/134914 A1 | 7/2020 |
| WO | WO-2020/191889 A1 | 10/2020 |
| WO | WO-2020/192051 A1 | 10/2020 |
| WO | WO-2020/199445 A1 | 10/2020 |
| WO | WO-2020/226383 A1 | 11/2020 |
| WO | WO-2020/261191 A1 | 12/2020 |

OTHER PUBLICATIONS

Forrest, James A. "Reductions of the glass transition temperature in thin polymer films: Probing the length scale of cooperative dynamics" Physical Review E 61.1 (2000): R53-6.

A. F., "Application of Molecular Amplification to Microcircuitry", Surface Physics Departme1lt, Year 1963, pp. 422-427.

A. Thran et al., "Condensation Coefficients of Ag on Polymers", The American Physical Society, vol. 82, No. 9, Date Mar. 1, 1999, pp. 1903-1906.

Akio Amano et al., "Highly Transmissive One Side Emission OLED Panel for Novel Lighting Applications", SID 2013 Digest, Date Jul. 1, 2013, pp. 689-692.

Alexey I. Safonov et al., "Deposition of Thin Composite Films Consisting of Fluoropolymer and Silver Nanoparticles Having Surface Plasmon Resonance", Thin Solid Films 603, Date Feb. 18, 2016, pp. 4.

Amano, Akio, et al. "49.4 L: Late-News Paper: Highly Transmissive One Side Emission OLED Panel for Novel Lighting Applications." SID Symposium Digest of Technical Papers. vol. 44. No. 1. Oxford, UK: Blackwell Publishing Ltd, 2013.

Amy V. Walker et al., "Dynamics of Interaction of Magnesium Atoms on Methoxy-Terminated Self-Assembled Monolayers: An Example of a Reactive Metal with a Low Sticking Probability", J. Phys. Chem. C, vol. 111, No. 2, Year 2007, pp. 765-772.

Aqra, Fathi, and Ahmed Ayyad. "Surface free energy of alkali and transition metal nanoparticles." Applied surface science 314 (2014): 308-313.

Baek, Seungin, et al. "74-2: Diffracted Image Retrieving with Deep Learning." SID Symposium Digest of Technical Papers. vol. 51. No. 1. 2020.

Bechtolsheim, C. V., V. Zaporojtchenko, and F. Faupel. "Interface structure and formation between gold and trimethylcyclohexane polycarbonate." Journal of materials research 14.9 (1999): 3538-3543.

(56) References Cited

OTHER PUBLICATIONS

Bing Zhang et al., "A 17.3-inch WQHD Top-Emission Foldable AMOLED Display with Outstanding Optical Performance and Visual Effects" SID 2020 Digest, Sep. 25, 2020, pp. 1836-1839.
C.V. Bechtolsheim et al., "Interface Structure and Formation Between Gold and Trimethylcyclohexane Polycarbonate", J. Mater. Res., vol. 14, No. 9, Date Sep. 9, 1999, pp. 3538-3543.
Chan II Park et al., "World 1st Large Size 77-inch Transparent Flexible OLED Display", SID 2018 Digest, Date Apr. 29, 2018, pp. 710-713.
Chang-Jun Lee et al., "Microcavity Effect of Top-emission Organic Light-emitting Diodes Using Aluminum Cathode and Anode", Bull. Korean Chem. Soc. 2005, vol. 26, No. 9, Date Mar. 5, 2005, pp. 1344-1346.
Chen, Yu-Hung, et al. "58.2: High-Performance Large-Size OLED Tv with Ultra Hd Resolution." SID Symposium Digest of Technical Papers. vol. 46. No. 1. 2015.
Chia-Tse Lee et al., A Novel Highly Transparent 6-in. AMOLED Display Consisting of IGZO TFTs:, SID 2015 Digest, Jul. 29, 2015, pp. 872-875.
Ching Suet Ying et al., "Plasmonic Properties of Silver-based Alloy Thin Films", Date Feb. 2015, pp. 198.
Ching, Suet Ying. "Plasmonic properties of silver-based alloy thin films." (2015). Open Access Theses and Dissertations. 194.
Ching, Suet Ying. "Plasmonic properties of silver-based alloy thin films." (2016).
Daiki Nakamura et al., "Top-emission OLED Kawara-type Multidisplay with Auxiliary Electrode", SID 2018 Digest, May 30, 2018, pp. 910-913.
Daimotsu Kato et al., "Transmissive One-Side-Emission OLED Panel using Alignment-Free Cathode Patterning", SID 2015 Digest, Date Jul. 29, 2015, pp. 790-793.
David S. Fryer et al., "Dependence of the Glass Transition Temperature of Polymer Films on Interfacial Energy and Thickness", Macromolecules 34, Date Apr. 6, 2001, pp. 5627-5634.
David, Robert, Neumann, A. Wilhelm. "A Theory for the Surface Tensions and Contact Angles of HydrogenBonding Liquids." Langmuir 30.39 (2014):11634-11639.
Dong-Youn Shin et al., "Self-patterning of fine metal electrodes by means of the formation of isolated silver nanoclusters embedded in polyaniline", Nanotechnology, Date Sep. 18, 2009, pp. 1-8.
Dubrovskii, Vladimir. "Fundamentals of Nucleation Theory." Nucleation Theory and Growth of Nanostructures. Springer, Berlin, Heidelberg, 2014. 1-73.
Eguchi, Shingo, et al. "35-1: Strategy for Developing an Ultra-High-Luminance AMOLED Display." SID Symposium Digest of Technical Papers. vol. 49. No. 1. 2018.
Eilers, H., et al. "Teflon AF/Ag nanocomposites with tailored optical properties." Journal of materials research 21.9 (2006): 2168-2171.
Emerton, Neil, David Ren, and Tim Large. "28-1: Image Capture Through TFT Arrays." SID Symposium Digest of Technical Papers. vol. 51. No. 1. 2020.
F. Faupel et al., "Nucleation, growth, interdiffusion, and adhesion of metal films on polymers", American Institute of Physics, Date Mar. 19, 2008, pp. 201-216.
Fathi Aqra et al., "Surface free energy of alkali and transition metal nanoparticles", Applied Surface Science 314, Date Jul. 1, 2014, pp. 308-313.
Faupel, F., et al. "Nucleation, growth, interdiffusion, and adhesion of metal films on polymers." AIP Conference Proceedings. vol. 491. No. 1. American Institute of Physics, 1999.
Feng, Zhengyu, et al. "28-3: Pixel Design for Transparent MicroLED Display with Low Blurring." SID Symposium Digest of Technical Papers. vol. 51. No. 1. 2020.
Flores-Camacho, Jose Manuel, et al. "Growth and optical properties of Ag clusters deposited on poly (ethylene terephthalate)." Nanotechnology 22.27 (2011): 275710.
Foreign Action other than Search Report on JP dated Aug. 3, 2022.
Foreign Action other than Search Report on JP 2018-521242 Dtd Nov. 16, 2020.
Foreign Action other than Search Report on JP 2018-521242 Dtd Jun. 3, 2021.
Foreign Action other than Search Report on TW 106115017 Dtd Oct. 15, 2020.
Fowkes, Frederick M. "Attractive Forces at Interfaces." Industrial and Engineering Chemistry 56.12 (1964): 40-52.
Frey, Kurt, et al. "Implications of coverage-dependent O adsorption for catalytic NO oxidation on the late transition metals." Catalysis Science & Technology 4.12 (2014): 4356-4365.
Fryer, David S., et al. "Dependence of the glass transition temperature of polymer films on interfacial energy and thickness." Macromolecules 34.16 (2001): 5627-5634.
Fusella, Michael A., et al. "Plasmonic enhancement of stability and brightness in organic light-emitting devices." Nature 585.7825 (2020): 379-382.
Georg Hass et al., "Physics of Thin Films Advances in Research and Development vol. 2", Year 1964, pp. 455.
H. Eilersa et al., "Teflon AF/Ag Nanocomposites With Tailored Optical Properties", J. Mater. Res., vol. 21, No. 9, Date Sep. 9, 2006, pp. 2168-2171.
H. Song et al., "Modeling vapor deposition of metal/semiconductor-polymer nanocomposite", Thin Solid Films 476 (2005), Date Nov. 18, 2004, pp. 190-195.
Haewon Kiml et al., " Analysis of Semi-Transparent Cathode Performance Based on Fabrication Methods", Year 2019, pp. 906-909.
Hailiang Wang et al., "An Under-Display Camera Optical Structure for Full-Screen LCD", SID 2020 Digest, Date Sep. 25, 2020, pp. 1881-1882.
Hao Zhang et al., "A Design of Under-screen Face Recognition based on Screen Miniature Blind Apertures", SID 2020 Digest, Date Sep. 25, 2020, pp. 1878-1880.
Heaney, James B. "Evaluation of commercially supplied silver coated Teflon for spacecraft temperature control usage." (1974).
Herbert Lifka et al., "P-169: Single Side Emitting Transparent OLED Lamp", SID 11 Digest, Date Aug. 16, 2012, pp. 1737-1739.
Ho, P. S. "Chemistry and adhesion of metal-polymer interfaces." Applied surface science 41 (1990): 559-566.
Ho, P. S., et al. "Chemical bonding and reaction at metal/polymer interfaces." Journal of Vacuum Science & Technology A: Vacuum, Surfaces, and Films 3.3 (1985): 739-745.
Hopkin, Hywel T., Edward A. Boardman, and Tim M. Smeeton. "36-4: Solution-Processed Transparent Top Electrode for QD-LED." SID Symposium Digest of Technical Papers. vol. 51. No. 1. 2020.
Hua Xu et al., "Transparent AMOLED Display Derived by Metal Oxide Thin Film Transistor with Praseodymium Doping", Date Jan. 14, 2019, pp. 557-559.
Hyun-Chang Kim et al., "A Method of Panel-Current Limitation for Automotive OLED Displays", SID 2020 Digest, Date Sep. 25, 2020, pp. 563-566.
Hywel T. Hopkin et al., "Solution-Processed Transparent Top Electrode for QD-LED", SID 2020 Digest, Date Sep. 25, 2020, pp. 516-519.
International Search Report and Written Opinion for International Application No. PCT/IB2016/056442, mailed on Jan. 9, 2017, 8 pages.
J. Kanzow et al., "Formation of a metal/epoxy resin interface", Applied Surface Science vol. 239, Issue 2, Date Jan. 15, 2005, pp. 227-236.
J. M. Flores-Camachol et al., "Growth and optical properties of Ag clusters deposited on poly(ethyleneterephthalate)", Nanotechnology 22, May 20, 2011, pp. 13.
James B. Heaney, "Evaluation of commercially supplied silver coated Teflon for Spacecraft Temperature Control Usage", Goddard Space Flight Center, Date Jan. 1974, pp. 34.
Jiao, Zhiqiang, et al. "61-2: Weakening Micro-Cavity Effects in White Top-Emitting WOLEDs with Semitransparent Metal Top Electrode." SID Symposium Digest of Technical Papers. vol. 49. No. 1. 2018.
Jongwoong Park et al., "The Method to Compensate IR-Drop of AMOLED Display", SID 2019 Digest, Date May 29, 2019, pp. 81-84.

(56) References Cited

OTHER PUBLICATIONS

Jun Ho Yu et al., "Fabrication of Auxiliary Electrodes using Ag Inkjet Printing for OLED Lighting" SID 2018 Digest, Date May 30, 2018, pp. 843-846.
Jun-Yu Yang et al., "AMOLED IR Drop Compensation for Channel Length Modulation", SID 2020 Digest, Date Sep. 25, 2020, pp. 459-462.
K. L. Mittal et al., "Metallized Plastics 3: Fundamental and Applied Aspects", Plenum Press, New York, Year 1992, pp. 391.
Kanzow, J., et al. "Formation of a metal/epoxy resin interface." Applied surface science 239.2 (2005): 227-236.
Karabacak, Tansel. "Thin-film growth dynamics with shadowing and re-emission effects." Journal of Nanophotonics 5.1 (2011): 052501.
Karina Morgenstern et al., "Decay of Two-Dimensional Ag Islands on Ag(111)", The American Physical Society, vol. 76, No. 12, Date Mar. 18, 1996, pp. 2113-2116.
Kaspaul, A. F., and E. E. Kaspaul. "Application of molecular amplification to microcircuitry." Trans. 10th National Vacuum Symposium. 1963. pp. 422-427.
Kato, Daimotsu, et al. "52.4 L Transmissive One-Side-Emission OLED Panel using Alignment-Free Cathode Patterning." SID Symposium Digest of Technical Papers. vol. 46. No. 1. 2015.
Kim, Haewon, et al. "Analysis of Semi-Transparent Cathode Performance Based on Fabrication Methods." IDW '19. 2019.
Kim, Hyun-Chang, et al. "39-4: A Method of Panel-Current Limitation for Automotive OLED Displays." SID Symposium Digest of Technical Papers. vol. 51. No. 1. 2020.
Kim, S.K., et al. "5-4: High Efficiency Top-Emission Organic Light Emitting Diodes Realized Using Newly Developed Low Absorption Pure Ag cathode Configuration." SID Symposium Digest of Technical Papers, 50: 50-53. 2019.
Kisin, S., "Adhesion changes at metal-polymer interfaces : study of the copper-(acrylonitrile-butadiene-styrene) system", Eindhoven University of Technology, Jan. 1, 2007, pp. 143.
Kisin, Srdjan. Adhesion changes at metal-polymer interfaces: Study of the copper-(acrylonitrile-butadiene-styrene) system. Diss. Dissertation, Technische Universiteit Eindhoven, 2007.
Knight Jr, L. B., et al. "Unusual behavior of vaporized magnesium under low pressure conditions." The Journal of Physical Chemistry? 79.12 (1975): 1183-1190.
Koma, N. et al. "44.2: Novel Front-light System Using Fine-pitch Patterned OLED." SID Symposium Digest of Technical Papers, 39: 655-658. 2008.
Kurt Frey et al., "Implications of coverage-dependent O adsorption for catalytic NO oxidation on the late transition metals", Catal. Sci. Technol., Date Aug. 4, 2014, pp. 4356-4365.
L. G. Lund et al., "Phosphonitrilic Derivatives. Part I. The Preparation of Cyclic and Linear Phosphonitrilic Chlorides.", Date Jan. 1, 1960, pp. 2542-2547.
L. Nittler et al., "Morphology study of small amounts of evaporated gold on polymers", Surf. Interface Anal., Date Feb. 24, 2012, pp. 1072-1075.
L. Vitos et al., "The surface energy of metals", Surface Science 411, Date May 2, 1998, pp. 186-202.
L.B. Knight et al., "Unusual Behavior of Vaporized Magnesium under Low Pressure Conditions", The Journal of Physical Chemistry. vol. 79, Year 1975, pp. 1183-1190.
Lee, Chang-Jun, et al. "Microcavity effect of top-emission organic light-emitting diodes using aluminum cathode and anode." Bulletin of the Korean Chemical Society 26.9 (2005): 1344-1346.
Lee, Chia-Tse, et al. "58.3: A Novel Highly Transparent 6-in. AMOLED Display Consisting of IGZO TFTs.''?SID Symposium Digest of Technical Papers. vol. 46. No. 1. 2015.
Lei Zhao et al., "Patterning of Metal Films on Arbitrary Substrates by Using Polydopamine as a UV-Sensitive Catalytic Layer for Electroless Deposition", American Chemical Society, Date May 16, 2016, p. 5285-5290.
Lifka, H. et al. "P-169: Single Side Emitting Transparent OLED Lamp." SID Symposium Digest of Technical Papers, 42: 1737-1739. 2011.
Lim, Sehoon, et al. "74-1: Image Restoration for Display-Integrated Camera." SID Symposium Digest of Technical Papers. vol. 51. No. 1. 2020.
Lin, Rong Jie, Chi Jui Cheng, and Hoang Yan Lin. "P-165: An Optimized Algorithm to Reconstruct the Structure of Transparent OLED Display Based on Monte Carlo Method." SID Symposium Digest of Technical Papers. vol. 51. No. 1. 2020.
Liu, Yang, et al. "P-168: Top Emission WOLED for High Resolution OLED TV." SID Symposium Digest of Technical Papers. vol. 49. No. 1. 2018.
Liu, Yunfei, et al. "P-202: High Transmittance Top Conductive Electrodes of OLEDs by Using Conductive Interface Layer." SID Symposium Digest of Technical Papers. vol. 51. No. 1. 2020.
Lund, L. G., et al. "514. Phosphonitrilic derivatives. Part I. The preparation of cyclic and linear phosphonitrilic chlorides." Journal of the Chemical Society (Resumed) (1960): 2542-2547.
M. Scharnberg et al., "Radiotracer measurements as a sensitive tool for the detection of metal penetration in molecular-based organic electronics", Appl. Phys. Lett. 86, 024104, Date Jan. 5, 2005, pp. 4.
Maissel, Leon I., and Maurice H. Francombe. An introduction to thin films. CRC Press, 1973. pp. 61-83, 198, 199.
Marcel B. J. Meinders, "Effect of Surface Elasticity on Ostwald Ripening in Emulsions", American Chemical Society, Langmuir, vol. 17, No. 13, Date May 30, 2001, pp. 3923-3929.
Meinders, Marcel BJ, William Kloek, and Ton van Vliet. "Effect of surface elasticity on Ostwald ripening in emulsions." Langmuir 17.13 (2001): 3923-3929.
Michael A. Fusellal et al., "Plasmonic Enhancement of Stability and Brightness in Organic Light-Emitting Devices", Nature, vol. 585, Date Sep. 16, 2020, pp. 379-387.
Michele Ricks et al., "Enabling Large-Size OLED Displays by Ink Jet Printing", OLEDs World Summit, Date Sep. 2020, pp. 28.
Michele Ricks. Advanced OLED Materials Enabling Large-Size OLED Displays by Ink Jet Printing. OLEDs World Summit, Sep. 2020.
Milton Ohring, "The Materials Science of Thin Films", Year 1992, pp. 742.
Mingmin Shen et al., "Destabilization of Ag nanoislands on Ag(100) by dsorbed sulfur", J. Chem. Phys. 135, 154701, Date Oct. 17, 2011, pp. 10.
Mittal, Kashmiri Lal, ed. Metallized plastics 3: fundamental and applied aspects. Springer Science & Business Media, 2012.
Morgenstern, Karina, Georg Rosenfeld, and George Comsa. "Decay of two-dimensional Ag islands on Ag (111)." Physical review letters 76.12 (1996): 2113.
Murano, Sven, et al. "30.3: Invited Paper: AMOLED Manufacturing-Challenges and Solutions from a Material Makers Perspective." SID Symposium Digest of Technical Papers. vol. 45. No. 1. 2014.
Nakamura, Daiki, et al. "68-4: Top-emission OLED Kawara-type Multidisplay with Auxiliary Electrode." SID Symposium Digest of Technical Papers. vol. 49. No. 1. 2018.
Neil Emerton et al., "Image Capture Through TFT Arrays", SID 2020 Digest, Date Sep. 25, 2020, pp. 402-405.
Nittler, Laurent, et al. "Morphology study of small amounts of evaporated gold on polymers." Surface and interface analysis 44.8 (2012): 1072-1075.
Non-Final Office Action on U.S. Appl. No. 15/527,702 Dtd Aug. 3, 2018.
Norio Koma et al., "44.2: Novel Front-light System Using Fine-pitch Patterned OLED", SID 08 Digest, Date Jul. 5, 2012, pp. 655-658.
Office Action and Search Report from corresponding Chinese Patent Application No. 201680075109.9, issued on Jul. 1, 2019, 8 pages.
Ohring, Milton. Materials science of thin films. Elsevier, 2001.
Okuyama, Kentaro, et al. "79-4L:?Late-News Paper: Highly Transparent LCD using New Scattering-type Liquid Crystal with Field Sequential Color Edge Light." SID Symposium Digest of Technical Papers,?48, 2017.

(56) References Cited

OTHER PUBLICATIONS

P.S. Ho et al., "Chemical bonding and reaction at metal/polymer interfaces", J. Vac. Sci. Technol. A Vacuum Surfaces and Films, Date Jun. 1985, pp. 739-745.
P.S. Ho, "Chemistry and Adhesion of Metal-Polymer Interfaces", Applied Surface Science, Date Apr. 5, 1989, pp. 559-566.
Pandharkar, Riddhish, et al. "A Computational Study of AlF3 and ACF Surfaces." Inorganics 6.4 (2018): 124.
Park, Chan II, et al. "54-1: Distinguished Paper: World 1st Large Size 77-inch Transparent Flexible OLED Display." SID Symposium Digest of Technical Papers. vol. 49. No. 1. 2018.
Park, Jongwoong, et al. "8-1: The Method to Compensate IR-Drop of AMOLED Display." SID Symposium Digest of Technical Papers. vol. 50. No. 1. 2019.
Park, Woo-Young, et al. "P-175L: Late-News Poster: High Efficiency Light Extraction from Top-Emitting Organic Light-Emitting Diodes Employing Mask-Free Plasma Etched Stochastic Polymer Surface." SID Symposium Digest of Technical Papers. vol. 46. No. 1. 2015.
Paul Schissel et al., "Reactions at the Silver/Polymer Interface: A Review", Solar Energy Research Institute, Date Feb. 1980, pp. 52.
Peters, Richard D., et al. "Using Self-Assembled Monolayers Exposed to X-rays to Control the Wetting Behavior of Thin Films of Diblock Copolymers." Langmuir 16.10 (2000): 4625-4631.
Quan Tang et al., "Study of the Image Blur through FFS LCD Panel Caused by Diffraction for Camera under Panel", SID 2020 Digest, Date Sep. 25, 2020, pp. 406-409.
Quan, Wei, et al. "69-2: Transparent Conductive Hybrid Cathode Structure for Top-Emitting Organic Light-Emitting Devices." SID Symposium Digest of Technical Papers. vol. 51. No. 1. 2020.
Robert L.W. Smithson et al., "Effects of polymer substrate surface energy on nucleation and growth of evaporated gold films", Thin Solid Films 307, May 13, 1997, pp. 110-112.
Rokni Fard et al., "Biased Ostwald Ripening in Site-Selective Growth of Two-Dimensional Gold Clusters", Date Journal of Physical Chemistry C, vol. 122, No. 14, Year 2018, pp. 18.
Rokni-Fard, Mahroo, and Quanmin Guo. "Biased Ostwald ripening in site-selective growth of two-dimensional gold clusters." The Journal of Physical Chemistry C 122.14 (2018): 7801-7805.
Rong Jie Lin et al., "An Optimized Algorithm to Reconstruct the Structure of Transparent OLED Display Based on Monte Carlo Method", SID 2020 Digest, Date Sep. 25, 2020, pp. 2009-2012.
Safonov, Alexey I., et al. "Deposition of thin composite films consisting of fluoropolymer and silver nanoparticles having surface plasmon resonance." Thin Solid Films 603 (2016): 313-316.
Satulu, Veronica, et al. "Combining fluorinated polymers with Ag nanoparticles as a route to enhance optical properties of composite materials." Polymers 12.8 (2020): 1640.
Scharnberg, M., et al. "Radiotracer measurements as a sensitive tool for the detection of metal penetration in molecular-based organic electronics." Applied Physics Letters 86.2 (2005): 024104.
Schissel, Paul, and Alvin Warren Czanderna. "Reactions at the silver/polymer interface: a review." Solar Energy Materials 3.1-2 (1980): 225-245.
Schwab, Tobias. Top-Emitting OLEDs: Improvement of the Light Extraction Efficiency and Optimization of Microcavity Effects for White Emission. Diss. Saechsische Landesbibliothek-Staats- und Universitaetsbibliothek Dresden, 2014.
Search Report on Taiwan Application No. 111112837 dated Nov. 8, 2022 (1 page).
Search Report on TW 110113620 Dtd Aug. 3, 2021.
Sehoon Lim et al., "Image Restoration for Display-Integrated Camera", SID 2020 Digest, Date Sep. 26, 2020, pp. 1102-1105.
Seong Keun Kim et al., "High Efficiency Top-Emission Organic Light Emitting Diodes Realized Using Newly Developed Low Absorption Pure Ag cathode Configuration", SID 2019 Digest, Date May 29, 2019, pp. 50-53.
Seungin Baek et al., "Diffracted Image Retrieving with Deep Learning", SID 2020 Digest, Date Sep. 25, 2020, pp. 1106-1108.
Shen, Mingmin, et al. "Destabilization of Ag nanoislands on Ag (100) by adsorbed sulfur." The Journal of chemical physics 135.15 (2011): 154701.
Shi, Shiming, et al. "56-1: Invited Paper: Research on Commercial Foldable AMOLED and Relevant Technologies." SID Symposium Digest of Technical Papers. vol. 51. No. 1. 2020.
Shiming Shi et al., "Research on Commercial Foldable AMOLED and Relevant Technologies", SID 2020 Digest, Date Sep. 25, 2020, pp. 826-829.
Shin, Dong-Youn, and Inyoung Kim. "Self-patterning of fine metal electrodes by means of the formation of isolated silver nanoclusters embedded in polyaniline." Nanotechnology 20.41 (2009): 415301.
Shingo Eguchi et al., "Strategy for Developing an Ultra-High-Luminance AMOLED Display", SID 2018 Digest, Date May 30, 2018, pp. 433-436.
Silvia Varagnolo et al., "Embedded-Grid Silver Transparent Electrodes Fabricated by Selective Metal Condensation", J. Mater. Chem. C. 2020, Date Sep. 9, 2020, pp. 5.
Silvia Varagnolo et al., "Selective Deposition of Silver and Copper Films by Condensation Coefficient Modulation", The Royal Society of Chemistry 2020, Date Jul. 12, 2019, pp. 143-148.
Silvia Varagnolo et al., "Selective Deposition of Silver and Copper Films by Condensation Coefficient Modulation", The Royal Society of Chemistry, Year 2019, pp. 1-22.
Smithson, Robert LW, Donald J. McClure, and D. Fennell Evans. "Effects of polymer substrate surface energy on nucleation and growth of evaporated gold films." Thin Solid Films 307.1-2 (1997): 110-112.
Song, Hongwei, Olusegun J. Ilegbusi, and L. I. Trakhtenberg. "Modeling vapor deposition of metal/semiconductor-polymer nanocomposite." Thin Solid Films 476.1 (2005): 190-195.
Song, Wenfeng, et al. "5-3: 3-Stacked Top-Emitting White OLEDs with Super-Wide Color Gamut and High Efficiency." SID Symposium Digest of Technical Papers. vol. 50. No. 1. 2019.
Sonoda, Tohru, et al. "84-1: Invited Paper: 30-inch 4K Rollable OLED Display." SID Symposium Digest of Technical Papers. vol. 51. No. 1. 2020.
Spelt, J. K., Absolom, D. R., Neumann, A. W. "Solid Surface Tension: The Interpretation of Contact Angles by the Equation of State Approach and the Theory of Surface Tension Components." Langmuir 2 (1986): 620-625.
Spelt, J. K., Neumann, A. W. "Solid Surface Tension: The Equation of State Approach and the Theory of Surface Tension Components. Theoretical and Conceptual Considerations." Langmuir 3 (1987): 588-591.
Suet Ying Ching et al., "Plasmonic properties of silver-based alloy thin films", Date Feb. 2015, pp. 198.
Sven Murano et al., "AMOLED Manufacturing—Challenges and Solutions from a Material Makers Perspective", SID 2014 Digest, Date Jul. 7, 2014, pp. 403-406.
Tang, Quan, et al. "28-2: Study of the Image Blur through FFS LCD Panel Caused by Diffraction for Camera under Panel." SID Symposium Digest of Technical Papers. vol. 51. No. 1. 2020.
Tansel Karabacak, "Thin-film growth dynamics with shadowing and re-emission effects", Journal of Nanophotonics, vol. 5, Date Mar. 4, 2011, pp. 19.
Tarasevich, Y. I. "Surface energy of oxides and silicates." Theoretical and Experimental Chemistry 42 (2006): 145-161.
Thran, A., et al. "Condensation coefficients of Ag on polymers." Physical review letters 82.9 (1999): 1903.
Tobias Schwab, "Improvement of the Light Extraction Efficiency and Optimization of Microcavity Effects for White Emission", Nov. 3, 2014, pp. 225.
Tohru Sonoda et al., "30-inch 4K Rollable OLED Display", SID 2020 Digest, Date Sep. 25, 2020, pp. 1261-1264.
Toshikazu Yamadal et al., "Nanoparticle chemisorption printing technique for conductive silver patterning with submicron resolution", N Nature Communications, Date Apr. 19, 2016, pp. 1-9.
Tsai, Yu-Hsiang, et al. "P-202: A Flexible Transparent OLED Display with FlexUPTM Technology." SID Symposium Digest of Technical Papers. vol. 48. No. 1. 2017.

(56) References Cited

OTHER PUBLICATIONS

Tsujioka, Tsuyoshi, and Kosuke Tsuji. "Metal-vapor deposition modulation on soft polymer surfaces." Applied Physics Express 5.2 (2012): 021601.

Tsujioka, Tsuyoshi, et al. "Selective metal deposition on photoswitchable molecular surfaces." Journal of the American Chemical Society 130.32 (2008): 10740-10747.

Tsujioka, Tsuyoshi, Rie Takagi, and Takahiro Shiozawa. "Light-controlled metal deposition on photochromic polymer films." Journal of Materials Chemistry?20.43 (2010): 9623-9627.

Tsuyoshi Tsujioka et al., "Light-controlled metal deposition on photochromic polymer films", J. Mater. Chem., vol. 20, Dates Jul. 22, 2010, pp. 9623-9627.

Tsuyoshi Tsujioka et al., "Metal-Vapor Deposition Modulation on Soft Polymer Surfaces", Appl. Phys. Express 5 021601, Date Feb. 8, 2012, pp. 4.

Tsuyoshi Tsujioka et al., "Selective Metal Deposition on Photoswitchable Molecular Surfaces", J. Am. Chem. Soc. 130, Date Jul. 16, 2008, pp. 10740-10747.

V. G. Dubrovskii, "Fundamentals of Nucleation Theory", Nucleation Theory and Growth of Nanostructures, Year 2014, pp. 1-74.

V. Zaporojtchenko et al., "Controlled growth of nano-size metal clusters on polymers by using VPD method", Surface Science 532-535, Year 2003, pp. 300-305.

V. Zaporojtchenko et al., "Condensation coefficients of noble metals on polymers: a novel method of determination by x-ray photoelectron spectroscopy", Surf. Interface Anal. 30, Date Nov. 22, 1999, pp. 439-443.

V. Zaporojtchenko et al., "Determination of condensation coefficients of metals on polymer Surfaces", Surface Science 454-456, Year 2000, pp. 412-416.

V. Zaporojtchenko et al., "Formation of metal-polymer interfaces by metal evaporation: influence of deposition parameters and defects", Microelectronic Engineering 50, Year 2000, pp. 465-471.

V. Zaporojtchenko et al., "Metal/polymer Interfaces With Designed Morphologies", J. Adhesion Sci. Technol., vol. 14, No. 3, Date Apr. 2, 2012, pp. 25.

Varagnolo, Silvia, et al. "Embedded-grid silver transparent electrodes fabricated by selective metal condensation." Journal of Materials Chemistry C?8.38 (2020): 13453-13457.

Varagnolo, Silvia, et al. "Selective deposition of silver and copper films by condensation coefficient modulation." Electronic Supplementary Material (ESI) for Materials Horizons. (2020).

Varagnolo, Silvia, et al. "Selective deposition of silver and copper films by condensation coefficient modulation." Materials Horizons 7.1 (2020): 143-148.

Veronica Satulu et al., "Combining Fluorinated Polymers with Ag Nanoparticles as a Route to Enhance Optical Properties of Composite Materials", Polymers, Date Jul. 23, 2020, pp. 1-13.

Vitos, Levente, et al. "The surface energy of metals." Surface science 411.1-2 (1998): 186-202.

Walker, Amy V., et al. "Dynamics of interaction of magnesium atoms on methoxy-terminated self-assembled monolayers: an example of a reactive metal with a low sticking probability." The Journal of Physical Chemistry C 111.2 (2007): 765-772.

Wang, Hailiang, et al. "P-132: An Under-Display Camera Optical Structure for Full-Screen LCD." SID Symposium Digest of Technical Papers. vol. 51. No. 1. 2020.

Wang, Zhibin, et al. "55-1: Invited Paper: Self-Assembled Cathode Patterning in AMOLED for Under-Display Camera." SID Symposium Digest of Technical Papers. vol. 51. No. 1. 2020.

Wang, Zhibin, et al. "60-5: Late-News Paper: 17-inch Transparent AMOLED Display with Self-Assembled Auxiliary Electrode." SID Symposium Digest of Technical Papers. vol. 50. No. 1. 2019.

Wei Quan et al., "Transparent Conductive Hybrid Cathode Structure for Top-Emitting Organic Light-Emitting Devices", SID 2020 Digest, Date Sep. 25, 2020, pp. 1029-1032.

Weimer, P. K. "Physics of Thin Films, vol. 2.". Academic Press, (1964).

Wenfeng Song et al., "3-Stacked Top-Emitting White OLEDs with Super-Wide Color Gamut and High Efficiency", SID 2019 Digest, Date May 29, 2019, pp. 46-49.

Wolfgang Decker et al., "High Definition Metallization for Printed Electronics," AIMCAL Fall Meeting 2011, Reno, NV, 11 pages.

Wolfgang Decker, "Selective Deposition of Metals on Polymer Films for Functional Applications", AIMCAL Fall Conference 2005, pp. 16.

Wolfgang Decker, Vast Films, Ltd. "Pattern Metallization: Selective Deposition of Metals on Polymer Films for Functional Applications" AIMCAL Fall Conference 2005.

Woo-Young Park et al., "High Efficiency Light Extraction from Top-Emitting Organic Light-Emitting Diodes Employing Mask-Free Plasma Etched Stochastic Polymer Surface", SID 2015 Digest, Date Mar. 1, 2016, pp. 1707-1709.

Wu, Zhongyuan, et al. "34-2: Distinguished Paper: Development of 55inch 8K AMOLED TV by Inkjet Printing Process." SID Symposium Digest of Technical Papers. vol. 51. No. 1. 2020.

Xu, Hua, et al. "Transparent AMOLED Display Derived by Metal Oxide Thin Film Transistor with Praseodymium Doping." Proceedings of the International Display Workshops vol. 26 (IDW '19). 2019.

Xuan Zhao et al., "Color Shift Improvement of AMOLED Device with Color Filter", SID 2020 DIGEST, Date Sep. 25, 2020, pp. 2111-2112.

Y. Numata et al., "Highly transparent LCD using new scattering-type liquid crystal with field sequential color edge light," 2017 24th International Workshop on Active-Matrix Flatpanel Displays and Devices, pp. 1166-1169.

Yamada, Toshikazu, et al. "Nanoparticle chemisorption printing technique for conductive silver patterning with submicron resolution." Nature communications 7.1 (2016): 1-9.

Yang Liu et al., "Top Emission WOLED for High Resolution OLED TV", SID 2018 Digest, Date May 30, 2018, pp. 1793-1795.

Yang Zeng et al., "Investigation of Moir Interference in Pinhole Matrix Fingerprint on Display Technology", SID 2020 Digest, Date Sep. 25, 2020, pp. 413-416.

Yang, Jun-Yu, et al. "32-3: AMOLED IR Drop Compensation for Channel Length Modulation." SID Symposium Digest of Technical Papers. vol. 51. No. 1. 2020.

Yu, Jun Ho, et al. "64-2: Fabrication of Auxiliary Electrodes using Ag Inkjet Printing for OLED Lighting." SID Symposium Digest of Technical Papers. vol. 49. No. 1. 2018.

Yu-Hsiang Tsai et al., "A Flexible Transparent OLED Display with FlexUPTM Technology", SID 2017 Digest, Date Jun. 2, 2017, pp. 2021-2024.

Yu-Hung Chen et al., "High-Performance Large-size OLED TV with Ultra HD Resolution", SID 2015 Digest, Date Jul. 29, 2015, pp. 869-871.

Yunfei Liu et al., " High Transmittance Top Conductive Electrodes of OLEDs by Using Conductive Interface Layer", SID 2020 Digest, May 14, 2020, pp. 2087-2088.

Zaporojtchenko, V., et al. "Condensation coefficients of noble metals on polymers: a novel method of determination by x-ray photoelectron spectroscopy." Surface and Interface Analysis: An International Journal devoted to the development and application of techniques for the analysis of surfaces, interfaces and thin films 30.1 (2000): 439-443.

Zaporojtchenko, V., et al. "Controlled growth of nano-size metal clusters on polymers by using VPD method." Surface science?532 (2003): 300-305.

Zaporojtchenko, V., et al. "Determination of condensation coefficients of metals on polymer surfaces." Surface science?454 (2000): 412-416.

Zaporojtchenko, V., et al. "Formation of metal-polymer interfaces by metal evaporation: influence of deposition parameters and defects." Microelectronic engineering 50.1-4 (2000): 465-471.

Zaporojtchenko, V., et al. "Metal/polymer interfaces with designed morphologies." Journal of Adhesion Science and Technology 14.3 (2000): 467-490.

Zeng, Yang, et al. "28-4: Investigation of Moir? Interference in Pinhole Matrix Fingerprint on Display Technology." SID Symposium Digest of Technical Papers. vol. 51. No. 1. 2020.

(56) References Cited

OTHER PUBLICATIONS

Zhang, Bing, et al. "P-124: A 17.3-inch WQHD Top-Emission Foldable AMOLED Display with Outstanding Optical Performance and Visual Effects." SID Symposium Digest of Technical Papers. vol. 51. No. 1. 2020.

Zhang, Hao, et al. "P-131: A Design of Under-screen Face Recognition based on Screen Miniature Blind Apertures." SID Symposium Digest of Technical Papers. vol. 51. No. 1. 2020.

Zhang, Zhenhua. "74-3: Image Deblurring of Camera Under Display by Deep Learning." SID Symposium Digest of Technical Papers. vol. 51. No. 1. 2020.

Zhao, Lei, Daqun Chen, and Weihua Hu. "Patterning of metal films on arbitrary substrates by using polydopamine as a UV-sensitive catalytic layer for electroless deposition." Langmuir 32.21 (2016): 5285-5290.

Zhao, Xuan, et al. "P-233: Late-News-Poster: Color Shift Improvement of AMOLED Device with Color Filter." SID Symposium Digest of Technical Papers. vol. 51. No. 1. 2020.

Zhengyu Feng et al., "Pixel Design for Transparent MicroLED Display with Low Blurring", SID 2020 Digest, Date Sep. 25, 2020, pp. 410-412.

Zhenhua Zhang, "Image Deblurring of Camera Under Display by Deep Learning", SID 2020 Digest, Date Jul. 17, 2020, pp. 1109-1112.

Zhibin Wang et al., " Self-Assembled Cathode Patterning in AMOLED for Under-Display Camera", SID 2020 Digest, Sep. 25, 2020, pp. 906-909.

Zhibin Wang et al., "17-inch Transparent AMOLED Display with Self-Assembled Auxiliary Electrode", Date May 29, 2019, pp. 4.

Zhigiang Jiao et al., "Weakening Micro-Cavity Effects in White Top-Emitting WOLEDs with Semitransparent Metal Top Electrode", SID 2018 Digest, Date May 30, 2018, pp. 808-810.

Zhonguyuan Wu et al., "Development of 55inch 8K AMOLED TV by Inkjet Printing Process", SID 2020 Digest, Date Sep. 25, 2020, pp. 6.

Abroshan, H. et al. "66-3: Active Learning for the Design of Novel OLED Materials." SID Symposium Digest of Technical Papers. 53.1 (2022).

Ai, Lianghui, et al. "Synthesis and flame retardant properties of cyclophosphazene derivatives containing boron." Polymer Degradation and Stability 155 (2018): 250-261.

Alaaeddine, Ali, et al. "Synthesis and characterization of novel alternating fluorinated copolymers bearing oligo (ethylene oxide) side chains." Journal of Polymer Science Part A: Polymer Chemistry 51.4 (2013): 977-986.

Alhadid A. et al., "Design of Deep Eutectic Systems: A Simple Approach for Preselecting Eutectic Mixture Constituents", Molecules, 25.5 (2020):1077.

Allcock, H. R. "Recent advances in phosphazene (phosphonitrilic) chemistry." chemical Reviews 72.4 (1972): 315-356.

Allcock, H. R., and D. B. Patterson. "Phosphorus-nitrogen compounds. 27. Ring-ring and ring-chain equilibration of dimethylphosphazenes. Relation to phosphazene polymerization." Inorganic Chemistry 16.1 (1977): 197-200.

Allcock, H. R., and L. A. Siegel. "Phosphonitrilic compounds. III. 1 Molecular inclusion compounds of tris (o-phenylenedioxy) phosphonitrile trimer." Journal of the American Chemical Society 86.23 (1964): 5140-5144.

Allcock, H. R., J. L. Schmutz, and Karen M. Kosydar. "A new route for poly (organophosphazene) synthesis. Polymerization, copolymerization, and ring-ring equilibration of trifluoroethoxy-and chloro-substituted cyclotriphosphazenes1, 2." Macromolecules 11.1 (1978): 179-186.

Allcock, H. R., R. L. Kugel, and K. J. Valan. "Phosphonitrilic compounds. VI. High molecular weight poly (alkoxy-and aryloxyphosphazenes)." Inorganic Chemistry 5.10 (1966): 1709-1715.

Allcock, H. R., W. J. Cook, and D. P. Mack. "Phosphonitrilic compounds. XV. High molecular weight poly [bis (amino) phosphazenes] and mixed-substituent poly (aminophosphazenes)." Inorganic Chemistry 11.11 (1972): 2584-2590.

Allcock, H.R. "Phosphorus-nitrogen Compounds", pp. 400-407, Academic Press (1972).

Allcock, H.R. and Walsh, E.J., "Phosphonitrilic Compounds. XIV. Basic Hydrolysis of Aryloxy- and Spiroarylenedioxycyclophosphazenes", J. Amer. Chem. Soc., 94.13 (1972):4538-4545.

Allcock, Harry R. "The expanding field of polyphosphazene high polymers." Dalton Transactions 45.5 (2016): 1856-1862.

Allcock, Harry R., and Chen Chen. "Polyphosphazenes: phosphorus in inorganic-organic polymers." The Journal of Organic Chemistry 85.22 (2020): 14286-14297.

Allcock, Harry R., and Dawn E. Smith. "Surface studies of poly (organophosphazenes) containing dimethylsiloxane grafts." Chemistry of materials 7.8 (1995): 1469-1474.

Allcock, Harry R., and Dennis C. Ngo. "Synthesis of poly [bis (phosphazo) phosphazenes] bearing aryloxy and alkoxy side groups." Macromolecules 25.11 (1992): 2802-2810.

Allcock, Harry R., and Michael L. Turner. "Ring expansion and polymerization of transannular bridged cyclotriphosphazenes and their spirocyclic analogs." Macromolecules 26.1 (1993): 3-10.

Allcock, Harry R., and R. L. Kugel. "Synthesis of high polymeric alkoxy-and aryloxyphosphonitriles." Journal of the American Chemical Society 87.18 (1965): 4216-4217.

Allcock, Harry R., and Young Baek Kim. "Synthesis, characterization, and modification of poly (organophosphazenes) with both 2, 2, 2-trifluoroethoxy and phenoxy side groups." Macromolecules 27.14 (1994): 3933-3942.

Allcock, Harry R., et al. "Controlled refractive index polymers: polyphosphazenes with chlorinated-and fluorinated-, aryloxy-and alkoxy-side-groups." Chemistry of materials 15.2 (2003): 473-477.

Allcock, Harry R., et al. "Hydrophobic and superhydrophobic polyphosphazenes." Journal of adhesion science and technology 23.3 (2009): 435-445.

Allcock, Harry R., et al. "Plasma surface functionalization of poly [bis (2, 2, 2-trifluoroethoxy) phosphazene] films and nanofibers." Langmuir 23.15 (2007): 8103-8107.

Allcock, Harry R., et al. "Poly (monophosphazophosphazenes): New polymers with N: PR3 side groups." Macromolecules 27.26 (1994): 7556-7564.

Allcock, Harry R., et al. "Syntheses and structures of cyclic and short-chain linear phosphazenes bearing 4-phenylphenoxy side groups." Journal of the American Chemical Society 113.7 (1991): 2628-2634.

Allcock, Harry R., Gayann S. McDonnell, and James L. Desorcie. "Ring expansion and equilibration in organophosphazenes and the relationship to polymerization." Inorganic chemistry 29.19 (1990): 3839-3844.

Allcock, Harry R., Lee B. Steely, and Anurima Singh. "Hydrophobic and superhydrophobic surfaces from polyphosphazenes." Polymer international 55.6 (2006): 621-625.

Allcock, Harry R., Michael L. Turner, and Karyn B. Visscher. "Synthesis of transannular-and spiro-substituted cyclotriphosphazenes: x-ray crystal structures of 1, 1-[N3P3 (OCH2CF3) 4 {O2C12H8}], 1, 3-[N3P3 (OCH2CF3) 4 {O2C12H8}], 1, 1-[N3P3 (OCH2CF3) 4 {O2C10H6}], and 1, 3-[N3P3 (OCH2CF3) 4} O2C10H6}]." Inorganic chemistry 31.21 (1992): 4354-4364.

Araki, H. and Naka, K., "Syntheses and Properties of Dumbbell-Shaped Poss Derivatives Linked by Luminescent p-Conjugated Units", Polymer Chemistry, 50.20 (2012):4170-4181.

Araki, H. and Naka, K., "Syntheses and Properties of Star- and Dumbbell-Shaped Poss Derivatives Containing Isobutyl Groups", Polymer Journal, 44 (2012):340-346.

Araki, H. and Naka, K., "Syntheses of Dumbbell-Shaped Trifluoropropyl-Substituted POSS Derivatives Linked by Simple Aliphatic Chains and Their Optical Transparent Thermoplastic Films", Macromolecules, 44.15 (2011):6039-6045.

Asuncion, M.Z et al., "Synthesis, Functionalization and Properties of Incompletely Condensed 'Half Cube' Silsesquioxanes as a Potential Route to Nanoscale Janus Particles", C. R. Chimie, 13.1-2 (2010):270-281.

(56) References Cited

OTHER PUBLICATIONS

Bae, J. et al. "Optically recoverable, deep ultraviolet (UV) stable and transparent sol-gel fluoro siloxane hybrid material for a UV LED encapsulant." RSC advances 6.32 (2016): 26826-26834.
Baradie, B. et al. "Synthesis and characterization of novel polysiloxane-grafted fluoropolymers." Canadian journal of chemistry 83.6-7 (2005): 553-558.
Barrett, Eric W., et al. "Patterning poly (organophosphazenes) for selective cell adhesion applications." Biomacromolecules 6.3 (2005): 1689-1697.
Barry, B., "Routes to Silsesquioxanes Functionalization—Capping of DDSQs for the Synthesis of Asymmetric POSS Compounds", Masters Thesis, Michigan State University (2019).
Becke-Goehring, Margot, and Ekkehard Fluck. "Phosphonitrilic chlorides from phosphorus pentachloride." Angewandte Chemie International Edition in English 1.6 (1962): 281-285.
Bertolucci, M. et al. "Wetting Behavior of Films of New Fluorinated Styrene—Siloxane Block Copolymers." Macromolecules 37.10 (2004): 3666-3672.
Besli, S. et al., "Bridged Cyclophosphazenes Resulting From Deprotonation Reactions of Cyclotriphophazenes Bearing a P—NH Group", 40.19 (2011):5307.
Besli, Serap, et al. "Regiochemical control in the substitution reactions of cyclotriphosphazene derivatives with secondary amines." Inorganic Chemistry 57.19 (2018): 12066-12077.
Biddlestone, M., and R. A. Shaw. "A two-ring assembly phosphazene." Chemical Communications (London) 7 (1968): 407-408.
Biederman, H. and Holland, L., "Metal Doped Fluorocarbon Polymer Films Prepared by Plasma Polymerization Using an RF Planar Magnetron Target", Nuclear Instruments and Methods, 212.1-3 (1983):497-503.
Biederman, H. et al., "The Properties of Fluorocarbon Films Prepared by R.F. Sputtering and Plasma Polymerization in Inert and Active Gas", Thin Solid Films, 41.3 (1977):329-339.
Blanchet, G.B., "Deposition of Amorphous Fluoropolymers Thin Films by Laser Ablation", Appl. Phys. Lett. 62 (1993):479-481.
Blanco, I., "The Rediscovery of Poss: A Molecule Rather than a Filler", Polymers, 10.8 (2018):904-914.
Boyne, D. et al., "Vacuum Thermal Evaporation of Polyaniline Doped with Camphor Sulfonic Acid", Journal of Vacuum Science & Technology A, 33.3 (2015):031510.
Brickley, J.F. et al., "Supramolecular Variations on a Molecular Theme: the Structural Diversity of Phosphazenes (RNH)6P3N3 in the Solid State", Dalton Trans., 7 (2003):1235-1244.
Brown, Douglas E., et al. "Poly[(vinyloxy)cyclophosphazenes]." Macromolecules 34.9 (2001), 2870-2875.
Buckley, D.H. and Johnson, R.L., "Degradation of Polymeric Compositions in Vacuum to 10-9 mm Hg in Evaporation and Sliding Friction Experiments", Polymer Engineering and Science, 4.4 (1964):306-314.
Buzin, M. I., et al. "Solid-state polymerization of hexaphenylcyclotrisiloxane." Journal of Polymer Science Part A: Polymer Chemistry 35.10 (1997): 1973-1984.
Cai, J. et al. "P-13.10: A New Color Space Model for AMOLED Display Based on IR Drop" SID Symposium Digest of Technical Papers 54 (2023).
Calhoun, Harry P. "Studies on the ligand properties of phosphonitrilic derivatives." Diss. University of British Columbia, 1973.
Camino, G. et al., "Polydimethylsiloxane Thermal Degradation Part 1. Kinetic Aspects", Polymer, 42.6 (2001):2395-2402.
Carolina Martínez Ceballos, Evelyn, et al. "Synthesis and characterization of polyphosphazenes modified with hydroxyethyl methacrylate and lactic acid." International Journal of Polymer Science 2013 (2013).
Carriedo, Gabino A., et al. "Preparation of a new type of phosphazene high polymers containing 2, 2'-dioxybiphenyl groups." Macromolecules 29.16 (1996): 5320-5325.
Chaiprasert, T. et al. "Vinyl-functionalized Janus ring siloxane: potential precursors to hybrid functional materials." Materials 14.8 (2021): 2014.

Chan, E.P. et al., "Viscoelastic Properties of Confined Polymer Films Measured via Thermal Wrinkling", Soft Matter, 5.23 (2009):4638-4641.
Chan, K.L. et al., "Cubic Silsesquioxanes for Use in Solution Processable Organic Light Emitting Diodes (OLED)", Journal of Materials Chemistry, 19.48 (2009):9103-9120.
Chandrasekhar, V. et al., "Cyclophosphazene-Based Multi-Site Coordination Ligands", Coordination Chemistry Reviews, 251.9-10 (2007):1045-1074.
Chaudhury, M. and Pocius, A. V. "Adhesion science and engineering-2: Surfaces, Chemistry and Applications" Elsevier (2002).
Chen, G. K. J., and J. Chen. "Flexible displays: Flexible AMOLED manufacturing." Handbook of Visual Display Technology; Chen, J., Cranton, W., Fihn, M., Eds (2016).
Chen, Hsiao-Fan, et al. "1,3,5-Triazine derivatives as new electron transport-type host materials for highly efficient green phosphorescent OLEDs." Journal of Materials Chemistry 19.43 (2009): 8112-8118.
Chen, W. et al., "Highly Thermal Stable Phenolic Resin Based on Double-Decker-Shaped POSS Nanocomposites for Supercapacitors", Polymers, 12.9 (2020):2151-2165.
Cho, H.U. et al. "17-1: Invited Paper: Enhancement of Current Efficiency for OLED Devices Using Meta-Heuristic Algorithm." SID Symposium Digest of Technical Papers. 52.1 (2021).
Cho, Song Yun, and Harry R. Allcock. "Novel highly fluorinated perfluorocyclobutane-based phosphazene polymers for photonic applications." Chemistry of Materials 19.25 (2007): 6338-6344.
Choi, B. K. et al. "48-1: Invited Paper: Next Generation Highly Efficient and Stable Phosphorescent Emitting Materials for OLEDs." SID Symposium Digest of Technical Papers 51.1 (2020).
Choi, J. et al., "Light Extraction Enhancement in Flexible Organic Light-Emitting Diodes by a Light-Scattering Layer of Dewetted Ag Nanoparticles at Low Temperatures", App. Mater. Interfaces, 10 (2018):32373-32379.
Çiftçi, Gönül Yenilmez, et al. "Investigation of the structural properties of 2-naphthylamine substituted cyclotetraphosphazenes." Polyhedron 77 (2014): 1-9.
Cordes, D.B. et al., "Recent Developments in the Chemistry of Cubic Polyhedral Oligosilsesquioxanes", Chem. Rev., 110 (2010):2081-2173.
Dalvi, V.H. and Rossky, P.J., "Molecular Origins of Fluorocarbon Hydrophobicity", PNAS, 107.31 (2010):13603-13607.
Dash, P. and Y. C.H. "How much battery does dark mode save? An accurate OLED display power profiler for modern smartphones." Proceedings of the 19th Annual International Conference on Mobile Systems, Applications, and Services (2021).
De Wilde, W., "Evaporation of Polytetrafluoroethylene by Electron Bombardment of the Bulk Material", Thin Solid Films, 24.1 (1974):101-111.
Dong, H. et al., "Surface Properties and Thermal Stability of a Novel Low-Surface-Energy Polybenzoxazine/Clay Nanocomposites", Polymer Composites, 33.8 (2012):1313-1320.
Drelich, J. et al., "Hydrophilic and Superhydrophilic Surfaces and Materials", Soft Matter, 7.21 (2011):9804-9828.
Dudziec, B. and Marciniec, B., "Double-decker Silsesquioxanes: Current Chemistry and Applications", Current Organic Chemistry, 21.28 (2017):2794-2813.
Dudziec, B. et al., "Synthetic Routes to Silsesquioxane-Based Systems as Photoactive Materials and Their Precursors", Polymers, 11.3 (2019):504-542.
Dutkiewicz, M. et al., "New Fluorocarbofunctional Spherosilicates: Synthesis and Characterization", Organometallics, 30.8 (2011):2149-2153.
Ellison, A. H., H. W. Fox, and W. A. Zisman. "Wetting of fluorinated solids by hydrogen-bonding liquids." The Journal of Physical Chemistry 57.7 (1953): 622-627.
Elmas, Gamze, et al. "Phosphorus-nitrogen compounds. Part 52. The reactions of octachlorocyclotetraphosphazene with sodium 3-(N-ferrocenylmethylamino)-1-propanoxide: Investigations of spectroscopic, crystallographic and stereogenic properties." Inorganica Chimica Acta 497 (2019): 119106.
English translation of 012-22-KR Div Official Action dated Jan. 1, 2024.

(56) References Cited

OTHER PUBLICATIONS

English translation of 012-23-JP Div Official Action dated Nov. 1, 2023.
Feher, F.J. and Budzichowski, T.A., "Silasesquioxanes as Ligands in Inorganic and Organometallic Chemistry", Polyhedron, 14.22 (1995):3239-3253.
Feistel, G. R., and T. Moeller. "The geminal structure of the compound N3P3CI4 (NH2) 2." Journal of Inorganic and Nuclear Chemistry 29.11 (1967): 2731-2737.
Fox, H.W. et al., "Polyorganosiloxanes . . . Surface Active Properties", Ind. Eng. Chem., 39.11 (1947):1401-1409.
Fushimi, Toshiki, and Harry R. Allcock. "Synthesis and optical properties of sulfur-containing monomers and cyclomatrix polyphosphazenes." Dalton transactions 39.22 (2010): 5349-5355.
Gabler, D.G. and Haw, J.F., "Hydrolysis Chemistry of the Chlorophosphazene Cyclic Trimer", Inorganic Chemistry, 29.20 (1990):4018-4021.
Gan, Y. et al., "Self-Wrinkling Patterned Surface of Photocuring Coating Induced by the Fluorinated POSS Containing Thiol Groups (F-POSS-SH) as the Reactive Nanoadditive", Macromolecules, 45.18 (2012):7520-7526.
Gao Y., "Microphase Separation of Stimulus-Responsive Block-co-Polypeptides on Surfaces", Master's thesis, Duke University (2018).
Giebink, C. "Catastrophic OLED failure and pathways to address it" Department of Energy, url:https://www.energy.gov/sites/prod/files/2018/02/f48/giebink_oled-failure_nashville18_0.pdf (2018).
Gluge, J. et al., An Overview of the Uses of Per- and Polyfluoroalkyl Substances (PFAS), Environmental Science: Processes & Impacts, 20.12 (2020):2345-2373.
Gogoi, N. et al., "Low-Surface-Energy Materials Based on Polybenzoxazines for Surface Modification of Textiles", The Journal of The Textile Institute, 105.11 (2014):1212-1220.
Golovin, K. et al., "Low-Interfacial Toughness Materials for Effective Large-Scale Deicing", Science, 364.6438 (2019):371-375.
Golovin, K. et al., Supplementary Materials for "Low-Interfacial Toughness Materials for Effective Large-Scale Deicing", Science, 364.6438 (2019):371-375.
Goyal, S. et al. "Fundamentals of Organic-Glass Adhesion", Handbook of Materials Modeling, edited by Andreoni W. and Yip S., Springer Nature Switzerland AG (2020): 2049-2089.
Grant Norton, M. et al., "Pulsed Laser Ablation and Deposition of Fluorocarbon Polymers", Applied Surface Science, 96-98 (1996):617-620.
Gritsenko, K.P. and Krasovsky, A.M., "Thin-Film Deposition of Polymers by Vacuum Degradation", Chem. Rev., 103.9 (2003):3607-3649.
Grytsenko, K. "Vacuum-deposited fluoropolymer films for organic electronics" International Symposium on Plastics Electronics (Part of Semicon Europe—2015) at Dresden, Germany (2015).
Grytsenko, K.P. et al., "Protective Applications of Vacuum-Deposited Perfluoropolymer Films", Semiconductor Physics, Quantum Electronics & Optoelectronics, 19.2 (2016):139-148.
Hoge, J. "Novel Benzoxazine Resin System for Flame Retardant Aircraft Interior Applications" The Sixth Triennial International Aircraft Fire and Cabin Safety Research (2010).
Holland, L. et al., "Sputtered and Plasma Polymerized Fluorocarbon Films", Thin Solid Films, 35 (1976): L19-L21.
Hwang, S. et al., "ChemInform Abstract: Dendritic Macromolecules for Organic Light-Emitting Diodes", Chemical Society Reviews, 37.11 (2008):2543-2557.
Iacono, S. T. et al. "Fluorinated polyhedral oligomeric silsesquioxanes (F-POSS), and pathways to address it", Defense Technical Information Center, url:https://apps.dtic.mil/sti/citations/ADA533422 (2010).
Iacono, S.T. et al., "Preparation of Composite Fluoropolymers with Enhanced Dewetting Using Fluorinated Silsesquioxanes as Drop-In Modifiers", J. Mater. Chem., 20.15 (2010):2979-2984.
Ibisoglu, H. et al., "Formation of Novel Spiro, Spiroansa and Dispiroansa Derivatives of Cyclotetraphosphazene From the Reactions of Polyfunctional Amines with Octachlorocyclotetraphosphazatetraene", J. Chem. Sci., 121.2 (2009):125-135.
Ikonnikov, D.A., "Controlling Multiple Diffraction with Quasiperiodic Gratings", Laser Phys. Lett., 16.12 (2019):126202.
Imoto, H. et al., "Corner- and Side-Opened Cage Silsesquioxanes: Structural Effects on the Materials Properties", European Journal of Inorganic Chemistry, 2020.9 (2020):737-742.
Imoto, H. et al., "Tripodal Polyhedral Oligomeric Silsesquioxanes as a Novel Class of Three-Dimensional Emulsifiers", Polymer Journal, 47 (2015):609-615.
Ito, Hitoshi, et al. "Synthesis and Thermal Properties of Fully Aromatic Polysilarylenesiloxanes." Polymer Journal 38.2 (2006): 109-116.
Ivleva, E.A. et al., "Synthesis of Adamantane Functional Derivatives Basing on N-[(Adamantan-1-yl)alkyl]acetamides", Russian Journal of Organic Chemistry, 52.11 (2016):1558-1564.
Iwamori, S. et al., "Adsorption Properties of Fluorocarbon Thin Films Prepared by Physical Vapor Deposition Methods", Surface & Coatings Technology, 204:16-17 (2010):2803-2807.
Iwamori, S., "Adhesion and Friction Properties of Fluorocarbon Polymer Thin Films Coated onto Metal Substrates", Key Engineering Materials, 384 (2008):311-320.
Jarvis, N.L. and Zisman, W.A., "Surface Chemistry of Fluorochemicals", Defense Technical Information Center (1965):1-37.
Jin, Y. et al. "Two-Tier Ensemble Deep Learning Model for Anomaly Detection in OLED Encapsulation Process" The 21st International Meeting on Information Display, Seoul, Korea (2021).
Jung, W. et al. "High-precision laser glass cutting for future display" Journal of the Society for Information Display 30.5 (2022): 462-470.
Kaesler, K., "The hidden defenders : Silane and siloxane impregnation protects construction materials", European coatings journal, 3 (2006):36-41.
Khanin, D.A., et al. "New hybrid materials based on cyclophosphazene and polysiloxane precursors: Synthesis and properties." Polymer 186 (2020): 122011.
Kim, Chiwoo, et al. "Fine metal mask material and manufacturing process for high-resolution active-matrix organic light-emitting diode displays." Journal of the Society for Information Display 28.8 (2020): 668-679.
Kim, G. et al. "Multiscale Calculation of Carrier Mobility in Organic Solids Through the Fine-Tuned Kinetic Monte Carlo Method" The 21st International Meeting on Information Display, Seoul, Korea (2021).
Kim, H. et al. "83-2: Reliability Characterization of Luminance Degradation of OLED Mobile Display Considering Color Difference Index Based on Usage Patterns." SID Symposium Digest of Technical Papers 51.1 (2020).
Kim, J. et al. "Design of Stable Blue Phosphorescent OLEDs Using State Interaction between Exciplex and Component Host" The 21st International Meeting on Information Display, Seoul, Korea (2021).
Kim, J.H. et al., "Thickness and Composition Dependence of the Glass Transition Temperature in Thin Homogeneous Polymer Blend Films", Macromolecules, 35.1 (2002):311-313.
Kim, J.H. et al., "Thickness Dependence of the Glass Transition Temperature in Thin Polymer Films", Langmuir, 17.9 (2001):2703-2710.
Kim, J.H. et al., "Thickness Dependence of the Melting Temperature of Thin Polymer Films", Macromol. Rapid Commun. 22.6 (2001):386-389.
Kim, S. et al. "25-3: Machine-Learning-Assisted Materials Discovery of Blue Emitter for More Efficient and Durable OLED Device." SID Symposium Digest of Technical Papers. 52.1 (2021).
Kim, S. "40-2: Invited Paper: Prolonging Device Lifetime of Blue Organic Light-Emitting Diodes." SID Symposium Digest of Technical Papers 53.1 (2022).
Kim, S. et al. "Autonomous Materials Design for More Efficient OLED Devices using Machine Learning" The 21st International Meeting on Information Display, Seoul, Korea (2021).
Kim, S. et al., "Origin of Macroscopic Adhesion in Organic Light-Emitting Diodes Analyzed at Different Length Scales", Scentific Reports, 8.6391 (2018): 1-7.

(56) References Cited

OTHER PUBLICATIONS

Kim, T. et al., "Electrical Injection and Transport in Teflon-Diluted Hole Transport Materials", Organic Electronics, 83 (2020):105754.

Kim, Y. "AI & Simulation Technology for Displays", SID 2021 Short Course, SID Display Week, virtual (2021).

Kim, Y. et al. "17-2: Invited Paper: Simulation Based Artificial Intelligence for Displays." SID Symposium Digest of Technical Papers. 52.1 (2021).

King, Allison, et al. "Semicrystalline polyphosphazenes: A comparative study of topology, morphology, and contact angles for three fluorous and one aryl polyphosphazene." Polymer 54.3 (2013): 1123-1129.

Kireev, Vyacheslav V., V. I. Astrina, and Eugeny A. Chernyshev. "Oligomeric Alkoxyphosphazens." Russian Chemical Reviews 50.12 (1981): 1186.

Kiskan, B., "Adapting Benzoxazine Chemistry for Unconventional Applications", Reactive and Functional Polymers, 129 (2018):76-88.

Kober, Ehrenfried, Henry Lederle, and Gerhard Ottmann. "Fluoroalkylphosphonitrilates: A New Class of Potential Fire-Resistant Hydraulic Fluids and Lubricants. I." Asle Transactions 7.4 (1964): 389-397.

Koh, K. et al., "Precision Synthesis of a Fluorinated Polyhedral Oligomeric Silsesquioxane-Terminated Polymer and Surface Characterization of Its Blend Film with Poly(methyl methacrylate)", Macromolecules, 38.4 (2005):1264-1270.

Kota, Arun K., Gibum Kwon, and Anish Tuteja. "The design and applications of superomniphobic surfaces." NPG Asia Materials 6.7 (2014): e109.

Kovacik, P. et al., "Vacuum-Deposited Planar Heterojunction Polymer Solar Cells", ACS Appl. Mater. Interfaces, 3.1 (2011):11-15.

Krishnamurthy, S. S., P. M. Sundaram, and Michael Woods. "Studies of phosphazenes. 12. Reactions of N4P4Cl8 with dibenzylamine-isolation of an unusual "bicyclic" phosphazene, N4P4 [N (CH2Ph) 2] 6 (NCH2Ph)." Inorganic Chemistry 21.1 (1982): 406-410.

Krishnan, S. et al., "Fluorinated Polymers: Liquid Crystalline Properties and Applications in Lithography", The Chemical Record, 4.5 (2004):315-330.

Kunthom, R. et al., "Synthesis and Characterization of Unsymmetrical Double-Decker Siloxane (Basket Cage)", Molecules, 24.23 (2019):4252.

Kuo, S. et al., "Preparing Low-Surface-Energy Polymer Materials by Minimizing Intermolecular Hydrogen-Bonding Interactions", J. Phys. Chem. C, 113.48 (2009):20666-20673.

Lanoux, S. and Mas, R.H., "Reactions of the Hydrolyzed Phosphazene N3P3(OCH2CF3)5ONa", Phosphorus and Sulfur and the Related Elements, 26.2 (1986):139-142.

Lederle, Henry, Ehrenfried Kober, and Gerhard Ottmann. "Fluoroaklyl Phosphonitrilates: A New Class of Potential Fire-Resistant Hydraulic Fluids and Lubricants." Journal of Chemical and Engineering Data 11.2 (1966): 221-228.

Lee, David KY, et al. "Synthesis and inclusion behavior of cyclotriphosphazene molecules with asymmetric spiro rings." Dalton Transactions 39.22 (2010): 5341-5348.

Lee, J. et al. "55-2: Methods for Overcoming the Trade-off between Efficiency and Lifetime of Organic Light-Emitting Diodes: OLED Lifetime Simulation." SID Symposium Digest of Technical Papers 51.1 (2020).

Lee, J.Y. and Saito, R., "Transparency and Water Vapor Barrier Properties of Polybenzoxazine-Silica Nanocomposites Provided with Perhydropolysilazane", J. Appl. Polym. Sci., 133.47 (2016):44238.

Lee, S. et al. "20-2: High Efficiency and Long Device Lifetime Green Organic Light Emitting Diodes using a Pt Complex." SID Symposium Digest of Technical Papers 51.1 (2020).

Lenton, M. V., and B. Lewis. "Preparation and properties of some novel diaminotetra (fluoroalkoxy)-triphosphonitriles." Journal of the Chemical Society A: Inorganic, Physical, Theoretical (1966): 665-667.

Li, L. et al., "Synthesis and Properties of Microporous Organic Polymers Based on Adamantane", Progress in Chemistry, 32 (2020):190-203.

Li, P. et al. "Preparation and application of fluorinated-siloxane protective surface coating material for stone inscriptions." Journal of Polymer Engineering 35.6 (2015): 511-522.

Li. J, et al. "40-4: Invited Paper: Self-Aligned Top-Gate Amorphous In—Ga—Zn—O Thin-Film Transistors with Hafnium-Induced Source/Drain Regions." SID Symposium Digest of Technical Papers. 54.1 (2023).

Liu, C. et al., "Mechanistic Studies on Ring-Opening Polymerization of Benzoxazines: A Mechanistically Based Catalyst Design", Macromolecules, 44.12 (2011):4616-4622.

Liu, F. et al. "Syntheses and structure of the first eight-membered fluoro and chloro hafnium siloxane complexes" Zeitschrift für anorganische und allgemeine Chemie 622.5 (1996): 819-822.

Liu, Xiao, et al. "Substituent exchange reactions of linear oligomeric aryloxyphosphazenes with sodium 2, 2, 2-trifluoroethoxide." Inorganic chemistry 51.21 (2012): 11910-11916.

Liu, Xiao, et al. "Substituent exchange reactions with high polymeric organophosphazenes." Macromolecules 45.22 (2012): 9100-9109.

Liu, Z. et al., "Two-Dimensional Gratings of Hexagonal Holes for High Order Diffraction Suppression", Optics Express, 25.2 (2017): 1339-1349.

Lowe, R.D. et al., "Deposition of Dense Siloxane Monolayers from Water and Trimethoxyorganosilane Vapor", Langmuir, 27.16 (2011):9928-9935.

Lu, H. and Nutt, S., "Restricted Relaxation in Polymer Nanocomposites near the Glass Transition", Macromolecules, 36.11 (2003):4010-4016.

Lu, T. et al., "Blended Hybrids Based on Silsesquioxane-OH and Epoxy Resins", Journal of Applied Polymer Science, 106.6 (2007):4117-4123.

Lysien, M. et al. "55-1: Deposition of Conductive and Insulating Materials at Micrometer Scale for Display-Component Prototyping." SID Symposium Digest of Technical Papers 53.1 (2022).

Mabry, J.M. et al., "Fluorinated Polyhedral Oligomeric Silsesquioxanes (F-POSS)", Angew. Chem. Int. Ed., 47.22 (2008):4137-4140.

Mabry, Joseph M., et al. "Ultrahydrophobic Fluorinated Polyhedral Oligomeric Silsesquioxanes (F-POSS)(Preprint)." Air Force Research Lab Edwards AFB CA Propulsion Directorate, 2007.

Mackus, A.J.M. et al. "From the bottom-up: toward area-selective atomic layer deposition with high selectivity" Chemistry of Materials 31.1 (2018): 2-12.

Maher, Andrew E., and Harry R. Allcock. "Influence of the n-Hexoxy Group on the Properties of Fluoroalkoxyphosphazene Polymers." Macromolecules 38.2 (2005): 641-642.

Majhy, B. et al., "Facile Fabrication and Mechanistic Understanding of a Transparent Reversible Superhydrophobic-Superhydrophilic Surface", Scientific Reports, 8 (2018):18018.

Mao, Y. and Gleason, K. K., "Vapor-Deposited Fluorinated Glycidyl Copolymer Thin Films with Low Surface Energy and Improved Mechanical Properties", Macromolecules, 39.11 (2006):3895-3900.

Marzari, N. et al. "Electronic-structure methods for materials design." Nature materials 20.6 (2021): 736-749.

Mikhaylov, D.Y. and Budnikova, Y.H., "Fluoroalkylation of Organic Compounds", Russian Chemical Reviews, 82.9 (2013):835-864.

Modzelewski, Tomasz, and Harry R. Allcock. "An unusual polymer architecture for the generation of elastomeric properties in fluorinated polyphosphazenes." Macromolecules 47.19 (2014): 6776-6782.

Mugisawa, M. et al., "Synthesis and Application of Novel Fluoroalkyl End-Capped Cooligomers Having Adamantane as a Pendant Group", Colloid Polym Sci, 285 (2007):737-744.

Murray, M. et al., "NMR Studies of Hydrolysis and Rearrangement Reactions of Cyclophosphazenes", Phosphorus, Sulfur, and Silicon and the Related Elements, 65.1-4 (1992):83-86.

Nason, T.C. et al., "Deposition of Amorphous Fluoropolymer Thin Films by Thermolysis of Teflon Amorphous Fluoropolymer", Appl. Phys. Lett. 60 (1992):1866-1868.

(56) References Cited

OTHER PUBLICATIONS

Nasrallah, H. and Hierso, J., "Porous Materials Based on 3-Dimensional Td-Directing Functionalized Adamantane Scaffolds and Applied as Recyclable Catalysts", Chem. Mater., 31.3 (2019):619-642.
Nicolas, G. and Spiegelmann, F., "Theoretical Study of Ethylene-Noble Metal Complexes", J. Am. Chem. Soc., 112 (1990):5410-5419.
Nishino, T. et al., "The Lowest Surface Free Energy Based on -CF3 Alignment", Langmuir, 15 (1999):4321-4323.
Niu, J. et al., "High Order Diffraction Suppression by Quasi-Periodic Two-Dimensional Gratings", Optical Materials Express, 7.2 (2017):366-375.
Nykänen, Virginia P. Silva, et al. "An efficient and stable star-shaped plasticizer for starch: cyclic phosphazene with hydrogen bonding aminoethoxy ethanol side chains." Green Chemistry 16.9 (2014): 4339-4350.
Ohnishi Y. et al., "Optical Characteristics of Poly(tetrafluoroethylene) Thin Film Prepared by a Vacuum Evaporation", Jpn. J. Appl. Phys., 55:2S (2016):02BB04.
Oka, M. and Satoshi, H. "Synthesis of photoresponsive cyclic poly (dimethyl siloxane) s from monodisperse linear precursors" Reactive and functional polymers 158 (2021): 104800.
Okui, N., H. M. Li, and J. H. Magill. "Thermal properties of poly (tetramethyl-p-silphenylene siloxane) and (tetramethyl-p-silphenylene siloxane-dimethyl siloxane) copolymers." Polymer 19.4 (1978): 411-415.
Olejnik, A. et al., "Silsesquioxanes in the Cosmetics Industry—Applications and Perspectives", Materials, 15.3 (2022):1126-1143.
Olshavsky, Michael, and Harry R. Allcock. "Polyphosphazenes with high refractive indices: optical dispersion and molar refractivity." Macromolecules 30.14 (1997): 4179-4183.
Ottmann, Gerhard, Henry Lederle, and Ehrenfried Kober. "Arylamino Polyfluoroalkoxy Phosphonitriles. New Class of Potential Fire-Resistant Hydraulic Fluids and Lubricants." Industrial & Engineering Chemistry Product Research and Development 5.2 (1966): 202-204.
Owen, M. J. "A review of significant directions in fluorosiloxane coatings" Surface Coatings International Part B: Coatings Transactions 87:B2 (2004).
Paulson, A.E. et al., "Three-Dimensional Profiling of OLED by Laser Desorption Ionization-Mass Spectrometry Imaging", Journal of the American Society for Mass Spectrometry, 31.12 (2020), 2443-2451.
Pham, J.Q. and Green, P.F., "The Glass Transition of Thin Film Polymer/Polymer Blends: Interfacial Interactions and Confinement", J. Chem. Phys., 116.13 (2002):5801-5806.
Plajer, Alex J., et al. "A modular approach to inorganic phosphazane macrocycles." Angewandte Chemie International Edition 56.31 (2017): 9087-9090.
Plajer, Alex J., et al. "Conformational Control in Main Group Phosphazane Anion Receptors and Transporters." Journal of the American Chemical Society 142.2 (2019): 1029-1037.
Plajer, Alex J., et al. "Tailoring the Binding Properties of Phosphazane Anion Receptors and Transporters." Journal of the American Chemical Society 141.22 (2019): 8807-8815.
Pocius, A. V. and Dillard, D.A. "Adhesion science and engineering-1: The Mechanics of Adhesion" Elsevier (2002).
Pu, T. et al., "Effects of Structure Parameters on High-Order Diffraction Suppression of Quasi-Periodic Gratings", Journal of the Optical Society of America B, 35.4 (2018):711-717.
Ramirez, S.M. et al., "Incompletely Condensed Fluoroalkyl Silsesquioxanes and Derivatives: Precursors for Low Surface Energy Materials", J. Am. Chem. Soc. 133.50 (2011):20084-20087.
Ratz, Rudi, et al. "A New Class of Stable Phosphonitrilic Acid Esters. Polyfluoroalkyl Phosphonitrilates." Journal of the American Chemical Society 84.4 (1962): 551-555.
Reichert, V.R. and Mathias, L.J., "Expanded Tetrahedral Molecules from 1,3,5,7-Tetraphenyladarnantane", Macromolecules, 27.24 (1994):7015-7023.

Riberiro, P et al., "Optics, Photonics and Laser Technology 2017", Chapters 2 and 3, Springer (2019).
Ringe, E., "Shapes, Plasmonic Properties, and Reactivity of Magnesium Nanoparticles", J. Phys, Chem. C, 124 (2020):15665.
Roesky, H. W., and E. Niecke. "Darstellung von P3N3F5NH2 und P3N3F5NPCI3." Inorganic and Nuclear Chemistry Letters 4.8 (1968): 463-465.
Roesky, Herbert W. "Lineare und cyclische Chlorphosphazene." Chemische Berichte 105.4 (1972): 1439-1445.
Roesky, Herbert W., Walter Grosse Bowing, and Edgar Niecke. "Über die Darstellung von Fluorcyclotriphosphazenen mit Phosphazenseitenketten." Chemische Berichte 104.2 (1971): 653-660.
Roy, M.R., "Surface Properties of Hard Fluorinated Amorphous Carbon Films Deposited by Pulsed-DC Discharges", Doctoral Thesis, Universitat de Barcelona (2012).
Schenck, Rudolf, and G. R?mer. "?ber die Phosphornitrilchloride und ihre Umsetzungen (I.)." Berichte der deutschen chemischen Gesellschaft (A and B Series) 57.8 (1924): 1343-1355.
Schilling, C.I. et al., "Fourfold Suzuki-Miyaura and Sonogashira Cross-Coupling Reactions on Tetrahedral Methane and Adamantane Derivatives", Eur. J. Org. Chem., 2011.9 (2011):1743-1754.
Schneider, Andreas, Stefan Kairies, and Klaus Rose. "Synthesis of alkoxysilyl substituted cyclophosphazenes and their properties in the sol-gel process." Silicon Chemistry. Springer, Vienna, 1999. 89-98.
Seebauer, E.G. and Allen, C.E., "Estimating Surface Diffusion Coefficients", Progress in Surface Science, 49.3 (1995): 265-330.
Senchyk, A.G. et al., "1,2,4-Triazole Functionalized Adamantanes: a New Library of Polydentate Tectons for Designing Structures of Coordination Polymers", Dalton Trans., 41.28 (2012):8675-8689.
Senchyk, G.A. et al., "Functionalized Adamantane Tectons Used in the Design of Mixed-Ligand Copper(II) 1,2,4-Triazolyl/Carboxylate Metal-Organic Frameworks", Inorganic Chemistry, 52.2 (2013):863-872.
Sessler, C.D. et al., "CF2H, a Hydrogen Bond Donor", J. Am. Chem. Soc., 139.27 (2017):9325-9332.
Shen. Y, et al. "32.1: Research of Nanocomposite Materials with High Refractive Index for HLEMS Application" SID Symposium Digest of Technical Papers 54 (2023).
Shevlin, S. et al. "Computational materials design." Nature Materials 20.6 (2021): 727-727.
Shi, Yan X., et al. "Synthesis and hydrolytic studies on the air-stable [(4-CN-PhO)(E) P(μ-N t Bu)] 2(E=O, S, and Se) cyclodiphosphazanes." Inorganic Chemistry 54.13 (2015): 6423-6432.
Shih, H. et al., "A Cross-Linkable Triphenylamine Derivative as a Hole Injection/Transporting Material in Organic Light-Emitting Diodes", Polym. Chem., 6 (2015):6227-6237.
Shin, D. and Grassia, P. "Preliminary study on the self-patterning and self-registration of metal electrodes by exploiting the chemical and optical traits of an organic silver compound in conjunction with polyaniline." Journal of Micromechanics and Microengineering 20.2 (2010): 025030.
Sim, Ying, et al. "Orthogonality in main group compounds: a direct one-step synthesis of air-and moisture-stable cyclophosphazanes by mechanochemistry." Chemical Communications 54.50 (2018): 6800-6803.
Singh, Anurima, Lee Steely, and Harry R. Allcock. "Poly [bis (2, 2, 2-trifluoroethoxy) phosphazene] superhydrophobic nanofibers." Langmuir 21.25 (2005): 11604-11607.
Singh, Rajendra Prasad, et al. "A Novel Synthesis of Hexakis (trifluoromethyl) cyclotriphosphazene. Single-Crystal X-ray Structures of N3P3 (CF3) 6 and N3P3F6." Inorganic Chemistry 39.2 (2000): 375-377.
Snyder Jr, Carl E. "Structural Modifications of Fluoro-alkyl S-Triazines and Their Lubricant Properties." Asle Transactions 14.3 (1971): 237-242.
Sohn, I. et al. "Improved modeling of material deposition during OLED manufacturing using direct simulation monte carlo method on GPU Architecture." International Journal of Precision Engineering and Manufacturing-Green Technology 6 (2019): 861-873.
Sohn, I. et al. "Numerical Experiment Using Direct Simulation Monte Carlo for Improving Material Deposition Uniformity During

(56) References Cited

OTHER PUBLICATIONS

OLED Manufacturing." International Journal of Precision Engineering and Manufacturing-Green Technology (2021): 1-14.

Spelt, J. K., Absolom, D. R., Neumann, A. W. "Solid Surface Tension: The Interpretation of Contact Angles by the Equation of State Approach and the Theory of Surface Tension Components." Langmuir 2.5 (1986): 620-625.

Spoljaric, S. et al., "Novel Elastomer-Dumbbell Functionalized POSS Composites: Thermomechanical and Morphological Properties", Journal of Applied Polymer Science, 123.1 (2012):585-600.

Starr, F.W. et al., "Bound Layers 'Cloak' Nanoparticles in Strongly Interacting Polymer Nanocomposites", ACS Nano, 10.12 (2016):10960-10965.

Steely, Lee B., et al. "Foam formation from fluorinated polyphosphazenes by liquid CO2 processing." Polymer Engineering & Science 48.4 (2008): 683-686.

Stokes, H. N. "On trimetaphosphimic acid and its decomposition-products." Amer. chem. J. 18 (1986): 629-663.

Stokes, Ho No. "On the chloronitrides of phosphorus." Amer. Chem. 17 (1985): 275-291.

Sun, J. et al. "6-4: Late-News Paper: Realizing Deep Blue Emission in Blue Phosphorescent Organic Light-Emitting Diodes", SID Symposium Digest of Technical Papers, 51,2020: 65-66.

Sun, T. et al., "Reversible Switching between Superhydrophilicity and Superhydrophobicity", Angew. Chem. Int. Ed., 43.3 (2004):357-360.

Sundaram, P. M., et al. "The Reaction of N4P4Cl8 with Dibenzylamine: Formation of an Unusual Bicyclic Phosphazene, N4P4 [N (CH2Ph) 2] 6 (NCH2Ph), by Dealkylation." Phosphorus and Sulfur and the Related Elements 8.3 (1980): 373-374.

Süzen, Yasemin, and Simge Metinoglu. "Novel cyclomatrix-type polyphosphazene microspheres crosslinked with octachlorocyclotetraphosphazene: preparation and characterization." Anadolu University Journal of Science and Technology A—Applied Sciences and Engineering 18.5 (2017): 973-987.

Svorcik, V. et al., "Deposition of Polystyrene Films by Vacuum Evaporation", Journal of Materials Science Letters, 16 (1997):1564-1566.

Takele, H. et al., "Plasmonic Properties of Ag Nanoclusters in Various Polymer Matrices", Nanotechnology, 17.14 (2006):3499-3505.

Tang, Meixian, et al. "Inhibition of bacterial adhesion and biofilm formation by a textured fluorinated alkoxyphosphazene surface." Bioactive Materials 6.2 (2021): 447-459.

Tao, C. et al., "Highly Icephobic Properties on Slippery Surfaces Formed From Polysiloxane and Fluorinated POSS", Progress in Organic Coatings, 103 (2017):48-59.

Thran, A., et al. "Condensation coefficients of Ag on polymers." Physical review letters 82.9 (1999): 1903-1906.

Tian, Zhicheng, Chen Chen, and Harry R. Allcock. "New Mixed-Substituent Fluorophosphazene High Polymers and Small Molecule Cyclophosphazene Models: Synthesis, Characterization, and Structure Property Correlations." Macromolecules 48.5 (2015): 1483-1492.

Tian, Zhicheng, et al. "Limits to expanding the PN—F series of polyphosphazene elastomers." Polymer Engineering & Science 54.8 (2014): 1827-1832.

Tian, Zhicheng, et al. "Phosphazene high polymers and models with cyclic aliphatic side groups: new structure-property relationships." Macromolecules 48.13 (2015): 4301-4311.

Tokuchi. S et al. "8-4: Oxide Semiconductor In—Zn—O—X system with High Electron Mobility." SID Symposium Digest of Technical Papers 54.1 (2023).

Tong, T. et al., "Adhesion in Organic Electronics Structures", Journal of Applied Physics, 106.8 (2009): 083708.

Topper, T. et al. "Siloxane-based thin films for biomimetic low-voltage dielectric actuators." Sensors and Actuators A: Physical 233 (2015): 32-41.

Trautner, Frank, et al. "Gas-Phase Structure of Hexakis (trifluoromethyl)-cyclotriphosphazene, [(CF3) 2PN] 3." Inorganic Chemistry 39.23 (2000): 5398-5399.

Tsubuku, M. et al. "8-1: Invited Paper: High Mobility Poly-Crystalline Oxide TFT Achieving Mobility over 50 cm2/Vs and High Level of Uniformity on the Large Size Substrates." SID Symposium Digest of Technical Papers 54.1 (2023).

Tuteja, A. et al., "Designing Superoleophobic Surfaces", Science, 318.5856 (2007):1618-1622.

Uslu, A. and Yesilot, S., "Chiral Configurations in Cyclophosphazene Chemistry", Coordination Chemistry Reviews, 291 (2015):28-67.

Usui, H. et al., "Anthracene and Polyethylene Thin Film Depositions by Ionized Cluster Beam", J. Vac. Sci. Technol., 4.1 (1986):52-60.

Usui, H. et al., "Effect of Substrate Temperature on the Deposition of Polytetrafluoroethylene by an Ionization-Assisted Evaporation Method", Journal of Vacuum Science & Technology A, 13.5 (1995):2318-2324.

Usui, H., "Deposition of Polymeric Thin Films by Ionization-Assisted Method", IEICE Trans. Electron., E83-C:7 (2000):1128-1133.

Vampola, K. J. et al. "12-1: Invited Paper: Through-OLED Display Ambient Color Sensing." SID Symposium Digest of Technical Papers. 53.1 (2022).

Van de Grampel, R.D., "Surfaces of Fluorinated Polymer Systems", Doctoral Thesis, Technische Universiteit Eindhoven (2002).

Vasilak, L. et al., "Statistical Paradigm for Organic Optoelectronic Devices: Normal Force Testing for Adhesion of Organic Photovoltaics and Organic Light-Emitting Diodes", ACS Appl. Mater. Interfaces, 9.15 (2017), 13347-13356.

Vassileva, P., et al. "XPS determination of the binding energies of phosphorus and nitrogen in phosphazenes." Journal of materials science 39.9 (2004): 3201-3202.

Vij, A. et al. "Self Assembly of Ultrahydrophobic 'Teflon-Mimicking' Fluorinated (Polyhedral Oligomeric Silsesquioxanes) POSS Nano Columns" 14th European Symposium on Fluorine Chemistry, Poland (2004).

Vogelsang, D.F. et al., "Separation of Asymmetrically Capped Double-Decker Silsesquioxanes Mixtures", Polyhedron, 155 (2018): 189-193.

Von R. Schleyer, P. and Nicholas, R. D., "The Reactivity of Bridgehead Compounds of Adamantane", J. Am. Chem. Soc., 83.12 (1961):2700-2707.

Vu, B.D. et al., "Simple Two-step Procedure for the Synthesis of Memantine Hydrochloride from 1,3-Dimethyl-adamantane", ACS Omega, 5.26 (2020):16085-16088.

Wahl, Helene, Delia A. Haynes, and Tanya le Roex. "A series of polymorphs of hexakis (4-fluorophenoxy) cyclotriphosphazene." Crystal growth & design 12.8 (2012): 4031-4038.

Wang, B. et al., "Graded-Index Fluoropolymer Antireflection Coatings for Invisible Plastic Optics", Nano Lett. 19.2 (2019):787-792.

Wang, C. et al., "Stable Superhydrophobic Polybenzoxazine Surfaces over a Wide pH Range", Langmuir, 22.20 (2006):8289-8292.

Wang, J. et al. "A new fluorinated polysiloxane with good optical properties and low dielectric constant at high frequency based on easily available tetraethoxysilane (TEOS)." Macromolecules 50.23 (2017): 9394-9402.

Wang, J. et al., "Fluorinated and Thermo-Cross-Linked Polyhedral Oligomeric Silsesquioxanes: New Organic-Inorganic Hybrid Materials for High Performance Dielectric Application", ACS Appl. Mater. Interfaces, 9.14 (2017):12782-12790.

Wang, Maw Ling, and Ho Sheng Wu. "Kinetic study of the substitution reaction of hexachlorocyclotriphosphazene with 2, 2, 2-trifluoroethanol by phase-transfer catalysis and separation of the products." Industrial & engineering chemistry research 29.10 (1990): 2137-2142.

Wang, Y. et al., "Substrate Effect on the Melting Temperature of Thin Polyethylene Films", Physical Review Letters, 96.2 (2006):028303.

Wei, H. and Eilers, H., "Electrical Conductivity of Thin-Film Composites Containing Silver Nanoparticles Embedded in a Dielectric Fluoropolymer Matrix", Thin Solid Films, 517.2 (2008):575-581.

(56) References Cited

OTHER PUBLICATIONS

Weigel, W.K. et al., "Direct Radical Functionalization Methods to Access Substituted Adamantanes and Diamondoids", Org. Biomol. Chem., 20 (2022):10-36.

Weiss, F.M. et al., "Molecular Beam Deposition of High-Permittivity Polydimethylsiloxane for Nanometer-Thin Elastomer Films in Dielectric Actuators", Materials and Design, 105 (2016):106-113.

Winget, P. et al. "57-1: Accelerating Next-Generation Display Materials Development with a Smart Digital Chemistry Platform." SID Symposium Digest of Technical Papers 54.1 (2023).

Wojtczak, L., "The Melting Point of Thin Films", Phys. Stat. Sol., 23.2 (1967):K163-K166.

Wu, Y. et al. "P-13.5: Investigation on Chromatic Dispersion of Reflection for CFOT Display" SID Symposium Digest of Technical Papers 54 (2023).

Xie, J. et al., "Regioselective Synthesis of Methyl-Substituted Adamantanes for Promoting Oxidation Stability of High-Density Fuels", Energy Fuels, 34.4 (2020):4516-4524.

Xu, Guang-Rui, Miao-Jun Xu, and Bin Li. "Synthesis and characterization of a novel epoxy resin based on cyclotriphosphazene and its thermal degradation and flammability performance." Polymer degradation and stability 109 (2014): 240-248.

Xu, J. et al., "Polyhedral Oligomeric Silsesquioxanes Tethered with Perfluoroalkylthioether Corner Groups: Facile Synthesis and Enhancement of Hydrophobicity of Their Polymer Blends", Journal of Materials Chemistry, 19.27 (2009):4740-4745.

Xu, X. et al. "A Unified Spatial-Angular Structured Light for Single-View Acquisition of Shape and Reflectance" Proceedings of the IEEE/CVF Conference on Computer Vision and Pattern Recognition (2023).

Xu, Y. et al. "Depth Estimation by Combining Binocular Stereo and Monocular Structured-Light" Proceedings of the IEEE/CVF Conference on Computer Vision and Pattern Recognition (2022).

Yang, H. et al., "Catalyst-Controlled C—H Functionalization of Adamantanes Using Selective H-Atom Transfer", ACS Catal., 9.6 (2019):5708-5715.

Yang, J. et al. "25-4: Methodology and Correlation of AI-Based Design for OLED Materials." SID Symposium Digest of Technical Papers 52.1 (2021).

Yao, Y. et al. "P-7.12: Research on High Brightness Mode Uniformity Problem of Flexible AMOLED Mobile" SID Symposium Digest of Technical Papers 54 (2023).

Yao, Z. et al. "Inverse design of nanoporous crystalline reticular materials with deep generative models." Nature Machine Intelligence 3.1 (2021): 76-86.

Yi, N. et al., "Preparation of Microstructure-Controllable Superhydrophobic Polytetrafluoroethylene Porous Thin Film by Vacuum Thermal-Evaporation", Front. Mater. Sci. 10.3 (2016):320-327.

Yoo, D. et al. "Retrosynthesis Planning for Thermally Activated Delayed Fluorescence Molecules" The 21st International Meeting on Information Display, Seoul, Korea (2021).

Youn, S. et al. "73-4: Novel Materials and Structures for High Efficiency and Long Lifetime Green Phosphorescent OLEDs in Automotive Applications." SID Symposium Digest of Technical Papers. 53.1 (2022).

Yuan, Fulong, et al. "A modified method for preparation of a pure octachlorocyclotetraphosphazene." Phosphorus, Sulfur, and Silicon and the Related Elements 176.1 (2001): 77-81.

Yun, J. et al. "A Novel Electroplex Host with Dual Triplet Exciton Up-Converting Channels for Long Lifetime Blue Phosphorescent Organic Light-Emitting Diodes" The 21st International Meeting on Information Display, Seoul, Korea (2021).

Zalewski, K. et al., "A Review of Polysiloxanes in Terms of Their Application in Explosives", Polymers, 13.7 (2021):1080-1090.

Zarian, J., P. C. Painter, and M. M. Coleman. "Vibrational Spectra and Normal Coordinate Calculations of Chlorophosphazene Compounds. II. Octachlorocyclotetraphosphazene." Applied Spectroscopy 36.3 (1982): 272-277.

Zhang, W. et al., "Polymer/polyhedral Oligomeric Silsesquioxane (POSS) Nanocomposites: An Overview of Fire Retardance", Progress in Polymer Science, 67 (2017):77-125.

Zhang, W. et al., "Why We Need to Look Beyond the Glass Transition Temperature to Characterize the Dynamics of Thin Supported Polymer Films", PNAS Latest Articles, 115.22 (2018):5641-5646.

Zhu, C. et al. "A novel synthetic UV-curable fluorinated siloxane resin for low surface energy coating." Polymers 10.9 (2018): 979.

Zibarov, A. et al., "AB5 Derivatives of Cyclotriphosphazene for the Synthesis of Dendrons and Their Applications", Molecules, 26.13 (2021):4017-4040.

\* cited by examiner

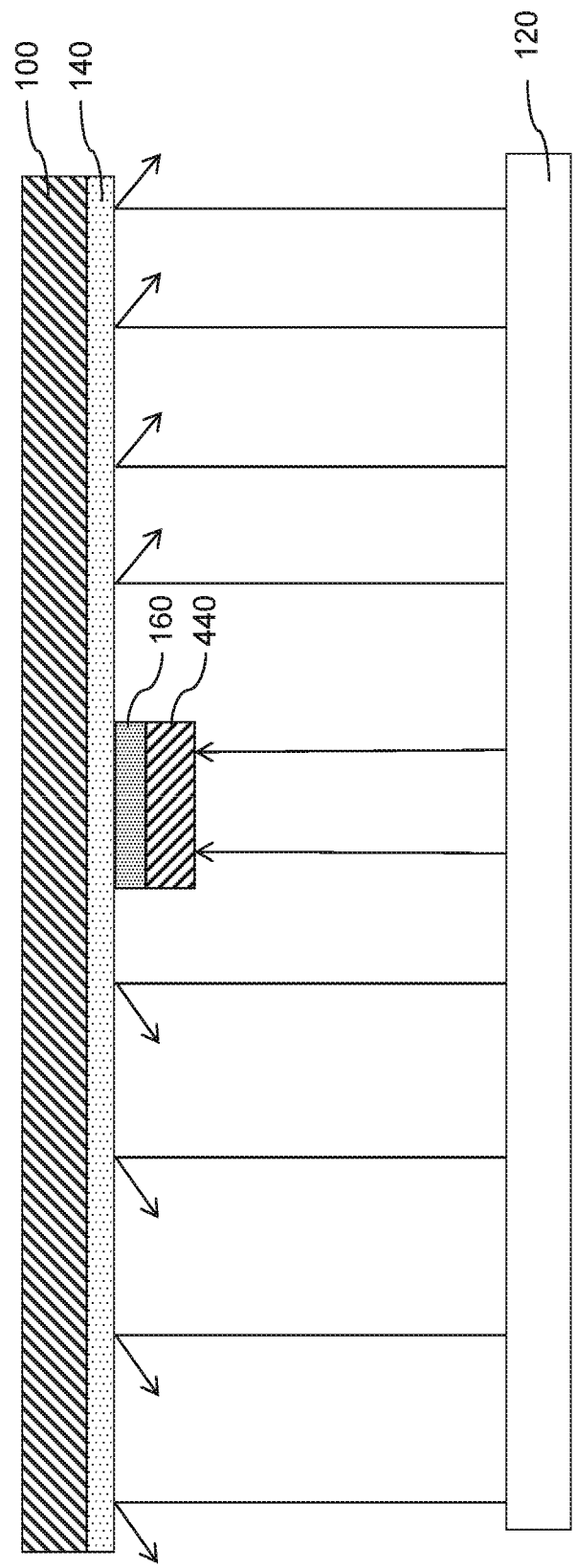

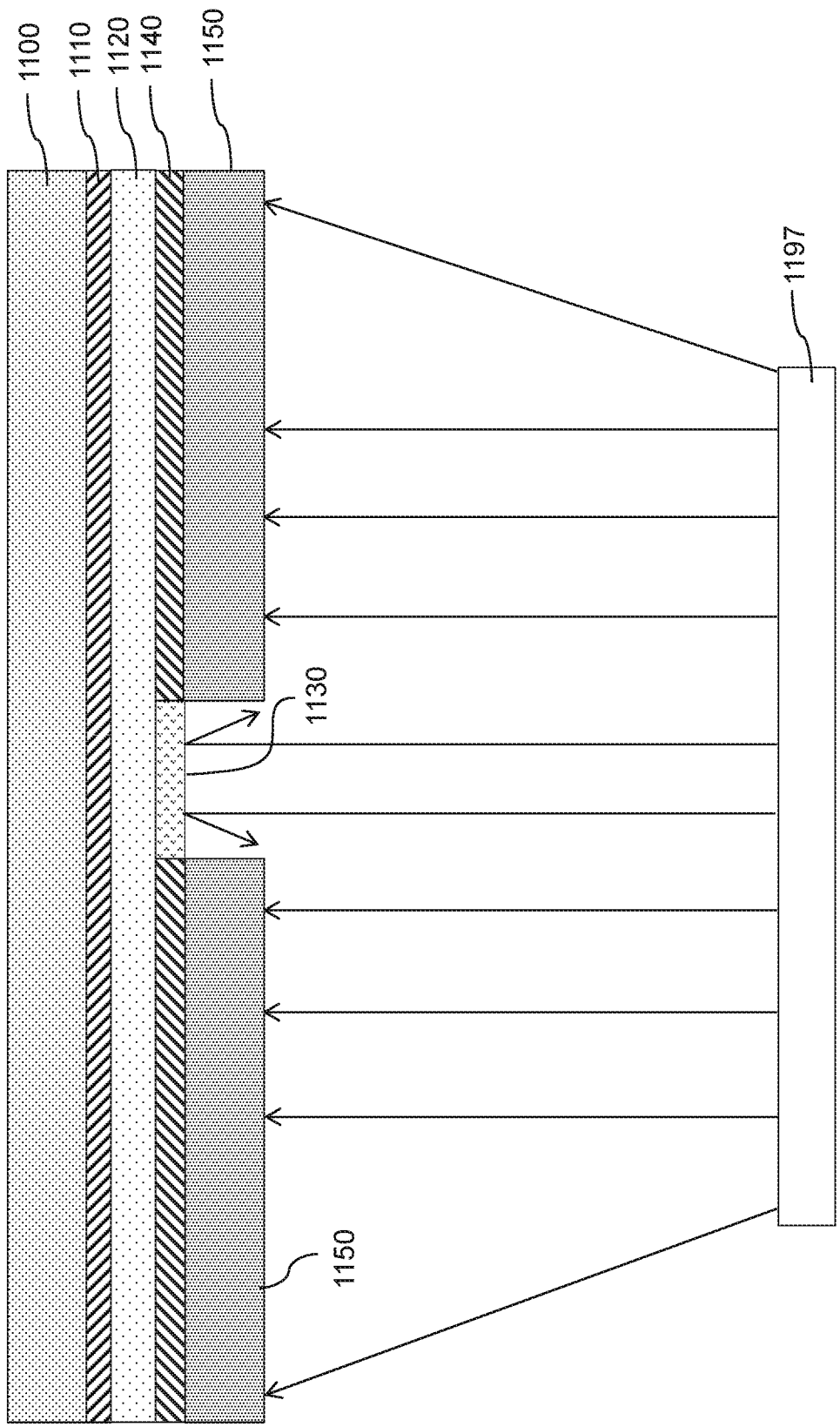

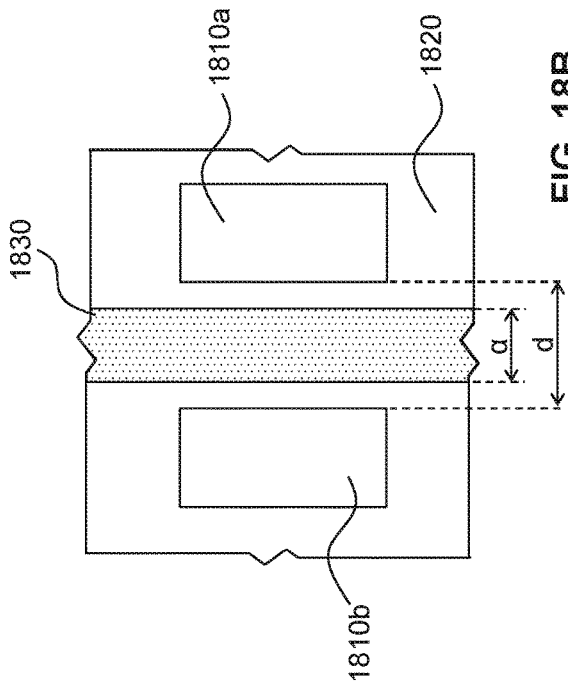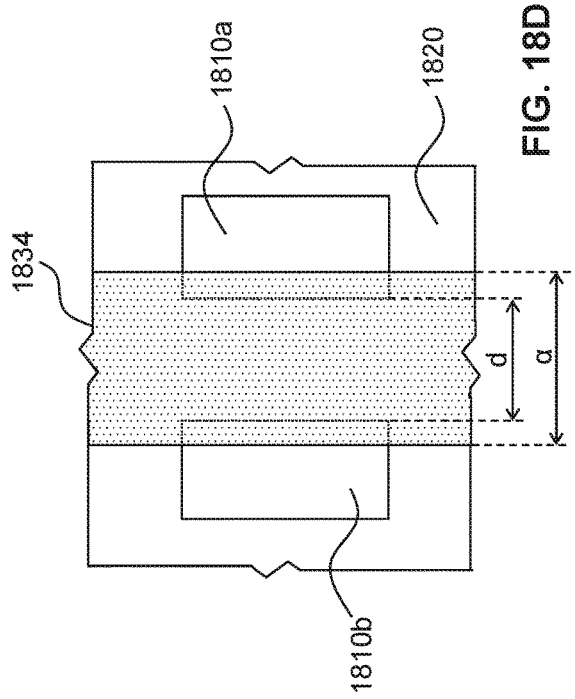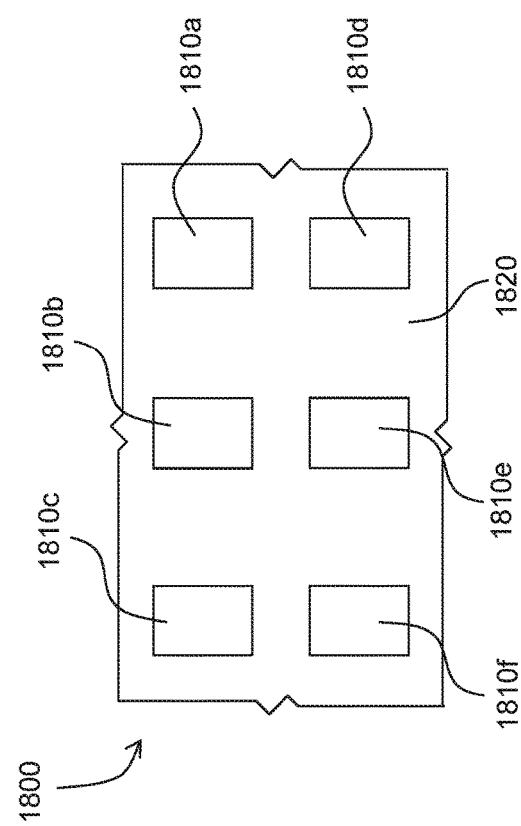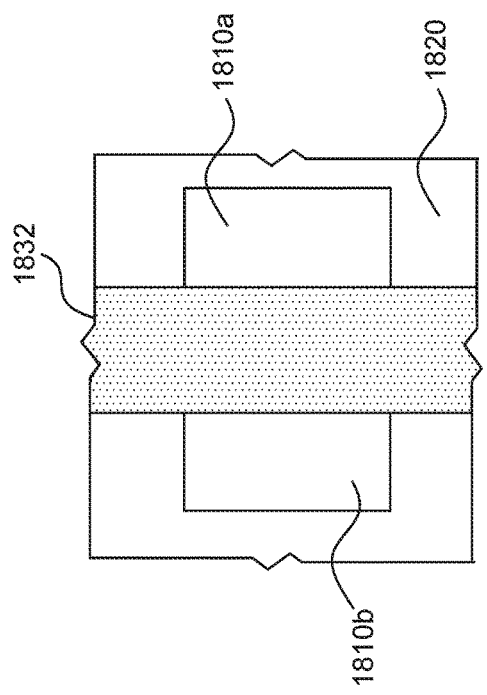

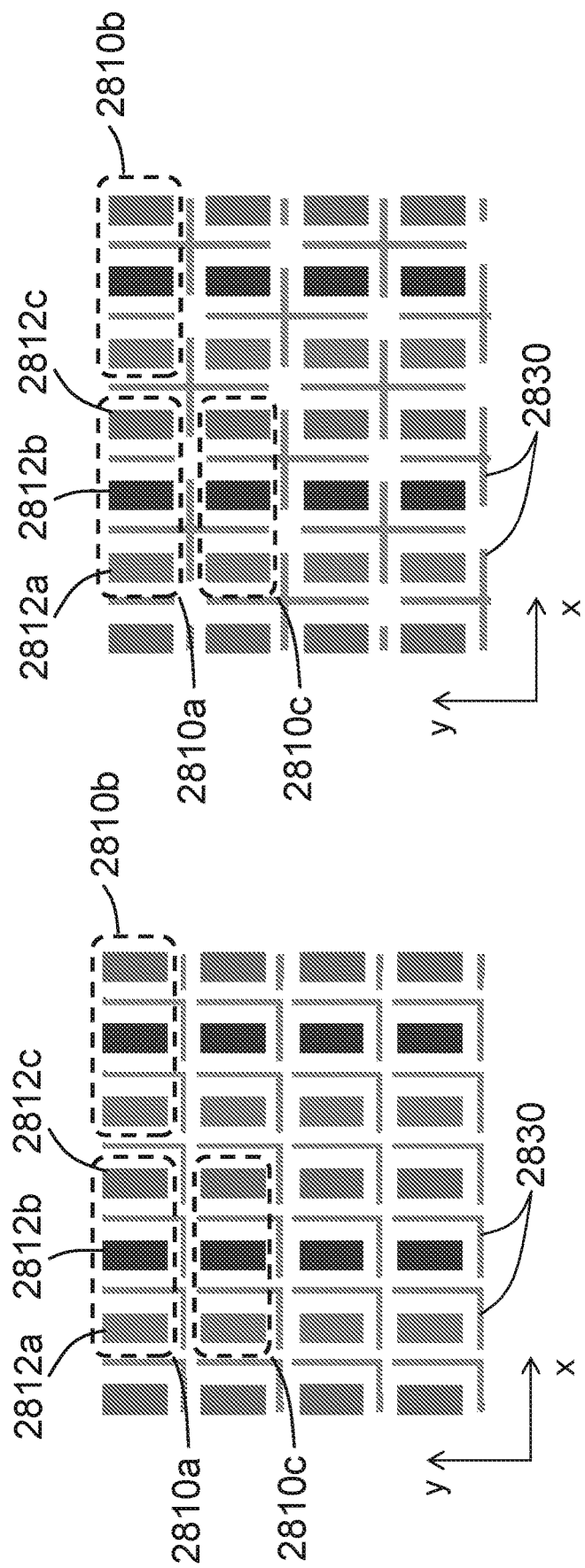

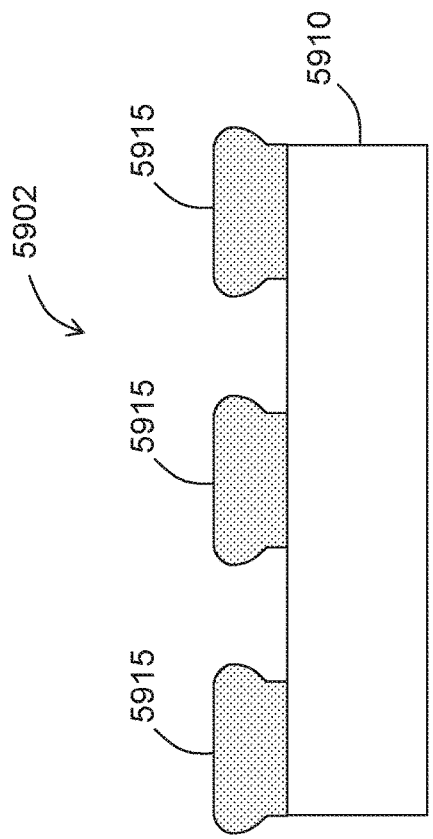
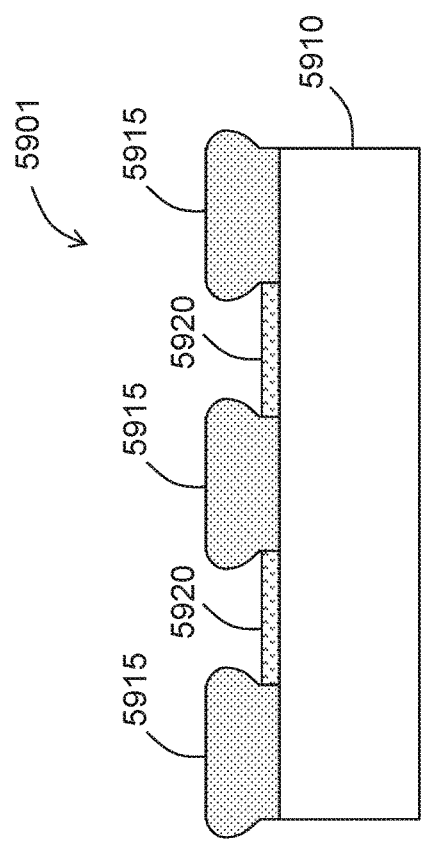

METHOD FOR PATTERNING A COATING ON A SURFACE AND DEVICE INCLUDING A PATTERNED COATING

CROSS REFERENCE TO RELATED APPLICATIONS

This application is a continuation of U.S. patent application Ser. No. 17/318,961 filed May 12, 2021, which is a continuation of U.S. patent application Ser. No. 16/279,930 filed Feb. 19, 2019, which is a continuation of U.S. patent application Ser. No. 15/527,702, filed May 17, 2017, which is a National Stage Entry of International Application No. PCT/IB2016/056442, filed Oct. 26, 2016, which claims the benefit of and priority to U.S. Provisional Application No. 62/246,597, filed Oct. 26, 2015, U.S. Provisional Application No. 62/277,989, filed Jan. 13, 2016, U.S. Provisional Application No. 62/373,927, filed Aug. 11, 2016, and U.S. Provisional Application No. 62/377,429, filed Aug. 19, 2016, the contents of all such applications being incorporated herein by reference in their entireties.

TECHNICAL FIELD

The following generally relates to a method for depositing an electrically conductive material on a surface. Specifically, the method relates to selective deposition of the electrically conductive material on a surface for forming an electrically conductive structure of a device.

BACKGROUND

Organic light emitting diodes (OLEDs) typically include several layers of organic materials interposed between conductive thin film electrodes, with at least one of the organic layers being an electroluminescent layer. When a voltage is applied to electrodes, holes and electrons are injected from an anode and a cathode, respectively. The holes and electrons injected by the electrodes migrate through the organic layers to reach the electroluminescent layer. When a hole and an electron are in close proximity, they are attracted to each other due to a Coulomb force. The hole and electron may then combine to form a bound state referred to as an exciton. An exciton may decay through a radiative recombination process, in which a photon is released. Alternatively, an exciton may decay through a non-radiative recombination process, in which no photon is released. It is noted that, as used herein, internal quantum efficiency (IQE) will be understood to be a proportion of all electron-hole pairs generated in a device which decay through a radiative recombination process.

A radiative recombination process can occur as a fluorescence or phosphorescence process, depending on a spin state of an electron-hole pair (namely, an exciton). Specifically, the exciton formed by the electron-hole pair may be characterized as having a singlet or triplet spin state. Generally, radiative decay of a singlet exciton results in fluorescence, whereas radiative decay of a triplet exciton results in phosphorescence.

More recently, other light emission mechanisms for OLEDs have been proposed and investigated, including thermally activated delayed fluorescence (TADF). Briefly, TADF emission occurs through a conversion of triplet excitons into singlet excitons via a reverse inter system crossing process with the aid of thermal energy, followed by radiative decay of the singlet excitons.

An external quantum efficiency (EQE) of an OLED device may refer to a ratio of charge carriers provided to the OLED device relative to a number of photons emitted by the device. For example, an EQE of 100% indicates that one photon is emitted for each electron that is injected into the device. As will be appreciated, an EQE of a device is generally substantially lower than an IQE of the device. The difference between the EQE and the IQE can generally be attributed to a number of factors such as absorption and reflection of light caused by various components of the device.

An OLED device can typically be classified as being either a "bottom-emission" or "top-emission" device, depending on a relative direction in which light is emitted from the device. In a bottom-emission device, light generated as a result of a radiative recombination process is emitted in a direction towards a base substrate of the device, whereas, in a top-emission device, light is emitted in a direction away from the base substrate. Accordingly, an electrode that is proximal to the base substrate is generally made to be light transmissive (e.g., substantially transparent or semi-transparent) in a bottom-emission device, whereas, in a top-emission device, an electrode that is distal to the base substrate is generally made to be light transmissive in order to reduce attenuation of light. Depending on the specific device structure, either an anode or a cathode may act as a transmissive electrode in top-emission and bottom-emission devices.

An OLED device also may be a double-sided emission device, which is configured to emit light in both directions relative to a base substrate. For example, a double-sided emission device may include a transmissive anode and a transmissive cathode, such that light from each pixel is emitted in both directions. In another example, a double-sided emission display device may include a first set of pixels configured to emit light in one direction, and a second set of pixels configured to emit light in the other direction, such that a single electrode from each pixel is transmissive.

In addition to the above device configurations, a transparent or semi-transparent OLED device also can be implemented, in which the device includes a transparent portion which allows external light to be transmitted through the device. For example, in a transparent OLED display device, a transparent portion may be provided in a non-emissive region between each neighboring pixels. In another example, a transparent OLED lighting panel may be formed by providing a plurality of transparent regions between emissive regions of the panel. Transparent or semi-transparent OLED devices may be bottom-emission, top-emission, or double-sided emission devices.

While either a cathode or an anode can be selected as a transmissive electrode, a typical top-emission device includes a light transmissive cathode. Materials which are typically used to form the transmissive cathode include transparent conducting oxides (TCOs), such as indium tin oxide (ITO) and zinc oxide (ZnO), as well as thin films, such as those formed by depositing a thin layer of silver (Ag), aluminum (Al), or various metallic alloys such as magnesium silver (Mg:Ag) alloy and ytterbium silver (Yb:Ag) alloy with compositions ranging from about 1:9 to about 9:1 by volume. A multi-layered cathode including two or more layers of TCOs and/or thin metal films also can be used.

Particularly in the case of thin films, a relatively thin layer thickness of up to about a few tens of nanometers contributes to enhanced transparency and favorable optical properties (e.g., reduced microcavity effects) for use in OLEDs. However, a reduction in the thickness of a transmissive electrode is accompanied by an increase in its sheet resistance. An electrode with a high sheet resistance is generally undesirable for use in OLEDs, since it creates a large current-resistance (IR) drop when a device is in use, which is detrimental to the performance and efficiency of OLEDs. The IR drop can be compensated to some extent by increasing a power supply level; however, when the power supply level is increased for one pixel, voltages supplied to other components are also increased to maintain proper operation of the device, and thus is unfavorable.

In order to reduce power supply specifications for top-emission OLED devices, solutions have been proposed to form busbar structures or auxiliary electrodes on the devices. For example, such an auxiliary electrode may be formed by depositing a conductive coating in electrical communication with a transmissive electrode of an OLED device. Such an auxiliary electrode may allow current to be carried more effectively to various regions of the device by lowering a sheet resistance and an associated IR drop of the transmissive electrode.

Since an auxiliary electrode is typically provided on top of an OLED stack including an anode, one or more organic layers, and a cathode, patterning of the auxiliary electrode is traditionally achieved using a shadow mask with mask apertures through which a conductive coating is selectively deposited, for example by a physical vapor deposition (PVD) process. However, since masks are typically metal masks, they have a tendency to warp during a high-temperature deposition process, thereby distorting mask apertures and a resulting deposition pattern. Furthermore, a mask is typically degraded through successive depositions, as a conductive coating adheres to the mask and obfuscates features of the mask. Consequently, such a mask should either be cleaned using time-consuming and expensive processes or should be disposed once the mask is deemed to be ineffective at producing the desired pattern, thereby rendering such process highly costly and complex. Accordingly, a shadow mask process may not be commercially feasible for mass production of OLED devices. Moreover, an aspect ratio of features which can be produced using the shadow mask process is typically constrained due to shadowing effects and a mechanical (e.g., tensile) strength of the metal mask, since large metal masks are typically stretched during a shadow mask deposition process.

Another challenge of patterning a conductive coating onto a surface through a shadow mask is that certain, but not all, patterns can be achieved using a single mask. As each portion of the mask is physically supported, not all patterns are possible in a single processing stage. For example, where a pattern specifies an isolated feature, a single mask processing stage typically cannot be used to achieve the desired pattern. In addition, masks which are used to produce repeating structures (e.g., busbar structures or auxiliary electrodes) spread across an entire device surface include a large number of perforations or apertures formed on the masks. However, forming a large number of apertures on a mask can compromise the structural integrity of the mask, thus leading to significant warping or deformation of the mask during processing, which can distort a pattern of deposited structures.

SUMMARY

According to some embodiments, a device (e.g., an opto-electronic device) includes: (1) a first electrode; (2) an organic layer disposed over the first electrode; (3) a nucleation promoting coating disposed over the organic layer; (4) a nucleation inhibiting coating covering a first region of the opto-electronic device; and (5) a conductive coating covering a second region of the opto-electronic device.

According to some embodiments, a device (e.g., an opto-electronic device) includes: (1) a substrate; (2) a nucleation inhibiting coating covering a first region of the substrate; and (3) a conductive coating including a first portion and a second portion. The first portion of the conductive coating covers a second region of the substrate, the second portion of the conductive coating partially overlaps the nucleation inhibiting coating, and the second portion of the conductive coating is spaced from the nucleation inhibiting coating by a gap.

According to some embodiments, a device (e.g., an opto-electronic device) includes: (1) a substrate including a first region and a second region; and (2) a conductive coating including a first portion and a second portion. The first portion of the conductive coating covers the second region of the substrate, the second portion of the conductive coating overlaps a portion of the first region of the substrate, and the second portion of the conductive coating is spaced from the first region of the substrate by a gap.

According to some embodiments, a device (e.g., an opto-electronic device) includes: (1) a substrate; (2) a nucleation inhibiting coating covering a first region of the substrate; and (3) a conductive coating covering a laterally adjacent, second region of the substrate. The conductive coating includes magnesium, and the nucleation inhibiting coating is characterized as having an initial sticking probability for magnesium of no greater than about 0.02.

According to some embodiments, a manufacturing method of a device (e.g., an opto-electronic device) includes: (1) providing a substrate and a nucleation inhibiting coating covering a first region of the substrate; and (2) depositing a conductive coating covering a second region of the substrate. The conductive coating includes magnesium, and the nucleation inhibiting coating is characterized as having an initial sticking probability for magnesium of no greater than 0.02.

BRIEF DESCRIPTION OF THE DRAWINGS

Some embodiments will now be described by way of example with reference to the appended drawings wherein:

FIGS. 5A-5C are schematic diagrams illustrating a process for selectively depositing a conductive coating according to one embodiment;

FIGS. 11A-11D are schematic diagrams illustrating the stages in the embodiment of FIG. 10;

FIGS. 18A-18D illustrate portions of auxiliary electrodes according to various embodiments;

FIGS. 59A and 59B illustrate a process for removing a nucleation inhibiting coating following deposition of a conductive coating according to one embodiment.

DETAILED DESCRIPTION

Figure 1:
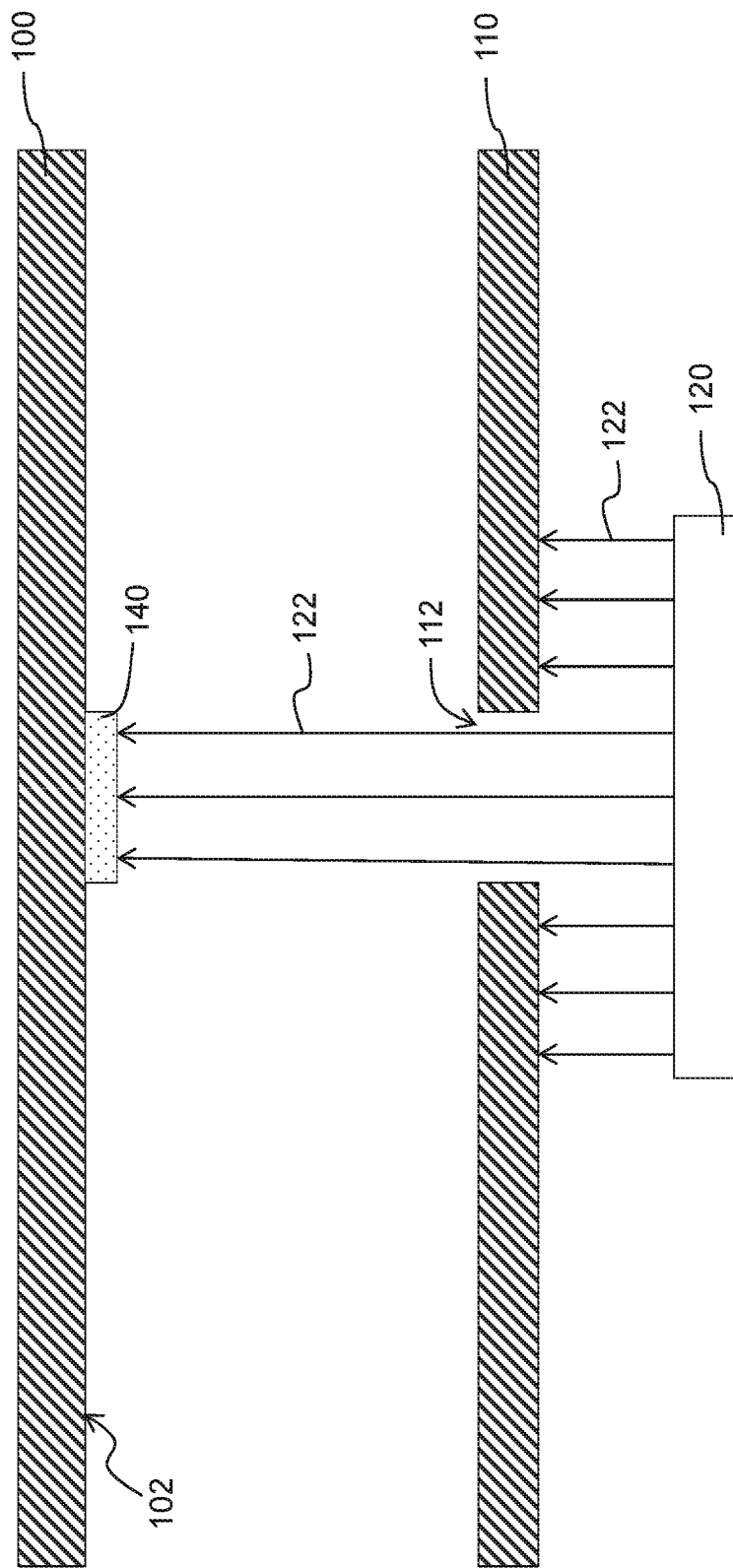
FIG. 1 is a schematic diagram illustrating a shadow mask deposition of a nucleation inhibiting coating according to one embodiment.

It will be appreciated that for simplicity and clarity of illustration, where considered appropriate, reference numerals may be repeated among the figures to indicate corresponding or analogous components. In addition, numerous specific details are set forth in order to provide a thorough understanding of example embodiments described herein. However, it will be understood by those of ordinary skill in the art that the example embodiments described herein may be practiced without some of those specific details. In other instances, certain methods, procedures and components have not been described in detail so as not to obscure the example embodiments described herein.

In one aspect according to some embodiments, a method for depositing an electrically conductive coating on a surface is provided. In some embodiments, the method is performed in the context of a manufacturing method of an optoelectronic device. In some embodiments, the method is performed in the context of a manufacturing method of another device. In some embodiments, the method includes depositing a nucleation inhibiting coating on a first region of a substrate to produce a patterned substrate. The patterned substrate includes the first region covered by the nucleation inhibiting coating, and a second region of the substrate that is exposed from, or is substantially free of or is substantially uncovered by, the nucleation inhibiting coating. The method also includes treating the patterned substrate to deposit the conductive coating on the second region of the substrate. In some embodiments, a material of the conductive coating includes magnesium. In some embodiments, treating the patterned substrate includes treating both the nucleation inhibiting coating and the second region of the substrate to deposit the conductive coating on the second region of the substrate, while the nucleation inhibiting coating remains exposed from, or is substantially free of or is substantially uncovered by, the conductive coating. In some embodiments, treating the patterned substrate includes performing evaporation or sublimation of a source material used to form the conductive coating, and exposing both the nucleation inhibiting coating and the second region of the substrate to the evaporated source material.

As used herein, the term "nucleation inhibiting" is used to refer to a coating or a layer of a material having a surface which exhibits a relatively low affinity towards deposition of an electrically conductive material, such that the deposition of the conductive material on the surface is inhibited, while the term "nucleation promoting" is used to refer to a coating or a layer of a material having a surface which exhibits a relatively high affinity towards deposition of an electrically conductive material, such that the deposition of the conductive material on the surface is facilitated. One measure of nucleation inhibiting or nucleation promoting property of a surface is an initial sticking probability of the surface for an electrically conductive material, such as magnesium. For example, a nucleation inhibiting coating with respect to magnesium can refer to a coating having a surface which exhibits a relatively low initial sticking probability for magnesium vapor, such that deposition of magnesium on the surface is inhibited, while a nucleation promoting coating with respect to magnesium can refer to a coating having a surface which exhibits a relatively high initial sticking probability for magnesium vapor, such that deposition of magnesium on the surface is facilitated. As used herein, the terms "sticking probability" and "sticking coefficient" may be used interchangeably. Another measure of nucleation inhibiting or nucleation promoting property of a surface is an initial deposition rate of an electrically conductive material, such as magnesium, on the surface relative to an initial deposition rate of the conductive material on another (reference) surface, where both surfaces are subjected or exposed to an evaporation flux of the conductive material.

As used herein, the terms "evaporation" and "sublimation" are interchangeably used to generally refer to deposition processes in which a source material is converted into a vapor (e.g., by heating) to be deposited onto a target surface in, for example, a solid state.

As used herein, a surface (or a certain area of the surface) which is "substantially free of" or "is substantially uncovered by" a material refers to a substantial absence of the material on the surface (or the certain area of the surface). Specifically regarding an electrically conductive coating, one measure of an amount of an electrically conductive material on a surface is a light transmittance, since electrically conductive materials, such as metals including magnesium, attenuate and/or absorb light. Accordingly, a surface can be deemed to be substantially free of an electrically conductive material if the light transmittance is greater than 90%, greater than 92%, greater than 95%, or greater than 98% in the visible portion of the electromagnetic spectrum. Another measure of an amount of a material on a surface is a percentage coverage of the surface by the material, such as where the surface can be deemed to be substantially free of the material if the percentage coverage by the material is no greater than 10%, no greater than 8%, no greater than 5%, no greater than 3%, or no greater than 1%. Surface coverage can be assessed using imaging techniques, such as using transmission electron microscopy, atomic force microscopy, or scanning electron microscopy.

FIG. 1 is a schematic diagram illustrating a process of depositing a nucleation inhibiting coating 140 onto a surface 102 of a substrate 100 according to one embodiment. In the embodiment of FIG. 1, a source 120 including a source material is heated under vacuum to evaporate or sublime the source material. The source material includes or substantially consists of a material used to form the nucleation inhibiting coating 140. The evaporated source material then travels in a direction indicated by arrow 122 towards the substrate 100. A shadow mask 110 having an aperture or slit 112 is disposed in the path of the evaporated source material such that a portion of a flux travelling through the aperture 112 is selectively incident on a region of the surface 102 of the substrate 100, thereby forming the nucleation inhibiting coating 140 thereon.

Figure 2B:
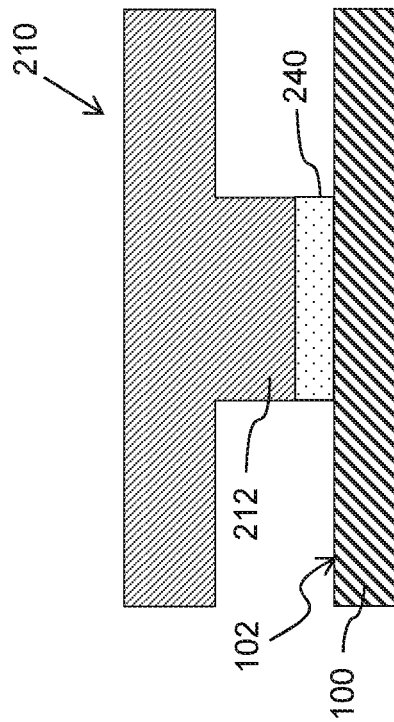
FIG. 2A, FIG. 2B, and FIG. 2C are schematic diagrams illustrating a micro-contact transfer printing process of a nucleation inhibiting coating according to one embodiment.
Figure 2A:
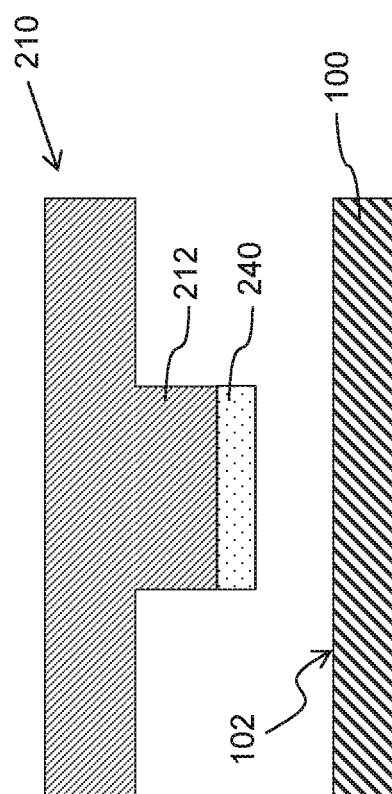
Figure 2C:
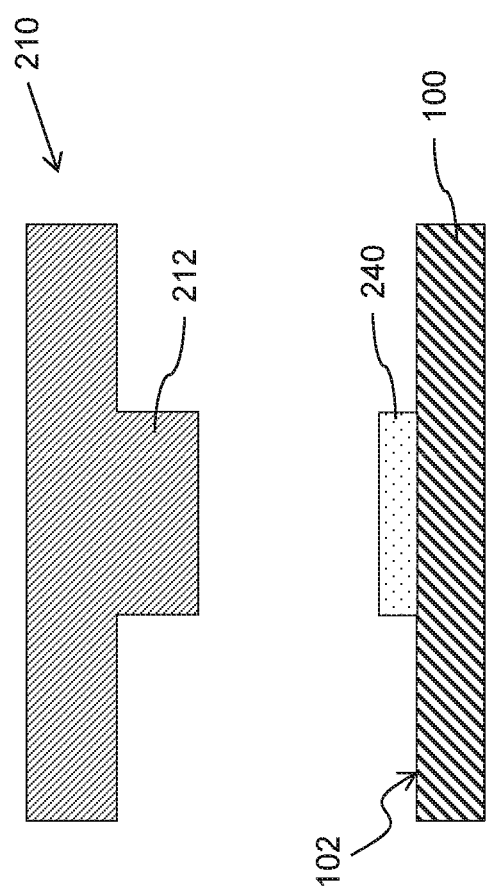

FIGS. 2A-2C illustrate a micro-contact transfer printing process for depositing a nucleation inhibiting coating on a surface of a substrate in one embodiment. Similarly to a shadow mask process, the micro-contact printing process may be used to selectively deposit the nucleation inhibiting coating on a region of a substrate surface.

FIG. 2A illustrates a first stage of the micro-contact transfer printing process, wherein a stamp 210 including a protrusion 212 is provided with a nucleation inhibiting coating 240 on a surface of the protrusion 212. As will be understood by persons skilled in the art, the nucleation inhibiting coating 240 may be deposited on the surface of the protrusion 212 using various suitable processes.

As illustrated in FIG. 2B, the stamp 210 is then brought into proximity of a substrate 100, such that the nucleation inhibiting coating 240 deposited on the surface of the protrusion 212 is in contact with a surface 102 of the substrate 100. Upon the nucleation inhibiting coating 240 contacting the surface 102, the nucleation inhibiting coating 240 adheres to the surface 102 of the substrate 100.

As such, when the stamp 210 is moved away from the substrate 100 as illustrated in FIG. 2C, the nucleation inhibiting coating 240 is effectively transferred onto the surface 102 of the substrate 100.

Figure 3:
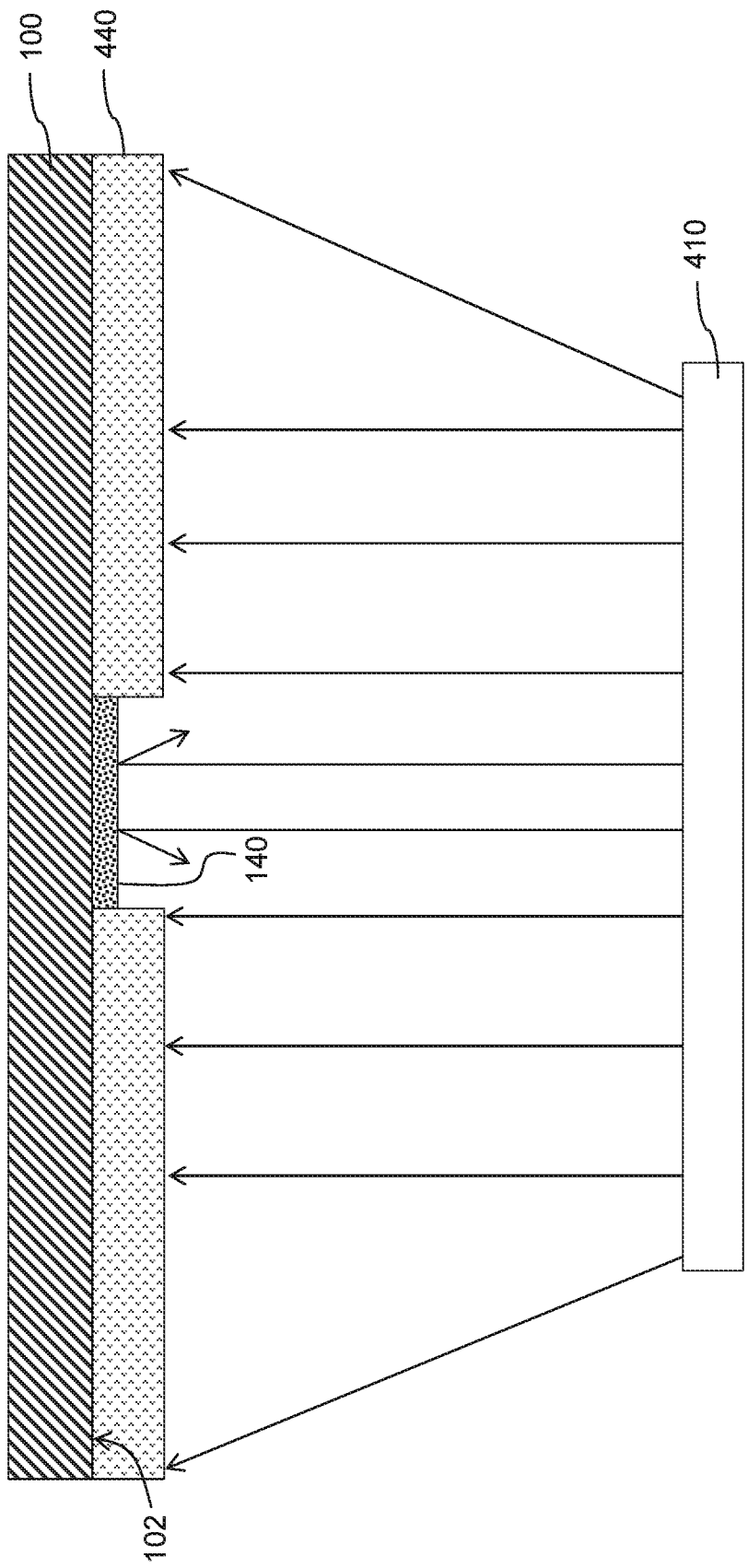
FIG. 3 is a schematic diagram illustrating the deposition of a conductive coating on a patterned surface according to one embodiment.

Once a nucleation inhibiting coating has been deposited on a region of a surface of a substrate, a conductive coating may be deposited on remaining uncovered region(s) of the surface where the nucleation inhibiting coating is not present. Turning to FIG. 3, a conductive coating source 410 is illustrated as directing an evaporated conductive material towards a surface 102 of a substrate 100. As illustrated in FIG. 3, the conducting coating source 410 may direct the evaporated conductive material such that it is incident on both covered or treated areas (namely, region(s) of the surface 102 with the nucleation inhibiting coating 140 deposited thereon) and uncovered or untreated areas of the surface 102. However, since a surface of the nucleation inhibiting coating 140 exhibits a relatively low initial sticking coefficient compared to that of the uncovered surface 102 of the substrate 100, a conductive coating 440 selectively deposits onto the areas of the surface 102 where the nucleation inhibiting coating 140 is not present. For example, an initial deposition rate of the evaporated conductive material on the uncovered areas of the surface 102 may be at least or greater than about 80 times, at least or greater than about 100 times, at least or greater than about 200 times, at least or greater than about 500 times, at least or greater than about 700 times, at least or greater than about 1000 times, at least or greater than about 1500 times, at least or greater than about 1700 times, or at least or greater than about 2000 times an initial deposition rate of the evaporated conductive material on the surface of the nucleation inhibiting coating 140. The conductive coating 440 may include, for example, pure or substantially pure magnesium.

It will be appreciated that although shadow mask patterning and micro-contact transfer printing processes have been illustrated and described above, other processes may be used for selectively patterning a substrate by depositing a nucleation inhibiting material. Various additive and subtractive processes of patterning a surface may be used to selectively deposit a nucleation inhibiting coating. Examples of such processes include, but are not limited to, photolithography, printing (including ink or vapor jet printing and reel-to-reel printing), organic vapor phase deposition (OVPD), and laser induced thermal imaging (LITI) patterning, and combinations thereof.

In some applications, it may be desirable to deposit a conductive coating having specific material properties onto a substrate surface on which the conductive coating cannot be readily deposited. For example, pure or substantially pure magnesium typically cannot be readily deposited onto an organic surface due to low sticking coefficients of magnesium on various organic surfaces. Accordingly, in some embodiments, the substrate surface is further treated by depositing a nucleation promoting coating thereon prior to depositing the conductive coating, such as one including magnesium.

Based on findings and experimental observations, it is postulated that fullerenes and other nucleation promoting materials, as will be explained further herein, act as nucleation sites for the deposition of a conductive coating including magnesium. For example, in cases where magnesium is deposited using an evaporation process on a fullerene treated surface, the fullerene molecules act as nucleation sites that promote formation of stable nuclei for magnesium deposition. Less than a monolayer of fullerene or other nucleation promoting material may be provided on the treated surface to act as nucleation sites for deposition of magnesium in some cases. As will be understood, treating the surface by depositing several monolayers of a nucleation promoting material may result in a higher number of nucleation sites, and thus a higher initial sticking probability.

It will also be appreciated that an amount of fullerene or other material deposited on a surface may be more, or less, than one monolayer. For example, the surface may be treated by depositing 0.1 monolayer, 1 monolayer, 10 monolayers, or more of a nucleation promoting material or a nucleation inhibiting material. As used herein, depositing 1 monolayer of a material refers to an amount of the material to cover a desired area of a surface with a single layer of constituent molecules or atoms of the material. Similarly, as used herein, depositing 0.1 monolayer of a material refers to an amount of the material to cover 10% of a desired area of a surface with a single layer of constituent molecules or atoms of the material. Due to, for example, possible stacking or clustering of molecules or atoms, an actual thickness of a deposited material may be non-uniform. For example, depositing 1 monolayer of a material may result in some regions of a surface being uncovered by the material, while other regions of the surface may have multiple atomic or molecular layers deposited thereon.

As used herein, the term "fullerene" refers to a material including carbon molecules. Examples of fullerene molecules include carbon cage molecules including a three-dimensional skeleton that includes multiple carbon atoms, which form a closed shell, and which can be spherical or semi-spherical in shape. A fullerene molecule can be designated as $C_n$, where n is an integer corresponding to a number of carbon atoms included in a carbon skeleton of the fullerene molecule. Examples of fullerene molecules include $C_n$, where n is in the range of 50 to 250, such as $C_{60}$, $C_{70}$, $C_{72}$, $C_{74}$, $C_{76}$, $C_{78}$, $C_{80}$, $C_{82}$, and $C_{84}$. Additional examples of fullerene molecules include carbon molecules in a tube or cylindrical shape, such as single-walled carbon nanotubes and multi-walled carbon nanotubes.

Figure 4:
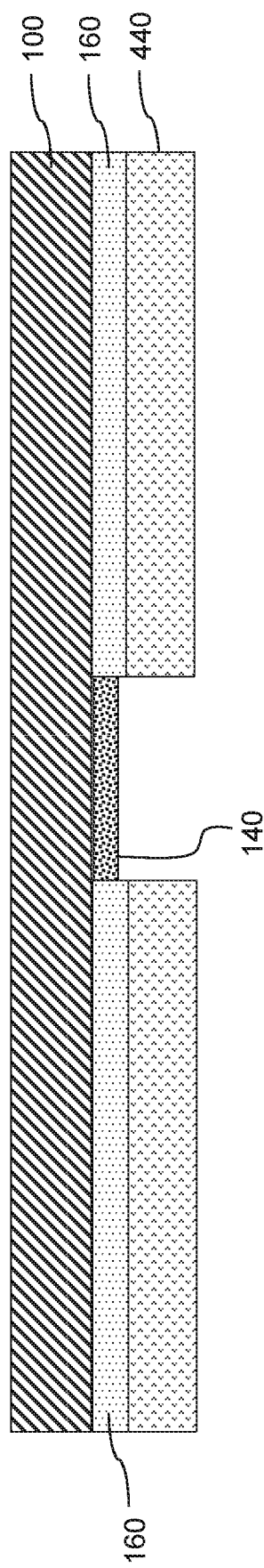
FIG. 4 is a diagram illustrating a device produced according to one embodiment of a process.

FIG. 4 illustrates an embodiment of a device in which a nucleation promoting coating 160 is deposited prior to the deposition of a conductive coating 440. As illustrated in FIG. 4, the nucleation promoting coating 160 is deposited over regions of the substrate 100 that are uncovered by a nucleation inhibiting coating 140. Accordingly, when the conductive coating 440 is deposited, the conductive coating 440 forms preferentially over the nucleation promoting coating 160. For example, an initial deposition rate of a material of the conductive coating 440 on a surface of the nucleation promoting coating 160 may be at least or greater than about 80 times, at least or greater than about 100 times, at least or greater than about 200 times, at least or greater than about 500 times, at least or greater than about 700 times, at least or greater than about 1000 times, at least or greater than about 1500 times, at least or greater than about 1700 times, or at least or greater than about 2000 times an initial deposition rate of the material on a surface of the nucleation inhibiting coating 140. In general, the nucleation promoting coating 160 may be deposited on the substrate 100 prior to, or following, the deposition of the nucleation inhibiting coating 140. Various processes for selectively depositing a material on a surface may be used to deposit the nucleation promoting coating 160 including, but not limited to, evaporation (including thermal evaporation and electron beam evaporation), photolithography, printing (including ink or vapor jet printing, reel-to-reel printing, and microcontact transfer printing), OVPD, LITI patterning, and combinations thereof.

Figure 5A:
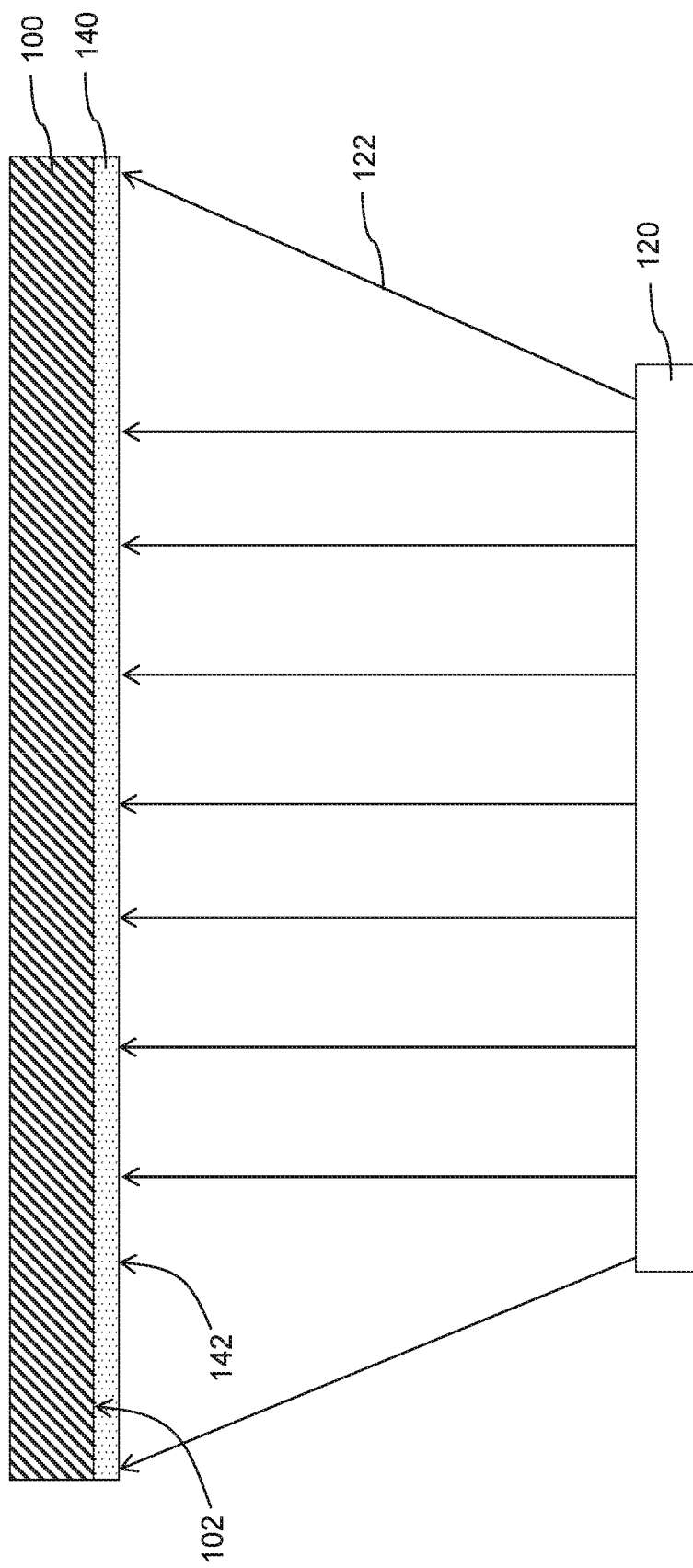
Figure 5B:
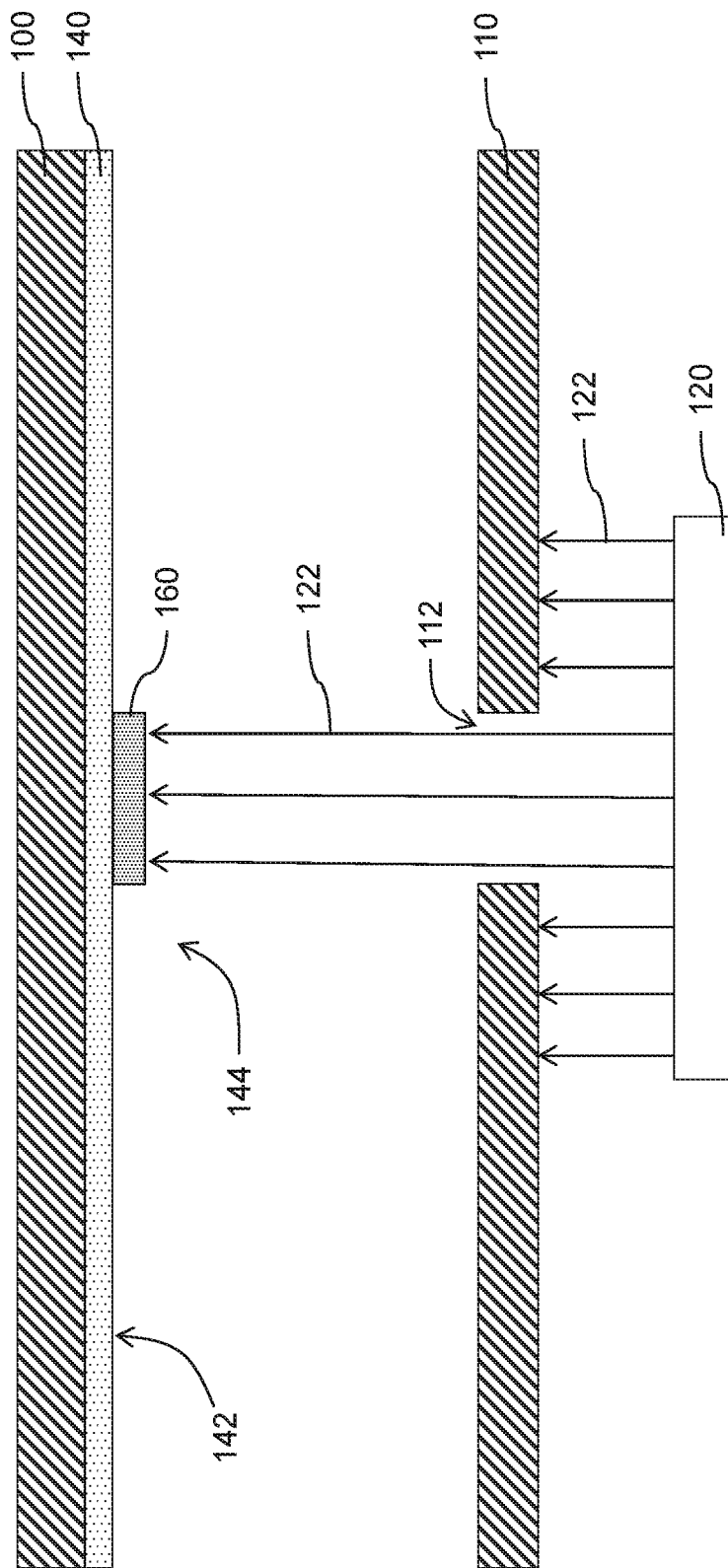

FIGS. 5A-5C illustrate a process for depositing a conductive coating onto a surface of a substrate in one embodiment.

In FIG. 5A, a surface 102 of a substrate 100 is treated by depositing a nucleation inhibiting coating 140 thereon. Specifically, in the illustrated embodiment, deposition is achieved by evaporating a source material inside a source 120, and directing the evaporated source material towards the surface 102 to be deposited thereon. The general direction in which the evaporated flux is directed towards the surface 102 is indicated by arrow 122. As illustrated, deposition of the nucleation inhibiting coating 140 may be performed using an open mask or without a mask, such that the nucleation inhibiting coating 140 substantially covers the entire surface 102 to produce a treated surface 142. Alternatively, the nucleation inhibiting coating 140 may be selectively deposited onto a region of the surface 102 using, for example, a selective deposition technique described above.

While the nucleation inhibiting coating 140 is illustrated as being deposited by evaporation, it will be appreciated that other deposition and surface coating techniques may be used, including but not limited to spin coating, dip coating, printing, spray coating, OVPD, LITI patterning, physical vapor deposition (PVD) (including sputtering), chemical vapor deposition (CVD), and combinations thereof.

In FIG. 5B, a shadow mask 110 is used to selectively deposit a nucleation promoting coating 160 on the treated surface 142. As illustrated, an evaporated source material travelling from the source 120 is directed towards the substrate 100 through the mask 110. The mask includes an aperture or slit 112 such that a portion of the evaporated source material incident on the mask 110 is prevented from traveling past the mask 110, and another portion of the evaporated source material directed through the aperture 112 of the mask 110 selectively deposits onto the treated surface 142 to form the nucleation promoting coating 160. Accordingly, a patterned surface 144 is produced upon completing the deposition of the nucleation promoting coating 160.

FIG. 5C illustrates a stage of depositing a conductive coating 440 onto the patterned surface 144. The conductive coating 440 may include, for example, pure or substantially pure magnesium. As will be explained further below, a material of the conductive coating 440 exhibits a relatively low initial sticking coefficient with respect to the nucleation inhibiting coating 140 and a relatively high initial sticking coefficient with respect to the nucleation promoting coating 160. Accordingly, the deposition may be performed using an open mask or without a mask to selectively deposit the conductive coating 440 onto regions of the substrate 100 where the nucleation promoting coating 160 is present. As illustrated in FIG. 5C, an evaporated material of the conductive coating 440 that is incident on a surface of the nucleation inhibiting coating 140 may be largely or substantially prevented from being deposited onto the nucleation inhibiting coating 140.

Figure 5D:
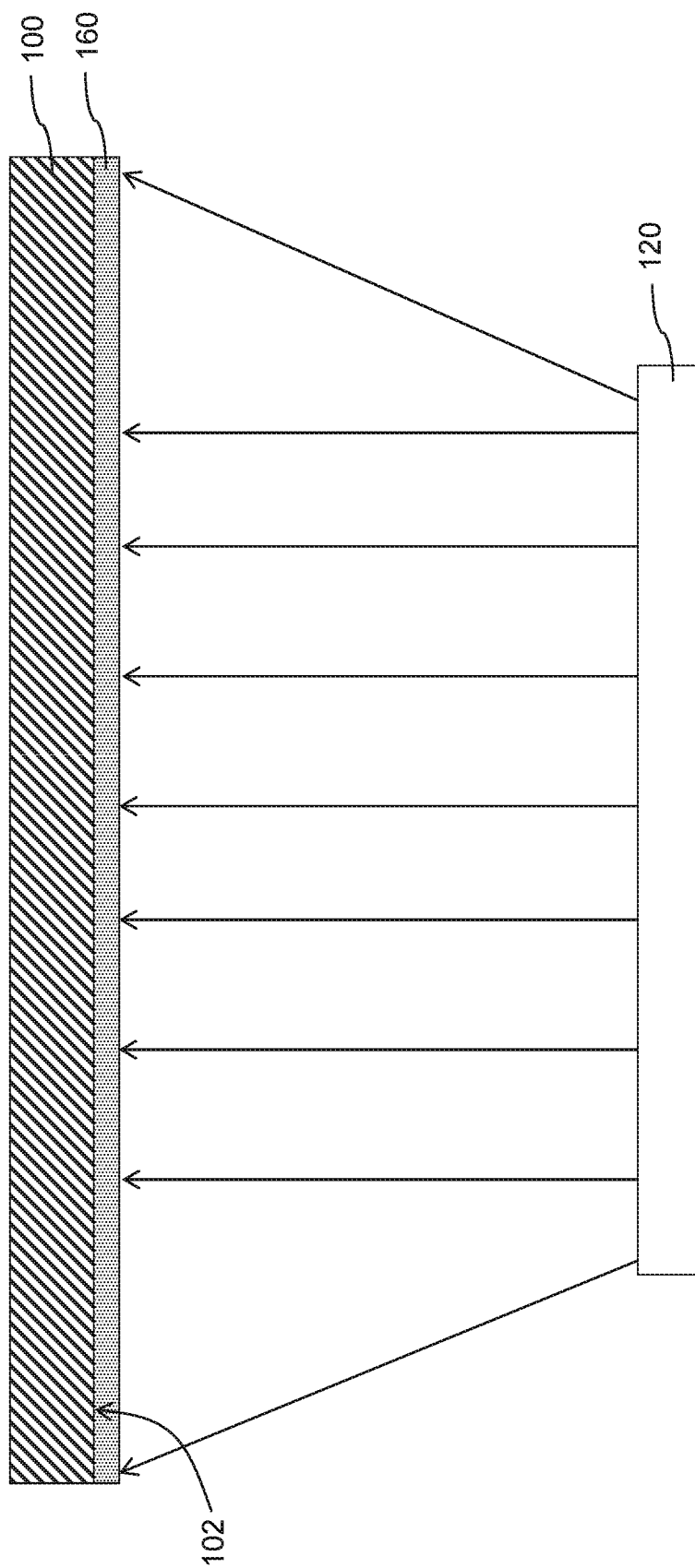
FIGS. 5D-5F are schematic diagrams illustrating a process for selectively depositing a conductive coating according to another embodiment.
Figure 5E:
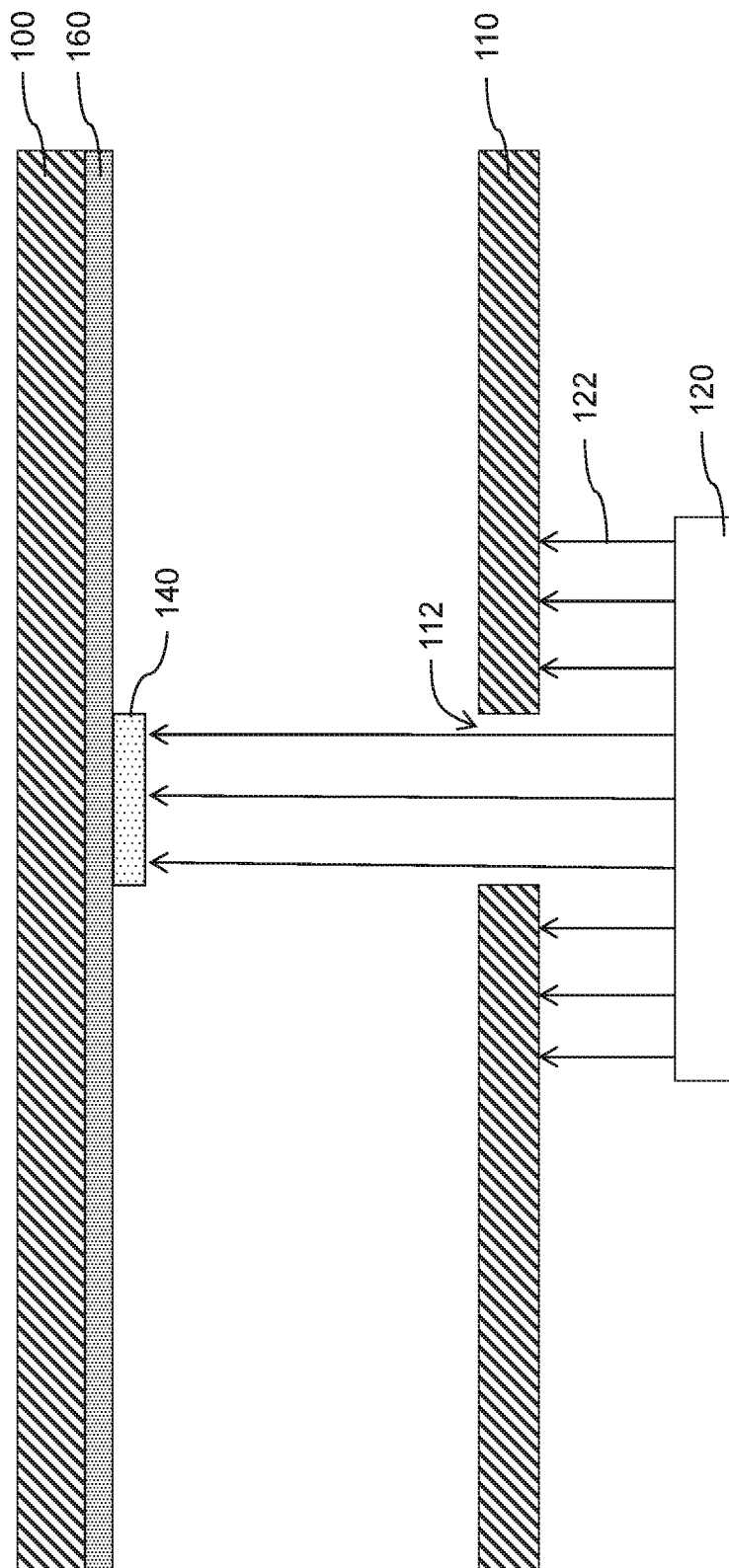
Figure 5F:
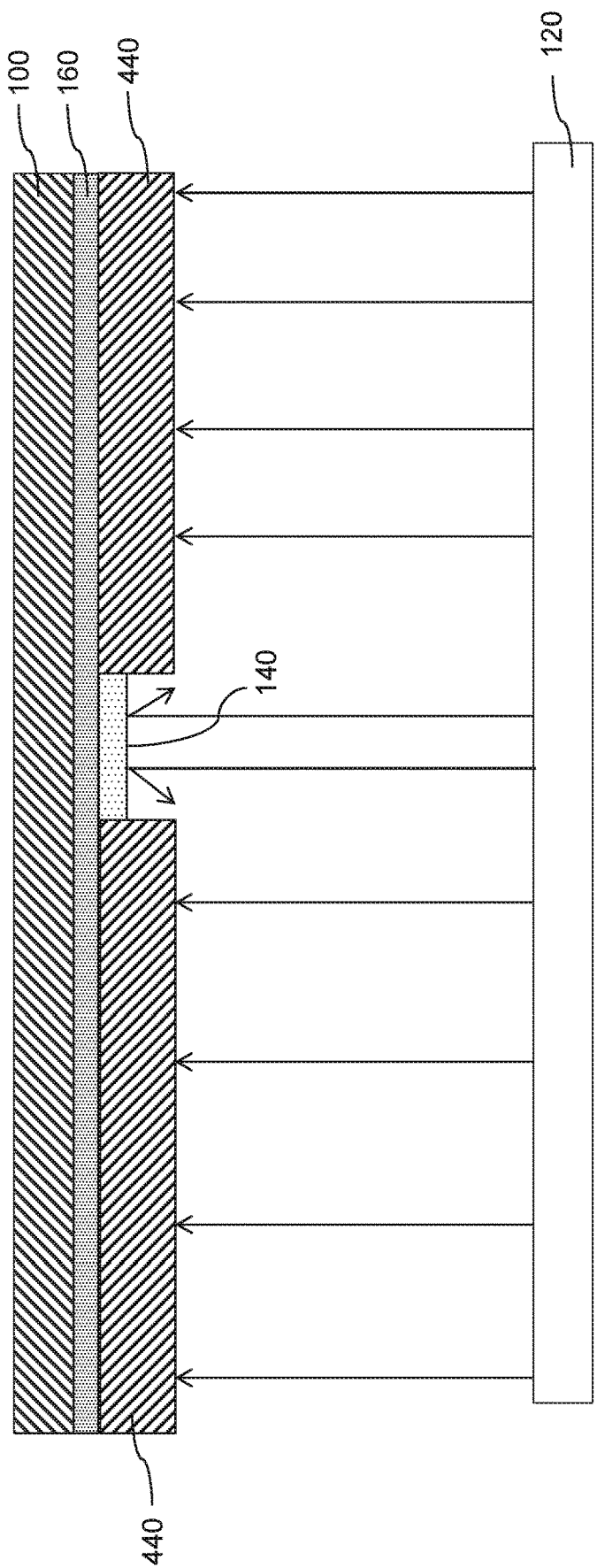

FIGS. 5D-5F illustrate a process for depositing a conductive coating onto a surface of a substrate in another embodiment.

In FIG. 5D, a nucleation promoting coating 160 is deposited on a surface 102 of a substrate 100. For example, the nucleation promoting coating 160 may be deposited by thermal evaporation using an open mask or without a mask. Alternatively, other deposition and surface coating techniques may be used, including but not limited to spin coating, dip coating, printing, spray coating, OVPD, LITI patterning, PVD (including sputtering), CVD, and combinations thereof.

In FIG. 5E, a nucleation inhibiting coating 140 is selectively deposited over a region of the nucleation promoting coating 160 using a shadow mask 110. Accordingly, a patterned surface is produced upon completing the deposition of the nucleation inhibiting coating 140. Then in FIG. 5F, a conductive coating 440 is deposited onto the patterned surface using an open mask or a mask-free deposition process, such that the conductive coating 440 is formed over exposed regions of the nucleation promoting coating 160.

In the foregoing embodiments, it will be appreciated that the conductive coating 440 formed by the processes may be used as an electrode or a conductive structure for an electronic device. For example, the conductive coating 440 may be an anode or a cathode of an organic opto-electronic device, such as an OLED device or an organic photovoltaic (OPV) device. In addition, the conductive coating 440 may also be used as an electrode for opto-electronic devices including quantum dots as an active layer material. For example, such a device may include an active layer disposed between a pair of electrodes with the active layer including quantum dots. The device may be, for example, an electroluminescent quantum dot display device in which light is emitted from the quantum dot active layer as a result of current provided by the electrodes. The conductive coating 440 may also be a busbar or an auxiliary electrode for any of the foregoing devices.

Accordingly, it will be appreciated that the substrate 100 onto which various coatings are deposited may include one or more additional organic and/or inorganic layers not specifically illustrated or described in the foregoing embodiments. For example, in the case of an OLED device, the substrate 100 may include one or more electrodes (e.g., an anode and/or a cathode), charge injection and/or transport layers, and an electroluminescent layer. The substrate 100 may further include one or more transistors and other electronic components such as resistors and capacitors, which are included in an active-matrix or a passive-matrix OLED device. For example, the substrate 100 may include one or more top-gate thin-film transistors (TFTs), one or more bottom-gate TFTs, and/or other TFT structures. A TFT may be an n-type TFT or a p-type TFT. Examples of TFT structures include those including amorphous silicon (a-Si), indium gallium zinc oxide (IGZO), and low-temperature polycrystalline silicon (LTPS).

The substrate 100 may also include a base substrate for supporting the above-identified additional organic and/or inorganic layers. For example, the base substrate may be a flexible or rigid substrate. The base substrate may include, for example, silicon, glass, metal, polymer (e.g., polyimide), sapphire, or other materials suitable for use as the base substrate.

The surface 102 of the substrate 100 may be an organic surface or an inorganic surface. For example, if the conductive coating 440 is for use as a cathode of an OLED device, the surface 102 may be a top surface of a stack of organic layers (e.g., a surface of an electron injection layer). In another example, if the conductive coating 440 is for use as an auxiliary electrode of a top-emission OLED device, the surface 102 may be a top surface of an electrode (e.g., a common cathode). Alternatively, such an auxiliary electrode may be formed directly beneath a transmissive electrode on top of a stack of organic layers.

Figure 6:
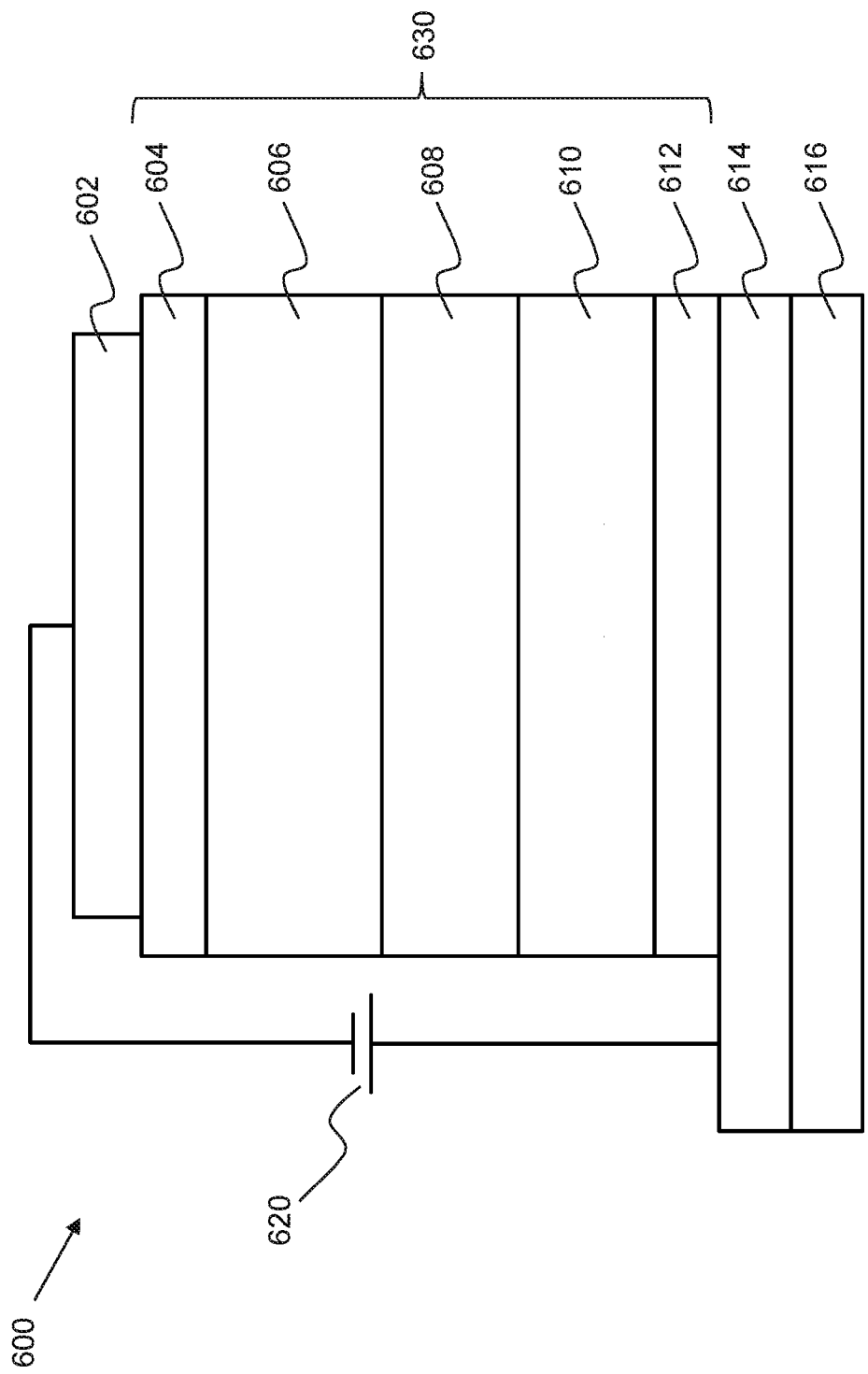
FIG. 6 is a diagram illustrating an electroluminescent device according to one embodiment.

FIG. 6 illustrates an electroluminescent (EL) device 600 according to one embodiment. The EL device 600 may be, for example, an OLED device or an electroluminescent quantum dot device. In one embodiment, the device 600 is an OLED device including a base substrate 616, an anode 614, organic layers 630, and a cathode 602. In the illustrated embodiment, the organic layers 630 include a hole injection layer 612, a hole transport layer 610, an electroluminescent layer 608, an electron transport layer 606, and an electron injection layer 604.

The hole injection layer 612 may be formed using a hole injection material which generally facilitates the injection of holes by the anode 614. The hole transport layer 610 may be formed using a hole transport material, which is generally a material that exhibits high hole mobility.

The electroluminescent layer 608 may be formed, for example, by doping a host material with an emitter material. The emitter material may be a fluorescent emitter, a phosphorescent emitter, or a TADF emitter, for example. A plurality of emitter materials may also be doped into the host material to form the electroluminescent layer 608.

The electron transport layer 606 may be formed using an electron transport material which generally exhibits high electron mobility. The electron injection layer 604 may be formed using an electron injection material, which generally acts to facilitate the injection of electrons by the cathode 602.

It will be understood that the structure of the device 600 may be varied by omitting or combining one or more layers. Specifically, one or more of the hole injection layer 612, the hole transport layer 610, the electron transport layer 606, and the electron injection layer 604 may be omitted from the device structure. One or more additional layers may also be present in the device structure. Such additional layers include, for example, a hole blocking layer, an electron blocking layer, and additional charge transport and/or injection layers. Each layer may further include any number of sub-layers, and each layer and/or sub-layer may include various mixtures and composition gradients. It will also be appreciated that the device 600 may include one or more layers containing inorganic and/or organo-metallic materials, and is not limited to devices composed solely of organic materials. For example, the device 600 may include quantum dots.

The device 600 may be connected to a power source 620 for supplying current to the device 600.

In another embodiment where the device 600 is an EL quantum dot device, the EL layer 608 generally includes quantum dots, which emit light when current is supplied.

Figure 7:
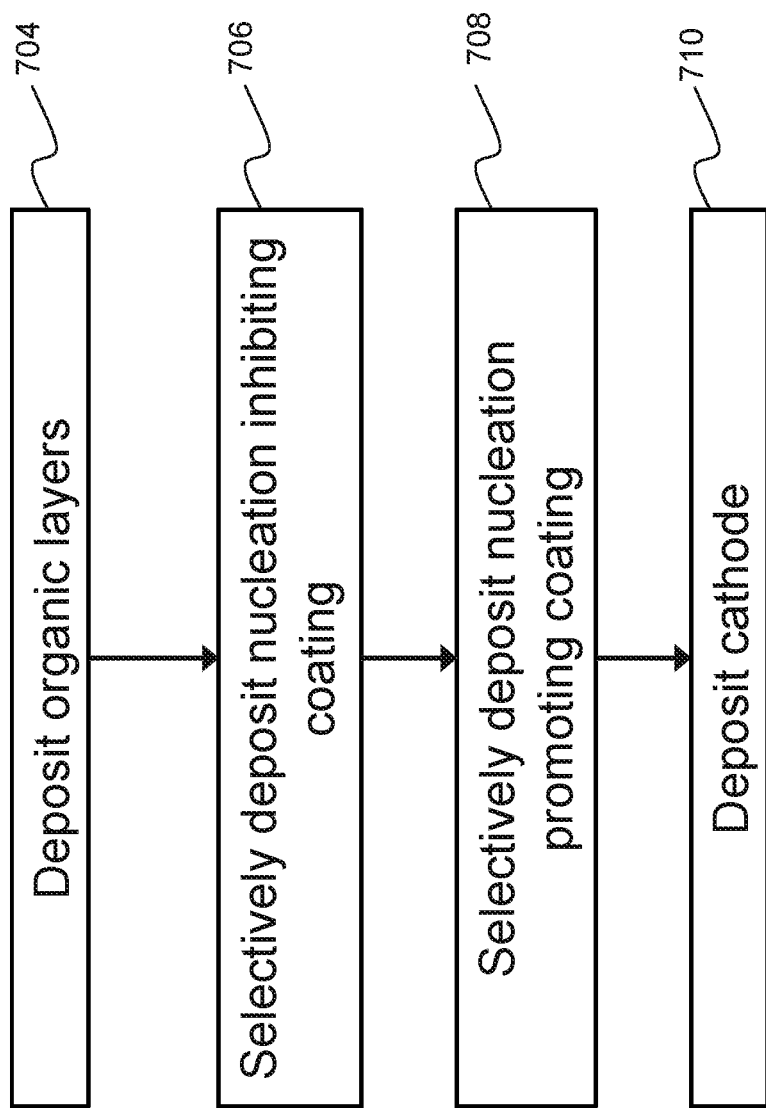
FIG. 7 is a flow diagram showing process stages according to one embodiment.

FIG. 7 is a flow diagram outlining stages of fabricating an OLED device according to one embodiment. In 704, organic layers are deposited on a target surface. For example, the target surface may be a surface of an anode that has been deposited on top of a base substrate, which may include, for example, glass, polymer, and/or metal foil. As discussed above, the organic layers may include, for example, a hole injection layer, a hole transport layer, an electroluminescence layer, an electron transport layer, and an electron injection layer. A nucleation inhibiting coating is then deposited on top of the organic layers in stage 706 using a selective deposition or patterning process. In stage 708, a nucleation promoting coating is selectively deposited on the nucleation inhibiting coating to produce a patterned surface. For example, the nucleation promoting coating and the nucleation inhibiting coating may be selectively deposited by evaporation using a mask, micro-contact transfer printing process, photolithography, printing (including ink or vapor jet printing and reel-to-reel printing), OVPD, or LITI patterning. A conductive coating is then deposited on the patterned surface using an open mask or a mask-free deposition process in stage 710. The conductive coating may serve as a cathode or another conductive structure of the OLED device.

Figure 8:
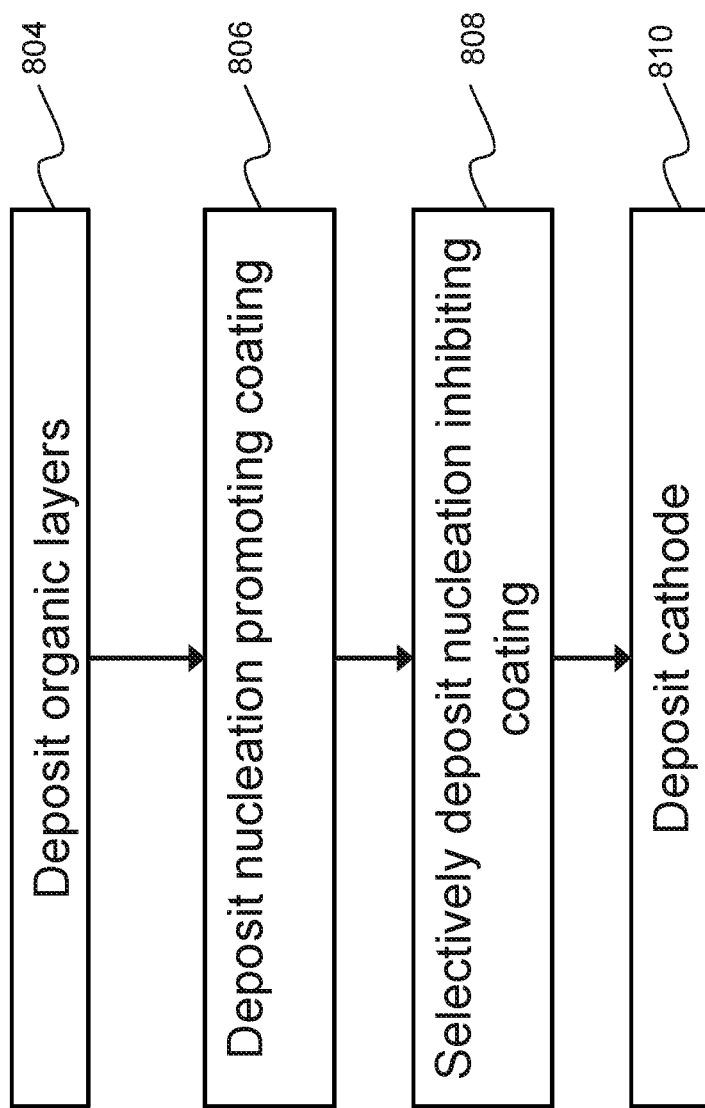
FIG. 8 is a flow diagram showing process stages according to another embodiment.
Figure 9A:
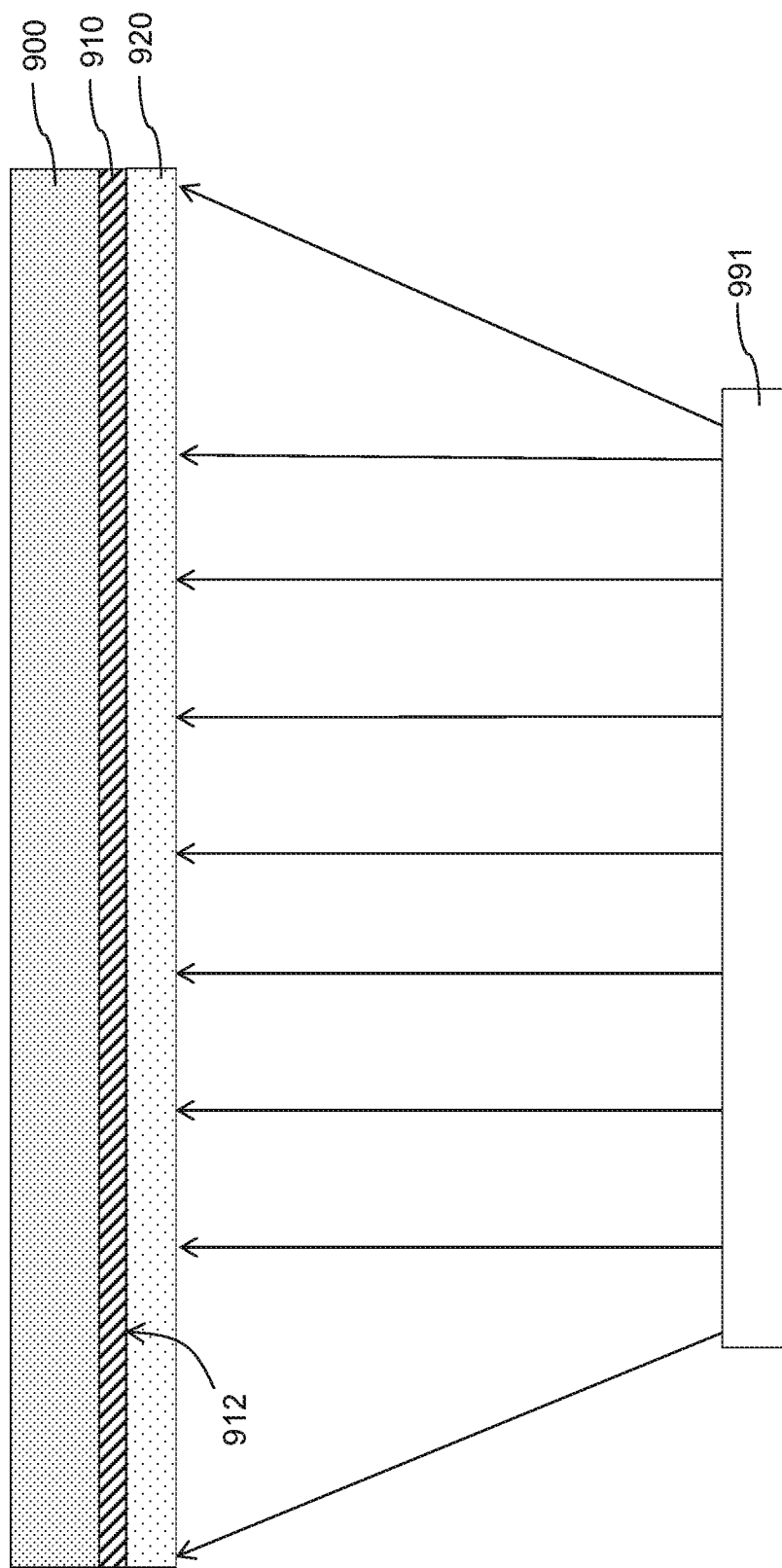
FIG. 9A-9D are schematic diagrams illustrating the stages in the embodiment of FIG. 8.
Figure 9B:
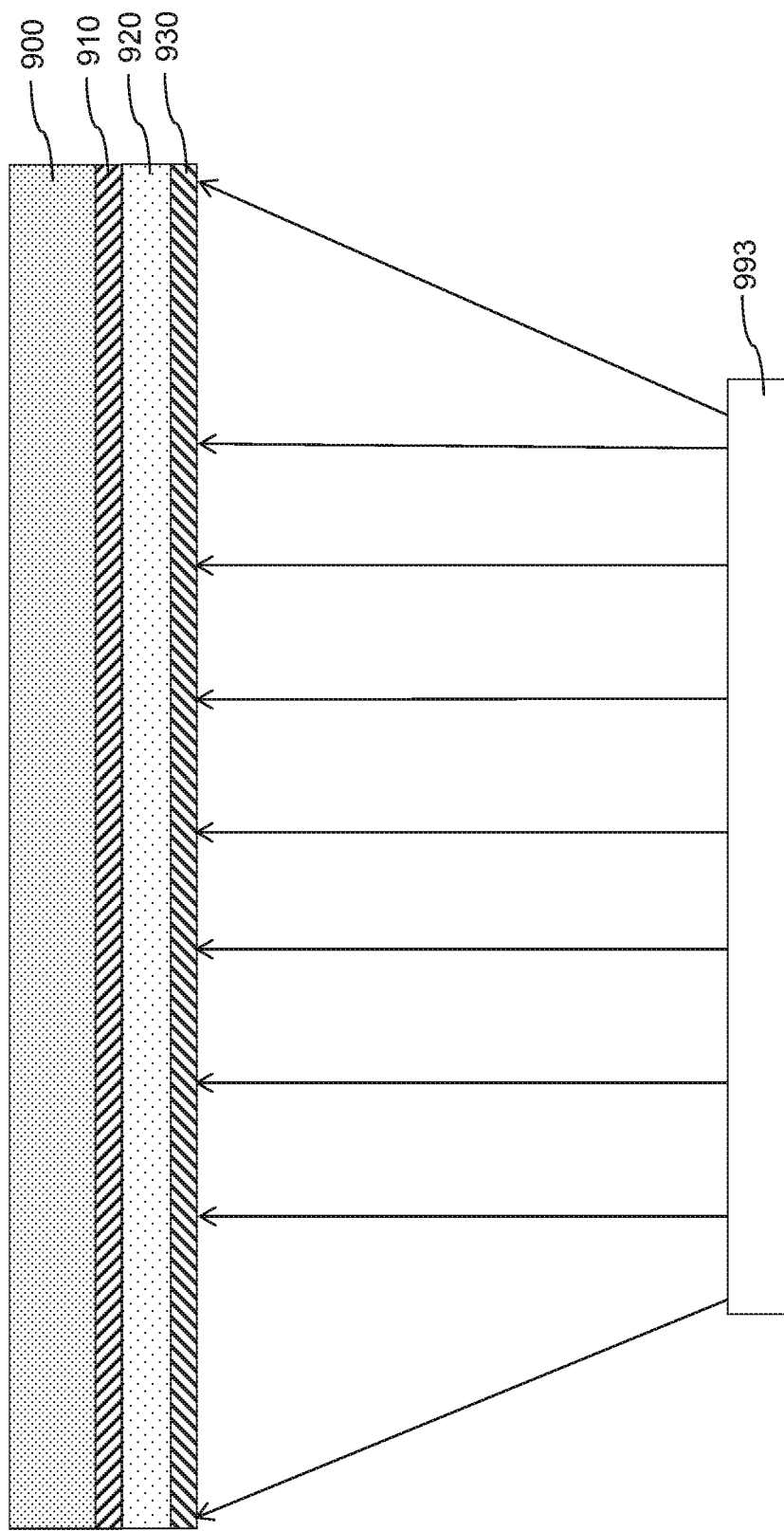
Figure 9C:
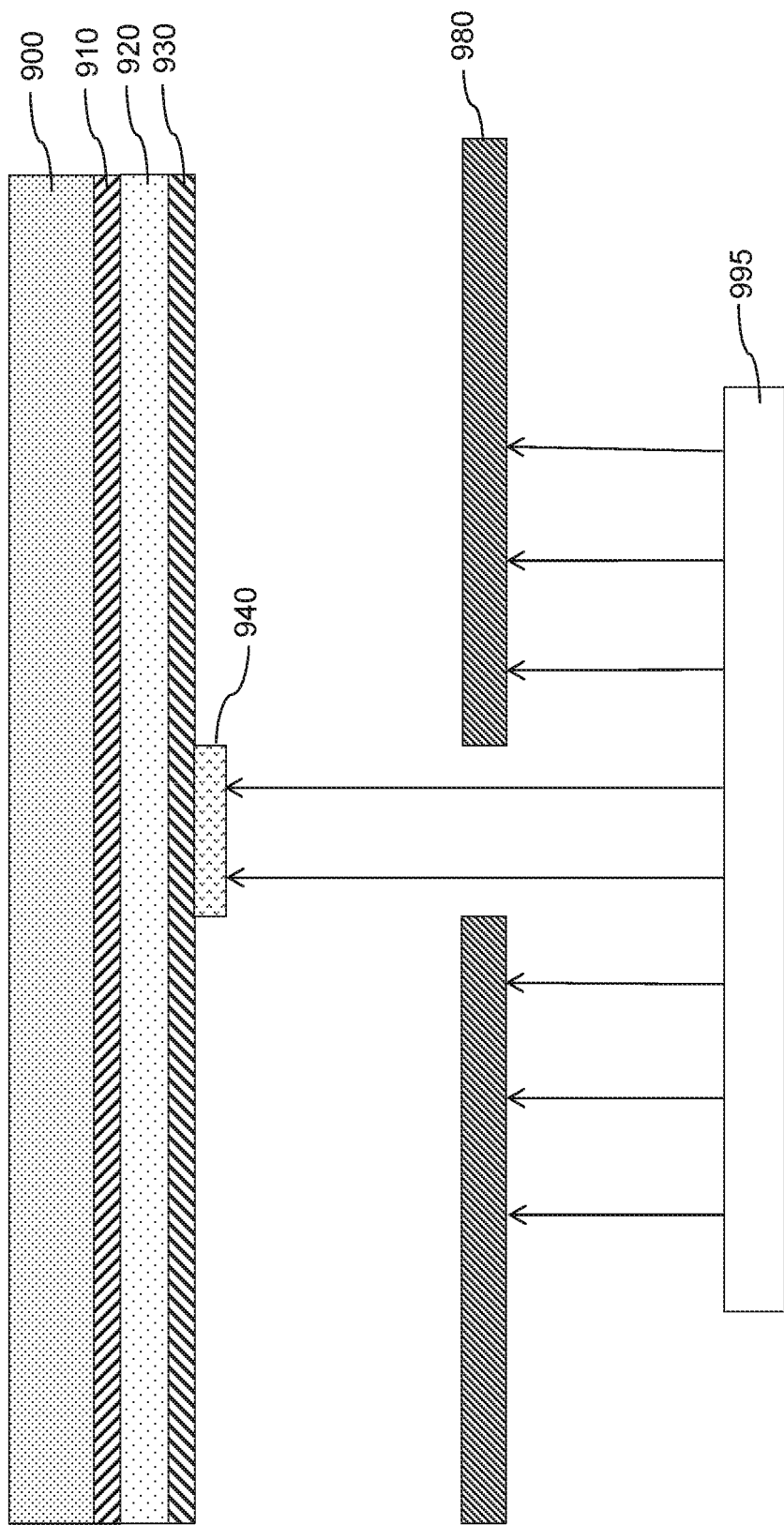
Figure 9D:
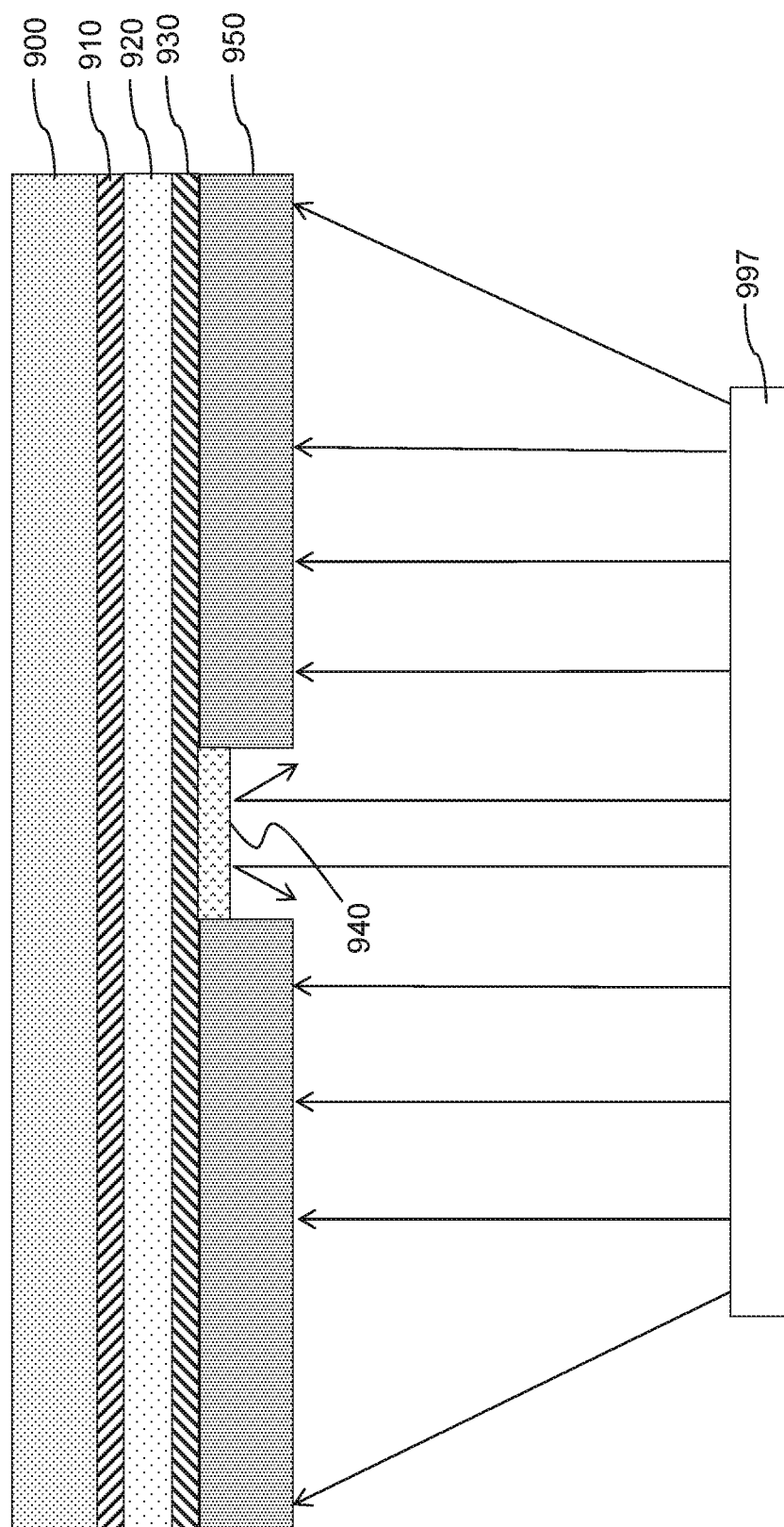

Referring next to FIGS. 8 and 9A-9D, a process for fabricating an OLED device according to another embodiment is provided. FIG. 8 is a flow diagram outlining stages for fabricating the OLED device, and FIGS. 9A-9D are schematic diagrams illustrating the device at each stage of the process. In stage 804, organic layers 920 are deposited on a target surface 912 using a source 991. In the illustrated embodiment, the target surface 912 is a surface of an anode 910 that has been deposited on top of a base substrate 900. The organic layers 920 may include, for example, a hole injection layer, a hole transport layer, an electroluminescence layer, an electron transport layer, and an electron injection layer. A nucleation promoting coating 930 is then deposited on top of the organic layers 920 in stage 806 using a source 993 and an open mask, or without a mask. In stage 808, a nucleation inhibiting coating 940 is selectively deposited on the nucleation promoting coating 930 using a mask 980 and a source 995, thereby producing a patterned surface. A conductive coating 950 is then deposited on the patterned surface using an open mask or a mask-free deposition process in stage 810, such that the conductive coating 950 is deposited on regions of the nucleation promoting coating 930 which are not covered by the nucleation inhibiting coating 940.

Figure 10:
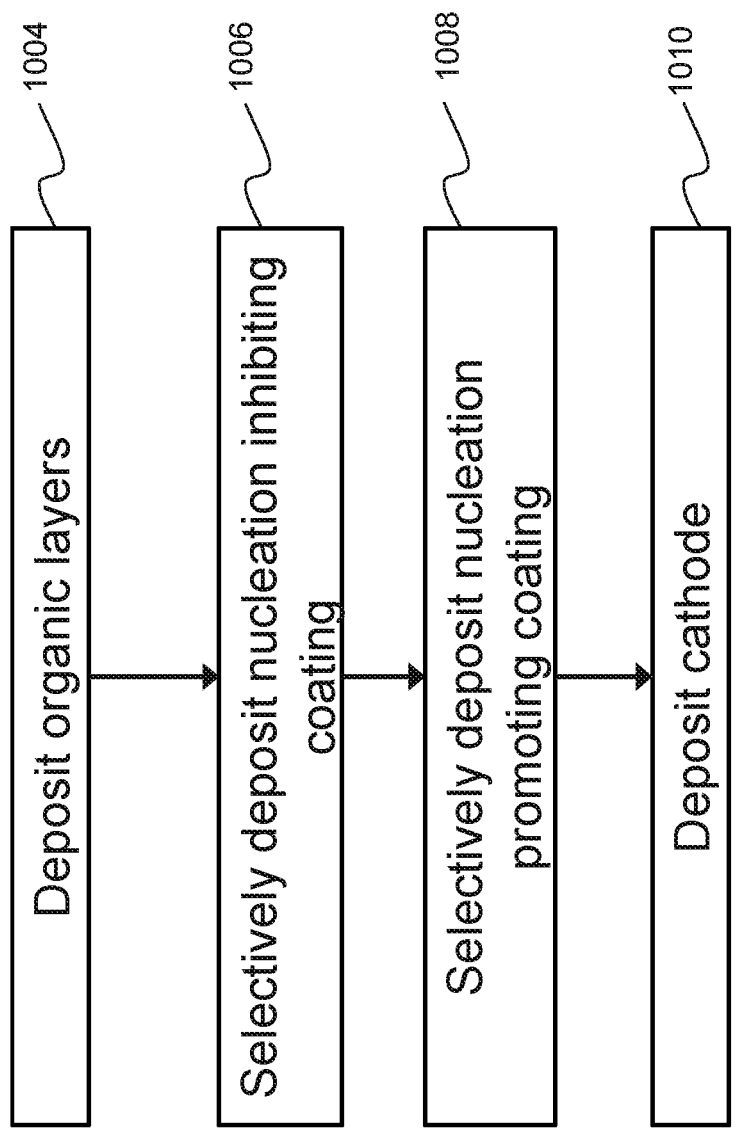
FIG. 10 is a flow diagram showing process stages according to yet another embodiment.
Figure 11A:
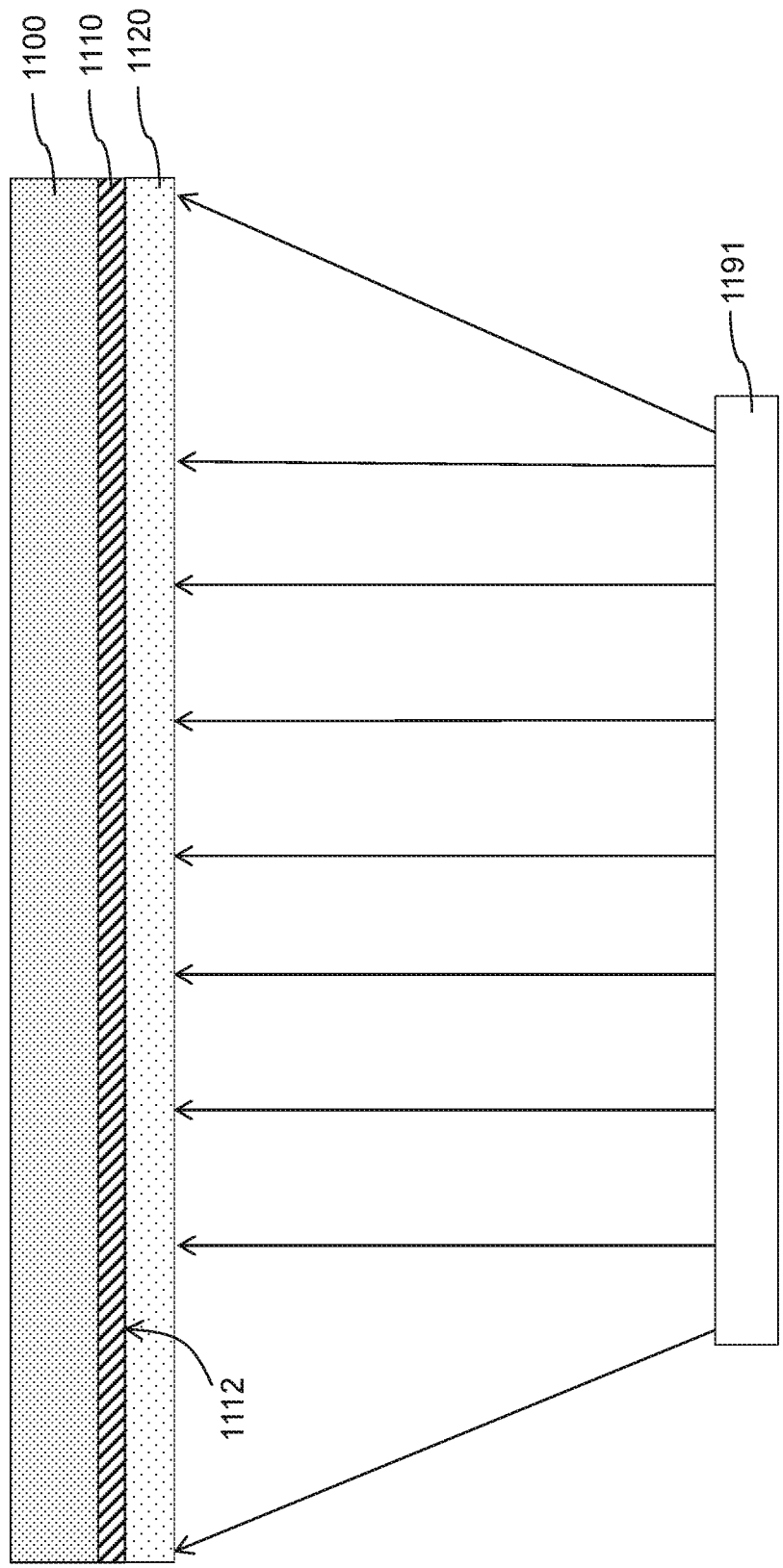
Figure 11B:
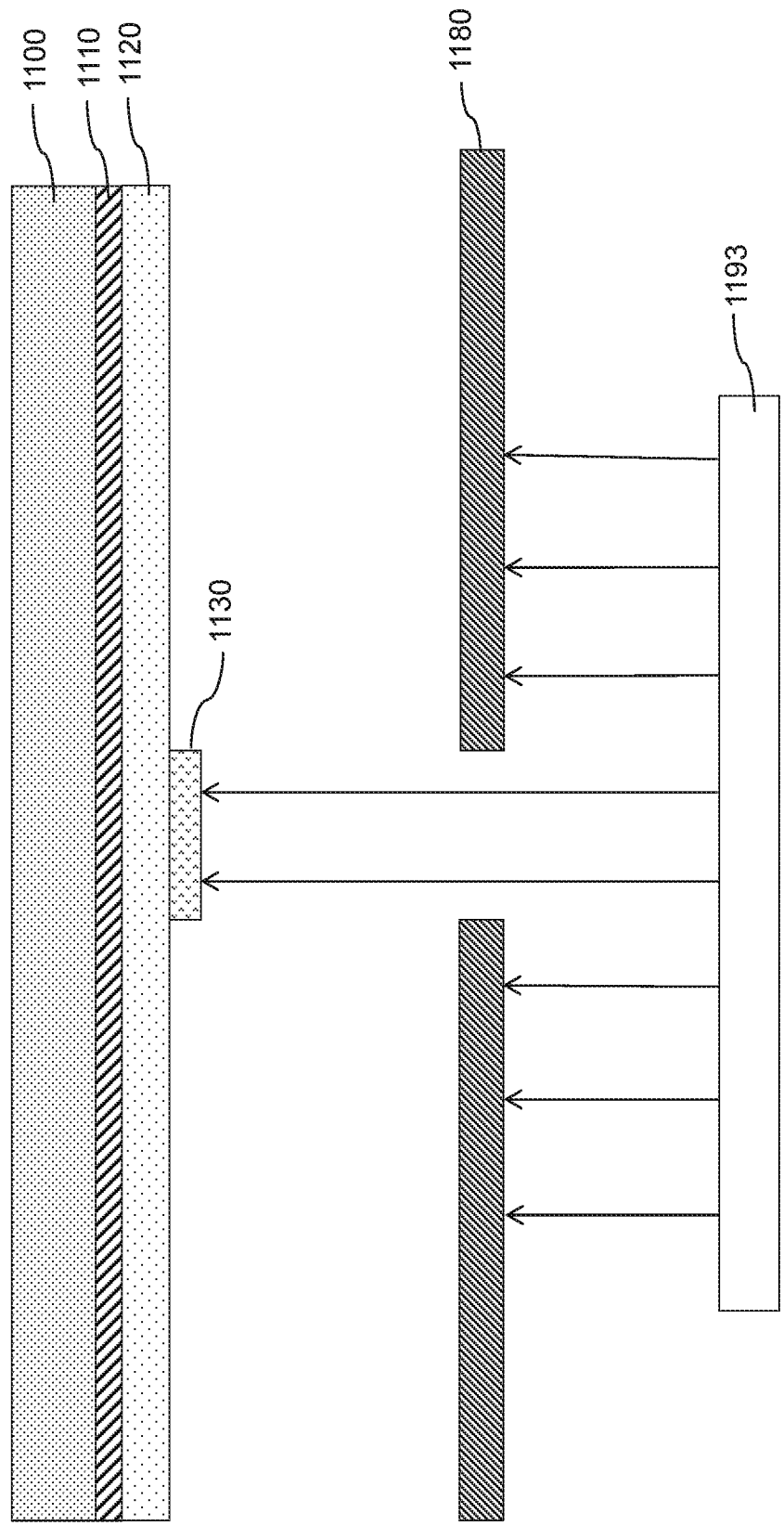
Figure 11C:
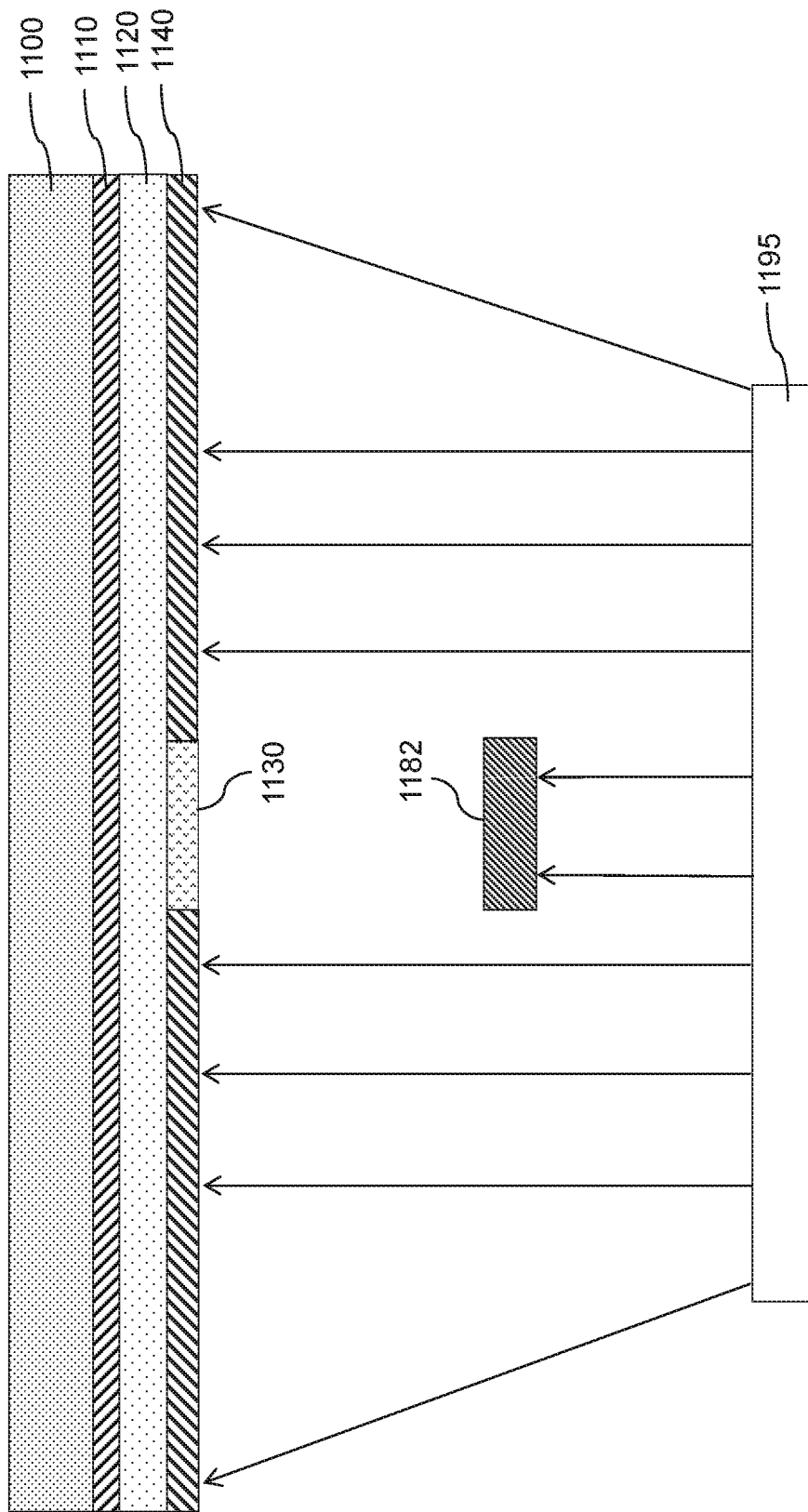

Referring next to FIGS. 10 and 11A-11D, a process for fabricating an OLED device according to yet another embodiment is provided. FIG. 10 is a flow diagram outlining stages for fabricating the OLED device, and FIGS. 11A-11D are schematic diagrams illustrating the stages of such a process. In stage 1004, organic layers 1120 are deposited on a target surface 1112 using a source 1191. In the illustrated embodiment, the target surface 1112 is a surface of an anode 1110 that has been deposited on top of a base substrate 1100. The organic layers 1120 may include, for example, a hole injection layer, a hole transport layer, an electroluminescence layer, an electron transport layer, and an electron injection layer. A nucleation inhibiting coating 1130 is then deposited on top of the organic layers 1120 in stage 1006 using a mask 1180 and a source 1193, such that the nucleation inhibiting coating 1130 is selectively deposited on a region of a surface of the organic layers 1120 that is exposed through an aperture of the mask 1180. In stage 1008, a nucleation promoting coating 1140 is selectively deposited using a mask 1182 and a source 1195. In the illustrated embodiment, the nucleation promoting coating 1140 is shown as being deposited over regions of the surface of the organic layers 1120 which are not covered by the nucleation inhibiting coating 1130, thereby producing a patterned surface. A conductive coating 1150 is then deposited on the patterned surface using an open mask or a mask-free deposition process in stage 1010, resulting in the conductive coating 1150 being deposited on a surface of the nucleation promoting coating 1140 while leaving a surface of the nucleation inhibiting coating 1130 substantially free of a material of the conductive coating 1150.

Figure 12:
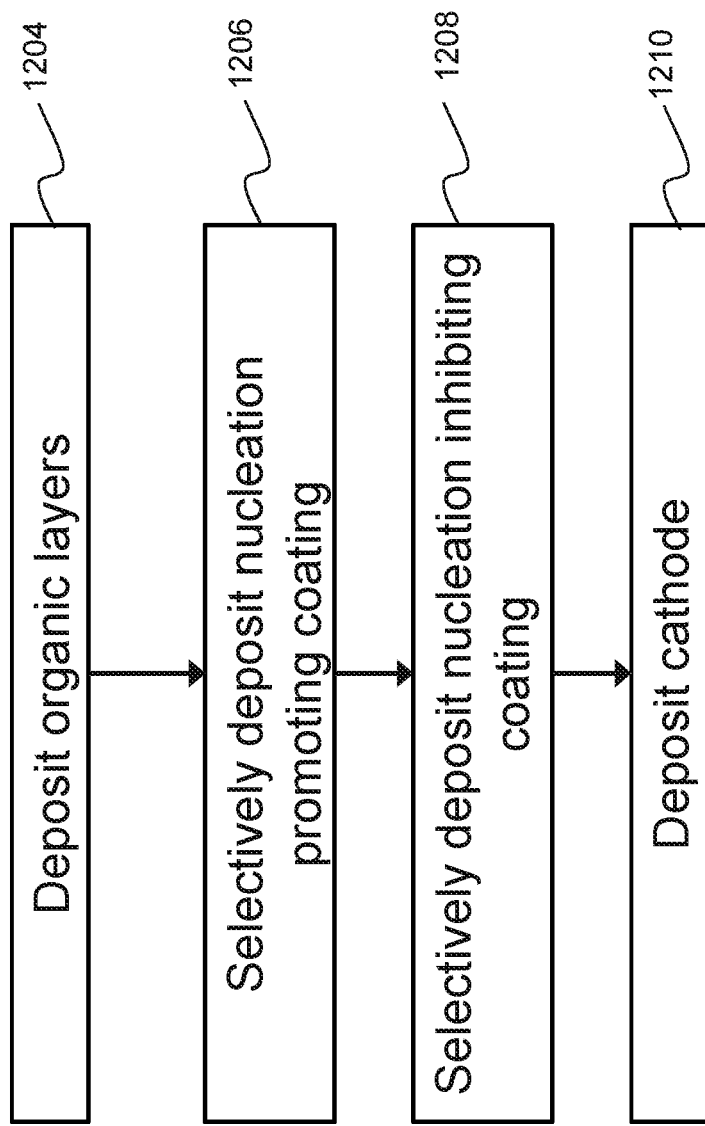
FIG. 12 is a flow diagram showing process stages according to yet another embodiment.
Figure 13A:
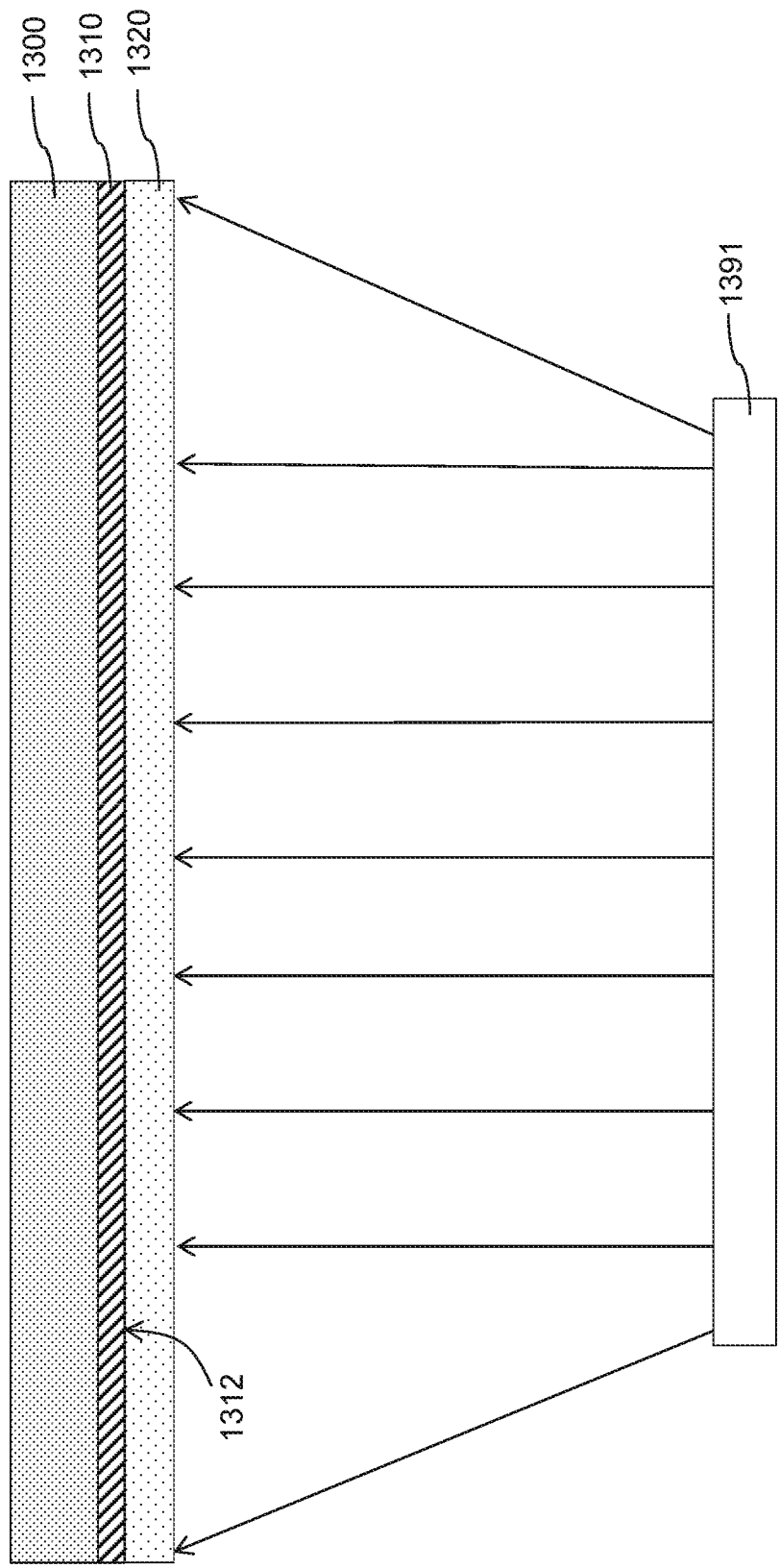
FIGS. 13A-13D are schematic diagrams illustrating the stages in the embodiment of FIG. 12.
Figure 13B:
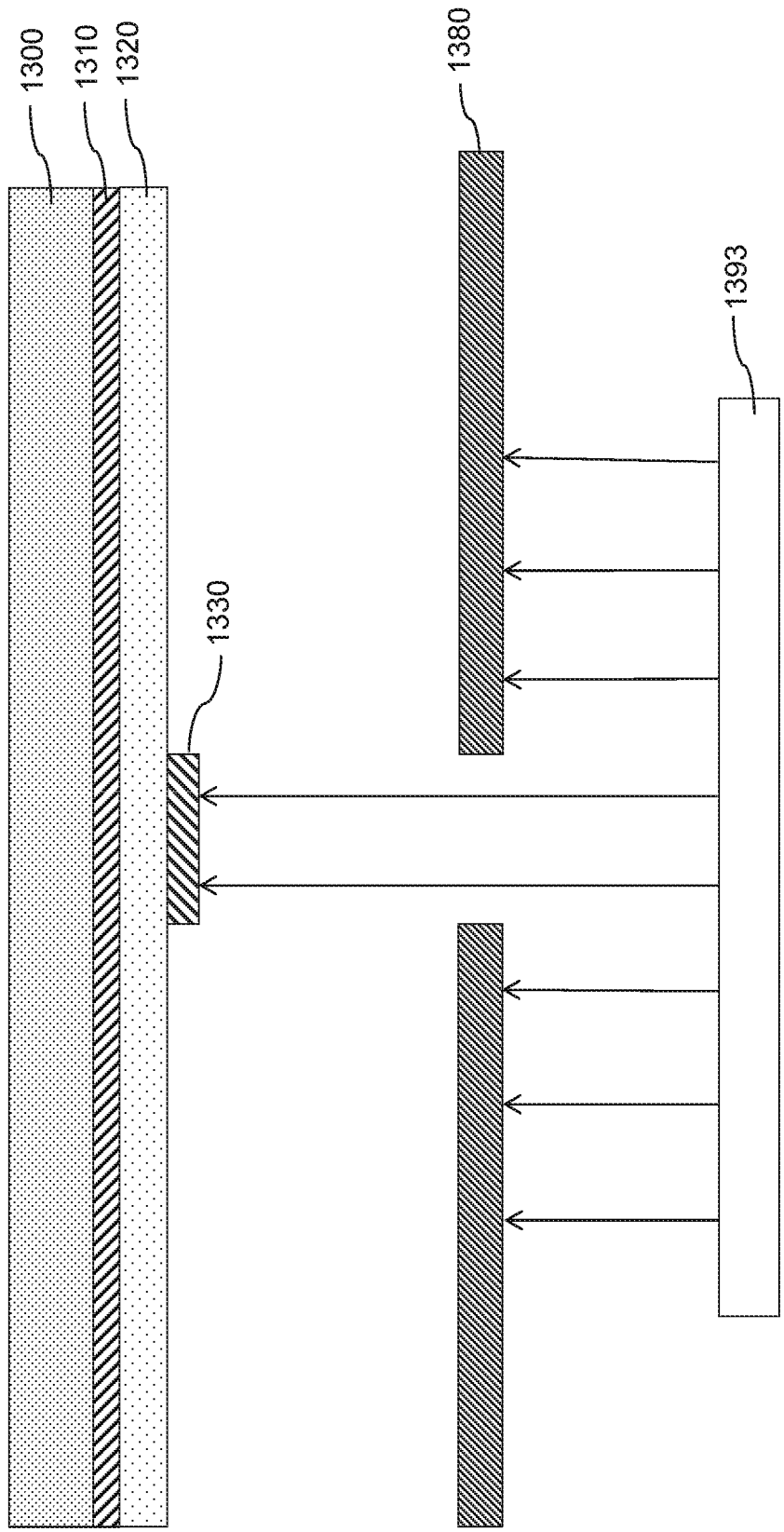
Figure 13C:
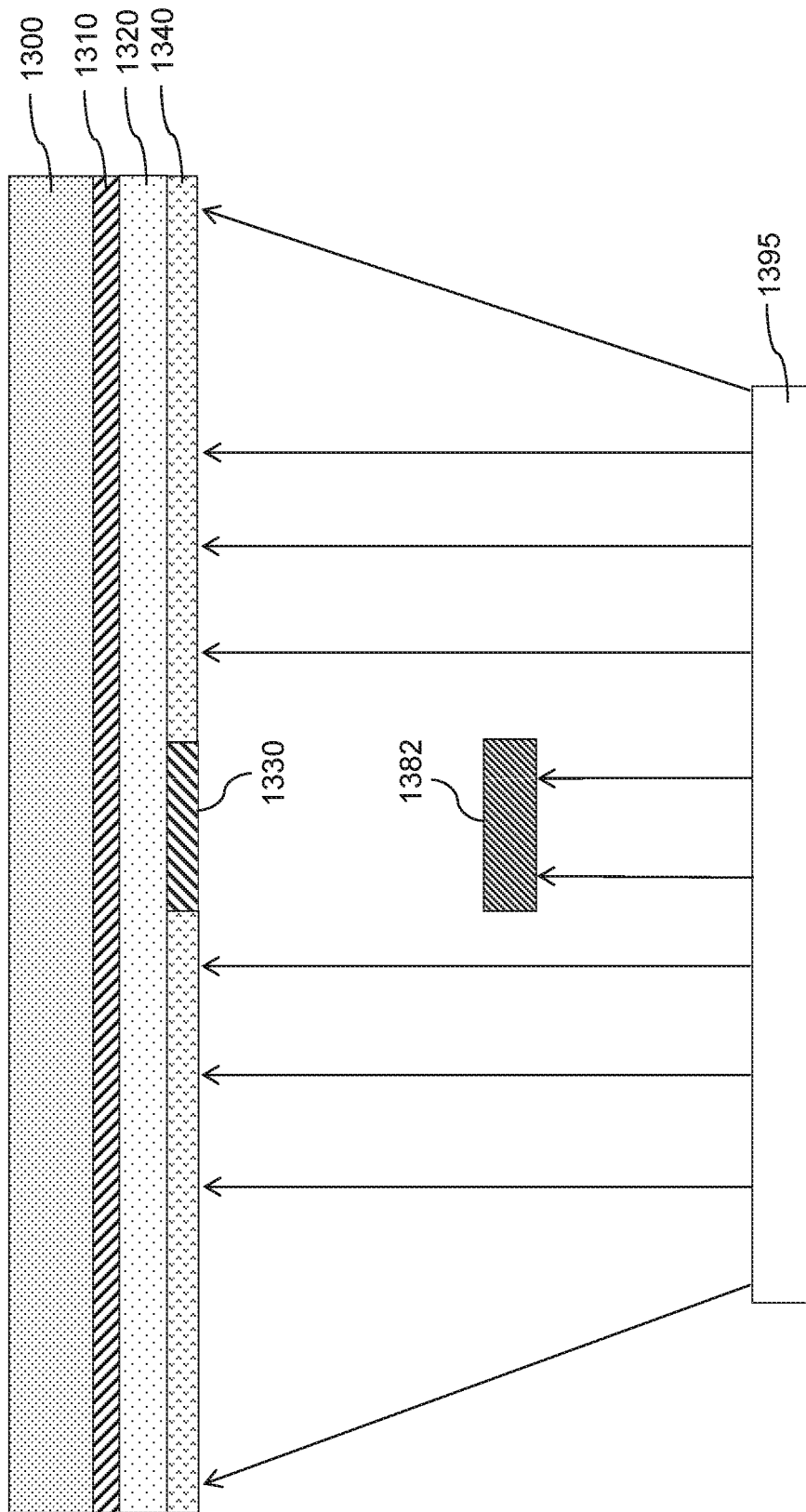
Figure 13D:
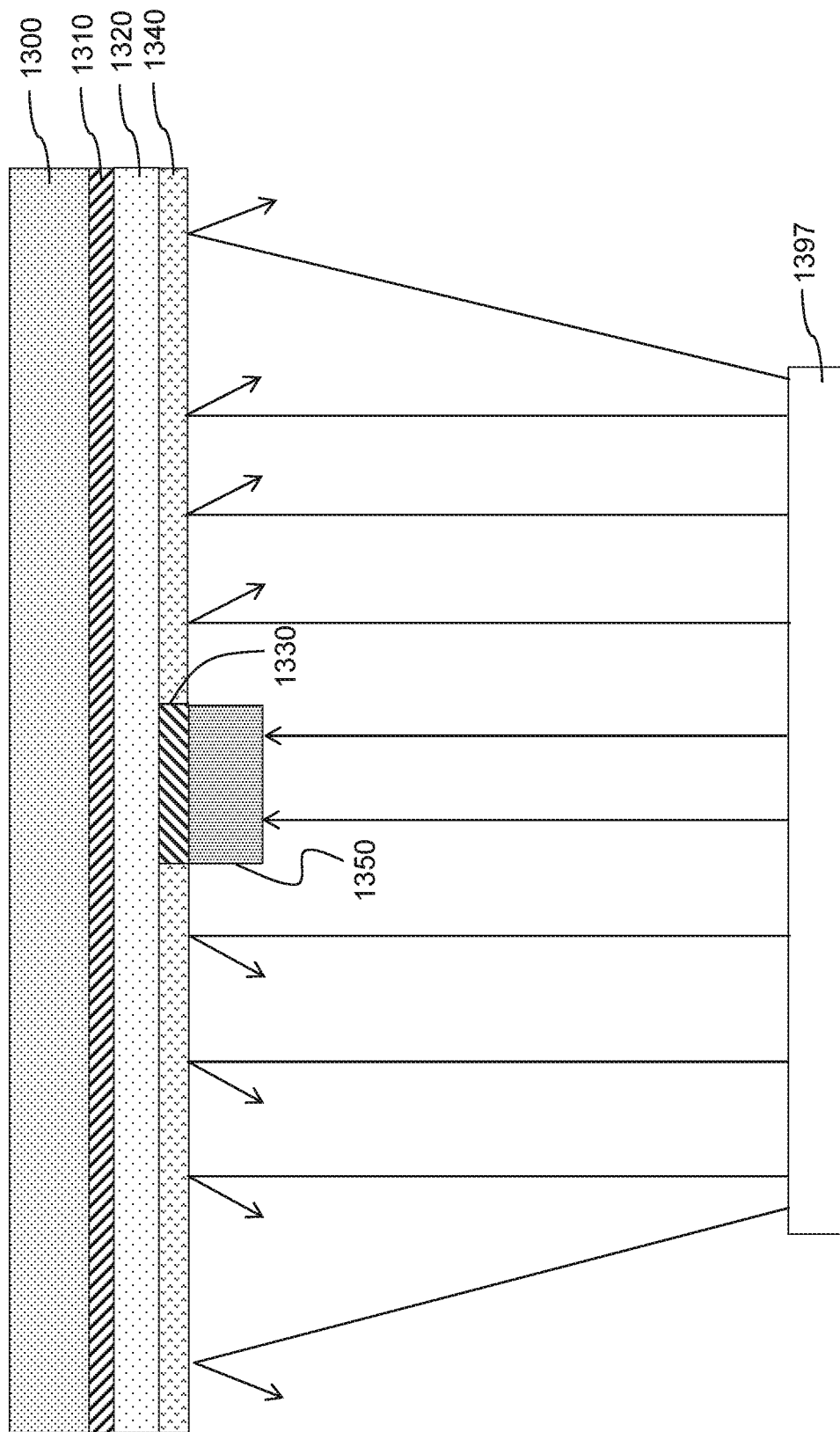

Referring next to FIGS. 12 and 13A-13D, a process for fabricating an OLED device according to yet another embodiment is provided. FIG. 12 is a flow diagram outlining stages for fabricating the OLED device, and FIGS. 13A-13D are schematic diagrams illustrating the stages of such a process. In stage 1204, organic layers 1320 are deposited on a target surface 1312 using a source 1391. In the illustrated embodiment, the target surface 1312 is a surface of an anode 1310 that has been deposited on top of a base substrate 1300. The organic layers 1320 may include, for example, a hole injection layer, a hole transport layer, an electroluminescence layer, an electron transport layer, and an electron injection layer. A nucleation promoting coating 1330 is then deposited on top of the organic layers 1320 in stage 1206 using a mask 1380 and a source 1393, such that the nucleation promoting coating 1330 is selectively deposited on a region of a surface of the organic layers 1320 that is exposed through an aperture of the mask 1380. In stage 1208, a nucleation inhibiting layer 1340 is selectively deposited using a mask 1382 and a source 1395. In the illustrated embodiment, the nucleation inhibiting coating 1340 is illustrated as being deposited over regions of the surface of the organic layers 1320 which are not covered by the nucleation promoting coating 1330, thereby producing a patterned surface. A conductive coating 1350 is then deposited on the patterned surface using an open mask or a mask-free deposition process in stage 1210, resulting in the conductive coating 1350 being deposited on a surface of the nucleation promoting coating 1330 while leaving a surface of the nucleation inhibiting coating 1340 substantially free of a material of the conductive coating 1350. The conductive coating 1350 formed in this manner may serve as an electrode (e.g., a cathode).

In accordance with the above-described embodiments, a conductive coating may be selectively deposited on target regions (e.g., non-emissive regions) using an open mask or a mask-free deposition process, through the use of a nucleation inhibiting coating or a combination of nucleation inhibiting and nucleation promoting coatings. By contrast, the lack of sufficient selectivity in an open mask or a mask-free deposition process would result in deposition of a conductive material beyond target regions and over emissive regions, which is undesired since the presence of such material over the emissive regions generally contributes to attenuation of light and thus a decrease in an EQE of an OLED device. Moreover, by providing high selectivity in depositing a conductive coating on target regions, the conductive coating can serve as an electrode with a sufficient thickness to achieve a desired conductivity in an OLED device. For example, the high selectivity provided by the above-described embodiments allows deposition of an auxiliary electrode having a high aspect ratio that remains confined to regions between neighbouring pixels or sub-pixels. By contrast, the lack of sufficient selectivity in forming a thick electrode in an open mask or a mask-free deposition process would result in deposition of a thick coating of a conductive material over both emissive and non-emissive regions, thus substantially decreasing a performance of a resulting OLED device.

For the sake of simplicity and clarity, details of deposited materials including thickness profiles and edge profiles have been omitted from the process diagrams.

The formation of thin films during vapor deposition on a surface of a substrate involves processes of nucleation and growth. During initial stages of film formation, a sufficient number of vapor monomers (e.g., atoms or molecules) typically condense from a vapor phase to form initial nuclei on the surface. As vapor monomers continue to impinge upon the surface, a size and density of these initial nuclei increase to form small clusters or islands. After reaching a saturation island density, adjacent islands typically will start to coalesce, increasing an average island size, while decreasing an island density. Coalescence of adjacent islands continues until a substantially closed film is formed.

There can be three basic growth modes for the formation of thin films: 1) island (Volmer-Weber), 2) layer-by-layer (Frank-van der Merwe), and 3) Stranski-Krastanov. Island growth typically occurs when stable clusters of monomers nucleate on a surface and grow to form discrete islands. This growth mode occurs when the interactions between the monomers is stronger than that between the monomers and the surface.

The nucleation rate describes how many nuclei of a critical size form on a surface per unit time. During initial stages of film formation, it is unlikely that nuclei will grow from direct impingement of monomers on the surface, since the density of nuclei is low, and thus the nuclei cover a relatively small fraction of the surface (e.g., there are large gaps/spaces between neighboring nuclei). Therefore, the rate at which critical nuclei grow typically depends on the rate at which adsorbed monomers (e.g., adatoms) on the surface migrate and attach to nearby nuclei.

After adsorption of an adatom on a surface, the adatom may either desorb from the surface, or may migrate some distance on the surface before either desorbing, interacting with other adatoms to form a small cluster, or attach to a growing nuclei. An average amount of time that an adatom remains on the surface after initial adsorption is given by:

$$\tau_s = \frac{1}{\nu} \exp\left(\frac{E_{des}}{kT}\right)$$

In the above equation, v is a vibrational frequency of the adatom on the surface, k is the Boltzmann constant, T is temperature, and $E_{des}$ is an energy involved to desorb the adatom from the surface. From this equation it is noted that the lower the value of $E_{des}$ the easier it is for the adatom to desorb from the surface, and hence the shorter the time the adatom will remain on the surface. A mean distance an adatom can diffuse is given by, $$X = a_0 \exp\left(\frac{E_{des} - E_S}{2kT}\right)$$

where $a_0$ is a lattice constant and $E_S$ is an activation energy for surface diffusion. For low values of $E_{des}$ and/or high values of $E_S$ the adatom will diffuse a shorter distance before desorbing, and hence is less likely to attach to a growing nuclei or interact with another adatom or cluster of adatoms.

During initial stages of film formation, adsorbed adatoms may interact to form clusters, with a critical concentration of clusters per unit area being given by, $$\frac{N_i}{N_0} = \left|\frac{N_1}{n_0}\right|^i \exp\left(\frac{E_i}{kT}\right)$$

where $E_i$ is an energy involved to dissociate a critical cluster containing i adatoms into separate adatoms, $n_0$ is a total density of adsorption sites, and $N_1$ is a monomer density given by:

$$N_1 = \dot{R}\tau_s$$

where $\dot{R}$ is a vapor impingement rate. Typically i will depend on a crystal structure of a material being deposited and will determine the critical cluster size to form a stable nucleus.

A critical monomer supply rate for growing clusters is given by the rate of vapor impingement and an average area over which an adatom can diffuse before desorbing:

$$\dot{R}X^2 = a_0^2 \exp\left(\frac{E_{des} - E_S}{kT}\right)$$

The critical nucleation rate is thus given by the combination of the above equations:

$$\dot{N}_i = \dot{R}a_0^2 n_0 \left(\frac{\dot{R}}{vn_0}\right)^i \exp\left(\frac{(i+1)E_{des} - E_S + E_i}{kT}\right)$$

From the above equation it is noted that the critical nucleation rate will be suppressed for surfaces that have a low desorption energy for adsorbed adatoms, a high activation energy for diffusion of an adatom, are at high temperatures, or are subjected to low vapor impingement rates.

Sites of substrate heterogeneities, such as defects, ledges or step edges, may increase $E_{des}$, leading to a higher density of nuclei observed at such sites. Also, impurities or contamination on a surface may also increase $E_{des}$, leading to a higher density of nuclei. For vapor deposition processes conducted under high vacuum conditions, the type and density of contaminates on a surface is affected by a vacuum pressure and a composition of residual gases that make up that pressure.

Under high vacuum conditions, a flux of molecules that impinge on a surface (per $cm^2$-sec) is given by:

$$\Phi = 3.513 \times 10^{22} \frac{P}{MT}$$

where P is pressure, and M is molecular weight. Therefore, a higher partial pressure of a reactive gas, such as $H_2O$, can lead to a higher density of contamination on a surface during vapor deposition, leading to an increase in $E_{des}$ and hence a higher density of nuclei.

A useful parameter for characterizing nucleation and growth of thin films is the sticking probability given by:

$$S = \frac{N_{ads}}{N_{total}}$$

where $N_{ads}$ is a number of adsorbed monomers that remain on a surface (e.g., are incorporated into a film) and $N_{total}$ is a total number of impinging monomers on the surface. A sticking probability equal to 1 indicates that all monomers that impinge the surface are adsorbed and subsequently incorporated into a growing film. A sticking probability equal to 0 indicates that all monomers that impinge the surface are desorbed and subsequently no film is formed on the surface. A sticking probability of metals on various surfaces can be evaluated using various techniques of measuring the sticking probability, such as a dual quartz crystal microbalance (QCM) technique as described by Walker et al., J. Phys. Chem. C 2007, 111, 765 (2006) and in the Examples section below.

As the density of islands increases (e.g., increasing average film thickness), a sticking probability may change. For example, a low initial sticking probability may increase with increasing average film thickness. This can be understood based on a difference in sticking probability between an area of a surface with no islands (bare substrate) and an area with a high density of islands. For example, a monomer that impinges a surface of an island may have a sticking probability close to 1.

An initial sticking probability $S_0$ can therefore be specified as a sticking probability of a surface prior to the formation of any significant number of critical nuclei. One measure of an initial sticking probability can involve a sticking probability of a surface for a material during an initial stage of deposition of the material, where an average thickness of the deposited material across the surface is at or below threshold value. In the description of some embodiments, a threshold value for an initial sticking probability can be specified as 1 nm. An average sticking probability is then given by:

$$\bar{S} = S_0(1 - A_{nuc}) + S_{nuc}(A_{nuc})$$

where $S_{nuc}$ is a sticking probability of an area covered by islands, and $A_{nuc}$ is a percentage of an area of a substrate surface covered by islands.

Suitable materials for use to form a nucleation inhibiting coating include those exhibiting or characterized as having an initial sticking probability for a material of a conductive coating of no greater than or less than about 0.1 (or 10%) or no greater than or less than about 0.05, and, more particularly, no greater than or less than about 0.03, no greater than or less than about 0.02, no greater than or less than about 0.01, no greater than or less than about 0.08, no greater than or less than about 0.005, no greater than or less than about 0.003, no greater than or less than about 0.001, no greater than or less than about 0.0008, no greater than or less than about 0.0005, or no greater than or less than about 0.0001. Suitable materials for use to form a nucleation promoting coating include those exhibiting or characterized as having an initial sticking probability for a material of a conductive coating of at least about 0.6 (or 60%), at least about 0.7, at least about 0.75, at least about 0.8, at least about 0.9, at least about 0.93, at least about 0.95, at least about 0.98, or at least about 0.99.

Suitable nucleation inhibiting materials include organic materials, such as small molecule organic materials and organic polymers. Examples of suitable organic materials include polycyclic aromatic compounds including organic molecules which may optionally include one or more heteroatoms, such as nitrogen (N), sulfur (S), oxygen (O), phosphorus (P), and aluminum (Al). In some embodiments, a polycyclic aromatic compound includes organic molecules each including a core moiety and at least one terminal moiety bonded to the core moiety. A number of terminal moieties may be 1 or more, 2 or more, 3 or more, or 4 or more. In the case of 2 or more terminal moieties, the terminal moieties may be the same or different, or a subset of the terminal moieties may be the same but different from at least one remaining terminal moiety. In some embodiments, at least one terminal moiety is, or includes, a biphenylyl moiety represented by one of the chemical structures (I-a), (I-b), and (Ic) as follows:

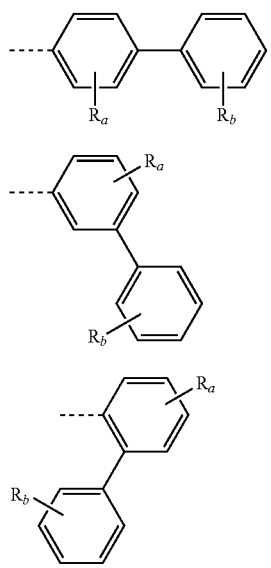

wherein the dotted line indicates a bond formed between the biphenylyl moiety and the core moiety. In general, the biphenylyl moiety represented by (I-a), (I-b) and (I-c) may be unsubstituted or may be substituted by having one or more of its hydrogen atoms replaced by one or more substituent groups. In the moiety represented by (I-a), (I-b), and (I-c), $R_a$ and $R_b$ independently represent the optional presence of one or more substituent groups, wherein $R_a$ may represent mono, di, tri, or tetra substitution, and $R_b$ may represent mono, di, tri, tetra, or penta substitution. For example, one or more substituent groups, $R_a$ and $R_b$, may independently be selected from: deutero, fluoro, alkyl including $C_1$-$C_4$ alkyl, cycloalkyl, arylalkyl, silyl, aryl, heteroaryl, fluoroalkyl, and any combinations thereof. Particularly, one or more substituent groups, $R_a$ and $R_b$, may be independently selected from: methyl, ethyl, t-butyl, trifluoromethyl, phenyl, methylphenyl, dimethylphenyl, trimethylphenyl, t-butylphenyl, biphenylyl, methylbiphenylyl, dimethylbiphenylyl, trimethylbiphenylyl, t-butylbiphenylyl, fluorophenyl, difluorophenyl, trifluorophenyl, polyfluorophenyl, fluorobiphenylyl, difluorobiphenylyl, trifluorobiphenylyl, and polyfluorobiphenylyl. Without wishing to be bound by a particular theory, the presence of an exposed biphenylyl moiety on a surface may serve to adjust or tune a surface energy (e.g., a desorption energy) to lower an affinity of the surface towards deposition of a conductive material such as magnesium. Other moieties and materials that yield a similar tuning of a surface energy to inhibit deposition of magnesium may be used to form a nucleation inhibiting coating.

In another embodiment, at least one terminal moiety is, or includes, a phenyl moiety represented by the structure (I-d) as follows:

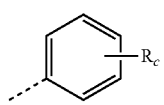

wherein the dotted line indicates a bond formed between the phenyl moiety and the core moiety. In general, the phenyl moiety represented by (I-d) may be unsubstituted or may be substituted by having one or more of its hydrogen atoms replaced by one or more substituent groups. In the moiety represented by (I-d), $R_c$ represents the optional presence of one or more substituent groups, wherein $R_c$ may represent mono, di, tri, tetra, or penta substitution. One or more substituent groups, $R_c$, may be independently selected from: deutero, fluoro, alkyl including $C_1$-$C_4$ alkyl, cycloalkyl, silyl, fluoroalkyl, and any combinations thereof. Particularly, one or more substituent groups, $R_c$, may be independently selected from: methyl, ethyl, t-butyl, fluoromethyl, bifluoromethyl, trifluoromethyl, fluoroethyl, and polyfluoroethyl.

In yet another embodiment, at least one terminal moiety is, or includes, a polycyclic aromatic moiety including fused ring structures, such as fluorene moieties or phenylene moieties (including those containing multiple (e.g., 3, 4, or more) fused benzene rings). Examples of such moieties include spirobifluorene moiety, triphenylene moiety, diphenylfluorene moiety, dimethylfluorene moiety, difluorofluorene moiety, and any combinations thereof.

In some embodiments, a polycyclic aromatic compound includes organic molecules represented by at least one of chemical structures (II), (III), and (IV) as follows:

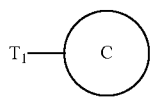

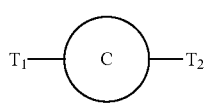

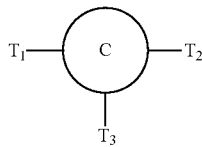

(IV)

In (II), (III), and (IV), C represents a core moiety, and $T_1$, $T_2$, and $T_3$ represent terminal moieties bonded to the core moiety. Although 1, 2, and 3 terminal moieties are depicted in (II), (III), and (IV), it should be understood that more than 3 terminal moieties also may be included.

In some embodiments, C is, or includes, a heterocyclic moiety, such as a heterocyclic moiety including one or more nitrogen atoms, for which an example is a triazole moiety. In some embodiments, C is, or includes, a metal atom (including transition and post-transition atoms), such as an aluminum atom, a copper atom, an iridium atom, and/or a platinum atom. In some embodiments, C is, or includes, a nitrogen atom, an oxygen atom, and/or a phosphorus atom. In some embodiments, C is, or includes, a cyclic hydrocarbon moiety, which may be aromatic. In some embodiments, C is, or includes, a substituted or unsubstituted alkyl, which may be branched or unbranched, a cycloalkynyl (including those containing between 1 and 7 carbon atoms), an alkenyl, an alkynyl, an aryl (including phenyl, naphthyl, thienyl, and indolyl), an arylalkyl, a heterocyclic moiety (including cyclic amines such as morpholino, piperdino and pyrolidino), a cyclic ether moiety (such as tetrahydrofuran and tetrahydropyran moieties), a heteroaryl (including pyrrole, furan, thiophene, imidazole, oxazole, thiazole, triazole, pyrazole, pyridine, pyrazine, pyrimidine, polycyclic heteroaromatic moieties, and dibenzylthiophenyl), fluorene moieties, silyl, and any combinations thereof.

In (II), (III), and (IV), $T_1$ is, or includes, a moiety represented by (I-a), (I-b), (I-c), or (I-d), or a polycyclic aromatic moiety including fused ring structures as described above. The moiety, $T_1$, may be directly bonded to the core moiety, or may be bonded to the core moiety via a linker moiety. Examples of a linker moiety include —O— (where O denotes an oxygen atom), —S— (where S denotes a sulfur atom), and cyclic or acyclic hydrocarbon moieties including 1, 2, 3, 4, or more carbon atoms, and which may be unsubstituted or substituted, and which may optionally include one or more heteroatoms. The bond between the core moiety and one or more terminal moieties may be a covalent bond or a bond formed between a metallic element and an organic element, particularly in the case of organometallic compounds.

In (III), $T_1$ and $T_2$ may be the same or different, as long as at least $T_1$ is, or includes, a moiety represented by (I-a), (I-b), (I-c), or (I-d), or a polycyclic aromatic moiety including fused ring structures as described above. For example, each of $T_1$ and $T_2$ may be, or may include, a moiety represented by (I-a), (I-b), (I-c), or (I-d), or a polycyclic aromatic moiety including fused ring structures as described above. As another example, $T_1$ is, or includes, a moiety represented by (I-a), (I-b), (I-c), or (I-d), or a polycyclic aromatic moiety including fused ring structures as described above, while $T_2$ may lack such a moiety. In some embodiments, $T_2$ is, or includes, a cyclic hydrocarbon moiety, which may be aromatic, which may include a single ring structure or may be polycyclic, which may be substituted or unsubstituted, and which may be directly bonded to the core moiety, or may be bonded to the core moiety via a linker moiety. In some embodiments, $T_2$ is, or includes, a heterocyclic moiety, such as a heterocyclic moiety including one or more nitrogen atoms, which may include a single ring structure or may be polycyclic, which may be substituted or unsubstituted, and which may be directly bonded to the core moiety, or may be bonded to the core moiety via a linker moiety. In some embodiments, $T_2$ is, or includes, an acyclic hydrocarbon moiety, which may be unsubstituted or substituted, which may optionally include one or more heteroatoms, and which may be directly bonded to the core moiety, or may be bonded to the core moiety via a linker moiety. In some embodiments where $T_1$ and $T_2$ are different, $T_2$ may be selected from moieties having sizes comparable to $T_1$. Specifically, $T_2$ may be selected from the above-listed moieties having molecular weights no greater than about 2 times, no greater than about 1.9 times, no greater than about 1.7 times, no greater than about 1.5 times, no greater than about 1.2 times, or no greater than about 1.1 times a molecular weight of $T_1$. Without wishing to be bound by a particular theory, it is postulated that, when the terminal moiety $T_2$ is included which is different from or lacks a moiety represented by (I-a), (I-b), (I-c), or (I-d), or a polycyclic aromatic moiety including fused ring structures as described above, a comparable size of $T_2$ with respect to $T_1$ may promote exposure of $T_1$ on a surface, in contrast to bulky terminal groups that may hinder exposure of $T_1$ due to molecular stacking, steric hindrance, or a combination of such effects.

In (IV), $T_1$, $T_2$, and $T_3$ may be the same or different, as long as at least $T_1$ is, or includes, a moiety represented by (I-a), (I-b), (I-c), or (I-d), or a polycyclic aromatic moiety including fused ring structures as described above. For example, each of $T_1$, $T_2$, and $T_3$ may be, or may include, a moiety represented by (I-a), (I-b), (I-c), or (I-d), or a polycyclic aromatic moiety including fused ring structures as described above. As another example, each of $T_1$ and $T_2$ may be, or may include, a moiety represented by (I-a), (I-b), (I-c), or (I-d), or a polycyclic aromatic moiety including fused ring structures as described above, while $T_3$ may lack such a moiety. As another example, each of $T_1$ and $T_3$ may be, or may include, a moiety represented by (I-a), (I-b), (I-c), or (I-d), or a polycyclic aromatic moiety including fused ring structures as described above, while $T_2$ may lack such a moiety. As a further example, $T_1$ is, or includes, a moiety represented by (I-a), (I-b), (I-c), or (I-d), or a polycyclic aromatic moiety including fused ring structures as described above, while both $T_2$ and $T_3$ may lack such a moiety. In some embodiments, at least one $T_2$ and $T_3$ is, or includes, a cyclic hydrocarbon moiety, which may be aromatic, which may include a single ring structure or may be polycyclic, which may be substituted or unsubstituted, and which may be directly bonded to the core moiety, or may be bonded to the core moiety via a linker moiety. In some embodiments, at least one $T_2$ and $T_3$ is, or includes, a heterocyclic moiety, such as a heterocyclic moiety including one or more nitrogen atoms, which may include a single ring structure or may be polycyclic, which may be substituted or unsubstituted, and which may be directly bonded to the core moiety, or may be bonded to the core moiety via a linker moiety. In some embodiments, at least one $T_2$ and $T_3$ is, or includes, an acyclic hydrocarbon moiety, which may be unsubstituted or substituted, which may optionally include one or more heteroatoms, and which may be directly bonded to the core moiety, or may be bonded to the core moiety via a linker moiety. In some embodiments where $T_1$, $T_2$, and $T_3$ are different, $T_2$ and $T_3$ may be selected from moieties having sizes comparable to $T_1$. Specifically, $T_2$ and $T_3$ may be selected from the above-listed moieties having molecular weights no greater than about 2 times, no greater than about 1.9 times, no greater than about 1.7 times, no greater than about 1.5 times, no greater than about 1.2 times, or no greater than about 1.1 times a molecular weight of $T_1$. Without wishing to be bound by a particular theory, it is postulated that, when the terminal moieties $T_2$ and $T_3$ are included which are different from or lacks a moiety represented by (I-a), (I-b), (I-c), or (I-d), or a polycyclic aromatic moiety including fused ring structures as described above, a comparable size of $T_2$ and $T_3$ with respect to $T_1$ may promote exposure of $T_1$ on a surface, in contrast to bulky terminal groups that may hinder exposure of $T_1$ due to molecular stacking, steric hindrance, or a combination of such effects.

Suitable nucleation inhibiting materials include polymeric materials. Examples of such polymeric materials include: fluoropolymers, including but not limited to perfluorinated polymers and polytetrafluoroethylene (PTFE); polyvinylbiphenyl; polyvinylcarbazole (PVK); and polymers formed by polymerizing a plurality of the polycyclic aromatic compounds as described above. In another example, polymeric materials include polymers formed by polymerizing a plurality of monomers, wherein at least one of the monomers includes a terminal moiety that is, or includes, a moiety represented by (I-a), (I-b), (I-c), or (I-d), or a polycyclic aromatic moiety including fused ring structures as described above.

Figure 14:
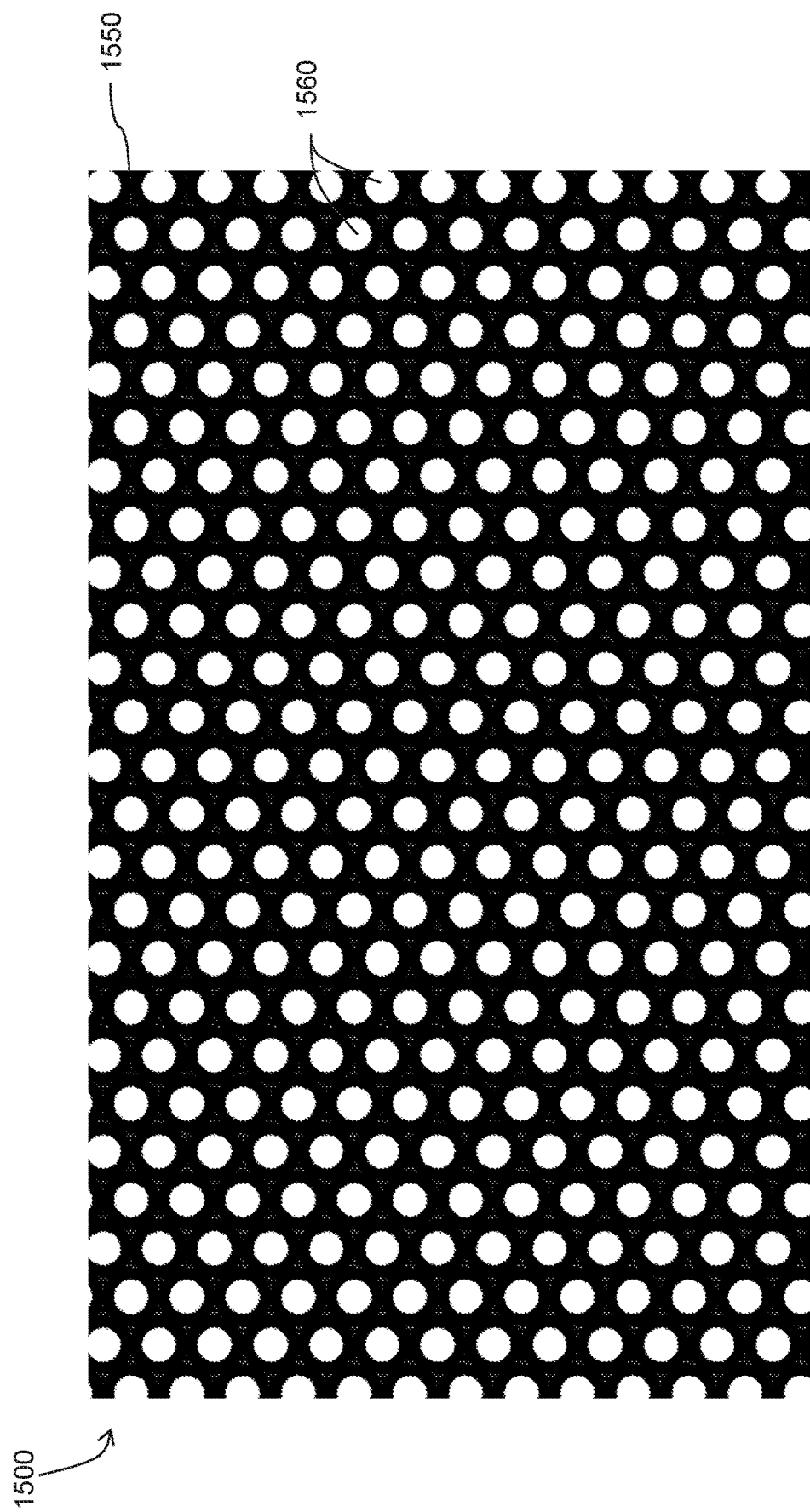
FIG. 14 is a top view of an OLED device according to one embodiment.
Figure 15:
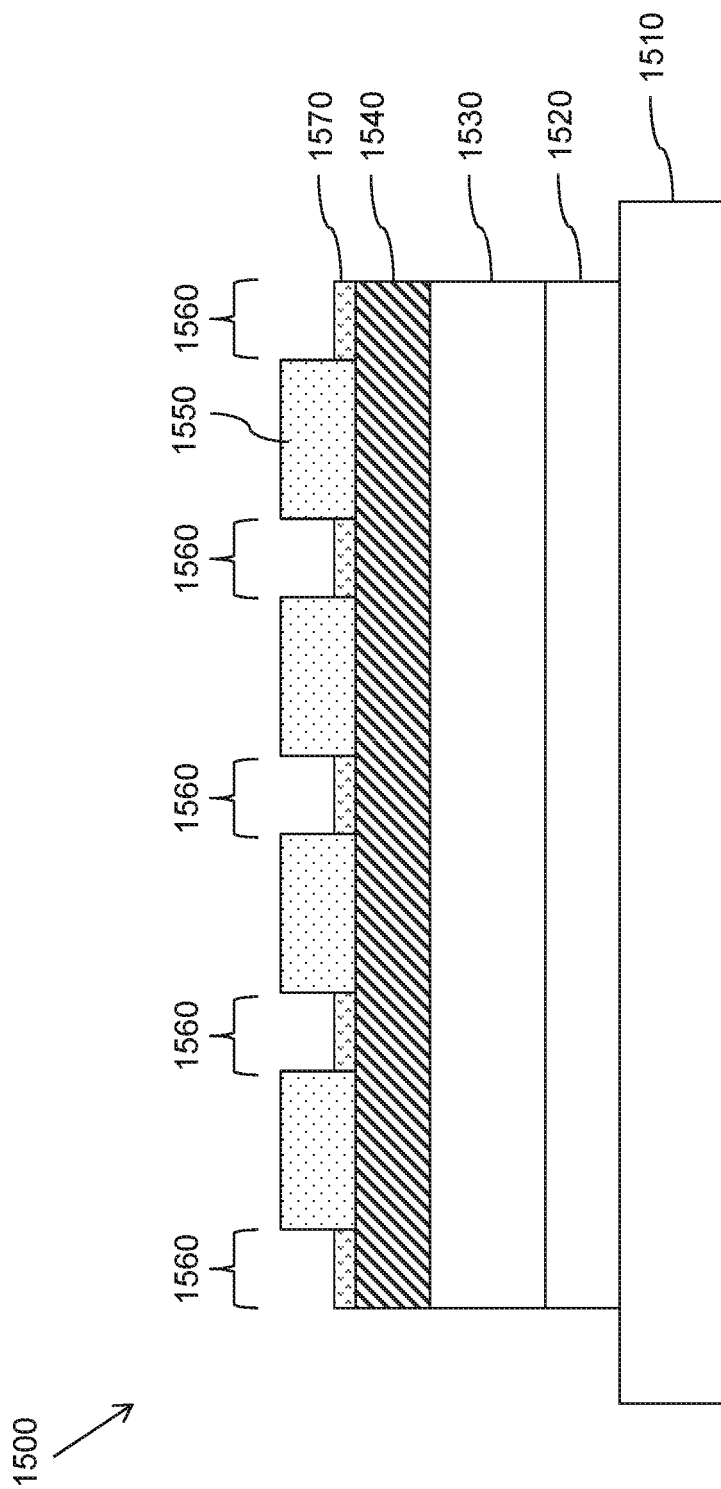
FIG. 15 is a cross-sectional view of the OLED device of FIG. 14.

FIGS. 14 and 15 illustrates an OLED device 1500 according to one embodiment. Specifically, FIG. 14 shows a top view of the OLED device 1500, and FIG. 15 illustrates a cross-sectional view of a structure of the OLED device 1500. In FIG. 14, a cathode 1550 is illustrated as a single monolithic or continuous structure having or defining a plurality of apertures or holes 1560 formed therein, which correspond to regions of the device 1500 where a cathode material was not deposited. This is further illustrated in FIG. 15, which shows the OLED device 1500 including a base substrate 1510, an anode 1520, organic layers 1530, a nucleation promoting coating 1540, a nucleation inhibiting coating 1570 selectively deposited over certain regions of the nucleation promoting coating 1540, and the cathode 1550 deposited over other regions of the nucleation promoting coating 1540 where the nucleation inhibiting coating 1570 is not present. More specifically, by selectively depositing the nucleation inhibiting coating 1570 to cover certain regions of a surface of the nucleation promoting coating 1540 during the fabrication of the device 1500, the cathode material is selectively deposited on exposed regions of the surface of the nucleation promoting coating 1540 using an open mask or a mask-free deposition process. The transparency or transmittance of the OLED device 1500 may be adjusted or modified by changing various parameters of an imparted pattern, such as an average size of the holes 1560 and a density of the holes 1560 formed in the cathode 1550. Accordingly, the OLED device 1500 may be a substantially transparent OLED device, which allows at least a portion of an external light incident on the OLED device to be transmitted therethrough. For example, the OLED device 1500 may be a substantially transparent OLED lighting panel. Such OLED lighting panel may be, for example, configured to emit light in one direction (e.g., either towards or away from the base substrate 1510) or in both directions (e.g., towards and away from the base substrate 1510).

Figure 16:
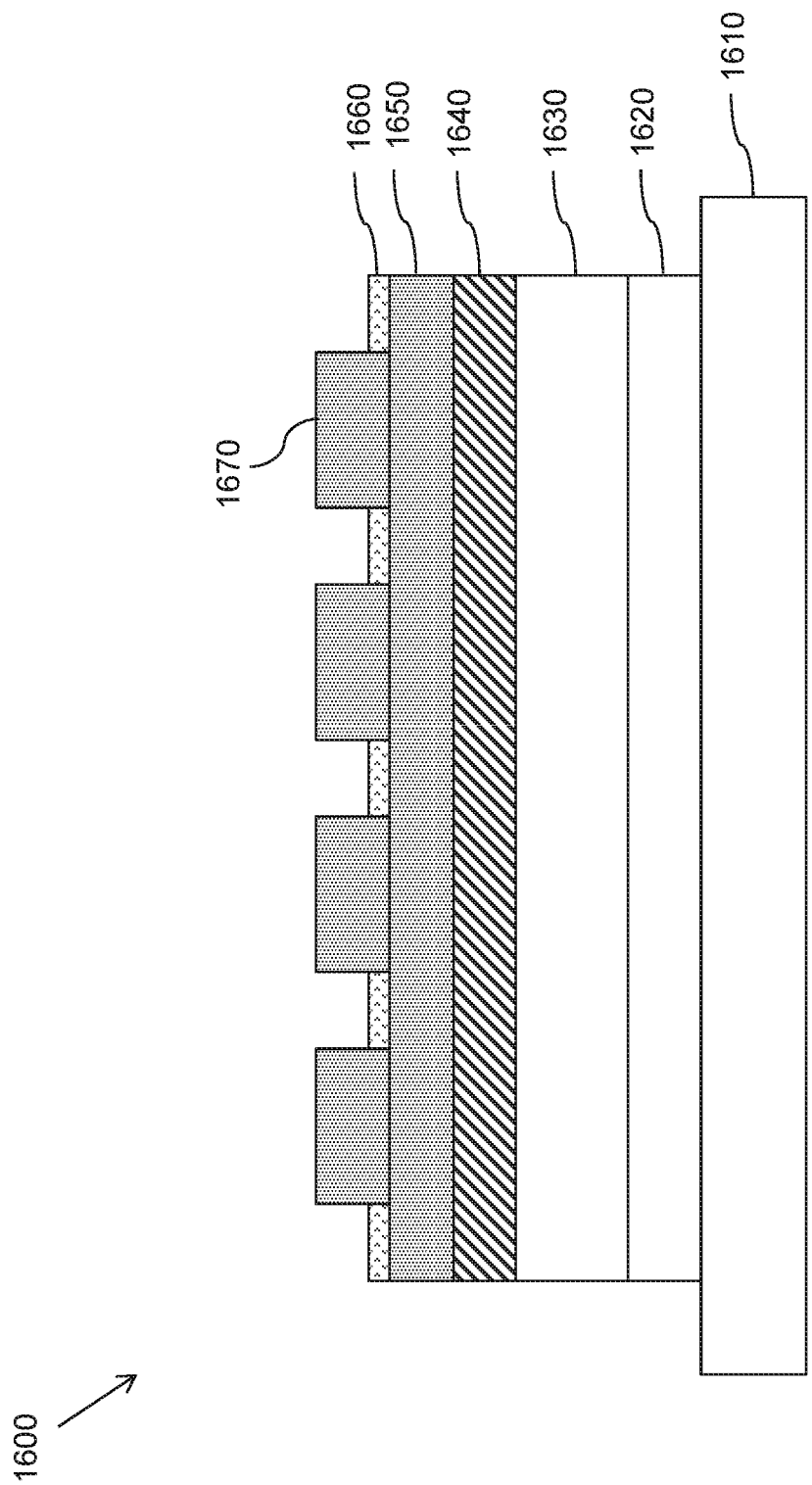
FIG. 16 is a cross-sectional view of an OLED device according to another embodiment.

FIG. 16 illustrates an OLED device 1600 according to another embodiment in which a cathode 1650 substantially covers an entire device area. Specifically, the OLED device 1600 includes a base substrate 1610, an anode 1620, organic layers 1630, a nucleation promoting coating 1640, the cathode 1650, a nucleation inhibiting coating 1660 selectively deposited over certain regions of the cathode 1650, and an auxiliary electrode 1670 deposited over other regions of the cathode 1650 where the nucleation inhibiting coating 1660 is not present.

The auxiliary electrode 1670 is electrically connected to the cathode 1650. Particularly in a top-emission configuration, it is desirable to deposit a relatively thin layer of the cathode 1650 to reduce optical interference (e.g., attenuation, reflection, diffusion, and so forth) due to the presence of the cathode 1650. However, a reduced thickness of the cathode 1650 generally increases a sheet resistance of the cathode 1650, thus reducing the performance and efficiency of the OLED device 1600. By providing the auxiliary electrode 1670 that is electrically connected to the cathode 1650, the sheet resistance and thus the IR drop associated with the cathode 1650 can be decreased. Furthermore, by selectively depositing the auxiliary electrode 1670 to cover certain regions of the device area while other regions remain uncovered, optical interference due to the presence of the auxiliary electrode 1670 may be controlled and/or reduced.

Figure 48:
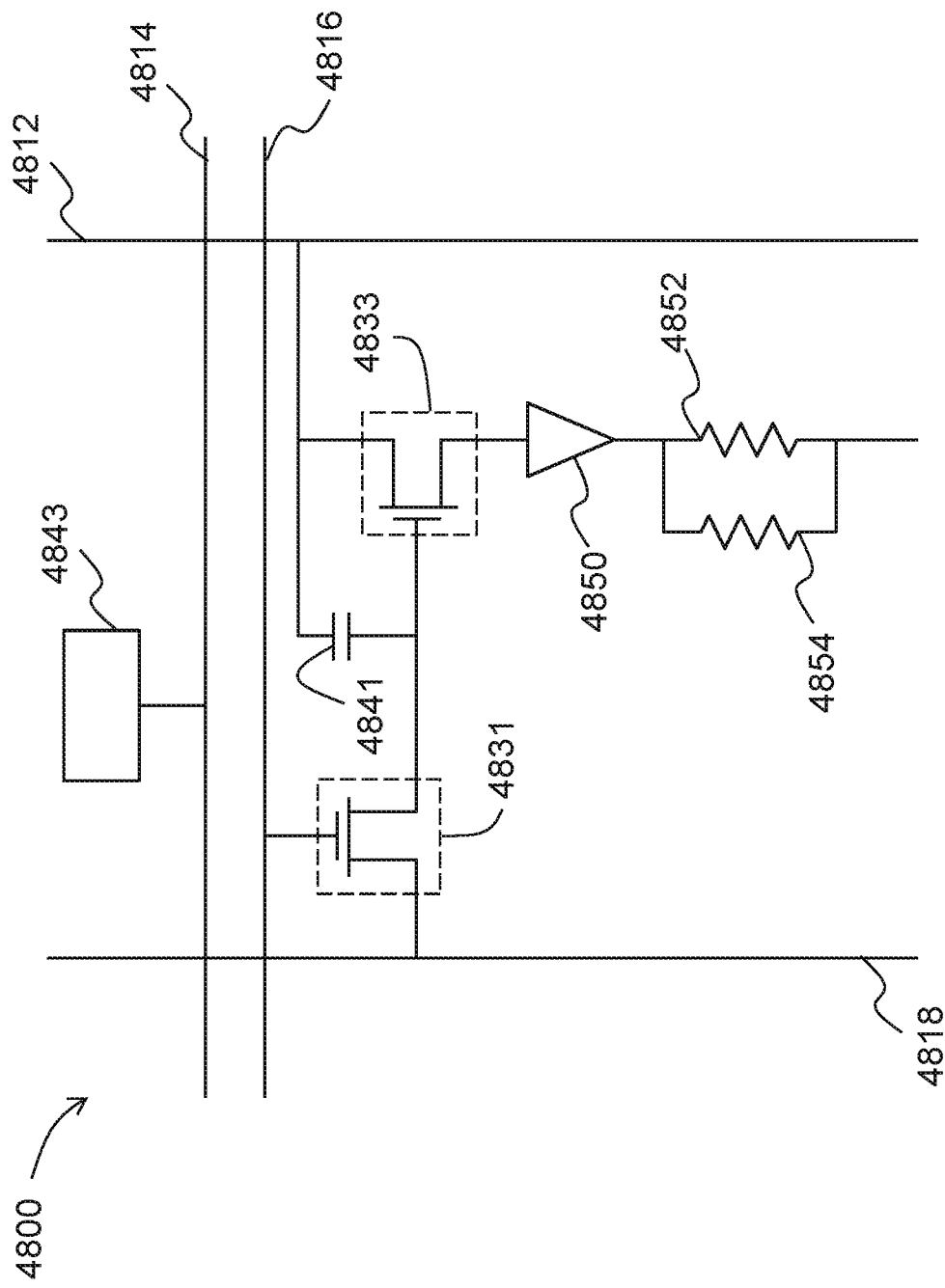
FIG. 48 is a circuit diagram showing an example driving circuit for an active matrix OLED display device.

The effect of an electrode sheet resistance will now be explained with reference to FIG. 48, which shows an example of a circuit diagram for a top-emission active matrix OLED (AMOLED) pixel with a p-type TFT. In FIG. 48, a circuit 4800 includes a power supply (VDD) line 4812, a control line 4814, a gate line 4816, and a data line 4818. A driving circuit including a first TFT 4831, a second TFT 4833, and a storage capacitor 4841 is provided, and the driving circuit components are connected to the data line 4818, the gate line 4816, and the VDD line 4812 in the manner illustrated in the figure. A compensation circuit 4843 is also provided, which generally acts to compensate for any deviation in transistor properties caused by manufacturing variances or degradation of the TFTs 4831 and 4833 over time.

An OLED pixel or subpixel 4850 and a cathode 4852, which is represented as a resistor in the circuit diagram, are connected in series with the second TFT 4833 (also referred to as a "driving transistor"). The driving transistor 4833 regulates a current passed through the OLED pixel 4850 in accordance with a voltage of a charge stored in the storage capacitor 4841, such that the OLED pixel 4850 outputs a desired luminance. The voltage of the storage capacitor 4841 is set by connecting the storage capacitor 4841 to the data line 4818 via the first TFT 4831 (also referred to as a "switch transistor").

Since the current through the OLED pixel or subpixel 4850 and the cathode 4852 is regulated based on a potential difference between a gate voltage and a source voltage of the driving transistor 4833, an increase in a sheet resistance of the cathode 4852 results in a greater IR drop, which is compensated by increasing the power supply (VDD). However, when the VDD is increased, other voltages supplied to the TFT 4833 and the OLED pixel 4850 are also increased to maintain proper operation, and thus is unfavorable.

Referring to FIG. 48, an auxiliary electrode 4854 is illustrated as a resistor connected in parallel to the cathode 4852. Since the resistance of the auxiliary electrode 4854 is substantially lower than that of the cathode 4852, a combined effective resistance of the auxiliary electrode 4854 and the cathode 4852 is lower than that of the cathode 4852 alone. Accordingly, an increase in the VDD can be mitigated by the presence of the auxiliary electrode 4854.

While the advantages of auxiliary electrodes have been explained in reference to top-emission OLED devices, it may also be advantageous to selectively deposit an auxiliary electrode over a cathode of a bottom-emission or double-sided emission OLED device. For example, while the cathode may be formed as a relatively thick layer in a bottom-emission OLED device without substantially affecting optical characteristics of the device, it may still be advantageous to form a relatively thin cathode. For example, in a transparent or semi-transparent display device, layers of the entire device including a cathode can be formed to be substantially transparent or semi-transparent. Accordingly, it may be beneficial to provide a patterned auxiliary electrode which cannot be readily detected by a naked eye from a typical viewing distance. It will also be appreciated that the described processes may be used to form busbars or auxiliary electrodes for decreasing a resistance of electrodes for devices other than OLED devices.

In some embodiments, a nucleation inhibiting coating deposited during a fabrication process may be removed by using, for example, a solvent or plasma etching after a conductive coating has been deposited.

FIG. 59A illustrates a device 5901 according to one embodiment, which includes a substrate 5910 and a nucleation inhibiting coating 5920 and a conductive coating 5915 (e.g., a magnesium coating) deposited over respective regions of a surface of the substrate 5910.

FIG. 59B illustrates a device 5902 after the nucleation inhibiting coating 5920 present in the device 5901 has been removed from the surface of the substrate 5910, such that the conductive coating 5915 remains on the substrate 5910 and regions of the substrate 5910 which were covered by the nucleation inhibiting coating 5920 are now exposed or uncovered. For example, the nucleation inhibiting coating 5920 of the device 5901 may be removed by exposing the substrate 5910 to solvent or plasma which preferentially reacts and/or etches away the nucleation inhibiting coating 5920 without substantially affecting the conductive coating 5915.

At least some of the above embodiments have been described in reference to various layers or coatings, including a nucleation promoting coating, a nucleation inhibiting coating, and a conductive coating, being formed using an evaporation process. As will be understood, an evaporation process is a type of PVD process where one or more source materials are evaporated or sublimed under a low pressure (e.g., vacuum) environment and deposited on a target surface through de-sublimation of the one or more evaporated source materials. A variety of different evaporation sources may be used for heating a source material, and, as such, it will be appreciated that the source material may be heated in various ways. For example, the source material may be heated by an electric filament, electron beam, inductive heating, or by resistive heating. In addition, such layers or coatings may be deposited and/or patterned using other suitable processes, including photolithography, printing, OVPD, LITI patterning, and combinations thereof. These processes may also be used in combination with a shadow mask to achieve various patterns.

For example, magnesium may be deposited at source temperatures up to about 600° C. to achieve a faster rate of deposition, such as about 10 to 30 nm per second or more. Referring to Table 1 below, various deposition rates measured using a Knudsen cell source to deposit substantially pure magnesium on a fullerene-treated organic surface of about 1 nm are provided. It will be appreciated that other factors may also affect a deposition rate including, but not limited to, a distance between a source and a substrate, characteristics of the substrate, presence of a nucleation promoting coating on the substrate, the type of source used and a shaping of a flux of material evaporated from the source.

TABLE 1

Magnesium Deposition Rate by Temperature

| Sample # | Temperature (° C.) | Rate (angstroms/s) |
|---|---|---|
| 1 | 510 | 10 |
| 2 | 525 | 40 |
| 3 | 575 | 140 |
| 4 | 600 | 160 |

It will be appreciated by those skilled in the art that particular processing conditions used may vary depending on an equipment being used to conduct a deposition. It will also be appreciated that higher deposition rates are generally attained at higher source temperatures; however, other deposition conditions can be selected, such as, for example, by placing a substrate closer to a deposition source.

It will also be appreciated that an open mask used for deposition of any of various layers or coatings, including a conductive coating, a nucleation inhibiting coating, and a nucleation promoting coating, may "mask" or prevent deposition of a material on certain regions of a substrate. However, unlike a fine metal mask (FMM) used to form relatively small features with a feature size on the order of tens of microns or smaller, a feature size of an open mask is generally comparable to the size of an OLED device being manufactured. For example, the open mask may mask edges of a display device during manufacturing, which would result in the open mask having an aperture that approximately corresponds to a size of the display device (e.g. about 1 inch for micro-displays, about 4-6 inches for mobile displays, about 8-17 inches for laptop or tablet displays, and so forth). For example, the feature size of an open mask may be on the order of about 1 cm or greater.

Figure 16B:
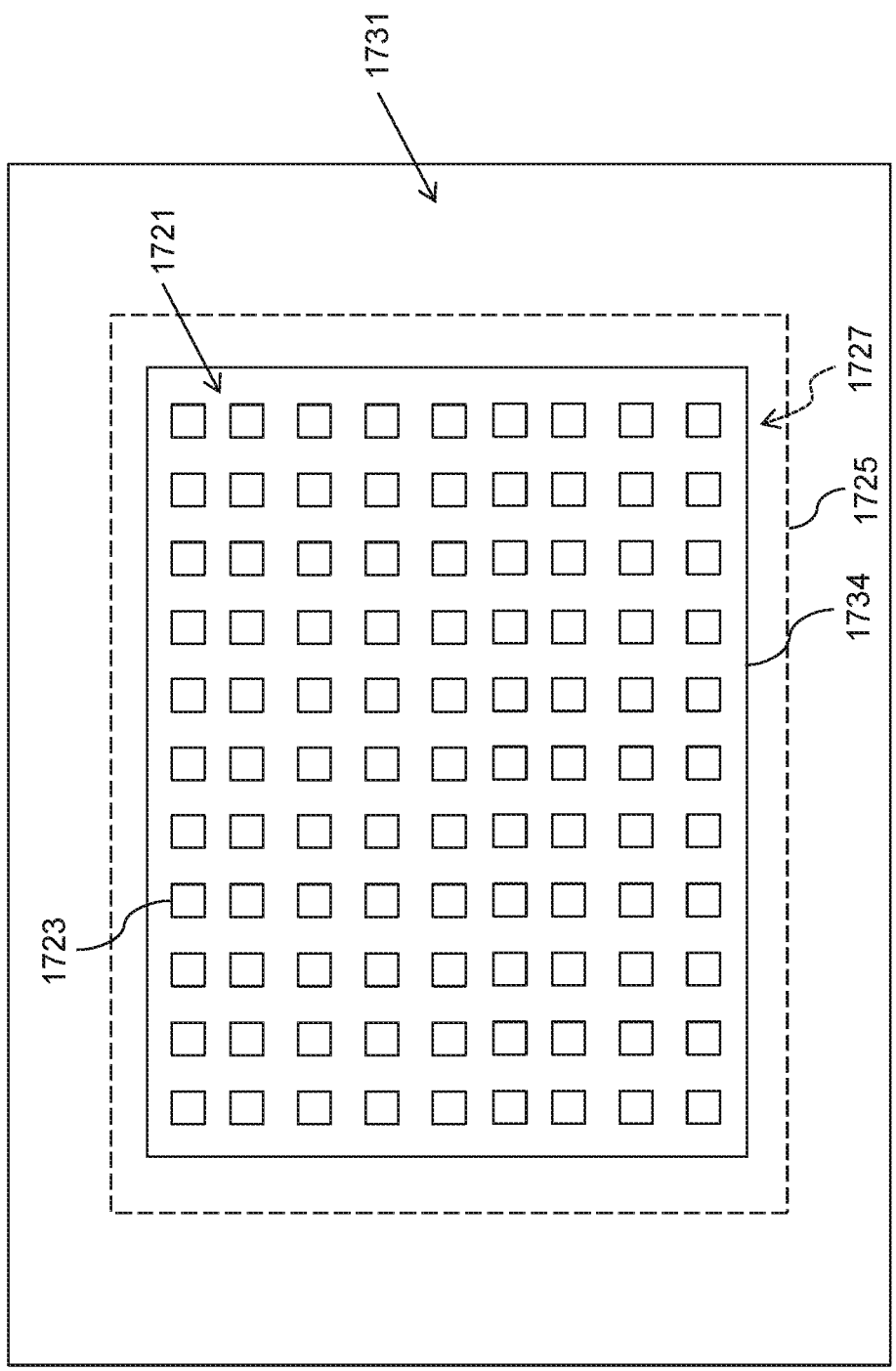
FIG. 16B is a top view illustrating an open mask according to one example.

FIG. 16B illustrates an example of an open mask 1731 having or defining an aperture 1734 formed therein. In the illustrated example, the aperture 1734 of the mask 1731 is smaller than a size of a device 1721, such that, when the mask 1731 is overlaid, the mask 1731 covers edges of the device 1721. Specifically, in the illustrated embodiments, all or substantially all emissive regions or pixels 1723 of the device 1721 are exposed through the aperture 1734, while an unexposed region 1727 is formed between outer edges 1725 of the device 1721 and the aperture 1734. As would be appreciated, electrical contacts or other device components may be located in the unexposed region 1727 such that these components remain unaffected through the open mask deposition process.

Figure 16C:
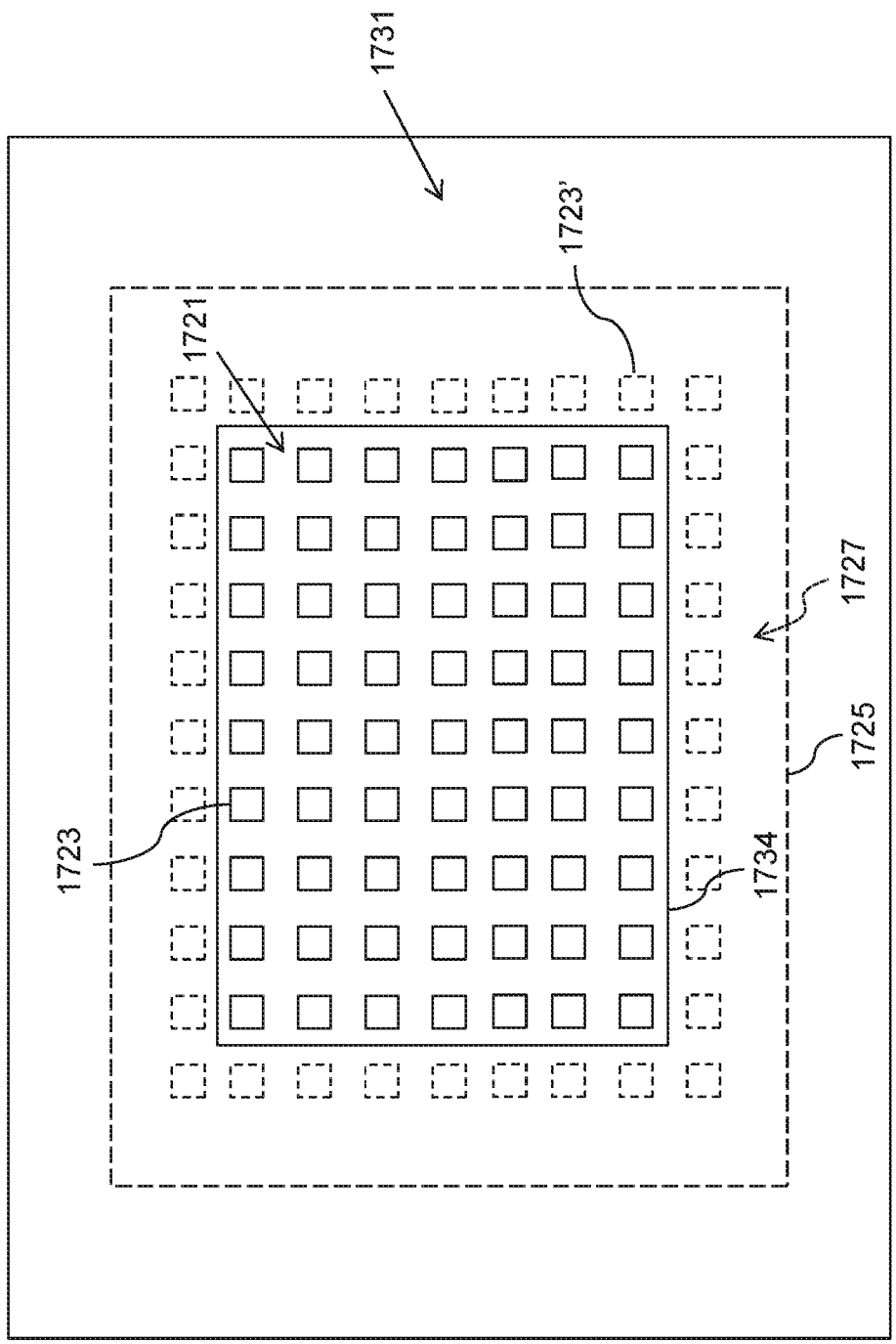
FIG. 16C is a top view illustrating an open mask according to another example.

FIG. 16C illustrates another example of an open mask 1731 where an aperture 1734 of the mask 1731 is smaller than that of FIG. 16B, such that the mask 1731 covers at least some emissive regions or pixels 1723 of a device 1721 when overlaid. Specifically, outer-most pixels 1723' are illustrated as being located within an unexposed region 1727 of the device 1721 formed between the aperture 1734 of the mask 1731 and outer edges 1725 of the device 1721.

Figure 16D:
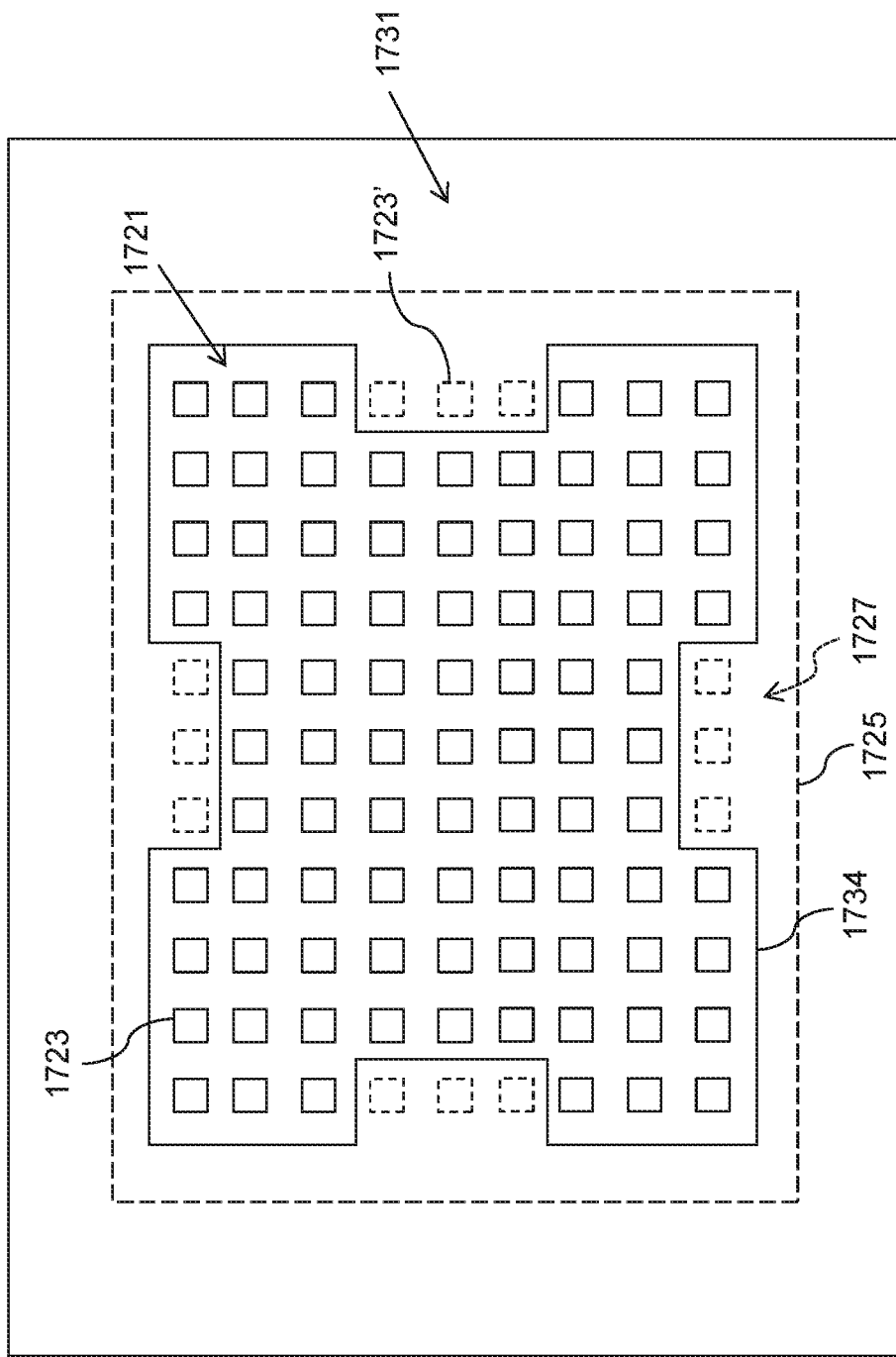
FIG. 16D is a top view illustrating an open mask according to yet another example.

FIG. 16D illustrates yet another example of an open mask 1731 wherein an aperture 1734 of the mask 1731 defines a pattern, which covers some pixels 1723' while exposing other pixels 1723 of a device 1721. Specifically, the pixels 1723' located within an unexposed region 1727 of the device 1721 (formed between the aperture 1734 and outer edges 1725) are masked during the deposition process to inhibit a vapor flux from being incident on the unexposed region 1727.

While outer-most pixels have been illustrated as being masked in the examples of FIGS. 16B-16D, it will be appreciated that an aperture of an open mask may be shaped to mask other emissive and non-emissive regions of a device. Furthermore, while an open mask has been illustrated in the foregoing examples as having one aperture, the open mask may also include additional apertures for exposing multiple regions of a substrate or a device.

Figure 16E:
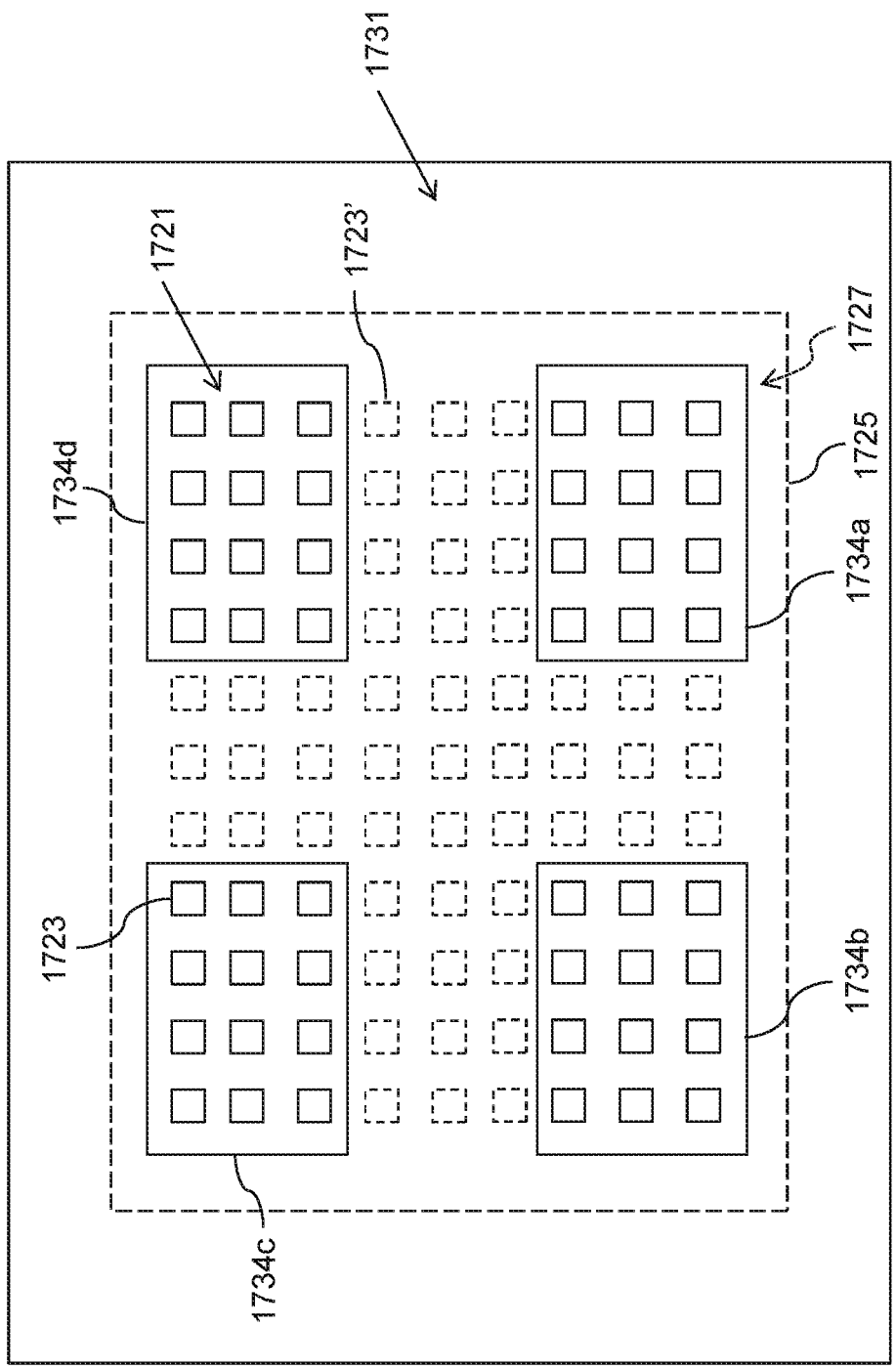
FIG. 16E is a top view illustrating an open mask according to yet another example.

FIG. 16E illustrates another example of an open mask 1731, where the mask 1731 has or defines a plurality of apertures 1734a-1734d. The apertures 1734a-1734d are positioned such that they selectively expose certain regions of a device 1721 while masking other regions. For example, certain emissive regions or pixels 1723 are exposed through the apertures 1734a-d, while other pixels 1723' located within an unexposed region 1727 are masked.

In various embodiments described herein, it will be understood that the use of an open mask may be omitted, if desired. Specifically, an open mask deposition process described herein may alternatively be conducted without the use of a mask, such that an entire target surface is exposed.

Although certain processes have been described with reference to evaporation for purposes of depositing a nucleation promoting material, a nucleation inhibiting material, and magnesium, it will be appreciated that various other processes may be used to deposit these materials. For example, deposition may be conducted using other PVD processes (including sputtering), CVD processes (including plasma enhanced chemical vapor deposition (PECVD)), or other suitable processes for depositing such materials. In some embodiments, magnesium is deposited by heating a magnesium source material using a resistive heater. In other embodiments, a magnesium source material may be loaded in a heated crucible, a heated boat, a Knudsen cell (e.g., an effusion evaporator source), or any other type of evaporation source.

A deposition source material used to deposit a conductive coating may be a mixture or a compound, and, in some embodiments, at least one component of the mixture or compound is not deposited on a substrate during deposition (or is deposited in a relatively small amount compared to, for example, magnesium). In some embodiments, the source material may be a copper-magnesium (Cu—Mg) mixture or a Cu—Mg compound. In some embodiments, the source material for a magnesium deposition source includes magnesium and a material with a lower vapor pressure than magnesium, such as, for example, Cu. In other embodiments, the source material for a magnesium deposition source is substantially pure magnesium. Specifically, substantially pure magnesium can exhibit substantially similar properties (e.g., initial sticking probabilities on nucleation inhibiting and promoting coatings) compared to pure magnesium (99.99% and higher purity magnesium). For example, an initial sticking probability of substantially pure magnesium on a nucleation inhibiting coating can be within ±10% or within ±5% of an initial sticking probability of 99.99% purity magnesium on the nucleation inhibiting coating. Purity of magnesium may be about 95% or higher, about 98% or higher, about 99% or higher, or about 99.9% or higher. Deposition source materials used to deposit a conductive coating may include other metals in place of, or in combination with, magnesium. For example, a source material may include high vapor pressure materials, such as ytterbium (Yb), cadmium (Cd), zinc (Zn), or any combination thereof.

Furthermore, it will be appreciated that the processes of various embodiments may be performed on surfaces of other various organic or inorganic materials used as an electron injection layer, an electron transport layer, an electroluminescent layer, and/or a pixel definition layer (PDL) of an organic opto-electronic device. Examples of such materials include organic molecules as well as organic polymers such as those described in PCT Publication No. WO 2012/016074. It will also be understood by persons skilled in the art that organic materials doped with various elements and/or inorganic compounds may still be considered to be an organic material. It will further be appreciated by those skilled in the art that various organic materials may be used, and the processes described herein are generally applicable to an entire range of such organic materials.

It will also be appreciated that an inorganic substrate or surface can refer to a substrate or surface primarily including an inorganic material. For greater clarity, an inorganic material will generally be understood to be any material that is not considered to be an organic material. Examples of inorganic materials include metals, glasses, and minerals. Specifically, a conductive coating including magnesium may be deposited using a process according to the present disclosure on surfaces of lithium fluoride (LiF), glass and silicon (Si). Other surfaces on which the processes according to the present disclosure may be applied include those of silicon or silicone-based polymers, inorganic semiconductor materials, electron injection materials, salts, metals, and metal oxides.

It will be appreciated that a substrate may include a semiconductor material, and, accordingly, a surface of such a substrate may be a semiconductor surface. A semiconductor material may be described as a material which generally exhibits a band gap. For example, such a band gap may be formed between a highest occupied molecular orbital (HOMO) and a lowest unoccupied molecular orbital (LUMO). Semiconductor materials thus generally possess electrical conductivity that is less than that of a conductive material (e.g., a metal) but greater than that of an insulating material (e.g., a glass). It will be understood that a semiconductor material may be an organic semiconductor material or an inorganic semiconductor material.

Figure 17:
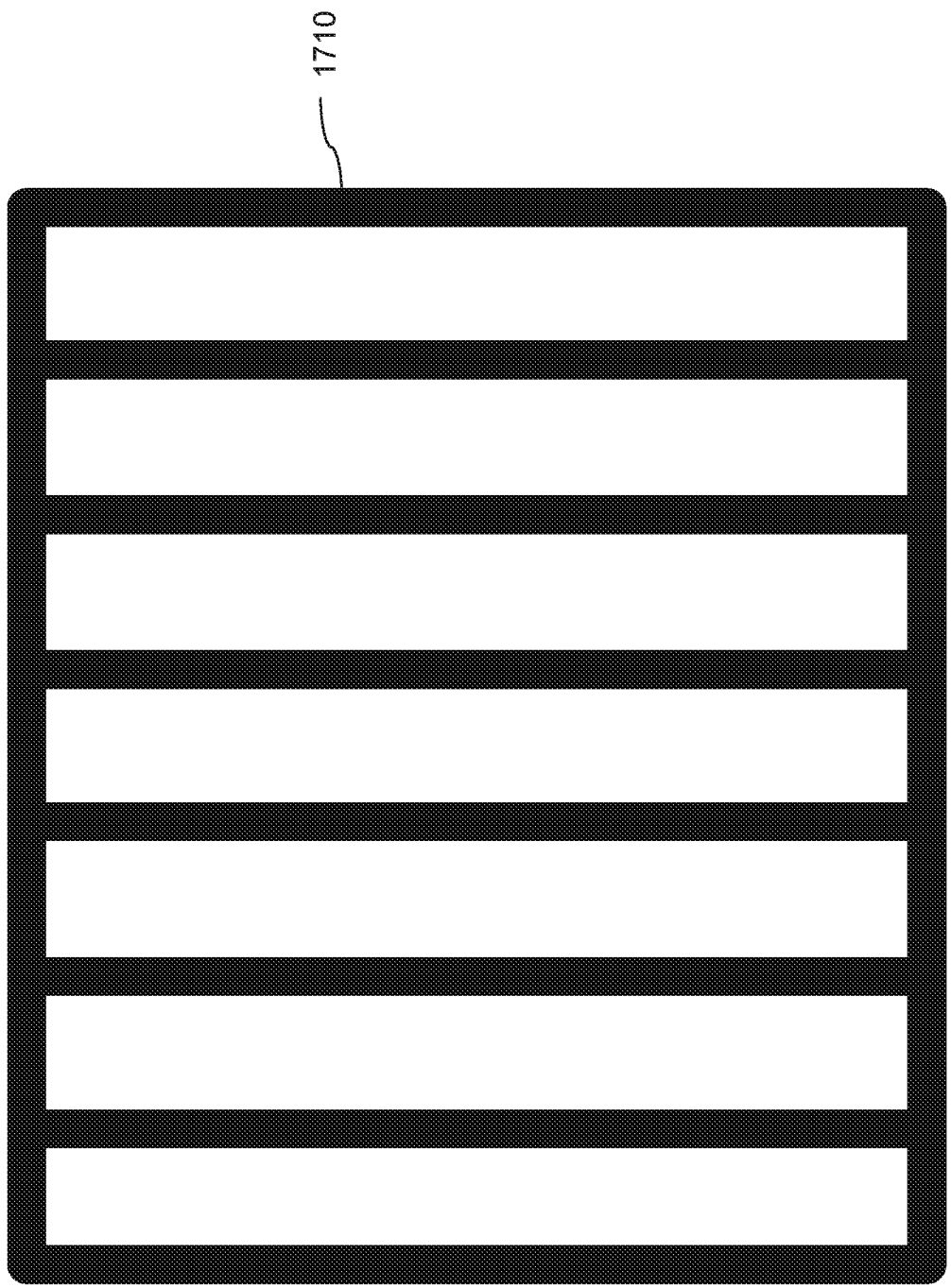
FIG. 17 is a top view illustrating a patterned electrode according to one embodiment.

FIG. 17 shows a patterned cathode 1710 according to one embodiment. The cathode 1710 is illustrated as a single monolithic or continuous structure including a plurality of substantially straight conductor segments, which are spaced apart and arranged substantially parallel with respect to one another. Each conductor segment is connected at both of its ends to end conductor segments, which are arranged substantially perpendicular to the plurality of substantially straight conductor segments. The cathode 1710 can be formed in accordance with the deposition processes described above.

Figure 17B:
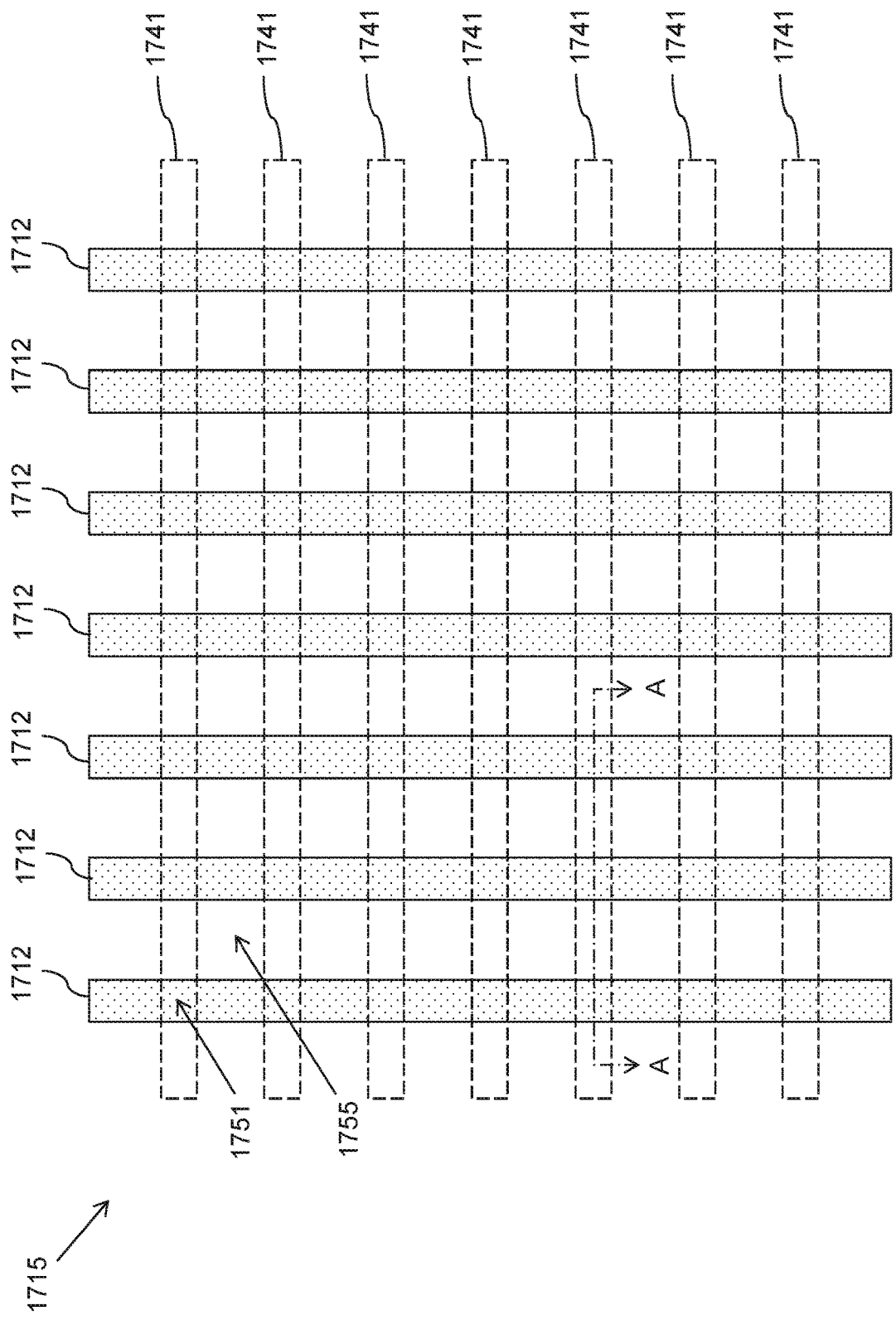
FIG. 17B is a schematic diagram illustrating a top view of a passive matrix OLED device according to one embodiment.

FIG. 17B shows a patterned cathode 1712 according to another embodiment, in which the cathode 1712 includes a plurality of spaced apart and elongated conductive strips. For example, the cathode 1712 may be used in a passive matrix OLED device (PMOLED) 1715. In the PMOLED device 1715, emissive regions or pixels are generally formed at regions where counter-electrodes overlap. Accordingly, in the embodiment of FIG. 17B, emissive regions or pixels 1751 are formed at overlapping regions of the cathode 1712 and an anode 1741, which includes a plurality of spaced apart and elongated conductive strips. Non-emissive regions 1755 are formed at regions where the cathode 1712 and the anode 1741 do not overlap. Generally, the strips of the cathode 1712 and the strips of the anode 1741 are oriented substantially perpendicular to each other in the PMOLED device 1715 as illustrated. The cathode 1712 and the anode 1741 may be connected to a power source and associated driving circuitry for supplying current to the respective electrodes.

Figure 17C:
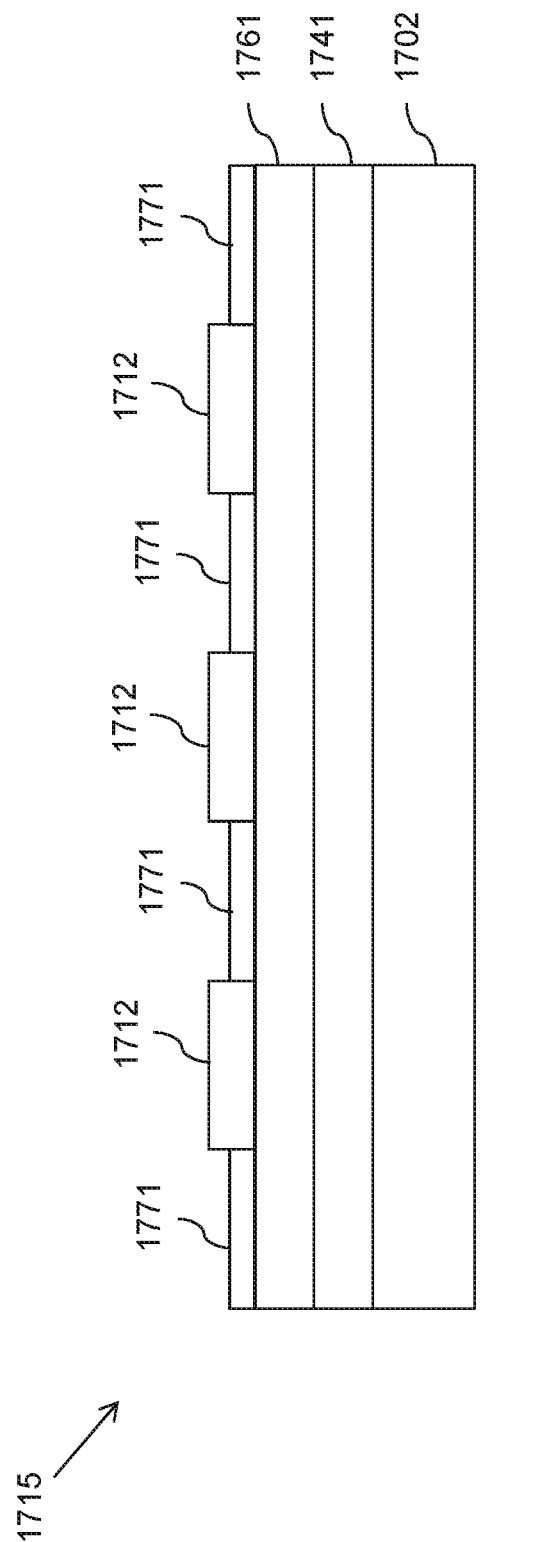
FIG. 17C is a schematic cross-sectional view of the passive matrix OLED device of FIG. 17B.

FIG. 17C illustrates a cross-sectional view taken along line A-A in FIG. 17B. In FIG. 17C, a base substrate 1702 is provided, which may be, for example, a transparent substrate. The anode 1741 is provided over the base substrate 1702 in the form of strips as illustrated in FIG. 17B. One or more organic layers 1761 are deposited over the anode 1741. For example, the organic layers 1761 may be provided as a common layer across the entire device, and may include any number of layers of organic and/or inorganic materials described herein, such as hole injection and transport layers, an electroluminescence layer, and electron transport and injection layers. Certain regions of a top surface of the organic layers 1761 are illustrated as being covered by a nucleation inhibition coating 1771, which is used to selectively pattern the cathode 1712 in accordance with the deposition processes described above. The cathode 1712 and the anode 1741 may be connected to their respective drive circuitry (not shown), which controls emission of light from the pixels 1751.

While thicknesses of the nucleation inhibiting coating 1771 and the cathode 1712 may be varied depending on the desired application and performance, at least in some embodiments, the thickness of the nucleation inhibiting coating 1771 may be comparable to, or substantially less than, the thickness of the cathode 1712 as illustrated in FIG. 17C. The use of a relatively thin nucleation inhibiting coating to achieve patterning of a cathode may be particularly advantageous for flexible PMOLED devices, since it can provide a relatively planar surface onto which a barrier coating may be applied.

Figure 17D:
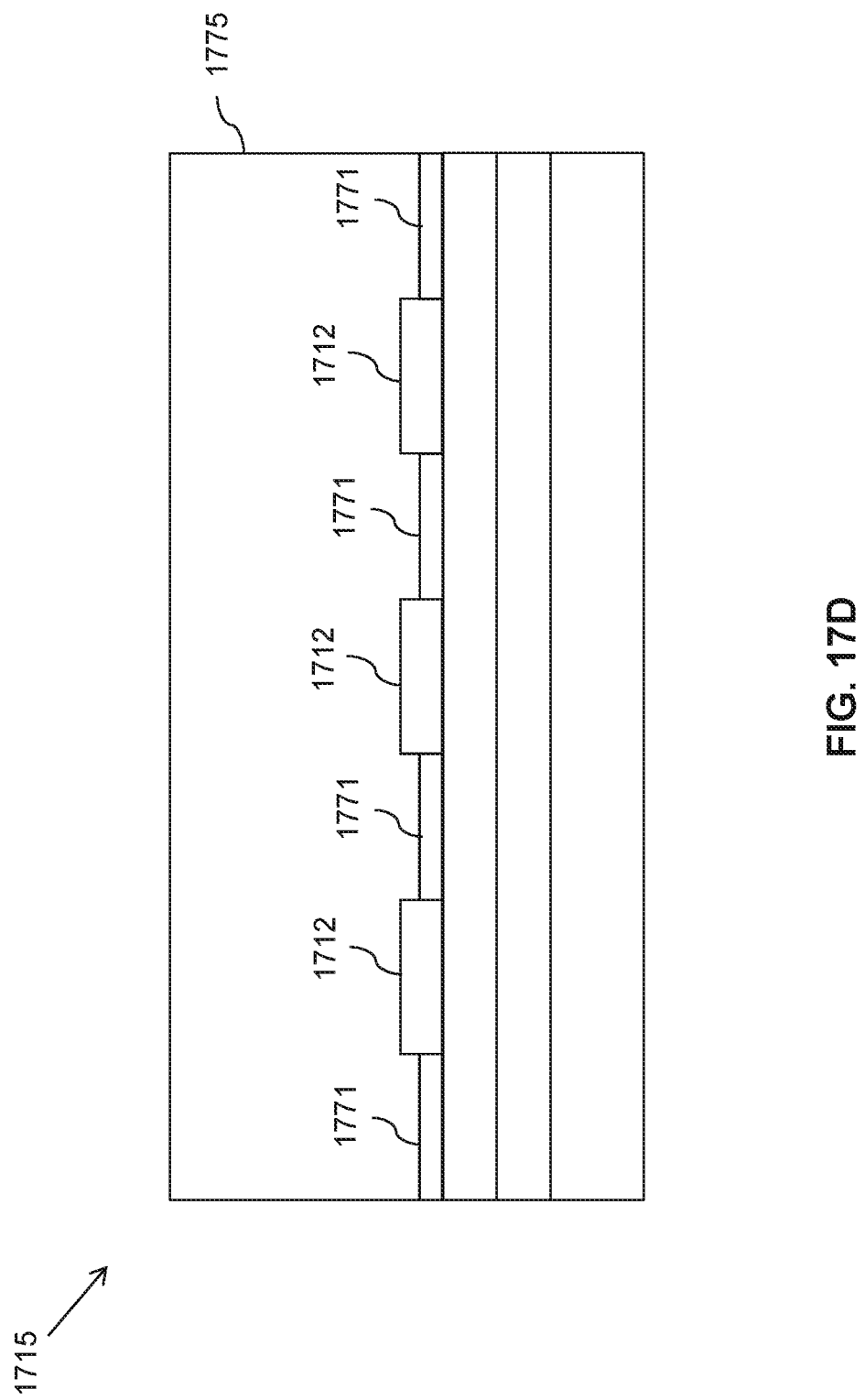
FIG. 17D is a schematic cross-sectional view of the passive matrix OLED device of FIG. 17B after encapsulation.

FIG. 17D illustrates the PMOLED device 1715 of FIG. 17C with a barrier coating 1775 applied over the cathode 1712 and the nucleation inhibiting coating 1771. As will be appreciated, the barrier coating 1775 is generally provided to inhibit the various device layers, including organic layers and the cathode 1712 which may be prone to oxidation, from being exposed to moisture and ambient air. For example, the barrier coating 1775 may be a thin film encapsulation formed by printing, CVD, sputtering, atomic-layer deposition (ALD), any combinations of the foregoing, or by any other suitable methods. The barrier coating 1775 may also be provided by laminating a pre-formed barrier film onto the device 1715 using an adhesive (not shown). For example, the barrier coating 1775 may be a multi-layer coating comprising organic materials, inorganic materials, or combination of both. The barrier coating 1775 may further comprise a getter material and/or a desiccant.

Figure 17E:
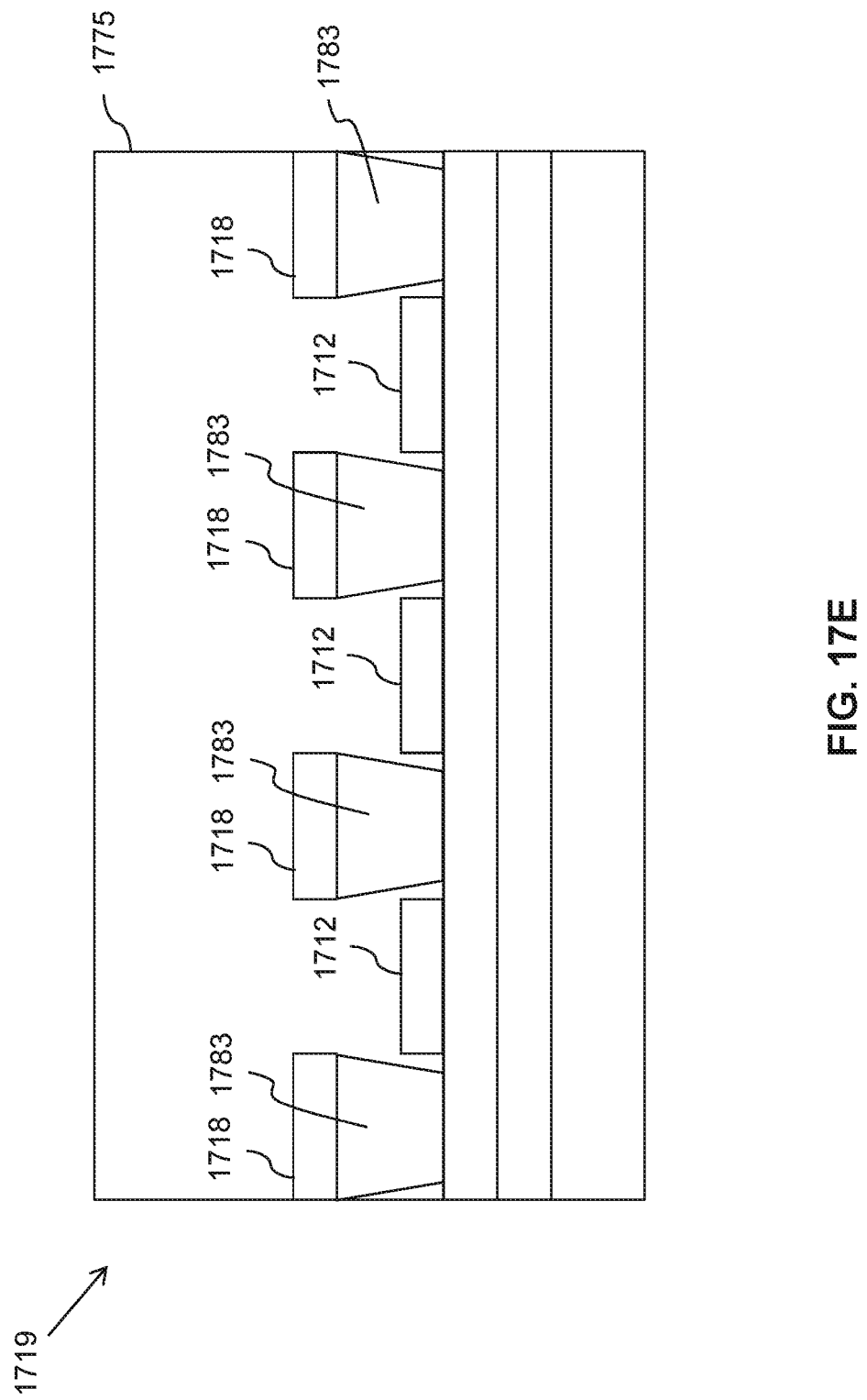
FIG. 17E is a schematic cross-sectional view of a comparative passive matrix OLED device.

For comparative purposes, an example of a comparative PMOLED device 1719 is illustrated in FIG. 17E. In the comparative example of FIG. 17E, a plurality of pixel definition structures 1783 are provided in non-emissive regions of the device 1719, such that when a conductive material is deposited using an open mask or a mask-free deposition process, the conductive material is deposited on both emissive regions located between neighboring pixel definition structures 1783 to form the cathode 1712, as well as on top of the pixel definition structures 1783 to form conductive strips 1718. However, in order to ensure that each segment of the cathode 1712 is electrically isolated from the conductive strips 1718, a thickness or height of the pixel definition structures 1783 are formed to be greater than a thickness of the cathode 1712. The pixel definition structures 1783 may also have an undercut profile to further decrease the likelihood of the cathode 1712 coming in electrical contact with the conductive strips 1718. The barrier coating 1775 is provided to cover the PMOLED device 1719 including the cathode 1712, the pixel definition structures 1783, and the conductive strips 1718.

In the comparative PMOLED device 1719 illustrated in FIG. 17E, the surface onto which the barrier coating 1775 is applied is non-uniform due to the presence of the pixel definition structures 1783. This makes the application of the barrier coating 1775 difficult, and even upon the application of the barrier coating 1775, the adhesion of the barrier coating 1775 to the underlying surface may be relatively poor. Poor adhesion increases the likelihood of the barrier coating 1775 peeling off the device 1719, particularly when the device 1719 is bent or flexed. Additionally, there is a relatively high probability of air pockets being trapped between the barrier coating 1775 and the underlying surface during the application procedure due to the non-uniform surface. The presence of air pockets and/or peeling of the barrier coating 1775 can cause or contribute to defects and partial or total device failure, and thus is highly undesirable. These factors are mitigated or reduced in the embodiment of FIG. 17D.

While the patterned cathodes 1710 and 1712 shown in FIGS. 17 and 17B may be used to form a cathode of an OLED device, it is appreciated that a similar pattern may be used to form an auxiliary electrode for an OLED device. Specifically, such an OLED device may be provided with a common cathode, and an auxiliary electrode deposited on top of, or beneath, the common cathode such that the auxiliary electrode is in electrical communication with the common cathode. For example, such an auxiliary electrode may be implemented in an OLED device including a plurality of emissive regions (e.g., an AMOLED device) such that the auxiliary electrode is formed over non-emissive regions, and not over the emissive regions. In another example, an auxiliary electrode may be provided to cover non-emissive regions as well as at least some emissive regions of an OLED device.

FIG. 18A depicts a portion of an OLED device 1800 including a plurality of emissive regions 1810a-1810f and a non-emissive region 1820. For example, the OLED device 1800 may be an AMOLED device, and each of the emissive regions 1810a-1810f may correspond to a pixel or a subpixel of such a device. For sake of simplicity, FIGS. 18B-18D depict a portion of the OLED device 1800. Specifically, FIGS. 18B-18D show a region surrounding a first emissive region 1810a and a second emissive region 1810b, which are two neighboring emissive regions. While not explicitly illustrated, a common cathode may be provided that substantially covers both emissive regions and non-emissive regions of the device 1800.

In FIG. 18B, an auxiliary electrode 1830 according to one embodiment is shown, in which the auxiliary electrode 1830 is disposed between the two neighboring emissive regions 1810a and 1810b. The auxiliary electrode 1830 is electrically connected to the common cathode (not shown). Specifically, the auxiliary electrode 1830 is illustrated as having a width (a), which is less than a separation distance (d) between the neighboring emissive regions 1810a and 1810b, thus creating a non-emissive gap region on each side of the auxiliary electrode 1830. For example, such an arrangement may be desirable in the device 1800 where the separation distance between the neighboring emissive regions 1810*a* and 1810*b* are sufficient to accommodate the auxiliary electrode 1830 of sufficient width, since the likelihood of the auxiliary electrode 1830 interfering with an optical output of the device 1800 can be reduced by providing the non-emissive gap regions. Furthermore, such an arrangement may be particularly beneficial in cases where the auxiliary electrode 1830 is relatively thick (e.g., greater than several hundred nanometers or on the order a few microns thick). For example, a ratio of a height or a thickness of the auxiliary electrode 1830 relative to its width (namely, an aspect ratio) may be greater than about 0.05, such as about 0.1 or greater, about 0.2 or greater, about 0.5 or greater, about 0.8 or greater, about 1 or greater, or about 2 or greater. For example, the height or the thickness of the auxiliary electrode 1830 may be greater than about 50 nm, such as about 80 nm or greater, about 100 nm or greater, about 200 nm or greater, about 500 nm or greater, about 700 nm or greater, about 1000 nm or greater, about 1500 nm or greater, about 1700 nm or greater, or about 2000 nm or greater.

In FIG. 18C, an auxiliary electrode 1832 according to another embodiment is shown. The auxiliary electrode 1832 is electrically connected to the common cathode (not shown). As illustrated, the auxiliary electrode 1832 has substantially the same width as the separation distance between the two neighboring emissive regions 1810*a* and 1810*b*, such that the auxiliary electrode 1832 substantially fully occupies the entire non-emissive region provided between the neighboring emissive regions 1810*a* and 1810*b*. Such an arrangement may be desirable, for example, in cases where the separation distance between the two neighboring emissive regions 1810*a* and 1810*b* is relatively small, such as in a high pixel density display device.

In FIG. 18D, an auxiliary electrode 1834 according to yet another embodiment is illustrated. The auxiliary electrode 1834 is electrically connected to the common cathode (not shown). The auxiliary electrode 1834 is illustrated as having a width (a), which is greater than the separation distance (d) between the two neighboring emissive regions 1810*a* and 1810*b*. Accordingly, a portion of the auxiliary electrode 1834 overlaps a portion of the first emissive region 1810*a* and a portion of the second emissive region 1810*b*. Such an arrangement may be desirable, for example, in cases where the non-emissive region between the neighboring emissive regions 1810*a* and 1810*b* is not sufficient to fully accommodate the auxiliary electrode 1834 of the desired width. While the auxiliary electrode 1834 is illustrated in FIG. 18D as overlapping with the first emissive region 1810*a* to substantially the same degree as the second emissive region 1810*b*, the extent to which the auxiliary electrode 1834 overlaps with an adjacent emissive region may be modulated in other embodiments. For example, in other embodiments, the auxiliary electrode 1834 may overlap to a greater extent with the first emissive region 1810*a* than the second emissive region 1810*b* and vice versa. Furthermore, a profile of overlap between the auxiliary electrode 1834 and an emissive region can also be varied. For example, an overlapping portion of the auxiliary electrode 1834 may be shaped such that the auxiliary electrode 1834 overlaps with a portion of an emissive region to a greater extent than it does with another portion of the same emissive region to create a non-uniform overlapping region.

Figure 19:
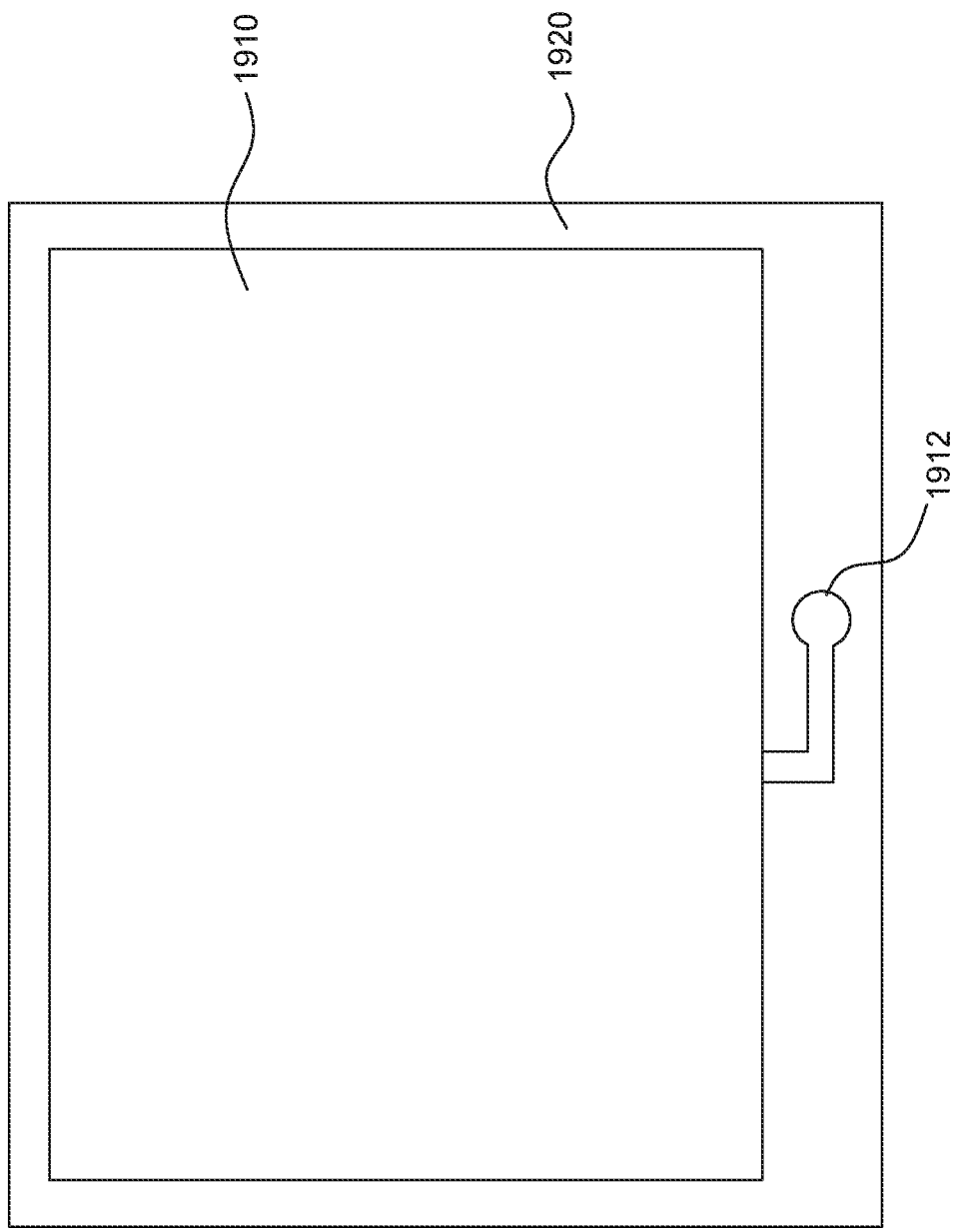
FIG. 19 illustrates a top view of a lead connected to an electrode of an OLED device according to one embodiment.

In FIG. 19, an OLED device 1900 according to one embodiment is illustrated in which an emissive region 1910 and a non-emissive region 1920 surrounding the emissive region 1910 are provided. A lead 1912 is illustrated as being formed in the non-emissive region 1920 of the device 1900. The lead 1912 is electrically connected to an electrode (not shown) covering the emissive region 1910 of the device 1900. The lead 1912 may provide a contact point for connecting to an external power supply for powering such an electrode. For example, the electrode may be connected to the external power supply via the lead 1912 by a soldering pad provided integral to the lead 1912 (to which an electrical wire may be soldered and connected to the power supply). It will be appreciated that, while not explicitly illustrated, an auxiliary electrode may be present and connected to the electrode covering the emissive region 1910 of the device 1900. Where such an auxiliary electrode is present, the lead 1912 may be directly connected to the auxiliary electrode, the electrode to which the auxiliary electrode is connected, or both.

It will be appreciated that the lead 1912 may be provided on a same plane as the electrode to which it is connected, or it may be provided on a different plane. For example, the lead 1912 may be connected to another layer of the OLED device 1900, such as a backplane through one or more vertical connections (e.g., vias).

Figure 20:
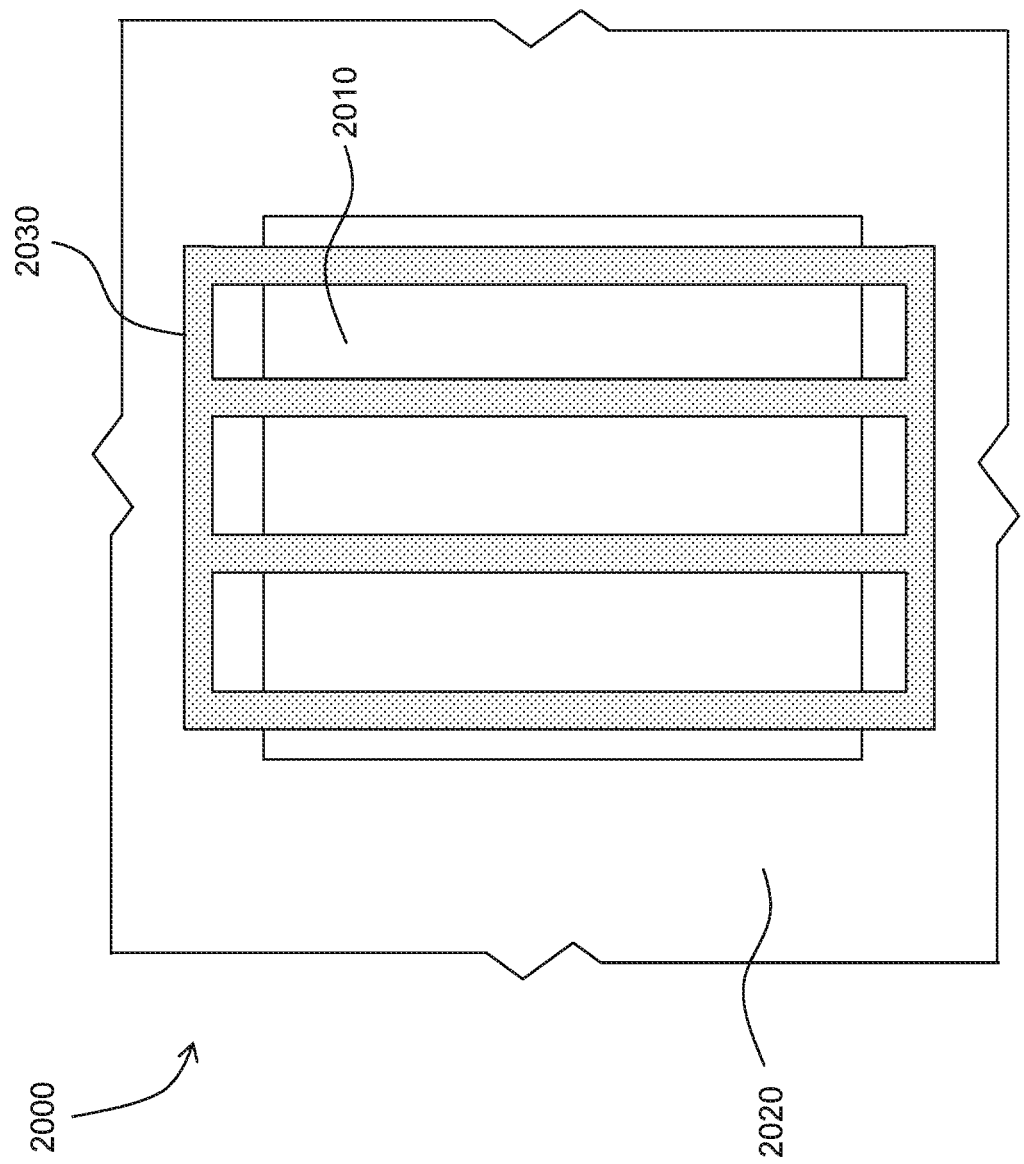
FIG. 20 illustrates a top view of a patterned electrode according to one embodiment.

FIG. 20 illustrates a portion of an OLED device 2000 according to another embodiment. The OLED device 2000 includes an emissive region 2010 and a non-emissive region 2020. The OLED device 2000 further includes a grid-like auxiliary electrode 2030, which is in electrical communication with an electrode (not shown) of the device 2000. As illustrated in FIG. 20, a first portion of the auxiliary electrode 2030 is disposed within the emissive region 2010, while a second portion of the auxiliary electrode 2030 is disposed outside of the emissive region 2010 and within the non-emissive region 2020 of the device 2000. Such an arrangement of the auxiliary electrode 2030 may allow a sheet resistance of the electrode to be reduced while keeping the auxiliary electrode 2030 from significantly interfering with an optical output of the device 2000.

Figure 21B:
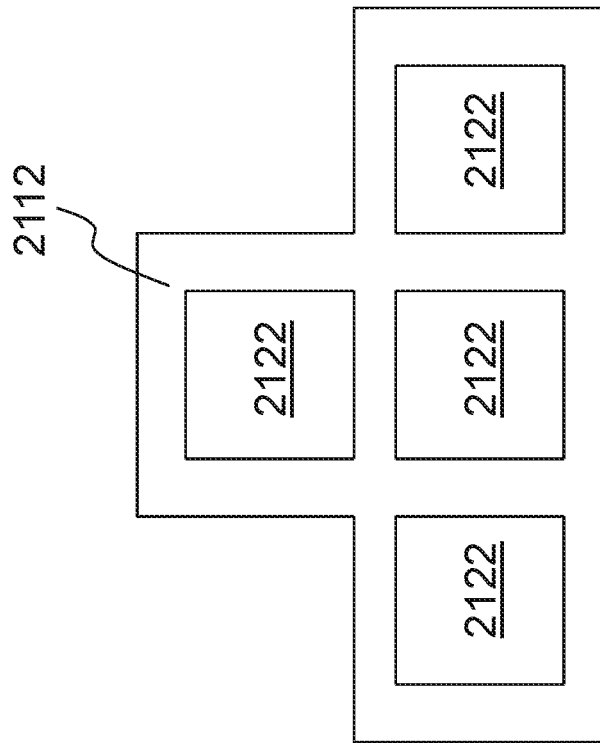
FIGS. 21A-21D illustrate patterned electrodes according to various embodiments.
Figure 21A:
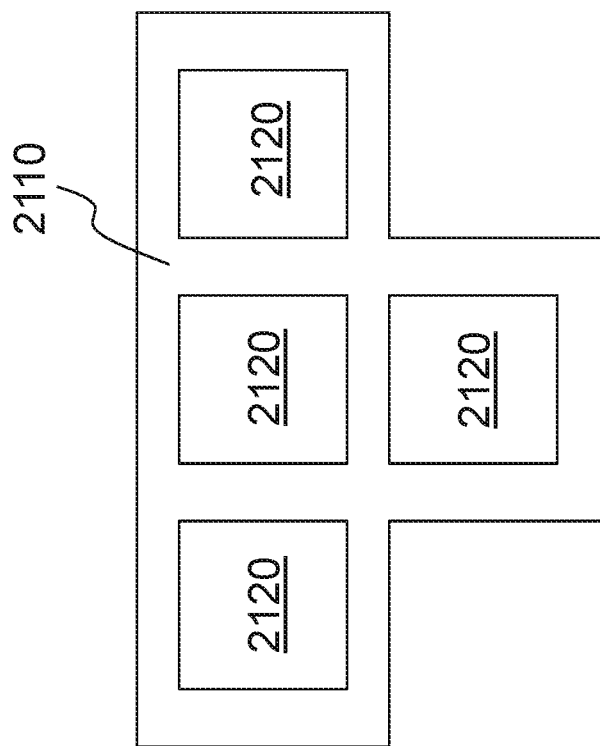
Figure 21D:
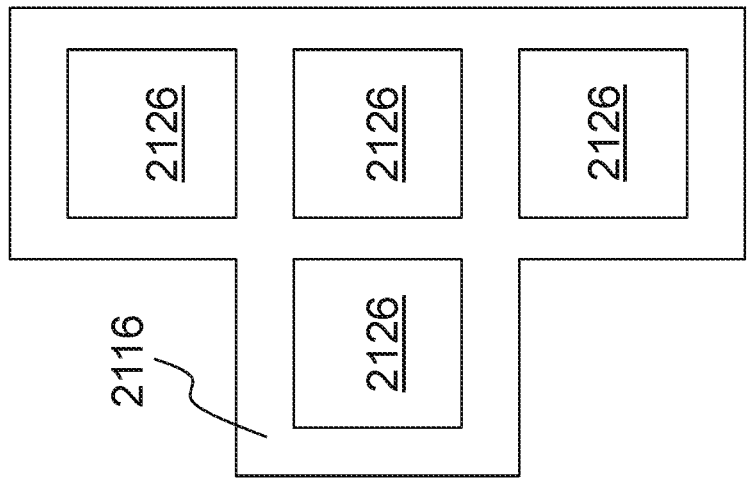
Figure 21C:
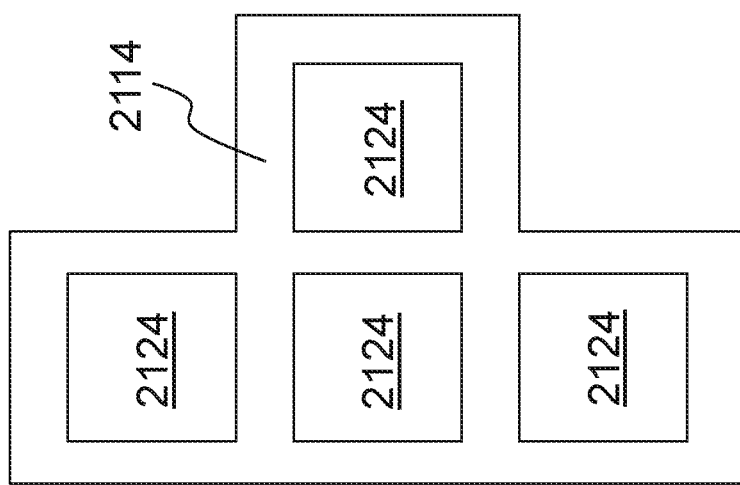

In some applications, it may be desirable to form a regular repeating pattern of an auxiliary electrode over an entire device area or a portion thereof. FIGS. 21A-21D illustrate various embodiments of repeating units of an auxiliary electrode that may be used. Specifically, in FIG. 21A, an auxiliary electrode 2110 encompasses four regions 2120 which are not covered by the auxiliary electrode 2110. The auxiliary electrode 2110 is formed such that the regions 2120 are arranged in a T-shape. For example, each of the regions 2120 may substantially correspond to an emissive region of an OLED device including a plurality of emissive regions. Accordingly, it will be appreciated that other layers or coatings, such as a common cathode, may be present in the regions 2120. In FIG. 21B, an auxiliary electrode 2112 is formed in an inverted T-shape and encompasses four uncovered regions 2122. In FIG. 21C, an auxiliary electrode 2114 is formed to encompass four uncovered regions 2124, and, similarly in FIG. 21D, an auxiliary electrode 2116 is formed to encompass four uncovered regions 2126.

Potential advantages of using repeating units of an auxiliary electrode, such as those illustrated in FIGS. 21A-21D, include ease of patterning in fabricating devices. For example, a mask used in patterning a nucleation promoting or nucleation inhibiting coating during the formation of the auxiliary electrode may be used repeatedly to pattern different portions of a device surface, thus obviating the need for more complex and/or larger masks.

Figure 22:
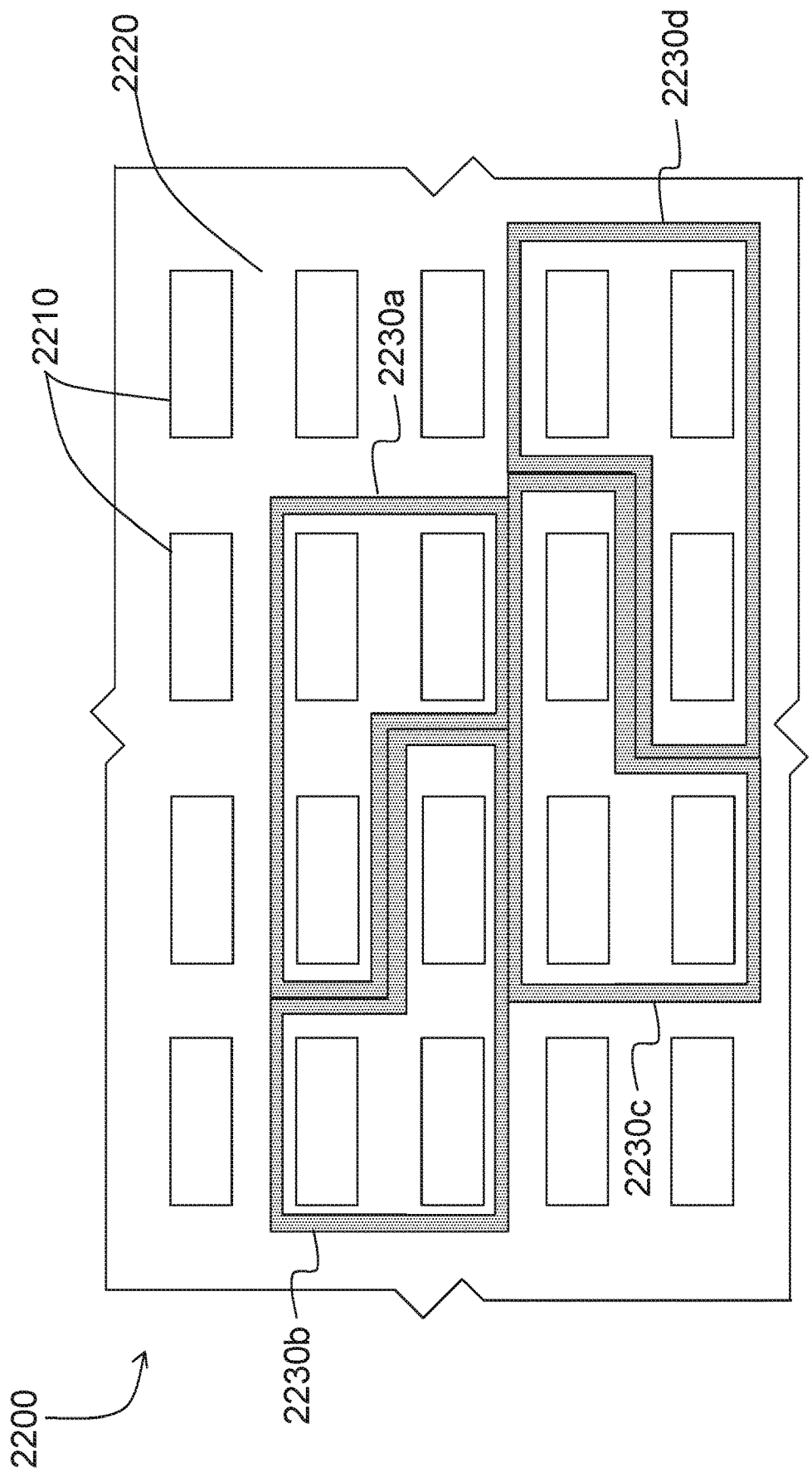
FIG. 22 illustrates repeating electrode units formed on an OLED device according to one embodiment.

FIG. 22 depicts a portion of an OLED device 2200 according to one embodiment, in which the device 2200 includes a plurality of repeating auxiliary electrode units 2230*a-d* formed thereon. Specifically, each auxiliary electrode unit 2230a-d is L-shaped and encompasses three distinct emitting regions 2210. For example, each emitting region 2210 may correspond to a pixel or a sub-pixel of the device 2200. As illustrated, neighboring auxiliary electrode units may interlock with one another. For example, a first auxiliary electrode unit 2230a is formed to be in an interlocking relationship with a second auxiliary electrode unit 2230b, and, similarly, a third auxiliary electrode unit 2230c is interlocked with a fourth auxiliary electrode unit 2230d. The auxiliary electrode units 2230a-d are formed on a non-emissive region 2220. It will be appreciated that the auxiliary electrode units 2230a-d may be formed such that they are in direct electrical communication with one another. For example, the repeating auxiliary electrode units 2230a-d may be formed integrally during fabrication. Alternatively, the auxiliary electrode units 2230a-d may be formed such that they are electrically connected via a common electrode.

Figure 23:
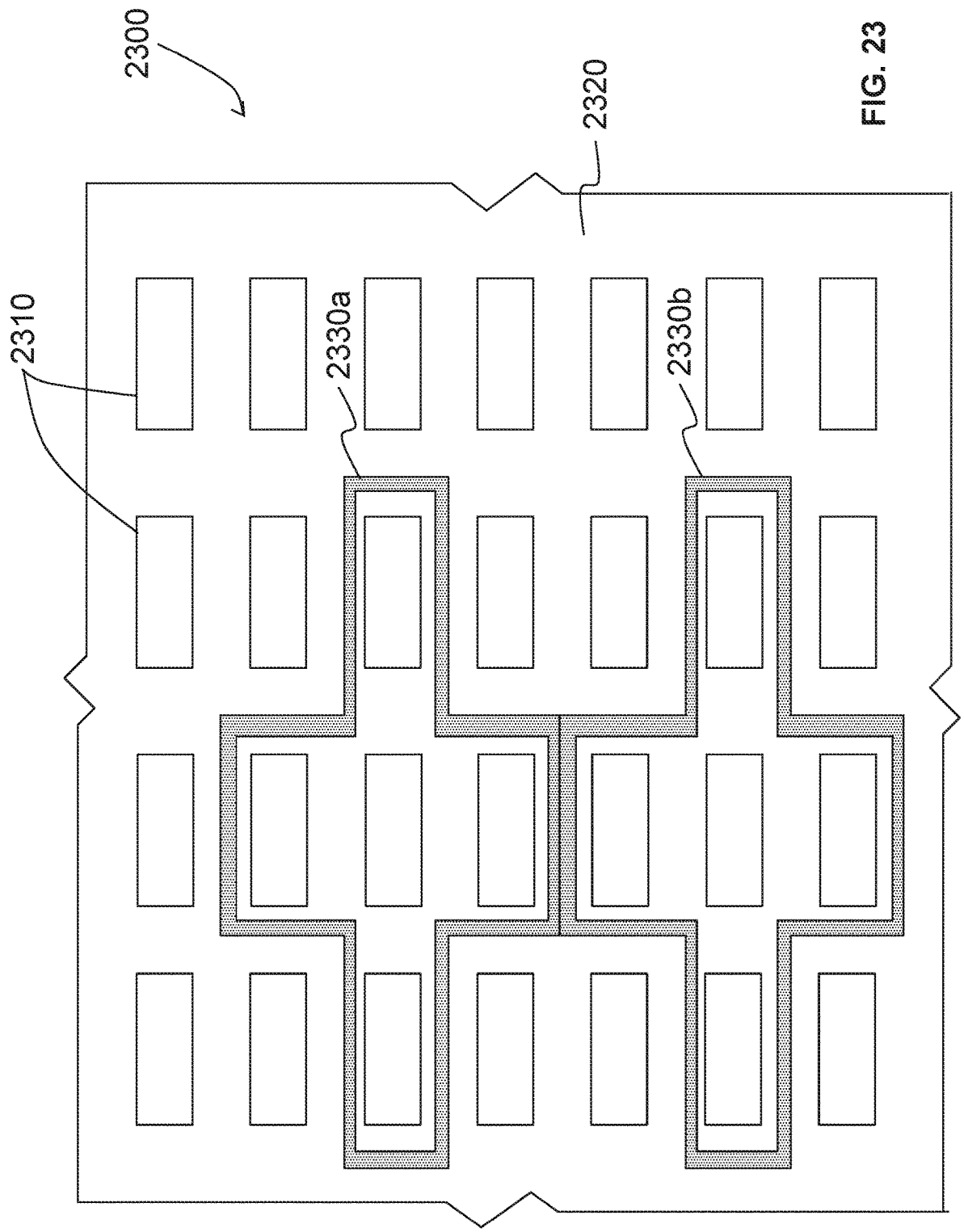
FIG. 23 illustrates repeating electrode units formed on an OLED device according to another embodiment.

FIG. 23 illustrates a portion of an OLED device 2300 according to another embodiment. In the embodiment of FIG. 23, each auxiliary electrode unit 2330a, 2330b is formed to encompass five distinct emissive regions 2310. The auxiliary electrode units 2330a and 2330b are formed on a non-emissive region 2320 of the device 2300. As illustrated, a first auxiliary electrode unit 2330a is positioned adjacent to, but not in an interlocking relationship with, a second auxiliary electrode unit 2330b.

Figure 24:
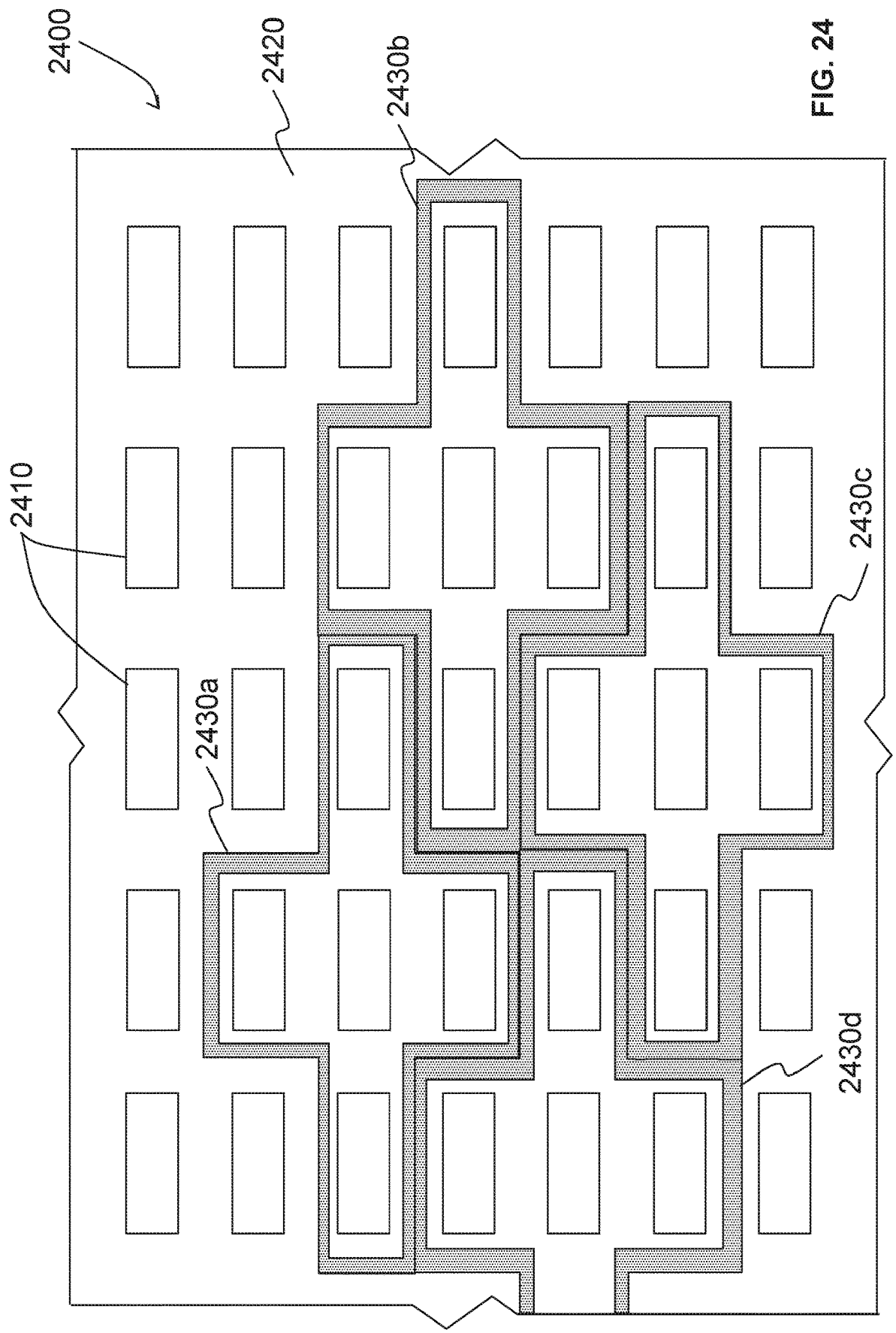
FIG. 24 illustrates repeating electrode units formed on an OLED device according to yet another embodiment.

In another embodiment illustrated in FIG. 24, similar auxiliary electrode units as those illustrated in FIG. 23 are provided. However, in FIG. 24, auxiliary electrode units 2430a-d are arranged in an interlocking relationship with one another. Similarly to the embodiment of FIG. 23, each auxiliary electrode unit 2430a-d encompasses five distinct emissive regions 2410, and are formed on a non-emissive region 2420 of a device 2400.

While various embodiments in which each auxiliary electrode unit encompasses 3, 4, or 5 emissive regions have been described and illustrated, it will be appreciated that each auxiliary electrode unit may encompass any number of emissive regions, including 1, 2, 3, 4, 5, 6, or more emissive regions.

Figure 25:
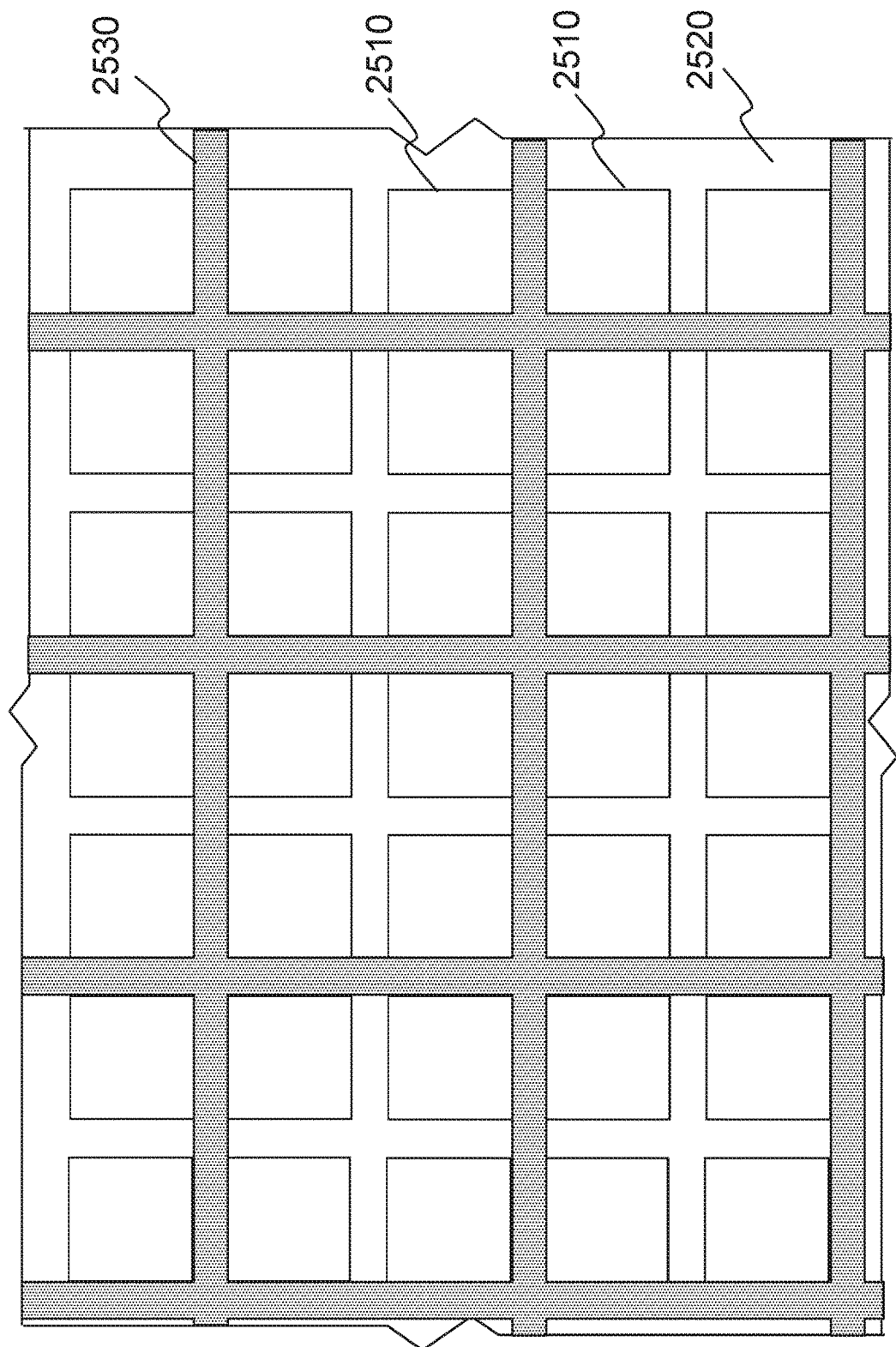
FIGS. 25-28J illustrate auxiliary electrode patterns formed on OLED devices according to various embodiments.

FIG. 25 illustrates an embodiment in which an auxiliary electrode 2530 is formed as a grid over an OLED device 2500. As illustrated, the auxiliary electrode is 2530 provided over a non-emissive region 2520 of the device 2500, such that it does not substantially cover any portion of emissive regions 2510.

Figure 26:
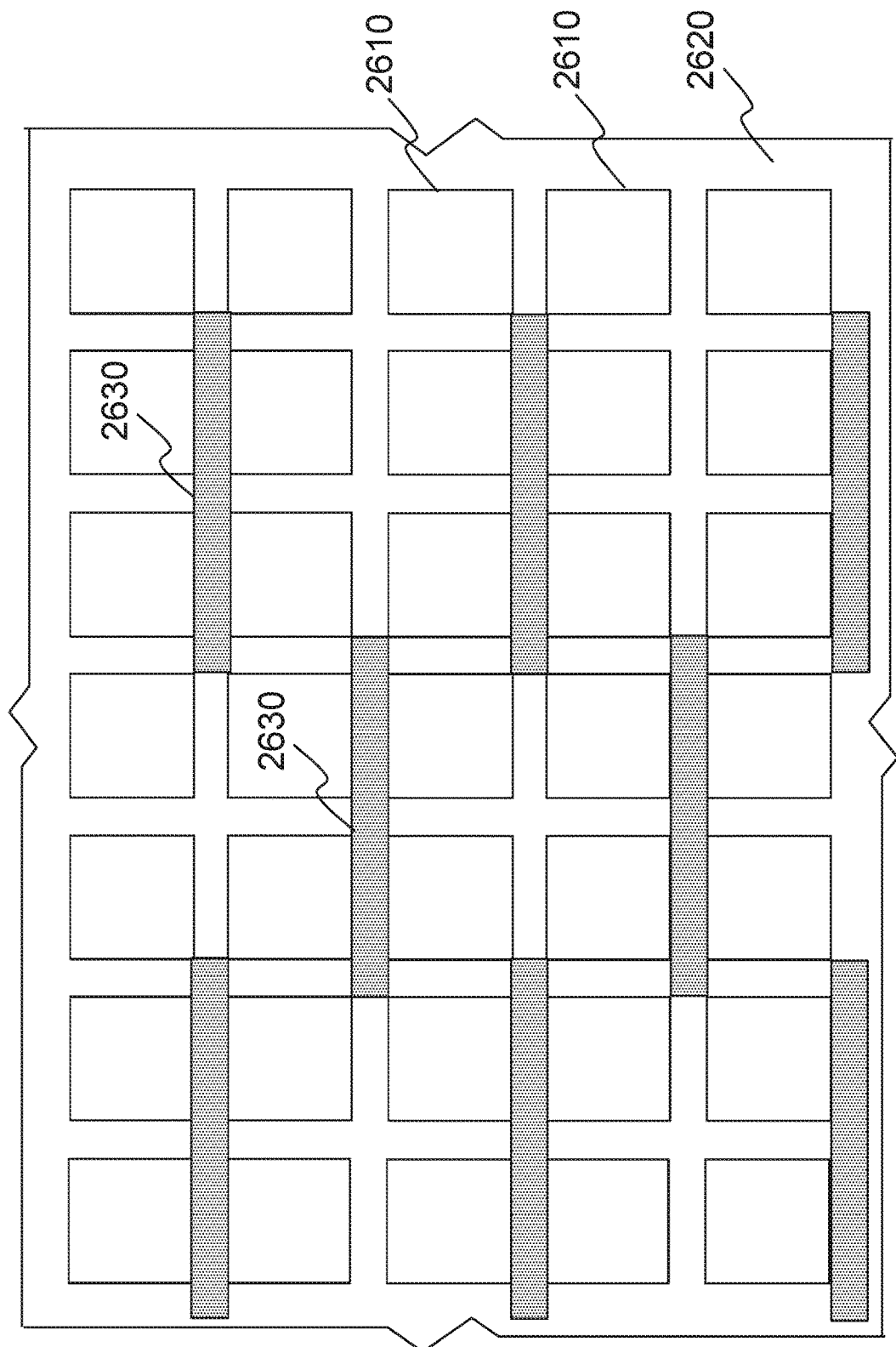

FIG. 26 illustrates an embodiment in which auxiliary electrode units 2630 are formed as series of elongated structures over an OLED device 2600. As illustrated, the auxiliary electrode units 2630 are provided over a non-emissive region 2620 of the device 2600, such that it does not substantially cover any portion of emissive regions 2610. The auxiliary electrode units 2610 are spaced apart and not physically connected to one another, but rather are electrically connected via a common electrode (not shown). As would be appreciated, the auxiliary electrode units 2610 which are not directly interconnected to one another may still provide substantial advantage by lowering an overall sheet resistance of the connected common electrode.

Figure 27:
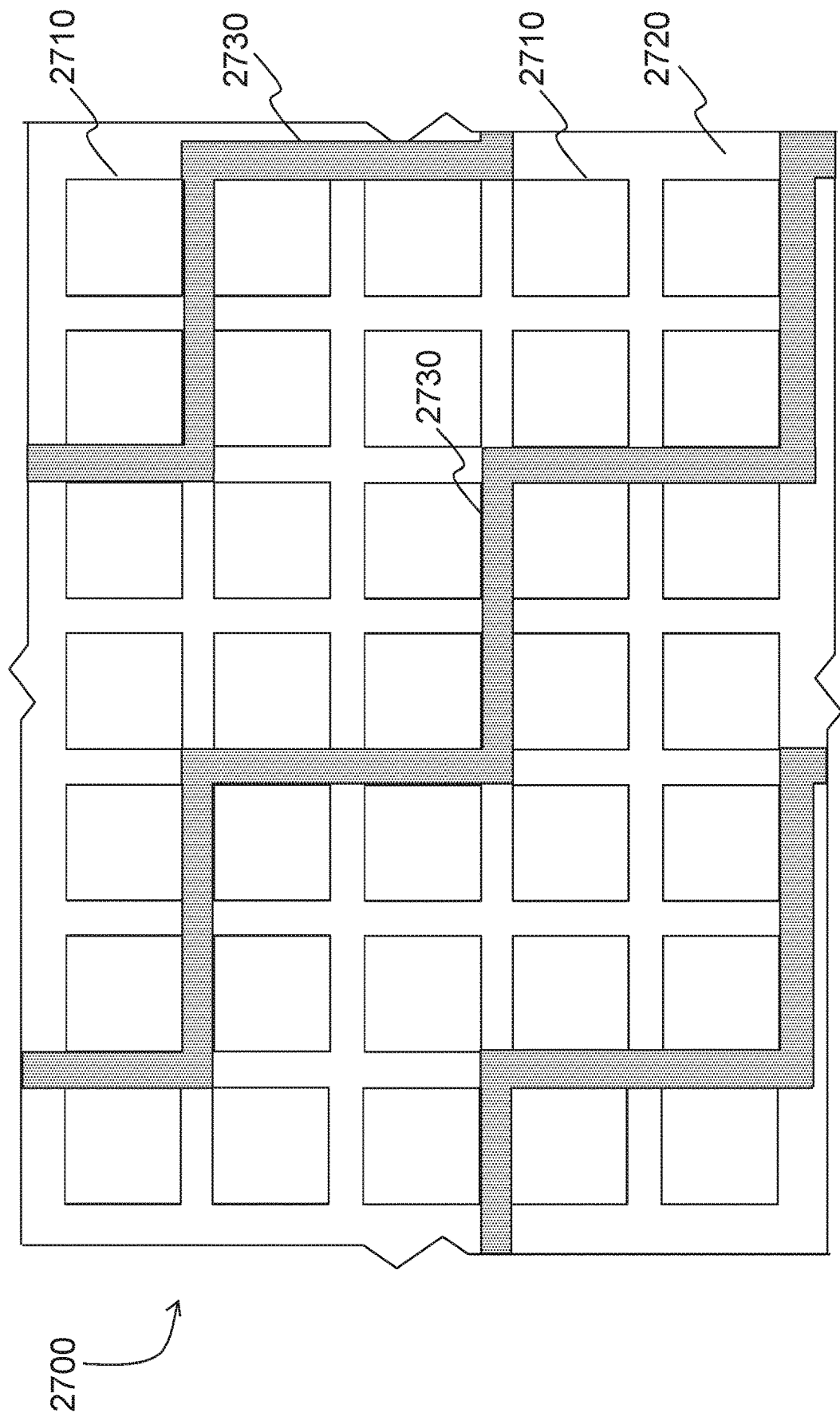

FIG. 27 illustrates an embodiment in which auxiliary electrode units 2730 are formed in a "stair case" pattern over an OLED device 2700. As illustrated, the auxiliary electrode units 2730 are provided over a non-emissive region 2720 of the device 2700, such that it does not substantially cover any portion of emissive regions 2710.

FIGS. 28A-28J illustrate various embodiments in which an auxiliary electrode is provided between neighboring subpixels.

Figure 28A:
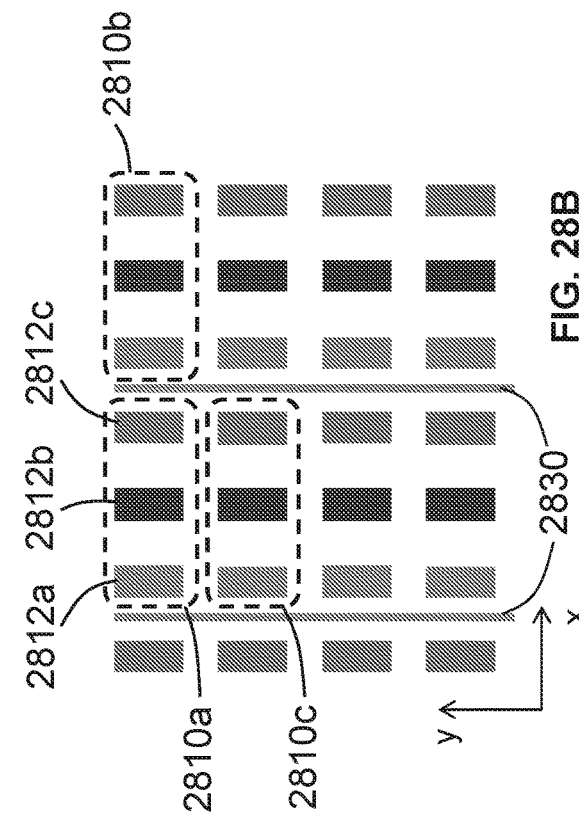

In FIG. 28A, auxiliary electrode units 2830 are provided as elongated strips between neighboring columns of subpixels 2812. Specifically in the embodiment of FIG. 28A, a first subpixel 2812a, a second subpixel 2812b, and a third subpixel 2812c collectively form a first pixel 2810a. For example, the first pixel 2810a may be an RGB pixel, in which case each subpixel 2812a-c would correspond to a red, a green, or a blue subpixel. Pixels 2810 may be arranged such that a same subpixel pattern (e.g., red, green, blue) is repeated across a display device. Specifically, a subpixel arrangement of a second pixel 2810b and a third pixel 2810c may be identical to that of the first pixel 2810a. In such an arrangement, all of the subpixels 2812 in each column of subpixels 2812 (e.g., subpixels arranged linearly along a first axis labelled Y) may be identical in color, and the auxiliary electrode unit 2830 extending substantially parallel to the first axis Y may be provided between neighboring columns of subpixels 2812 as illustrated in FIG. 28A.

For sake of simplicity, FIG. 28B-28J are illustrated using identical pixel and subpixel arrangements as that described in reference to FIG. 28A above.

Figure 28B:
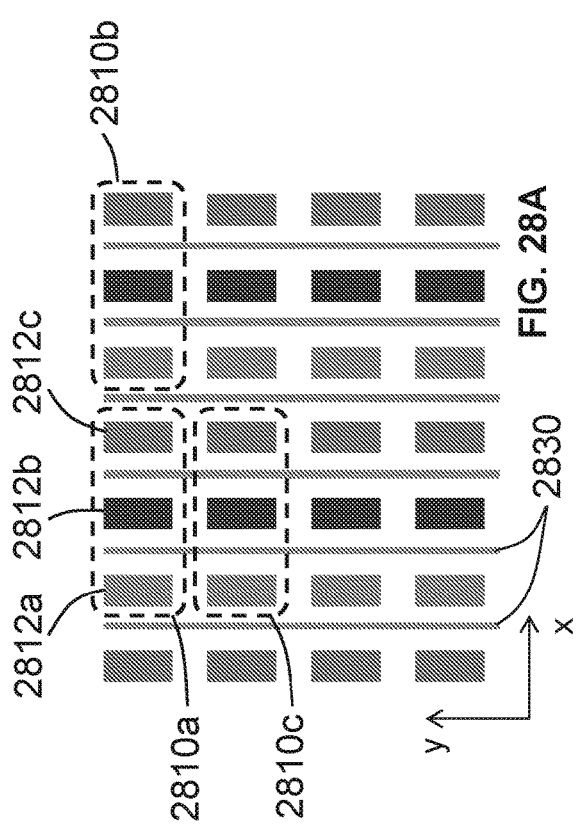

In FIG. 28B, auxiliary electrode units 2830 are illustrated as being provided between neighboring columns of pixels 2810. Specifically, the auxiliary electrode unit 2830 that extends substantially parallel to the first axis Y is provided between the first pixel 2810a and the second pixel 2810b, which are aligned in the direction of a second axis X with respect to each other. However, no auxiliary electrode unit 2830 is provided between the first pixel 2810a and the third pixel 2810c, which are aligned in the direction of the first axis Y with respect to each other. The first axis Y and the second axis X are perpendicular to one another as illustrated in the figures. It will be appreciated that while the auxiliary electrode units 2830 are illustrated in FIG. 28B as extending along the first axis Y, the auxiliary electrode units 2830 may extend along the second axis X in another embodiment.

Figure 28C:
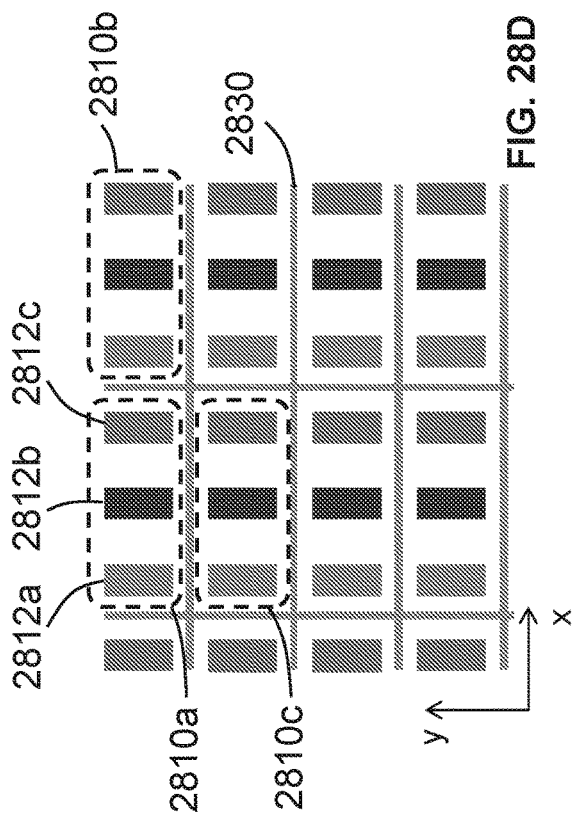

FIG. 28C illustrates an embodiment in which an auxiliary electrode 2830 is provided as a grid across a display device between neighboring subpixels 2812. Specifically, the auxiliary electrode 2830 is provided between each pair of neighboring subpixels 2812a-2812c. Accordingly, the auxiliary electrode 2830 includes segments, which extend substantially parallel to the first axis Y and the second axis X to form a mesh or a grid between the subpixels 2812a-2812c.

Figure 28D:
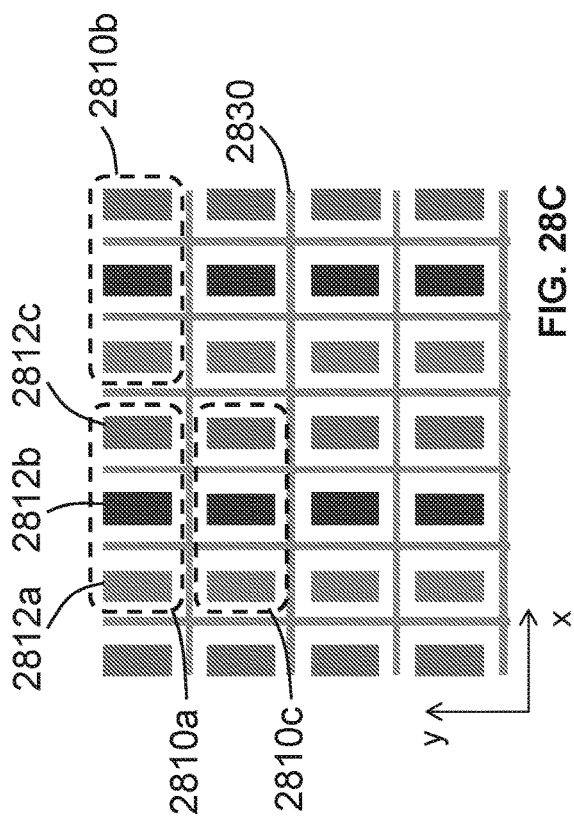

In another embodiment illustrated in FIG. 28D, an auxiliary electrode 2830 is provided between neighboring pixels 2810. Specifically, the auxiliary electrode 2830 is provided between the first pixel 2810a and the second pixel 2810b which are aligned along the second axis X with respect to each other, as well as between the first pixel 2810a and the third pixel 2810c which are aligned along the first axis Y with respect to each other. Accordingly, the auxiliary electrode 2830 forms a mesh or a grid between the pixels 2810a-c.

Figure 28F:
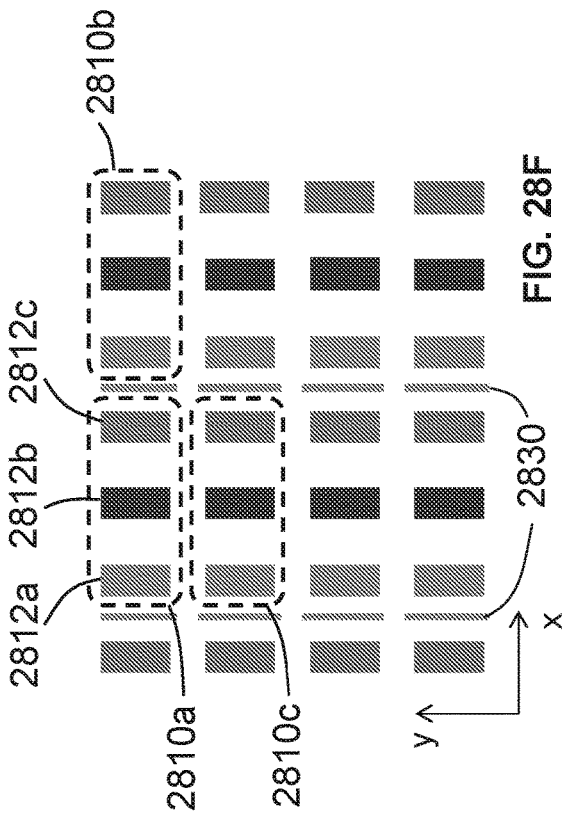
Figure 28H:
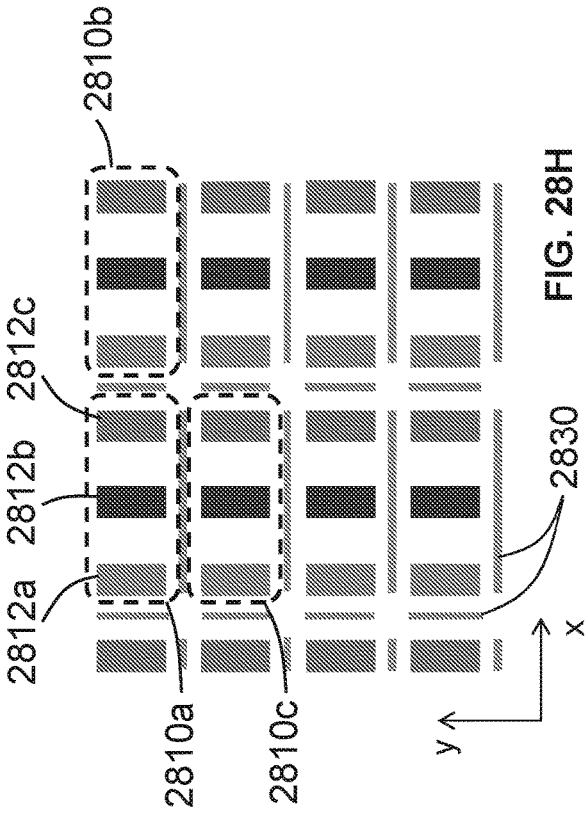
Figure 28E:
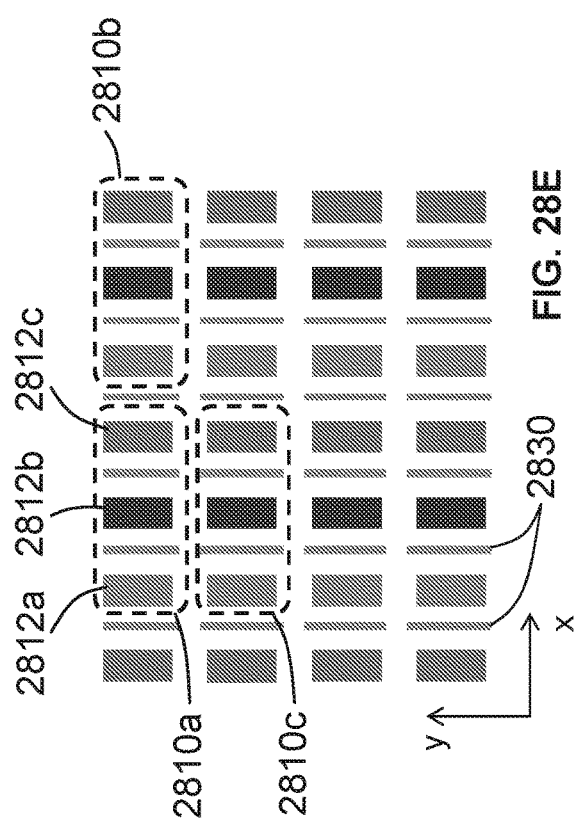

In FIG. 28E, a yet another embodiment is illustrated in which discrete auxiliary electrode units 2830 are provided between neighboring subpixels 2812. Specifically, the auxiliary electrode units 2830 are oriented substantially parallel to the first axis Y and are provided between the neighboring subpixels 2812a-c.

In FIG. 28F, an embodiment is illustrated in which discrete auxiliary electrode units 2830 are provided between neighboring pixels 2810. Specifically, the auxiliary electrode unit 2830 is oriented substantially parallel to the first axis Y and is provided between the first pixel 2810*a* and the second pixel 2810*b*, which are arranged adjacent to each other along the second axis X.

Figure 28G:
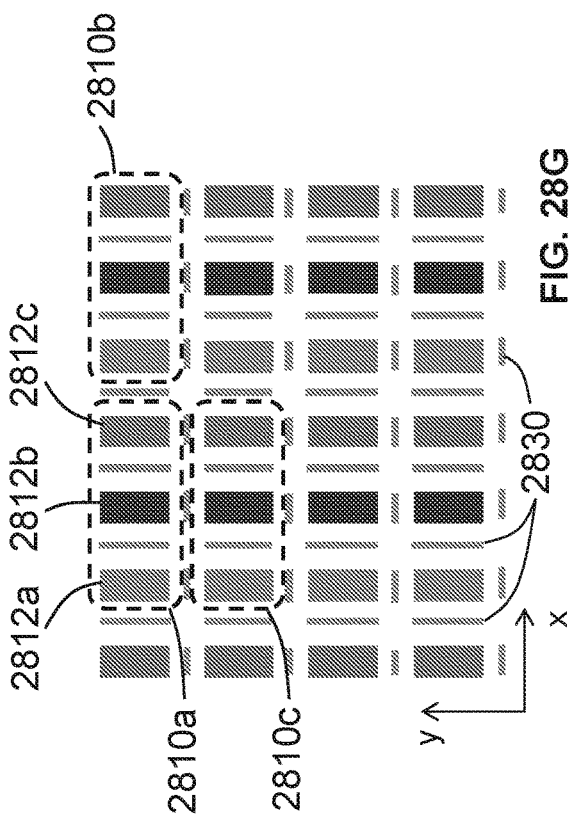

In FIG. 28G, discrete auxiliary electrode units 2830 are provided between neighboring subpixels 2812 to create a grid or a mesh across a display device. As illustrated, the elongated auxiliary electrode units 2830 which extend substantially parallel to the first axis Y are disposed between neighboring subpixels 2812 aligned along the second axis X. Similarly, the elongated auxiliary electrode units 2830 extending substantially parallel to the second axis X are disposed between neighboring subpixels 2812 aligned along the first axis Y.

In FIG. 28H, discrete auxiliary electrode units 2830 are provided between neighboring pixels 2810 to create a grid or a mesh across a display device. As illustrated, the elongated auxiliary electrode unit 2830 which extends substantially parallel to the first axis Y is disposed between neighboring pixels 2810*a* and 2810*b* aligned along the second axis X. Similarly, the elongated auxiliary electrode unit 2830 extending substantially parallel to the second axis X is disposed between neighboring pixels 2810*a* and 2810*c* aligned along the first axis Y.

FIG. 28I illustrates another embodiment in which discrete auxiliary electrode units 2830 are provided between neighboring subpixels 2812 to form a grid or a mesh across a display device. The auxiliary electrode units 2830 each comprises a first segment extending substantially parallel to the first axis Y and a second segment extending substantially parallel to the second axis X. The first axis Y and the second axis X are perpendicular to one another. In FIG. 28I, the first segment and the second segment are connected end-to-end to form an inverted L-shape.

FIG. 28J illustrates another embodiment in which discrete auxiliary electrode units 2830 are provided between neighboring subpixels 2812 to form a grid or a mesh across a display device. The auxiliary electrode units 2830 each comprises a first segment extending substantially parallel to the first axis Y and a second segment extending substantially parallel to the second axis X. The first axis Y and the second axis X are perpendicular to one another. In FIG. 28J, the first segment and the second segment are connected near a mid-point of the first and the second segments to form a cross shape.

While auxiliary electrode units have been illustrated in certain embodiments as not being physically connected to one another, they may be nevertheless in electrical communication with one another via a common electrode. For example, providing discrete auxiliary electrode units, which are indirectly connected to one another via the common electrode, may still substantially lower a sheet resistance and thus increase an efficiency of an OLED device without substantially interfering with optical characteristics of the device.

Auxiliary electrodes may also be used in display devices with other pixel or sub-pixel arrangements. For example, auxiliary electrodes may be provided on a display device in which a diamond pixel arrangement is used. Examples of such pixel arrangements are illustrated in FIGS. 29-33.

Figure 29:
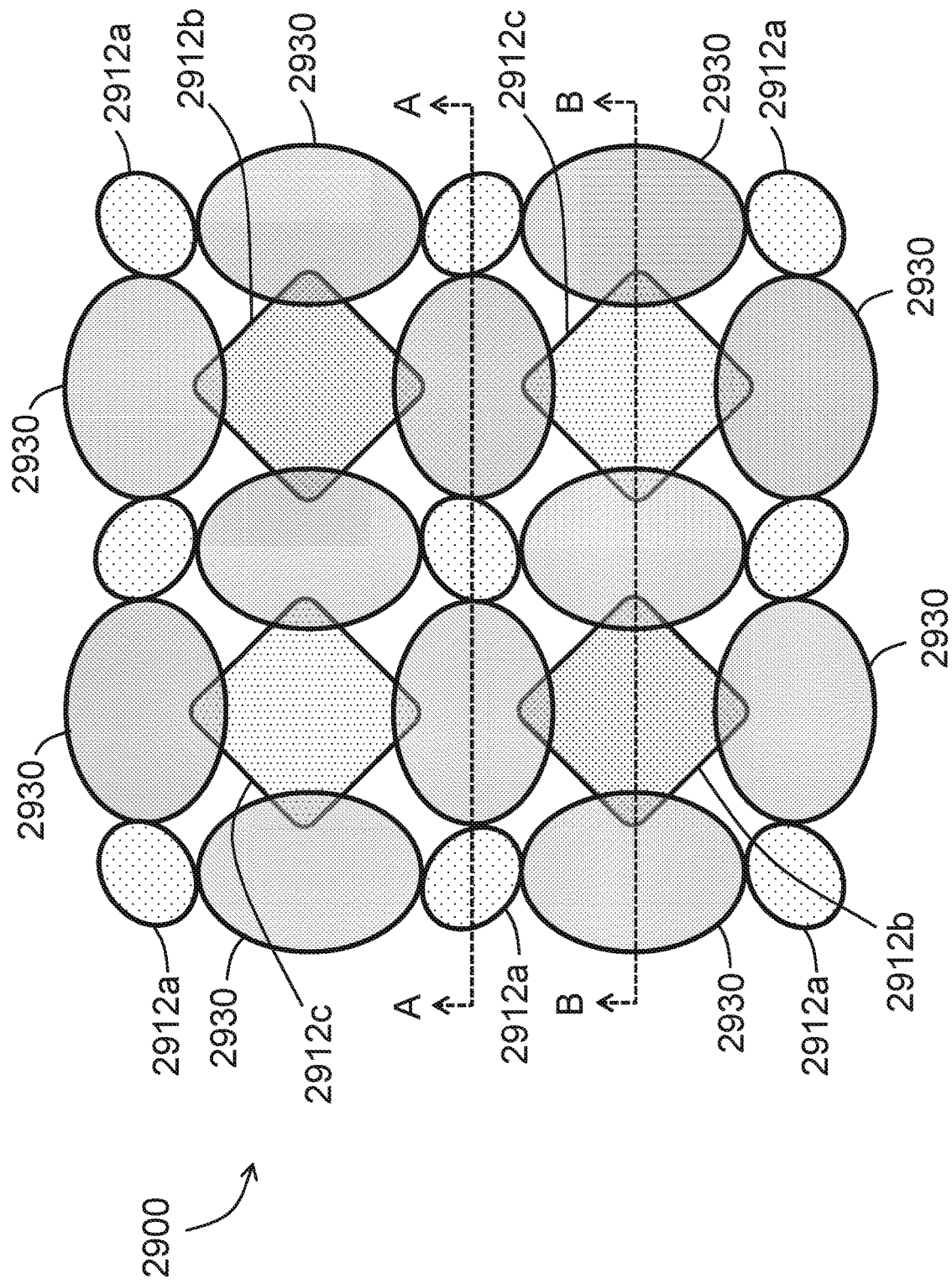
FIG. 29 illustrate a portion of a device with a pixel arrangement according to one embodiment.

FIG. 29 is a schematic illustration of an OLED device 2900 having a diamond pixel arrangement according to one embodiment. The OLED device 2900 includes a plurality of pixel definition layers (PDLs) 2930 and emissive regions 2912 (sub-pixels) disposed between neighboring PDLs 2930. The emissive regions 2912 include those corresponding to first sub-pixels 2912*a*, which may, for example, correspond to green sub-pixels, second sub-pixels 2912*b*, which may, for example, correspond to blue sub-pixels, and third sub-pixels 2912*c*, which may, for example, correspond to red sub-pixels.

Figure 30:
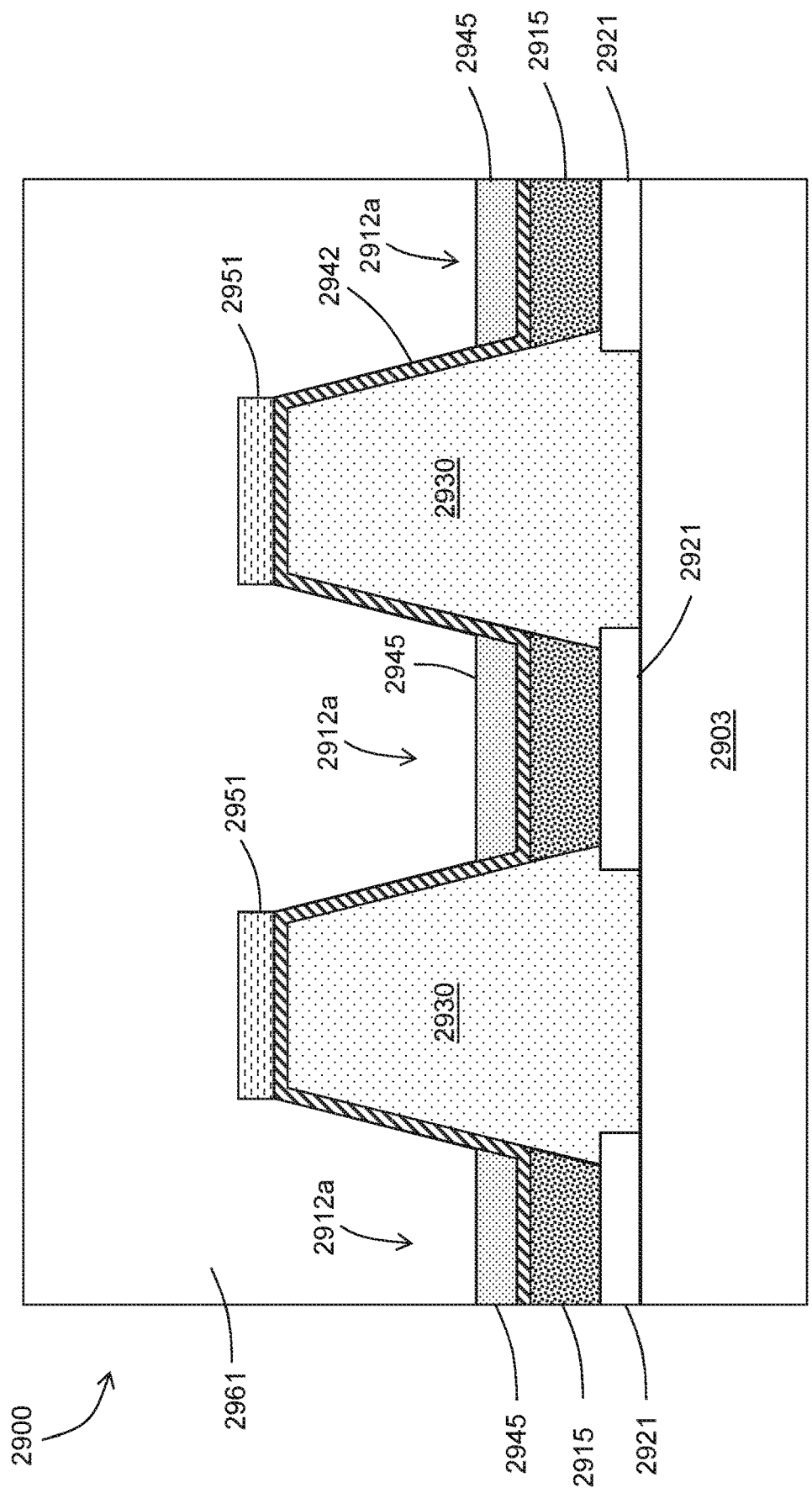
FIG. 30 is a cross-sectional diagram taken along line A-A of the device according to FIG. 29.

FIG. 30 is a schematic illustration of the OLED device 2900 taken along line A-A shown in FIG. 29. As more clearly illustrated in FIG. 30, the device 2900 includes a substrate 2903 and a plurality of anode units 2921 formed on a surface of the base substrate 2903. The substrate 2903 may further include a plurality of transistors and a base substrate, which have been omitted from the figure for sake of simplicity. An organic layer 2915 is provided on top of each anode unit 2921 in a region between neighboring PDLs 2930, and a common cathode 2942 is provided over the organic layer 2915 and the PDLs 2930 to form the first sub-pixels 2912*a*. The organic layer 2915 may include a plurality of organic and/or inorganic layers. For example, such layers may include a hole transport layer, a hole injection layer, an electroluminescence layer, an electron injection layer, and/or an electron transport layer. A nucleation inhibiting coating 2945 is provided over regions of the common cathode 2942 corresponding to the first sub-pixels 2912*a* to allow selective deposition of an auxiliary electrode 2951 over uncovered regions of the common cathode 2942 corresponding to substantially planar regions of the PDLs 2930. The nucleation inhibiting coating 2945 may also act as an index-matching coating. A thin film encapsulation layer 2961 may optionally be provided to encapsulate the device 2900.

Figure 31:
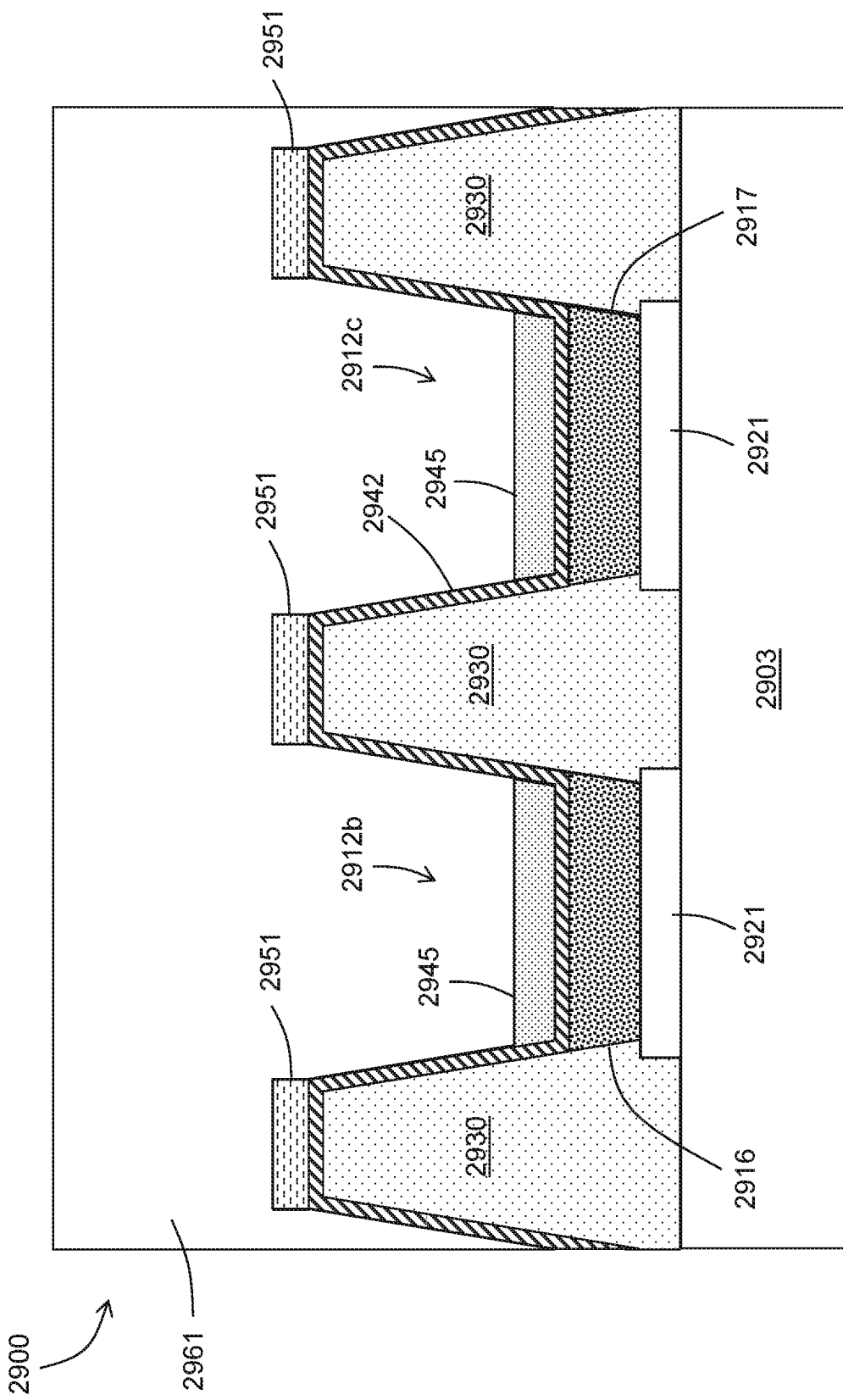
FIG. 31 is a cross-sectional diagram taken along line B-B of the device according to FIG. 29.

FIG. 31 shows a schematic illustration of the OLED device 2900 taken along line B-B indicated in FIG. 29. The device 2900 includes the plurality of anode units 2921 formed on the surface of the substrate 2903, and an organic layer 2916 or 2917 provided on top of each anode unit 2921 in a region between neighboring PDLs 2930. The common cathode 2942 is provided over the organic layers 2916 and 2917 and the PDLs 2930 to form the second sub-pixel 2912*b* and the third sub-pixel 2912*c*, respectively. The nucleation inhibiting coating 2945 is provided over regions of the common cathode 2942 corresponding to the sub-pixels 2912*b* and 2912*c* to allow selective deposition of the auxiliary electrode 2951 over uncovered regions of the common cathode 2942 corresponding to the substantially planar regions of the PDLs 2930. The nucleation inhibiting coating 2945 may also act as an index-matching coating. The thin film encapsulation layer 2961 may optionally be provided to encapsulate the device 2900.

Figure 32:
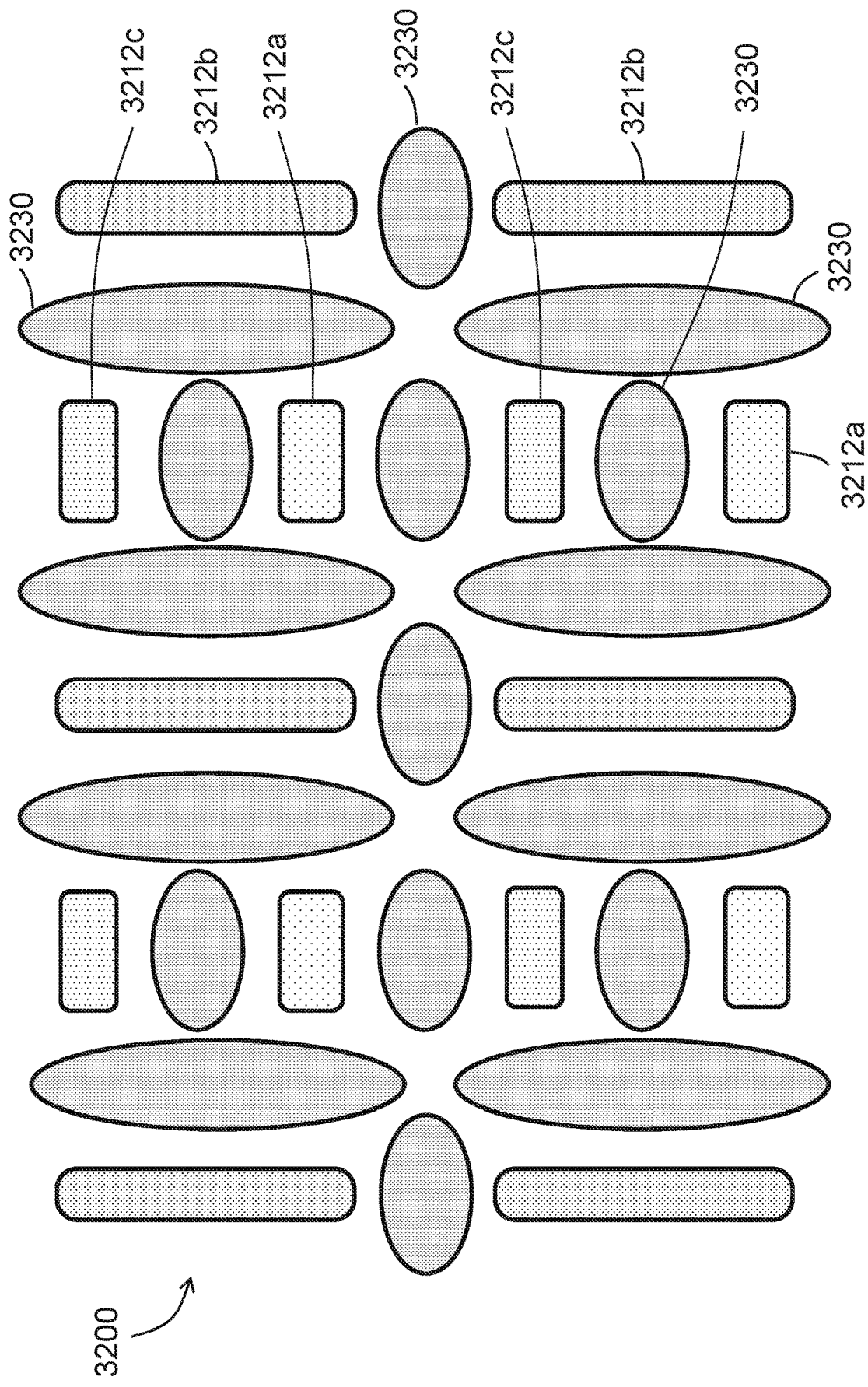
FIG. 32 is a diagram illustrating a portion of a device with a pixel arrangement according to another embodiment.
Figure 33:
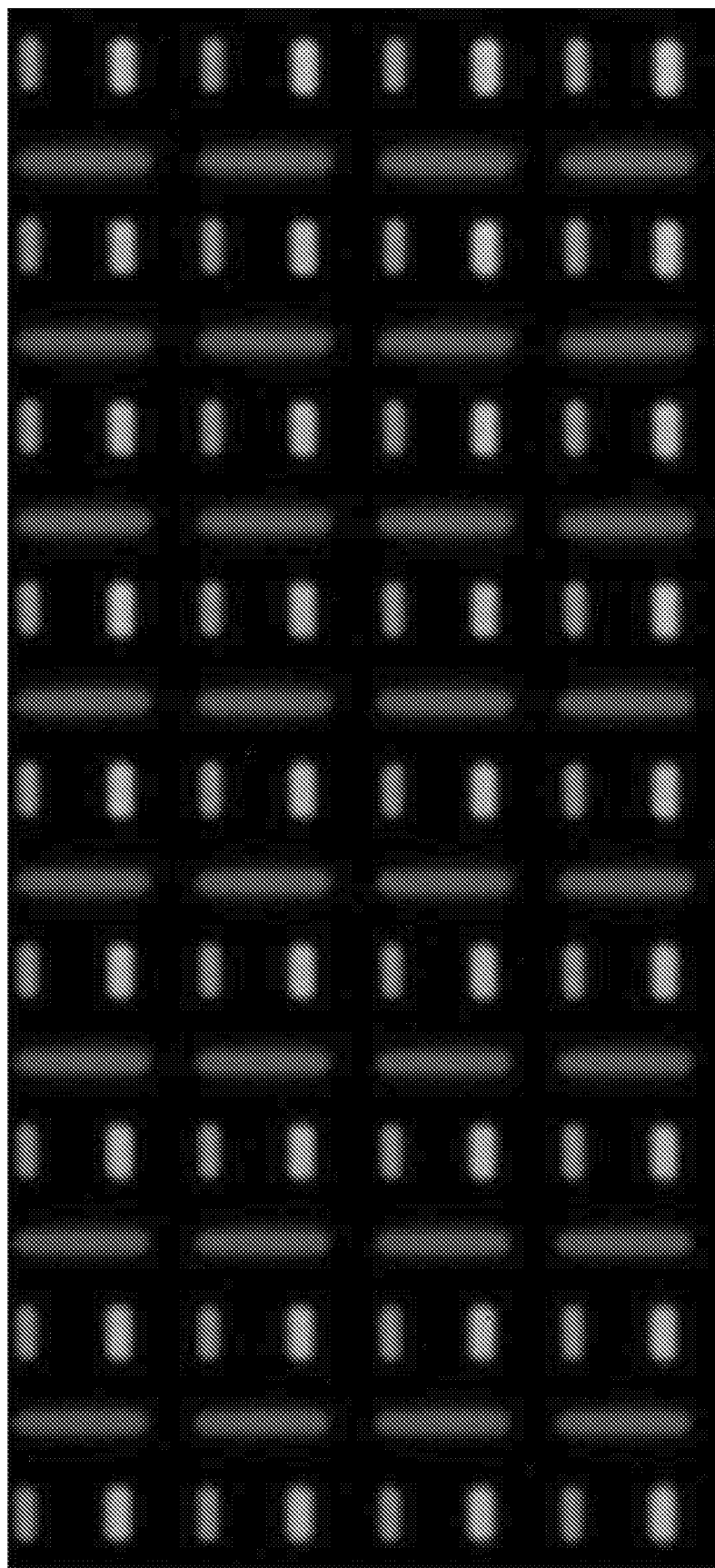
FIG. 33 is a micrograph of a device having the pixel arrangement illustrated in FIG. 32.

FIG. 32 is a schematic illustration of an OLED device 3200 with a pixel arrangement according to another embodiment. Specifically, the device 3200 includes a plurality of PDLs 3230 separating emissive regions 3212 (sub-pixels). For example, first sub-pixels 3212*a* may correspond to green sub-pixels, second sub-pixels 3212*b* may correspond to blue sub-pixels, and third sub-pixels 3212*c* may correspond to red sub-pixels. FIG. 33 is an image of an OLED device with the pixel arrangement according to the embodiment of FIG. 32. Although not shown, the device 3200 may further include an auxiliary electrode provided over non-emissive regions of the device 3200. For example, the auxiliary electrode may be disposed over regions of a common cathode corresponding to substantially planar portions of the PDLs 3230.

In another aspect according to some embodiments, a device is provided. In some embodiments, the device is an opto-electronic device. In some embodiments, the device is another electronic device or other product. In some embodiments, the device includes a substrate, a nucleation inhibiting coating, and a conductive coating. The nucleation inhibiting coating covers a first region of the substrate. The conductive coating covers a second region of the substrate, and partially overlaps the nucleation inhibiting coating such that at least a portion of the nucleation inhibiting coating is exposed from, or is substantially free of or is substantially uncovered by, the conductive coating. In some embodiments, the conductive coating includes a first portion and a second portion, the first portion of the conductive coating covers the second region of the substrate, and the second portion of the conductive coating overlaps a portion of the nucleation inhibiting coating. In some embodiments, the second portion of the conductive coating is spaced from the nucleation inhibiting coating by a gap. In some embodiments, the nucleation inhibiting coating includes an organic material. In some embodiments, the first portion of the conductive coating and the second portion of the conductive coating are integrally formed with one another.

In another aspect according to some embodiments, a device is provided. In some embodiments, the device is an opto-electronic device. In some embodiments, the device is another electronic device or other product. In some embodiments, the device includes a substrate and a conductive coating. The substrate includes a first region and a second region. The conductive coating covers the second region of the substrate, and partially overlaps the first region of the substrate such that at least a portion of the first region of the substrate is exposed from, or is substantially free of or is substantially uncovered by, the conductive coating. In some embodiments, the conductive coating includes a first portion and a second portion, the first portion of the conductive coating covers the second region of the substrate, and the second portion of the conductive coating overlaps a portion of the first region of the substrate. In some embodiments, the second portion of the conductive coating is spaced from the first region of the substrate by a gap. In some embodiments, the first portion of the conductive coating and the second portion of the conductive coating are integrally formed with one another.

Figure 34:
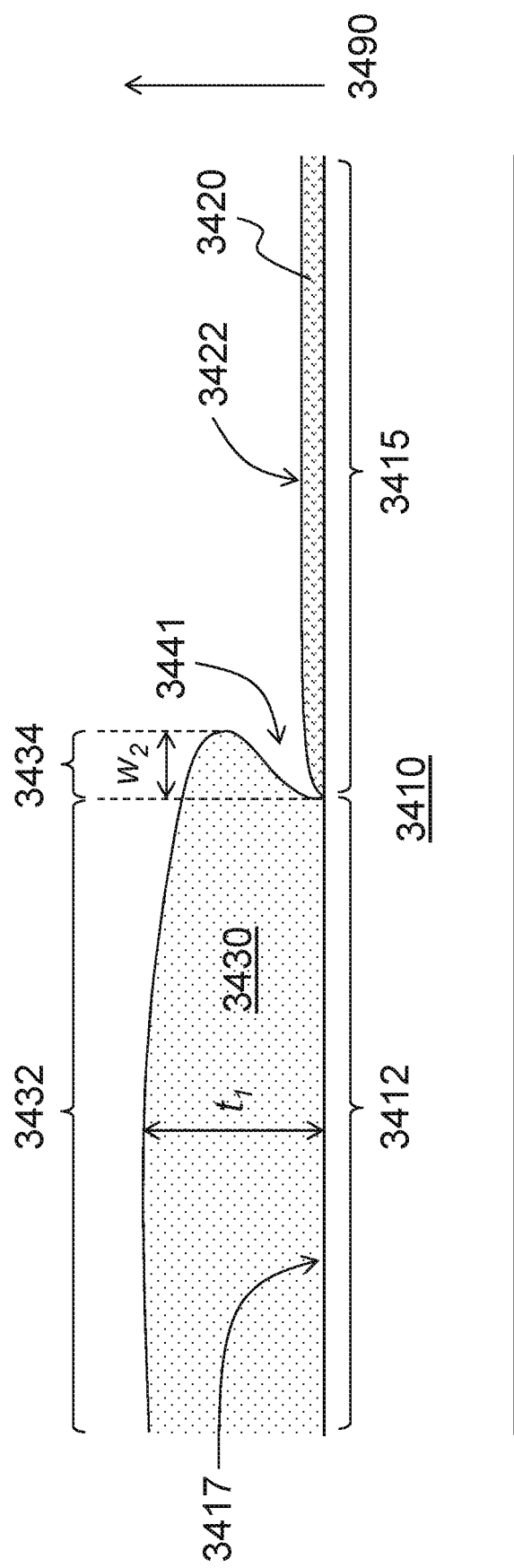
FIG. 34 is a diagram illustrating a cross-sectional profile around an interface of a conductive coating and a nucleation inhibiting coating according to one embodiment.

FIG. 34 illustrates a portion of a device according to one embodiment. The device includes a substrate 3410 having a surface 3417. A nucleation inhibiting coating 3420 covers a first region 3415 of the surface 3417 of the substrate 3410, and a conductive coating 3430 covers a second region 3412 of the surface 3417 of the substrate 3410. As illustrated in FIG. 34, the first region 3415 and the second region 3412 are distinct and non-overlapping regions of the surface 3417 of the substrate 3410. The conductive coating 3430 includes a first portion 3432 and a second portion 3434. As illustrated in the figure, the first portion 3432 of the conductive coating 3430 covers the second region 3412 of the substrate 3410, and the second portion 3434 of the conductive coating 3430 partially overlaps a portion of the nucleation inhibiting coating 3420. Specifically, the second portion 3434 is illustrated as overlapping the portion of the nucleation inhibiting coating 3420 in a direction that is perpendicular (or normal) to the underlying substrate surface 3417.

Particularly in the case where the nucleation inhibiting coating 3420 is formed such that its surface 3422 exhibits a relatively low initial sticking probability against a material used to form the conductive coating 3430, there is a gap 3441 formed between the overlapping, second portion 3434 of the conductive coating 3430 and the surface 3422 of the nucleation inhibiting coating 3420. Accordingly, the second portion 3434 of the conductive coating 3430 is not in direct physical contact with the nucleation inhibiting coating 3420, but is spaced from the nucleation inhibiting coating 3420 by the gap 3441 along the direction perpendicular to the surface 3417 of the substrate 3410 as indicated by arrow 3490. Nevertheless, the first portion 3432 of the conductive coating 3430 may be in direct physical contact with the nucleation inhibiting coating 3420 at an interface or a boundary between the first region 3415 and the second region 3412 of the substrate 3410.

In some embodiments, the overlapping, second portion 3434 of the conductive coating 3430 may laterally extend over the nucleation inhibiting coating 3420 by a comparable extent as a thickness of the conductive coating 3430. For example, in reference to FIG. 34, a width $w_2$ (or a dimension along a direction parallel to the surface 3417 of the substrate 3410) of the second portion 3434 may be comparable to a thickness $t_1$ (or a dimension along a direction perpendicular to the surface 3417 of the substrate 3410) of the first portion 3432 of the conductive coating 3430. For example, a ratio of $w_2:t_1$ may be in a range of about 1:1 to about 1:3, about 1:1 to about 1:1.5, or about 1:1 to about 1:2. While the thickness $t_1$ would generally be relatively uniform across the conductive coating 3430, the extent to which the second portion 3434 overlaps with the nucleation inhibiting coating 3420 (namely, $w_2$) may vary to some extent across different portions of the surface 3417.

Figure 35:
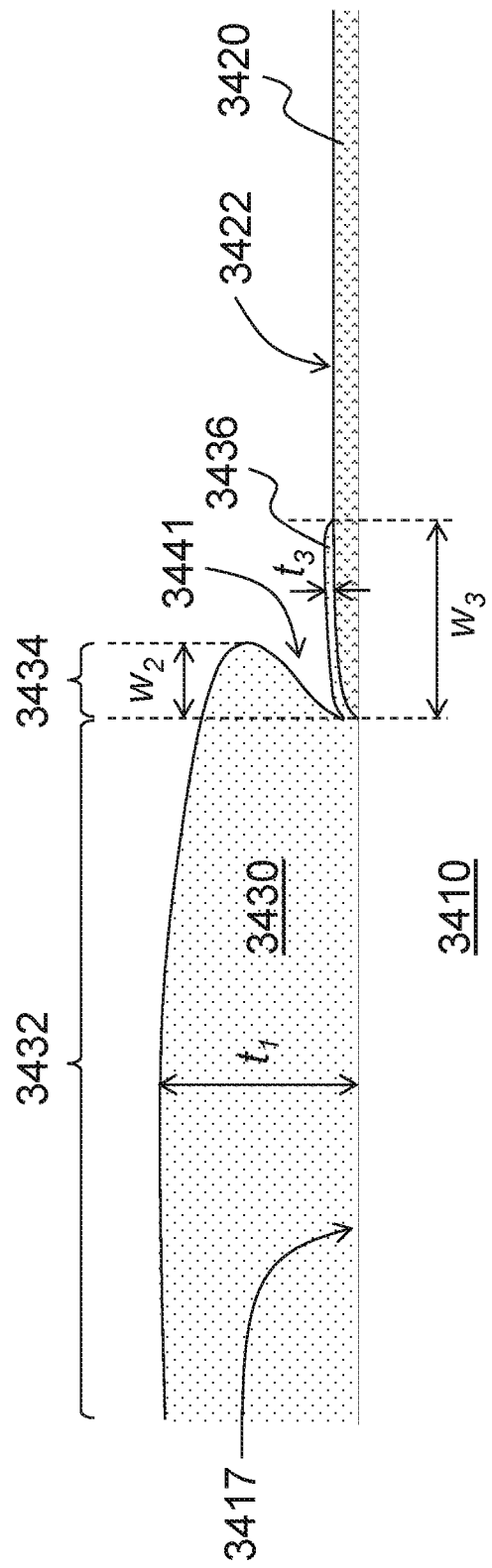
FIG. 35 is a diagram illustrating a cross-sectional profile around an interface of a conductive coating and a nucleation inhibiting coating according to another embodiment.

In another embodiment illustrated in FIG. 35, the conductive coating 3430 further includes a third portion 3436 disposed between the second portion 3434 and the nucleation inhibiting coating 3420. As illustrated, the second portion 3434 of the conductive coating 3430 laterally extends over and is spaced from the third portion 3436 of the conductive coating 3430, and the third portion 3436 may be in direct physical contact with the surface 3422 of the nucleation inhibiting coating 3420. A thickness $t_3$ of the third portion 3436 may be less, and, in some cases, substantially less than the thickness $t_1$ of the first portion 3432 of the conductive coating 3430. Furthermore, at least in some embodiments, a width $w_3$ of the third portion 3436 may be greater than the width $w_2$ of the second portion 3434. Accordingly, the third portion 3436 may extend laterally to overlap with the nucleation inhibiting coating 3420 to a greater extent than the second portion 3434. For example, a ratio of $w_3:t_1$ may be in a range of about 1:2 to about 3:1 or about 1:1.2 to about 2.5:1. While the thickness $t_1$ would generally be relatively uniform across the conductive coating 3430, the extent to which the third portion 3436 overlaps with the nucleation inhibiting coating 3420 (namely, $w_3$) may vary to some extent across different portions of the surface 3417. The thickness $t_3$ of the third portion 3436 may be no greater than or less than about 5% of the thickness $t_1$ of the first portion 3432. For example, $t_3$ may be no greater than or less than about 4%, no greater than or less than about 3%, no greater than or less than about 2%, no greater than or less than about 1%, or no greater than or less than about 0.5% of $t_1$. Instead of, or in addition to, the third portion 3436 being formed as a thin film as shown in FIG. 35, the material of the conductive coating 3430 may form as islands or disconnected clusters on a portion of the nucleation inhibiting coating 3420. For example, such islands or disconnected clusters may include features which are physically separated from one another, such that the islands or clusters are not formed as a continuous layer.

Figure 36:
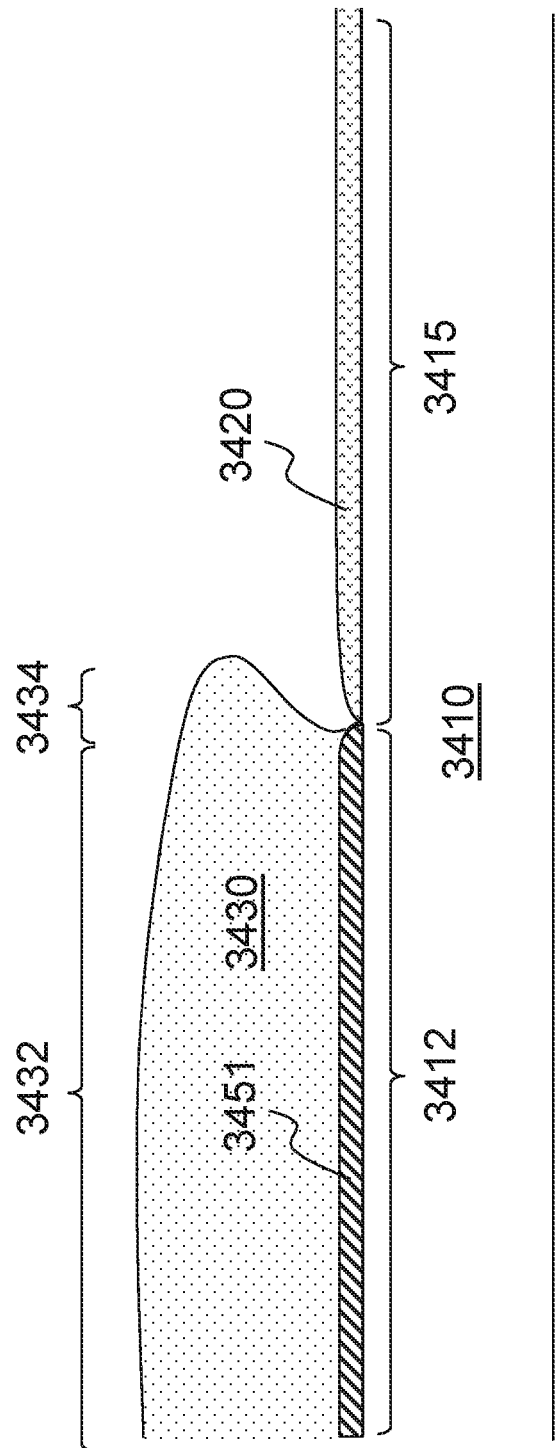
FIG. 36 is a diagram illustrating a cross-sectional profile around an interface of a conductive coating, a nucleation inhibiting coating, and a nucleation promoting coating according to one embodiment.

In yet another embodiment illustrated in FIG. 36, a nucleation promoting coating 3451 is disposed between the substrate 3410 and the conductive coating 3430. Specifically, the nucleation promoting coating 3451 is disposed between the first portion 3432 of the conducting coating 3430 and the second region 3412 of the substrate 3410. The nucleation promoting coating 3451 is illustrated as being disposed on the second region 3412 of the substrate 3410, and not on the first region 3415 where the nucleation inhibiting coating 3420 is deposited. The nucleation promoting coating 3451 may be formed such that, at an interface or a boundary between the nucleation promoting coating 3451 and the conductive coating 3430, a surface of the nucleation promoting coating 3451 exhibits a relatively high initial sticking probability for the material of the conductive coating 3430. As such, the presence of the nucleation promoting coating 3451 may promote the formation and growth of the conductive coating 3430 during deposition. Various features of the conducting coating 3430 (including the dimensions of the first portion 3432 and the second portion 3434) and other coatings of FIG. 36 can be similar to those described above for FIG. 34-35 and are not repeated for brevity.

Figure 37:
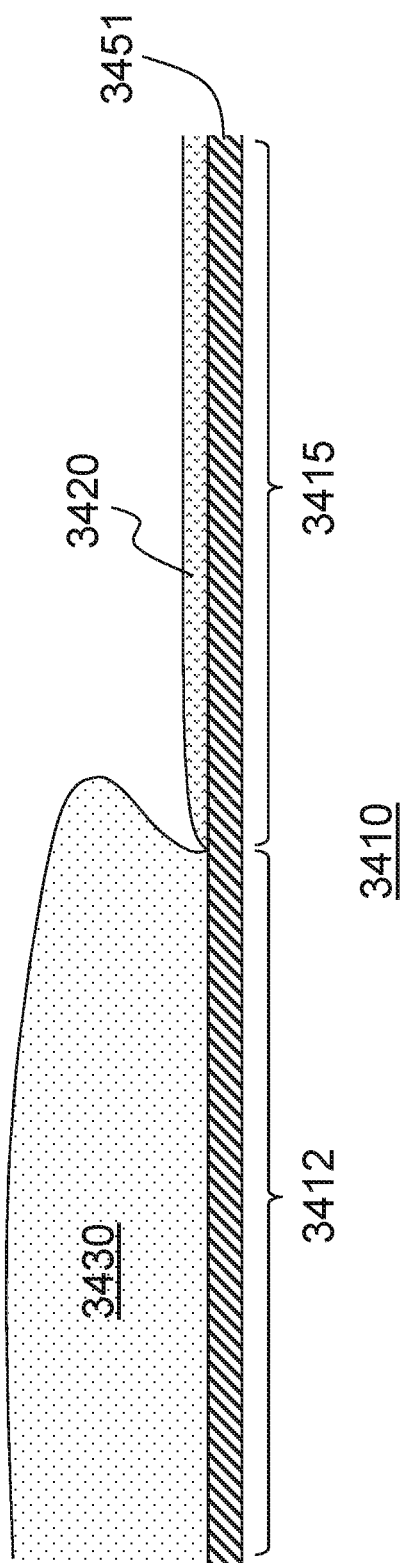
FIG. 37 is a diagram illustrating a cross-sectional profile around an interface of a conductive coating, a nucleation inhibiting coating, and a nucleation promoting coating according to another embodiment.

In yet another embodiment illustrated in FIG. 37, the nucleation promoting coating 3451 is disposed on both the first region 3415 and the second region 3412 of the substrate 3410, and the nucleation inhibiting coating 3420 covers a portion of the nucleation promoting coating 3451 disposed on the first region 3415. Another portion of the nucleation promoting coating 3451 is exposed from, or is substantially free of or is substantially uncovered by, the nucleation inhibiting coating 3420, and the conductive coating 3430 covers the exposed portion of the nucleation promoting coating 3451. Various features of the conducting coating 3430 and other coatings of FIG. 37 can be similar to those described above for FIG. 34-35 and are not repeated for brevity.

Figure 38:
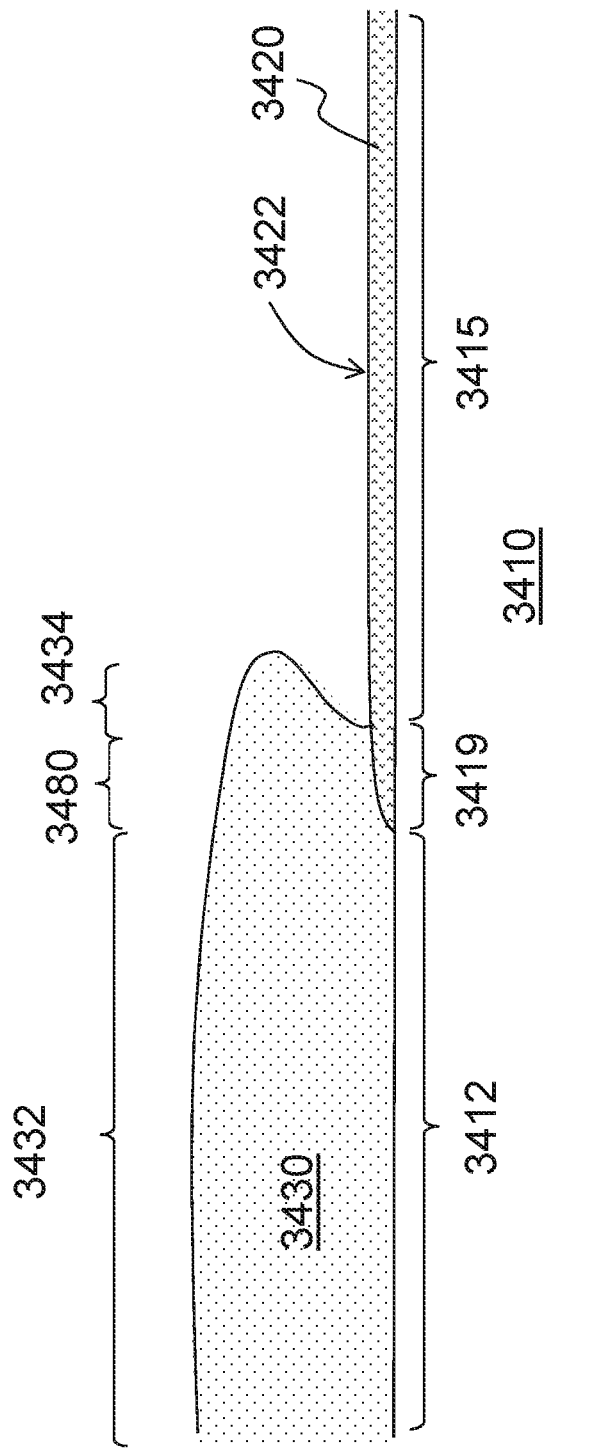
FIG. 38 is a diagram illustrating a cross-sectional profile around an interface of a conductive coating and a nucleation inhibiting coating according to yet another embodiment.

FIG. 38 illustrates a yet another embodiment in which the conductive coating 3430 partially overlaps a portion of the nucleation inhibiting coating 3420 in a third region 3419 of the substrate 3410. Specifically, in addition to the first portion 3432 and the second portion 3434, the conductive coating 3430 further includes a third portion 3480. As illustrated in the figure, the third portion 3480 of the conductive coating 3430 is disposed between the first portion 3432 and the second portion 3434 of the conductive coating 3430, and the third portion 3480 may be in direct physical contact with the surface 3422 of the nucleation inhibiting coating 3420. In this regard, the overlap in the third region 3419 may be formed as a result of lateral growth of the conductive coating 3430 during an open mask or mask-free deposition process. More specifically, while the surface 3422 of the nucleation inhibiting coating 3420 may exhibit a relatively low initial sticking probability for the material of the conductive coating 3430 and thus the probability of the material nucleating on the surface 3422 is low, as the conductive coating 3430 grows in thickness, the coating 3430 may also grow laterally and may cover a portion of the nucleation inhibiting coating 3420 as illustrated in FIG. 38.

While details regarding certain features of the device and the conductive coating 3430 have been omitted in the above description for the embodiments of FIGS. 36-38, it will be appreciated that descriptions of various features including the gap 3441, the second portion 3434, and the third portion 3436 of the conductive coating 3430 described in relation to FIG. 34 and FIG. 35 would similarly apply to such embodiments.

It will be appreciated that, while not explicitly illustrated, a material used to form the nucleation inhibiting coating 3420 may also be present to some extent at an interface between the conductive coating 3430 and an underlying surface (e.g., a surface of the nucleation promoting layer 3451 or the substrate 3410). Such material may be deposited as a result of a shadowing effect, in which a deposited pattern is not identical to a pattern of a mask and may result in some evaporated material being deposited on a masked portion of a target surface. For example, such material may form as islands or disconnected clusters, or as a thin film having a thickness that is substantially less than an average thickness of the nucleation inhibiting coating 3420.

In some embodiments, the nucleation inhibiting coating 3420 may be removed subsequent to deposition of the conductive coating 3430, such that at least a portion of an underlying surface covered by the nucleation inhibiting coating 3420 in the embodiments of FIGS. 34-38 becomes exposed. For example, the nucleation inhibiting coating 3420 may be selectively removed by etching or dissolving the nucleation inhibiting coating 3420, or using plasma or solvent processing techniques without substantially affecting or eroding the conductive coating 3430.

A device of some embodiments may be an electronic device, and, more specifically, an opto-electronic device. An opto-electronic device generally encompasses any device that converts electrical signals into photons or vice versa. As such, an organic opto-electronic device can encompass any opto-electronic device where one or more active layers of the device are formed primarily of an organic material, and, more specifically, an organic semiconductor material. Examples of organic opto-electronic devices include, but are not limited to, OLED devices and OPV devices.

It will also be appreciated that organic opto-electronic devices may be formed on various types of base substrates. For example, a base substrate may be a flexible or rigid substrate. The base substrate may include, for example, silicon, glass, metal, polymer (e.g., polyimide), sapphire, or other materials suitable for use as the base substrate.

It will also be appreciated that various components of a device may be deposited using a wide variety of techniques, including vapor deposition, spin-coating, line coating, printing, and various other deposition techniques.

In some embodiments, an organic opto-electronic device is an OLED device, wherein an organic semiconductor layer includes an electroluminescent layer. In some embodiments, the organic semiconductor layer may include additional layers, such as an electron injection layer, an electron transport layer, a hole transport layer, and/or a hole injection layer. For example, the OLED device may be an AMOLED device, PMOLED device, or an OLED lighting panel or module. Furthermore, the opto-electronic device may be a part of an electronic device. For example, the opto-electronic device may be an OLED display module of a computing device, such as a smartphone, a tablet, a laptop, or other electronic device such as a monitor or a television set.

Figure 39:
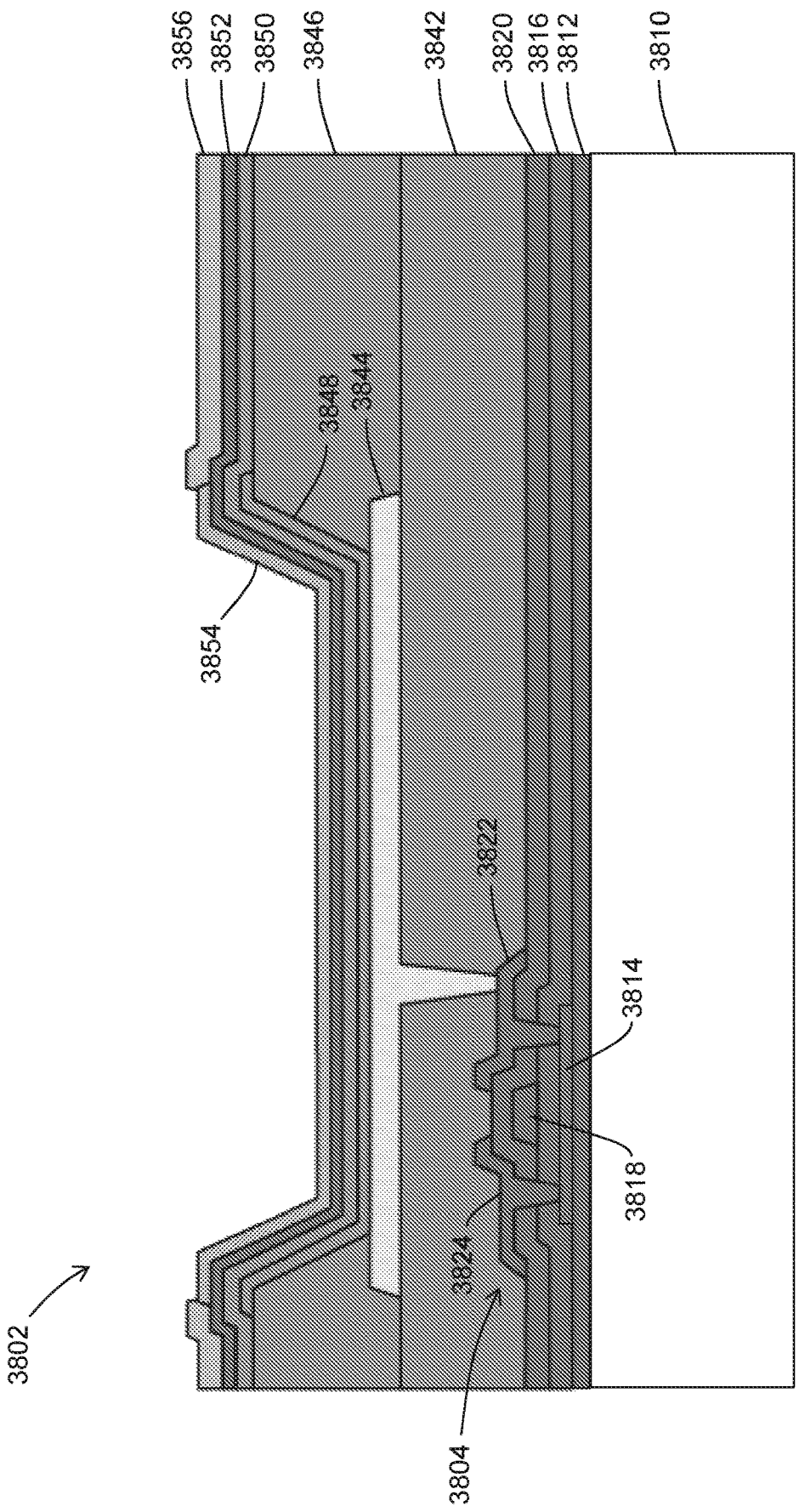
FIG. 39 is a diagram illustrating a cross-sectional profile of an active matrix OLED device according to one embodiment.
Figure 40:
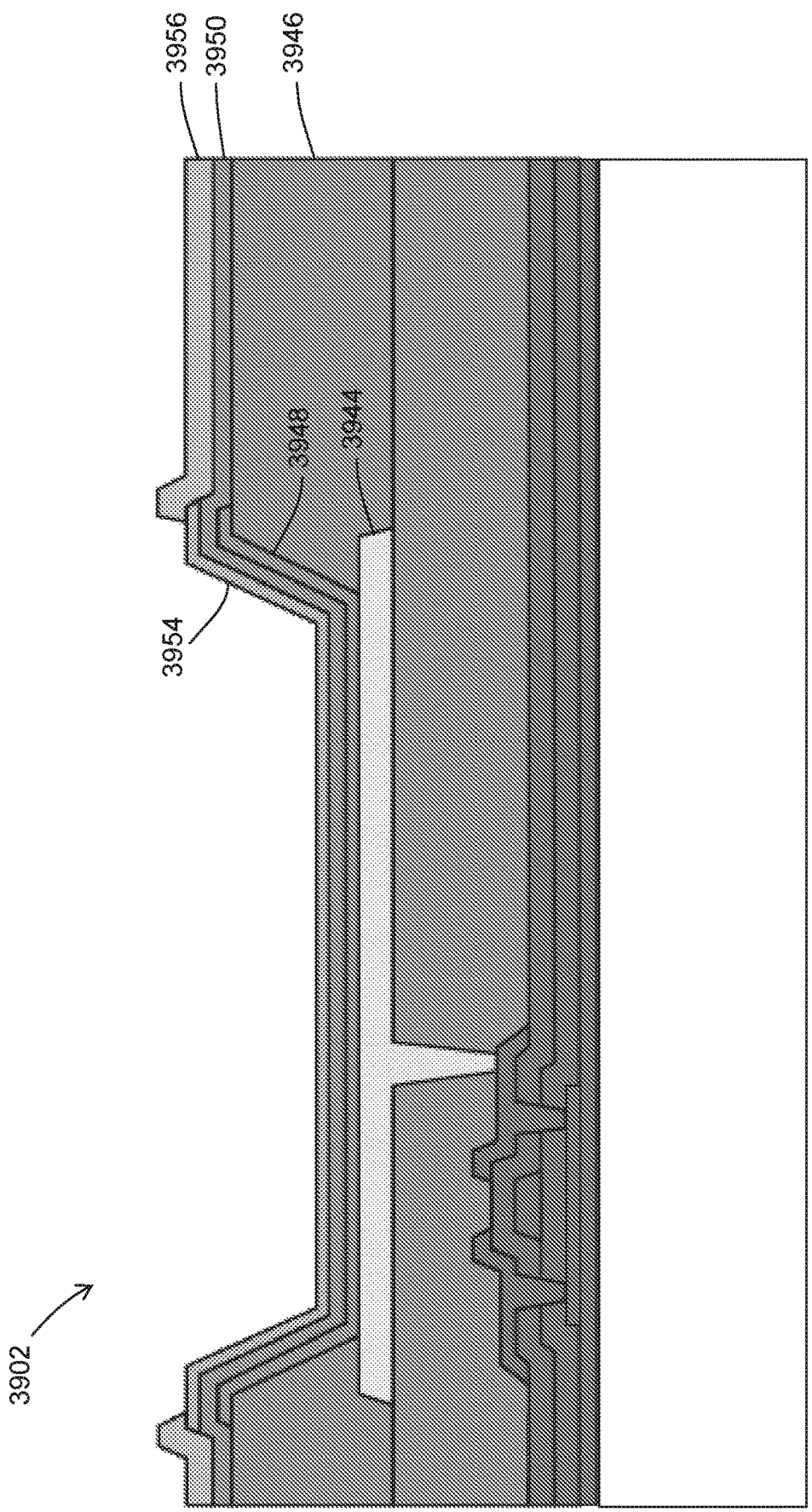
FIG. 40 is a diagram illustrating a cross-sectional profile of an active matrix OLED device according to another embodiment.
Figure 41:
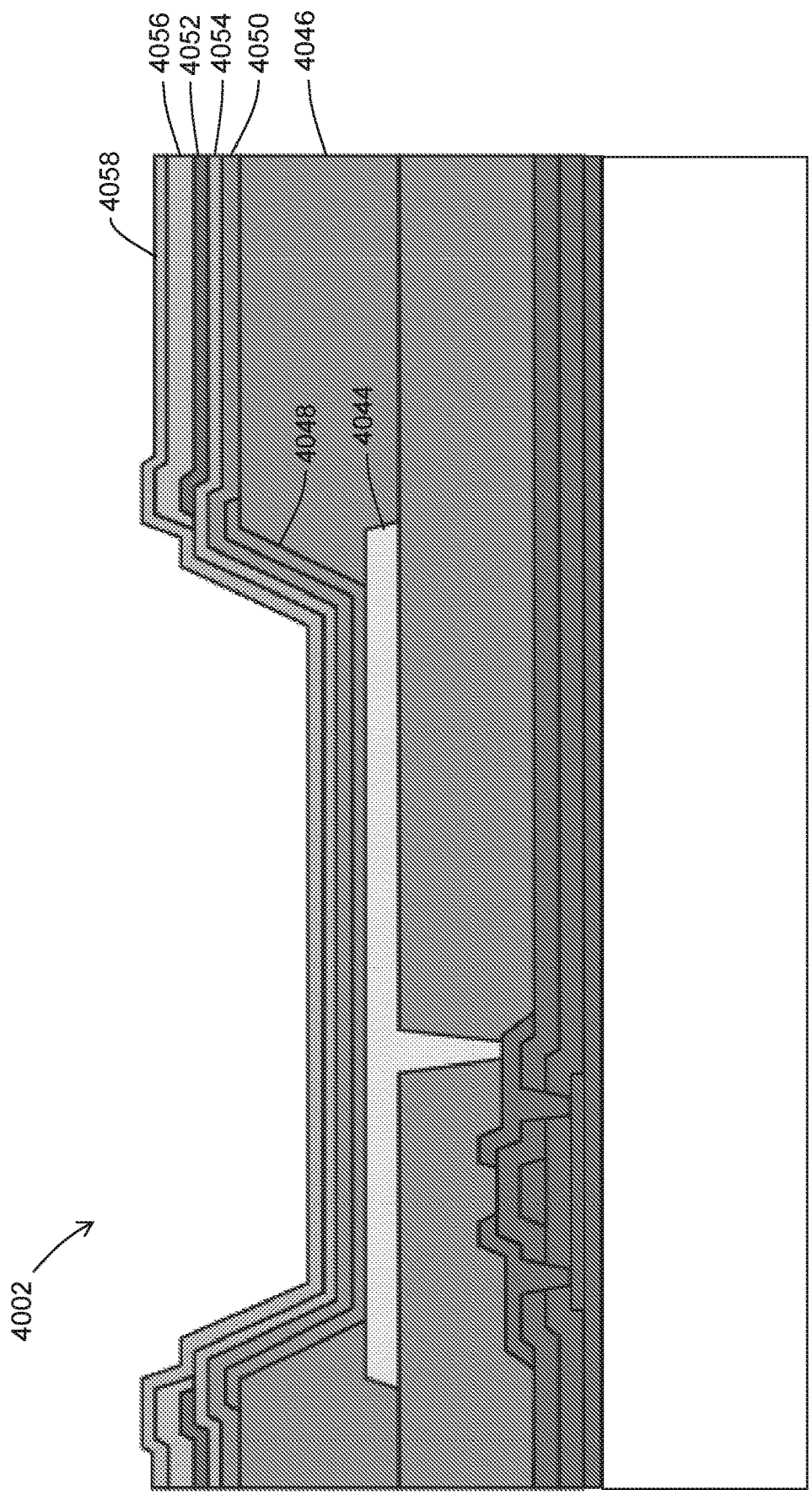
FIG. 41 is a diagram illustrating a cross-sectional profile of an active matrix OLED device according to yet another embodiment.

FIGS. 39-41 illustrate various embodiments of an active matrix OLED (AMOLED) display device. For the sake of simplicity, various details and characteristics of a conductive coating at or near an interface between the conductive coating and a nucleation inhibiting coating described above in reference to FIGS. 34-38 have been omitted. However, it will be appreciated that the features described in reference to FIGS. 34-38 may also be applicable to the embodiments of FIGS. 39-41.

FIG. 39 is a schematic diagram illustrating a structure of an AMOLED device 3802 according to one embodiment.

The device 3802 includes a base substrate 3810, and a buffer layer 3812 deposited over a surface of the base substrate 3810. A thin-film transistor (TFT) 3804 is then formed over the buffer layer 3812. Specifically, a semiconductor active area 3814 is formed over a portion of the buffer layer 3812, and a gate insulating layer 3816 is deposited to substantially cover the semiconductor active area 3814. Next, a gate electrode 3818 is formed on top of the gate insulating layer 3816, and an interlayer insulating layer 3820 is deposited. A source electrode 3824 and a drain electrode 3822 are formed such that they extend through openings formed through the interlayer insulating layer 3820 and the gate insulating layer 3816 to be in contact with the semiconductor active layer 3814. An insulating layer 3842 is then formed over the TFT 3804. A first electrode 3844 is then formed over a portion of the insulating layer 3842. As illustrated in FIG. 39, the first electrode 3844 extends through an opening of the insulating layer 3842 such that it is in electrical communication with the drain electrode 3822. Pixel definition layers (PDLs) 3846 are then formed to cover at least a portion of the first electrode 3844, including its outer edges. For example, the PDLs 3846 may include an insulating organic or inorganic material. An organic layer 3848 is then deposited over the first electrode 3844, particularly in regions between neighboring PDLs 3846. A second electrode 3850 is deposited to substantially cover both the organic layer 3848 and the PDLs 3846. A surface of the second electrode 3850 is then substantially covered with a nucleation promoting coating 3852. For example, the nucleation promoting coating 3852 may be deposited using an open mask or a mask-free deposition technique. A nucleation inhibiting coating 3854 is selectively deposited over a portion of the nucleation promoting coating 3852. For example, the nucleation inhibiting coating 3854 may be selectively deposited using a shadow mask. Accordingly, an auxiliary electrode 3856 is selectively deposited over an exposed surface of the nucleation promoting coating 3852 using an open mask or a mask-free deposition process. For further specificity, by conducting thermal deposition of the auxiliary electrode 3856 (e.g., including magnesium) using an open mask or with a mask, the auxiliary electrode 3856 is selectively deposited over the exposed surface of the nucleation promoting coating 3852, while leaving a surface of the nucleation inhibiting coating 3854 substantially free of a material of the auxiliary electrode 3856.

FIG. 40 illustrates a structure of an AMOLED device 3902 according to another embodiment in which a nucleation promoting coating has been omitted. For example, the nucleation promoting coating may be omitted in cases where a surface on which an auxiliary electrode is deposited has a relatively high initial sticking probability for a material of the auxiliary electrode. In other words, for surfaces with a relatively high initial sticking probability, the nucleation promoting coating may be omitted, and a conductive coating may still be deposited thereon. For sake of simplicity, certain details of a backplane including a TFT is omitted in describing the following embodiments.

In FIG. 40, an organic layer 3948 is deposited between a first electrode 3944 and a second electrode 3950. The organic layer 3948 may partially overlap with portions of PDLs 3946. A nucleation inhibiting coating 3954 is deposited over a portion (e.g., corresponding to an emissive region) of the second electrode 3950, thereby providing a surface with a relatively low initial sticking probability (e.g., a relatively low desorption energy) for a material used to form an auxiliary electrode 3956. Accordingly, the auxiliary electrode 3956 is selectively deposited over a portion of the second electrode 3950 that is exposed from the nucleation inhibiting coating 3954. As would be understood, the auxiliary electrode 3956 is in electrical communication with the underlying second electrode 3950 so as to reduce a sheet resistance of the second electrode 3950. For example, the second electrode 3950 and the auxiliary electrode 3956 may include substantially the same material to ensure a high initial sticking probability for the material of the auxiliary electrode 3956. Specifically, the second electrode 3950 may include substantially pure magnesium (Mg) or an alloy of magnesium and another metal, such as silver (Ag). For Mg:Ag alloy, an alloy composition may range from about 1:9 to about 9:1 by volume. The auxiliary electrode 3956 may include substantially pure magnesium.

FIG. 41 illustrates a structure of an AMOLED device 4002 according to yet another embodiment. In the illustrated embodiment, an organic layer 4048 is deposited between a first electrode 4044 and a second electrode 4050 such that it partially overlaps with portions of PDLs 4046. A nucleation inhibiting coating 4054 is deposited so as to substantially cover a surface of the second electrode 4050, and a nucleation promoting coating 4052 is selectively deposited on a portion of the nucleation inhibiting coating 4054. An auxiliary electrode 4056 is then formed over the nucleation promoting coating 4052. Optionally, a capping layer 4058 may be deposited to cover exposed surfaces of the nucleation inhibiting coating 4054 and the auxiliary electrode 4056.

While the auxiliary electrode 3856 or 4056 is illustrated as not being in direct physical contact with the second electrode 3850 or 4050 in the embodiments of FIGS. 39 and 41, it will be understood that the auxiliary electrode 3856 or 4056 and the second electrode 3850 or 4050 may nevertheless be in electrical communication. For example, the presence of a relatively thin film (e.g., up to about 100 nm) of a nucleation promoting material or a nucleation inhibiting material between the auxiliary electrode 3856 or 4056 and the second electrode 3850 or 4050 may still sufficiently allow a current to pass therethrough, thus allowing a sheet resistance of the second electrode 3850 or 4050 to be reduced.

Figure 42:
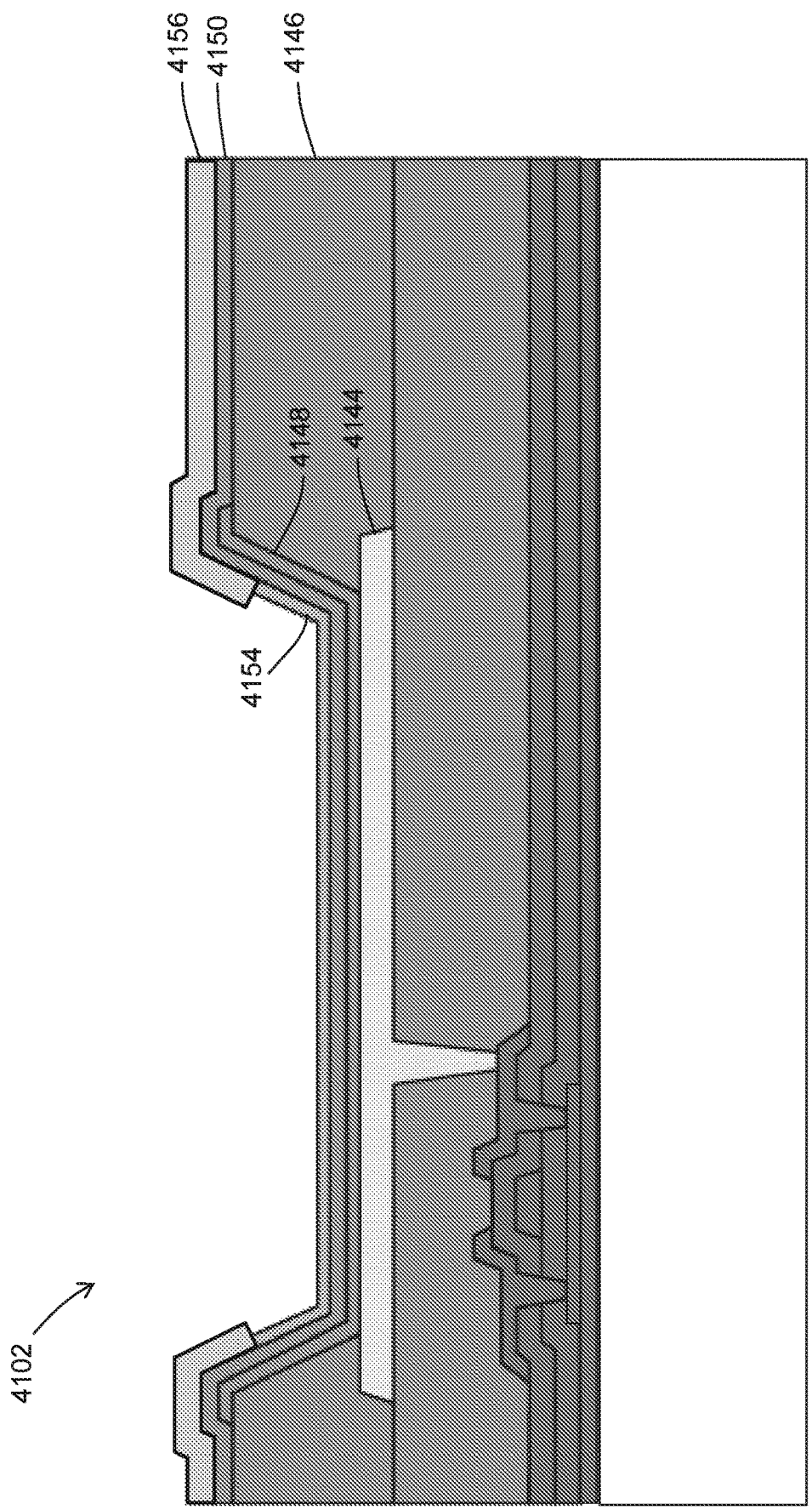
FIG. 42 is a diagram illustrating a cross-sectional profile of an active matrix OLED device according to yet another embodiment.

FIG. 42 illustrates a structure of an AMOLED device 4102 according to yet another embodiment in which an interface between a nucleation inhibiting coating 4154 and an auxiliary electrode 4156 is formed on a slanted surface created by PDLs 4146. The device 4102 includes an organic layer 4148 deposited between a first electrode 4144 and a second electrode 4150, and the nucleation inhibiting coating 4154 is deposited over a portion of the second electrode 4150 which corresponds to an emissive region of the device 4102. The auxiliary electrode 4156 is deposited over portions of the second electrode 4150 that are exposed from the nucleation inhibiting coating 4154.

While not shown, the AMOLED device 4102 of FIG. 42 may further include a nucleation promoting coating disposed between the auxiliary electrode 4156 and the second electrode 4150. The nucleation promoting coating may also be disposed between the nucleation inhibiting coating 4154 and the second electrode 4150, particularly in cases where the nucleation promoting coating is deposited using an open mask or a mask-free deposition process.

Figure 43:
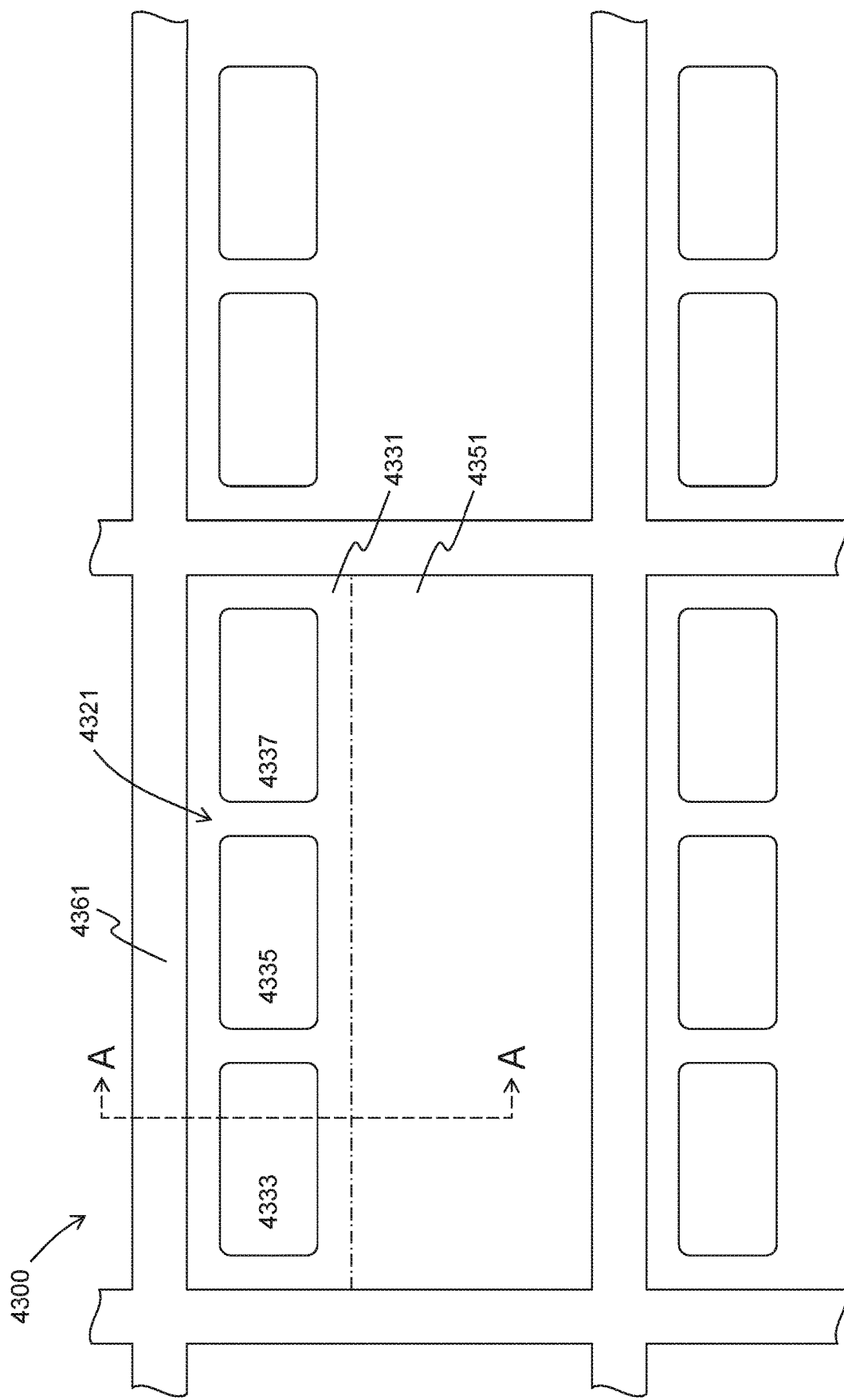
FIG. 43 is a diagram illustrating a transparent active matrix OLED device according to one embodiment.

FIG. 43 illustrates a portion of an AMOLED device 4300 according to yet another embodiment wherein the AMOLED device 4300 includes a plurality of light transmissive regions. As illustrated, the AMOLED device 4300 includes a plurality of pixels 4321 and an auxiliary electrode 4361 disposed between neighboring pixels 4321. Each pixel 4321 includes a subpixel region 4331, which further includes a plurality of subpixels 4333, 4335, 4337, and a light transmissive region 4351. For example, the subpixel 4333 may correspond to a red subpixel, the subpixel 4335 may correspond to a green subpixel, and the subpixel 4337 may correspond to a blue subpixel. As will be explained, the light transmissive region 4351 is substantially transparent to allow light to pass through the device 4300.

Figure 44:
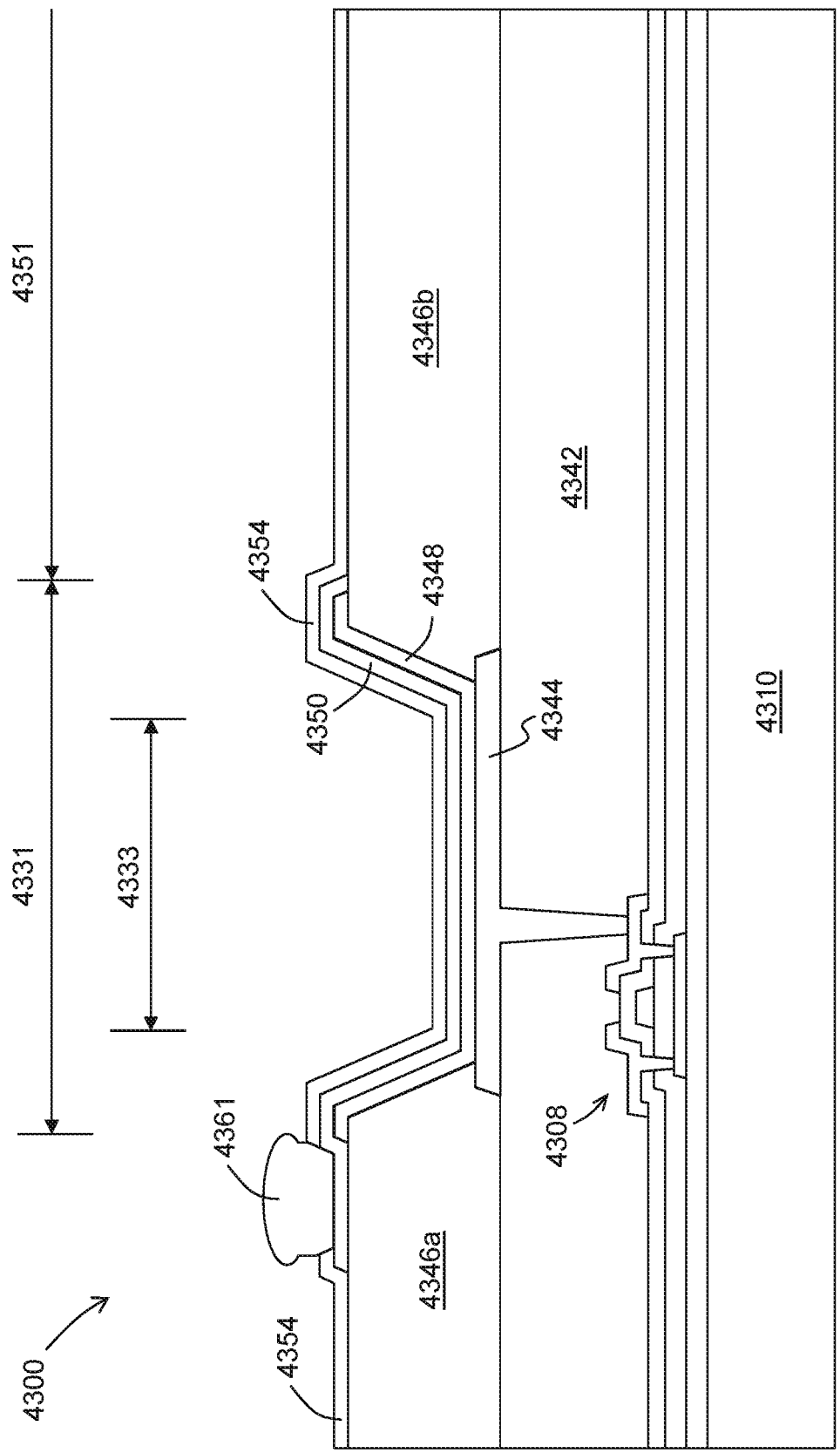
FIG. 44 is a diagram illustrating a cross-sectional profile of the device according to FIG. 43.

FIG. 44 illustrates a cross-sectional view of the device 4300 taken along line A-A as indicated in FIG. 43. Briefly, the device 4300 includes a base substrate 4310, a TFT 4308, an insulating layer 4342, and an anode 4344 formed on the insulating layer 4342 and in electrical communication with the TFT 4308. A first PDL 4346a and a second PDL 4346b are formed over the insulating layer 4342 and cover edges of the anode 4344. One or more organic layers 4348 are deposited to cover an exposed region of the anode 4344 and portions of the PDLs 4346a, 4346b. A cathode 4350 is then deposited over the one or more organic layers 4348. Next, a nucleation inhibiting coating 4354 is deposited to cover portions of the device 4300 corresponding to the light transmissive region 4351 and the subpixel region 4331. The entire device surface is then exposed to magnesium vapor flux, thus causing selective deposition of magnesium over an uncoated region of the cathode 4350. In this way, the auxiliary electrode 4361, which is in electrical contact with the underlying cathode 4350, is formed.

In the device 4300, the light transmissive region 4351 is substantially free of any materials which may substantially affect the transmission of light therethrough. In particular, the TFT 4308, the anode 4344, and the auxiliary electrode 4361 are all positioned within the subpixel region 4331 such that these components do not attenuate or impede light from being transmitted through the light transmissive region 4351. Such arrangement allows a viewer viewing the device 4300 from a typical viewing distance to see through the device 4300 when the pixels are off or are non-emitting, thus creating a transparent AMOLED display.

While not shown, the AMOLED device 4300 of FIG. 44 may further include a nucleation promoting coating disposed between the auxiliary electrode 4361 and the cathode 4350. The nucleation promoting coating may also be disposed between the nucleation inhibiting coating 4354 and the cathode 4350.

In other embodiments, various layers or coatings, including the organic layers 4348 and the cathode 4350, may cover a portion of the light transmissive region 4351 if such layers or coatings are substantially transparent. Alternatively, the PDLs 4346a, 4346b may not be provided in the light transmissive region 4351, if desired.

It will be appreciated that pixel and subpixel arrangements other than the arrangement illustrated in FIGS. 43 and 44 may also be used, and the auxiliary electrode 4361 may be provided in other regions of a pixel. For example, the auxiliary electrode 4361 may be provided in the region between the subpixel region 4331 and the light transmissive region 4351, and/or be provided between neighbouring subpixels, if desired.

In the foregoing embodiments, a nucleation inhibiting coating may, in addition to inhibiting nucleation and deposition of a conductive material (e.g., magnesium) thereon, act to enhance an out-coupling of light from a device. Specifically, the nucleation inhibiting coating may act as an index-matching coating and/or an anti-reflective coating.

A barrier coating (not shown) may be provided to encapsulate the devices illustrated in the foregoing embodiments depicting AMOLED display devices. As will be appreciated, such a barrier coating may inhibit various device layers, including organic layers and a cathode which may be prone to oxidation, from being exposed to moisture and ambient air. For example, the barrier coating may be a thin film encapsulation formed by printing, CVD, sputtering, ALD, any combinations of the foregoing, or by any other suitable methods. The barrier coating may also be provided by laminating a pre-formed barrier film onto the devices using an adhesive. For example, the barrier coating may be a multi-layer coating comprising organic materials, inorganic materials, or combination of both. The barrier coating may further comprise a getter material and/or a desiccant in some embodiments.

A sheet resistance specification for a common electrode of an AMOLED display device may vary according to a size of the display device (e.g., a panel size) and a tolerance for voltage variation. In general, the sheet resistance specification increases (e.g., a lower sheet resistance is specified) with larger panel sizes and lower tolerances for voltage variation across a panel.

Figure 56:
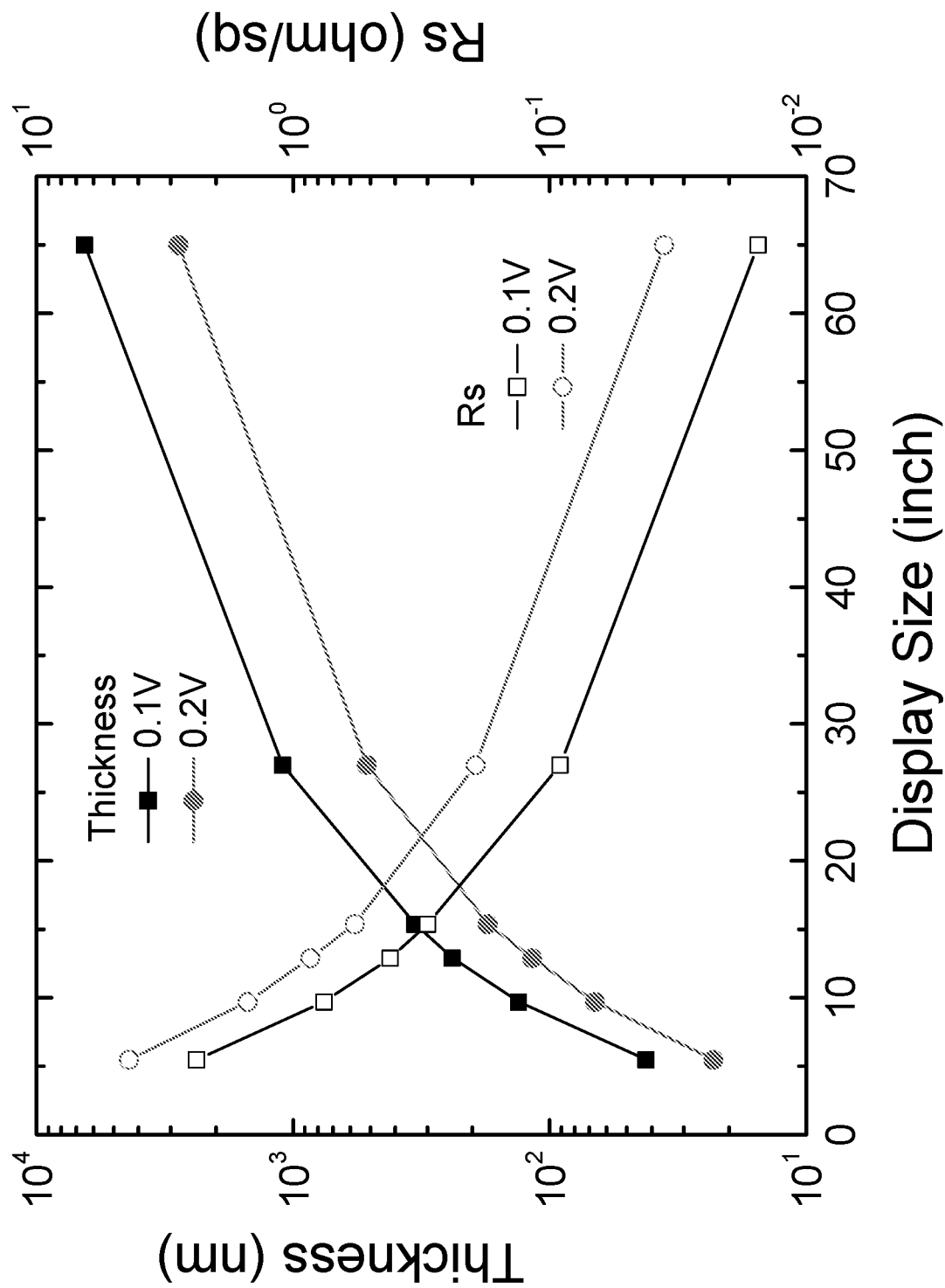
FIG. 56 is a plot showing sheet resistance specifications and associated auxiliary electrode thicknesses for various display panel sizes.

The sheet resistance specification and an associated thickness of an auxiliary electrode to comply with the specification according to an embodiment were calculated for various panel sizes and plotted in FIG. 56. The sheet resistances and the auxiliary electrode thicknesses were calculated for voltage tolerances of 0.1 V and 0.2 V. Specifically, a voltage tolerance indicates a difference in voltage that would be supplied to pixels at an edge and those at a center of a panel to compensate for a combined IR drop of a transparent electrode and an auxiliary electrode as explained above. For the purpose of the calculation, an aperture ratio of 0.64 was assumed for all display panel sizes.

The specified thickness of the auxiliary electrode at example panel sizes are summarized in Table 2 below.

TABLE 2

Specified thickness of auxiliary electrode for various panel sizes

|  |  | Panel Size (inch) | | | | |
| --- | --- | --- | --- | --- | --- | --- |
|  |  | 9.7 | 12.9 | 15.4 | 27 | 65 |
| Specified Thickness (nm) | @ 0.1 V | 132 | 239 | 335 | 1100 | 6500 |
|  | @ 0.2 V | 67 | 117 | 174 | 516 | 2800 |

As will be understood, various layers and portions of a backplane, including a thin-film transistor (TFT) (e.g., TFT 3804 shown in FIG. 39) may be fabricated using a variety of suitable materials and processes. For example, the TFT may be fabricated using organic or inorganic materials, which may be deposited and/or processed using techniques such as CVD, PECVD, laser annealing, and PVD (including sputtering). As would be understood, such layers may be patterned using photolithography, which uses a photomask to expose selective portions of a photoresist covering an underlying device layer to UV light. Depending on the type of photoresist used, exposed or unexposed portions of the photomask may then be washed off to reveal desired portion(s) of the underlying device layer. A patterned surface may then be etched, chemically or physically, to effectively remove an exposed portion of the device layer.

Furthermore, while a top-gate TFT has been illustrated and described in certain embodiments above, it will be appreciated that other TFT structures may also be used. For example, the TFT may be a bottom-gate TFT. The TFT may be an n-type TFT or a p-type TFT. Examples of TFT structures include those utilizing amorphous silicon (a-Si), indium gallium zinc oxide (IGZO), and low-temperature polycrystalline silicon (LTPS).

Various layers and portions of a frontplane, including electrodes, one or more organic layers, a pixel definition layer, and a capping layer may be deposited using any suitable deposition processes, including thermal evaporation and/or printing. It will be appreciated that, for example, a shadow mask may be used as appropriate to produce desired patterns when depositing such materials, and that various etching and selective deposition processes may also be used to pattern various layers. Examples of such methods include, but are not limited to, photolithography, printing (including ink or vapor jet printing and reel-to-reel printing), OVPD, and LITI patterning.

While certain embodiments have been described above with reference to selectively depositing a conductive coating to form a cathode or an auxiliary electrode for a common cathode, it will be understood that similar materials and processes may be used to form an anode or an auxiliary electrode for an anode in other embodiments.

EXAMPLES

Aspects of some embodiments will now be illustrated and described with reference to the following examples, which are not intended to limit the scope of the present disclosure in any way.

As used in the examples herein, a reference to a layer thickness of a material refers to an amount of the material deposited on a target surface (or target region(s) of the surface in the case of selective deposition), which corresponds to an amount of the material to cover the target surface with an uniformly thick layer of the material having the referenced layer thickness. By way of example, depositing a layer thickness of 10 nm indicates that an amount of the material deposited on the surface corresponds to an amount of the material to form an uniformly thick layer of the material that is 10 nm thick. It will be appreciated that, for example, due to possible stacking or clustering of molecules or atoms, an actual thickness of the deposited material may be non-uniform. For example, depositing a layer thickness of 10 nm may yield some portions of the deposited material having an actual thickness greater than 10 nm, or other portions of the deposited material having an actual thickness less than 10 nm. A certain layer thickness of a material deposited on a surface can correspond to an average thickness of the deposited material across the surface.

Molecular structures of certain materials used in the illustrative examples are provided below.

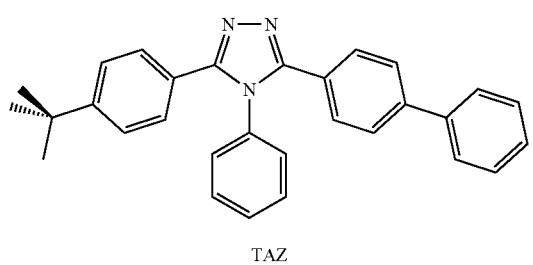

TAZ

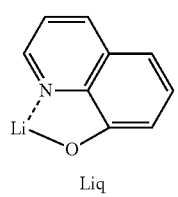

Liq

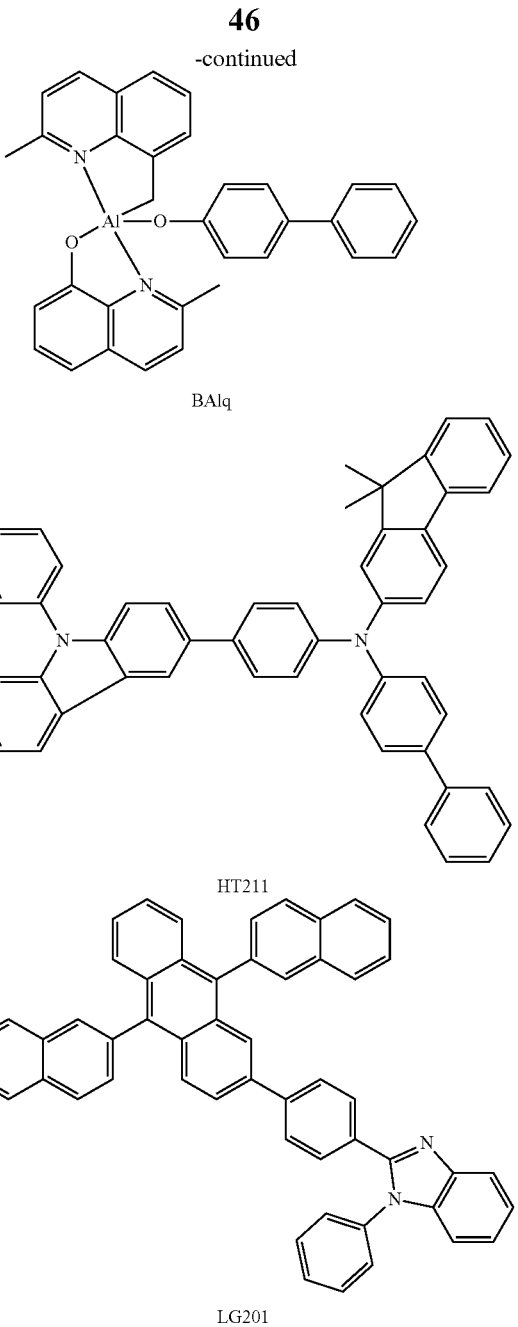

Example 1

In order to characterize an interface between a nucleation inhibiting coating and an adjacent magnesium coating, a series of samples having varying layer thicknesses of the nucleation inhibiting coating and the magnesium coating were prepared and analyzed. Samples were prepared in a high vacuum deposition system with cryo-pumped processing chamber and turbo-molecular pumped load lock chamber using stainless steel shadow masks. Materials were thermally deposited from Knudsen cells (K-cells) using quartz crystal microbalances (QCMs) to monitor a deposition rate. A base pressure of the system was less than about $10^{-5}$ Pa, with a partial pressure of $H_2O$ less than about $10^{-8}$ Torr during deposition. Magnesium was deposited at a source temperature of about 430-570° C. at a deposition rate of about 1-5 Å/sec. SEM micrographs were taken using a Hitachi S-5200.

The samples were prepared by first depositing about 30 nm of silver over a silicon substrate using thermal deposition. A nucleation inhibiting coating was then selectively deposited on a region of the silver surface using a shadow mask. In all of the samples, 3-(4-biphenyl)-4-phenyl-5-tert-butylphenyl-1,2,4-triazole (TAZ) was used to form the nucleation inhibiting coating. Once the nucleation inhibiting coating was deposited, substantially pure magnesium (about 99.99% purity) was deposited using open mask deposition. More specifically, both an exposed silver surface and a nucleation inhibiting coating surface were subjected to an evaporated magnesium flux during the open mask deposition. The layer thicknesses of the nucleation inhibiting coating and associated deposition rates are summarized in Table 3 below. All depositions were conducted under vacuum (about $10^{-4}$ to about $10^{-6}$ Pa), and the layer thicknesses and deposition rates were monitored using a calibrated quartz crystal microbalance (QCM).

TABLE 3

TAZ and magnesium thicknesses and deposition rates

| Sample No. | TAZ thickness (nm) | Mg thickness (nm) | TAZ deposition rate (Å/s) | Mg deposition rate (Å/s) |
|---|---|---|---|---|
| Sample 1 | 10 | 1160 | 0.2 | 2 |
| Sample 2 | 100 | 500 | 0.7 | 2 |

The samples were analyzed using scanning electron microscopy (SEM) and energy-dispersive X-ray spectroscopy (EDX).

Figure 45A:
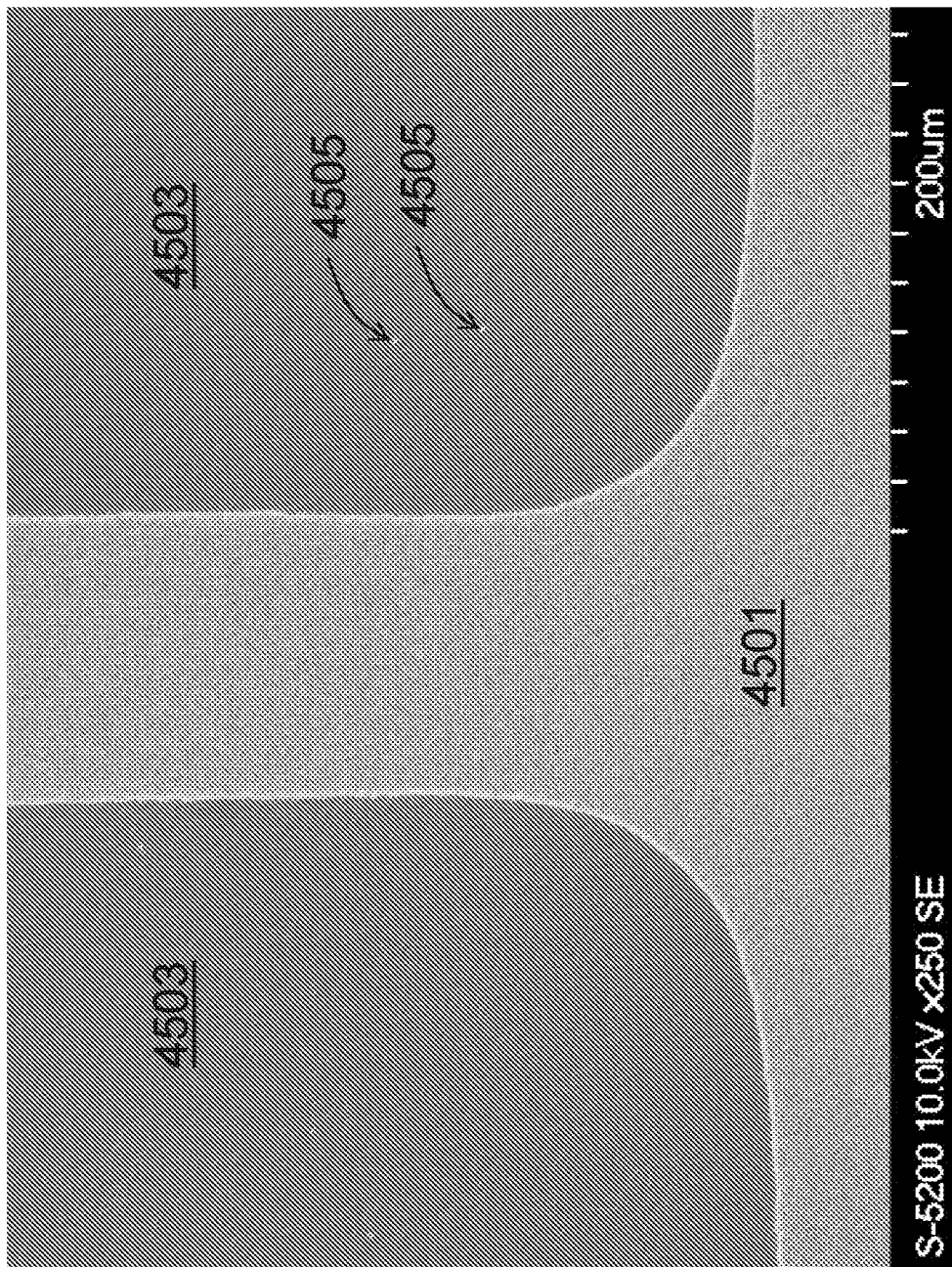
FIG. 45A is a SEM image of a top view of Sample 1.
Figure 45C:
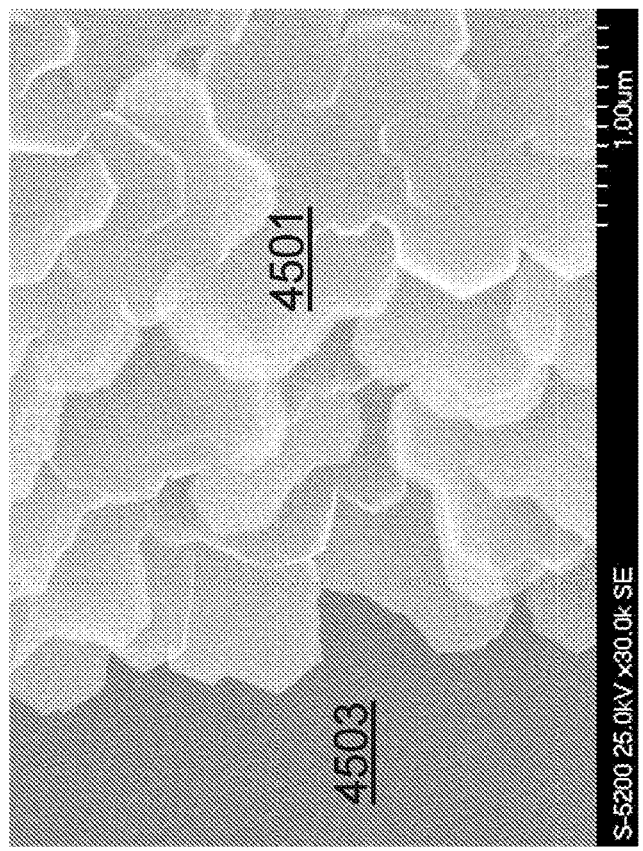
FIGS. 45B and 45C are SEM images showing a magnified view of a portion of the sample of FIG. 45A.
Figure 45B:
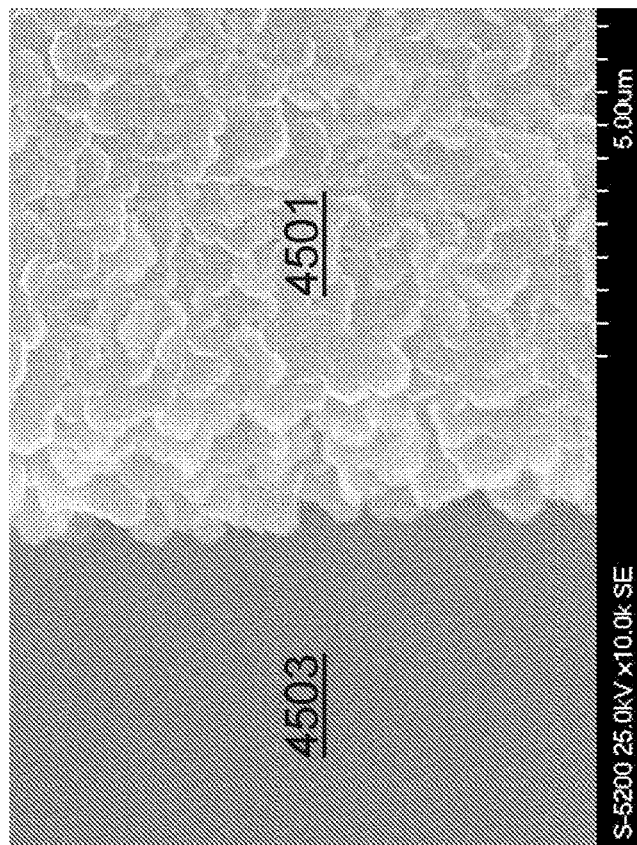

FIG. 45A is a SEM image of a top view of Sample 1. A first region 4501 of the image corresponds to a region over which magnesium has been deposited on top of the exposed silver surface, and a second region 4503 corresponds to a region covered by the nucleation inhibiting coating (TAZ). FIGS. 45B and 45C show a magnified top view of a portion of Sample 1 as shown in FIG. 45A. Based on the EDX elemental analysis, the presence of magnesium was not detected over a majority of the second region 4503. However, the formation of magnesium-containing islands or clusters 4505 was observed (see FIG. 45A), and the presence of magnesium in those islands 4503 was confirmed based on the EDX elemental analysis.

Figure 45E:
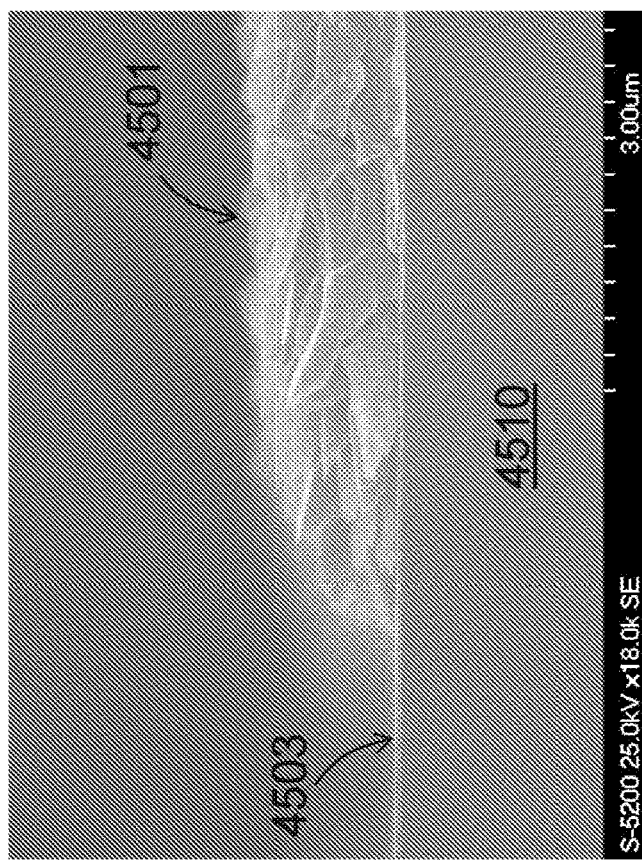
FIG. 45E is a SEM image showing a cross-sectional view of the sample of FIG. 45A.
Figure 45D:
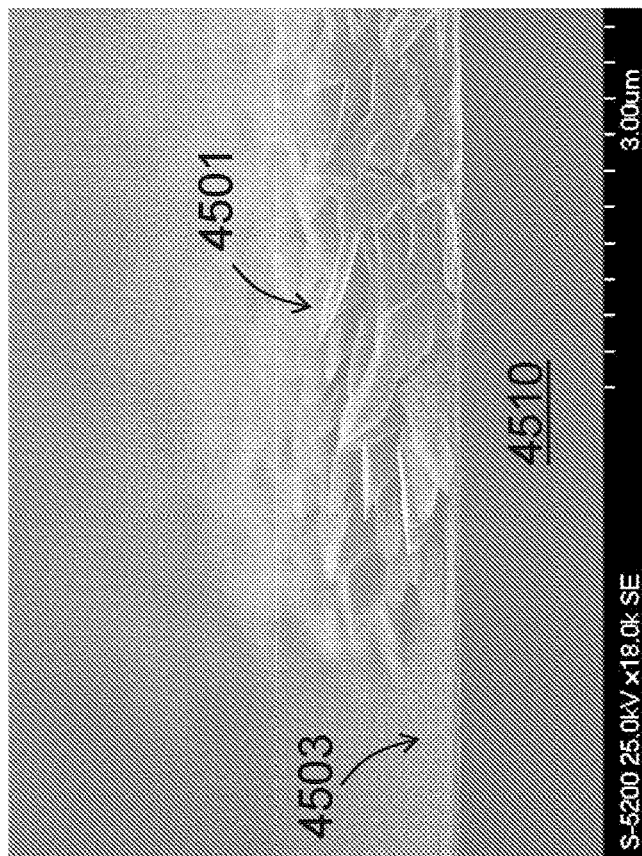
FIG. 45D is a SEM image showing a cross-sectional view of the sample of FIG. 45A.

FIGS. 45D and 45E are SEM cross-sectional images of Sample 1, which shows an interface between the magnesium coating (the region 4501) and the nucleation inhibiting coating (region 4503). The underlying substrate 4510 can also be seen in these images.

Figure 45G:
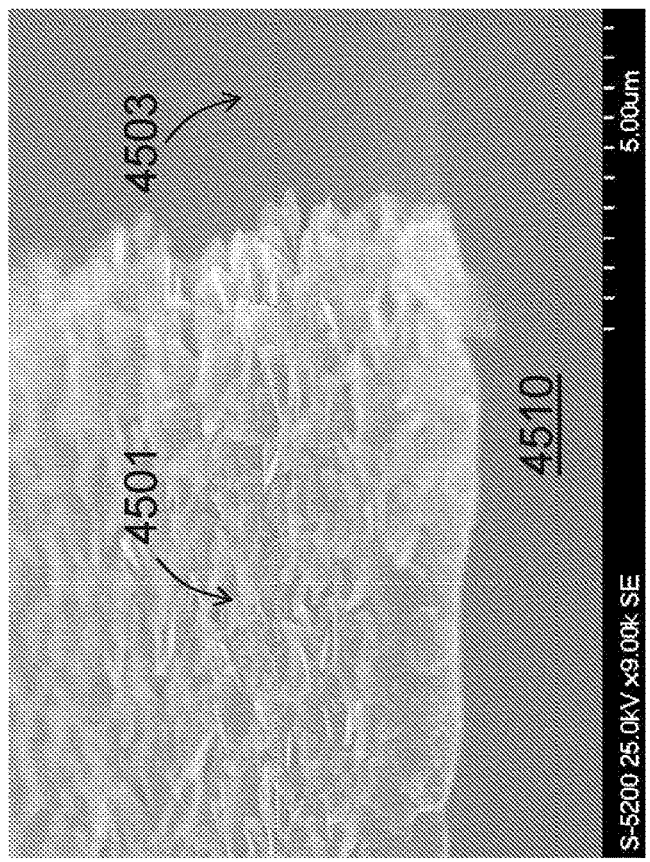
FIG. 45G is a tilted SEM image showing the sample portion of FIG. 45F.
Figure 45F:
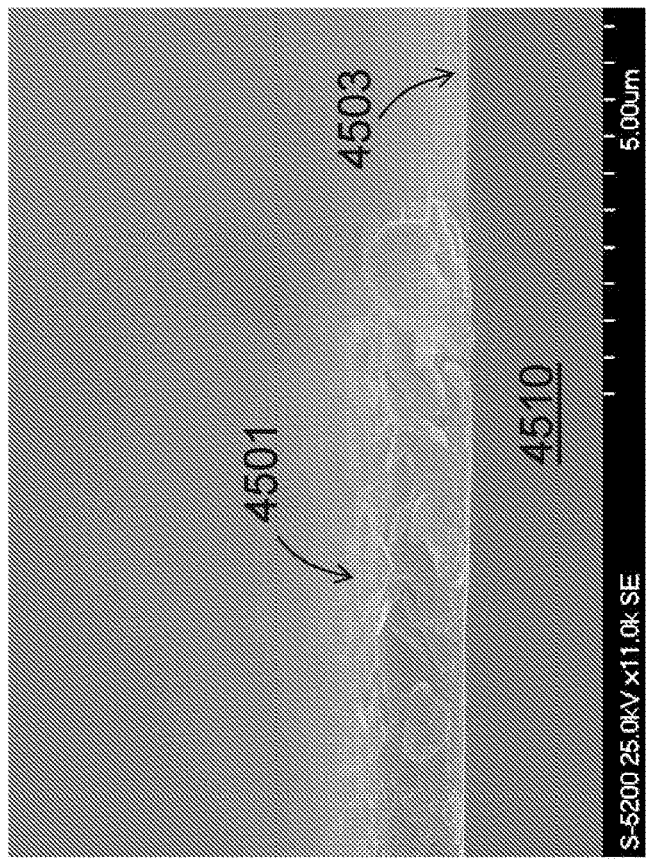
FIG. 45F is a SEM image showing a cross-sectional view of another portion of the sample of FIG. 45A.

FIGS. 45F and 45G are additional SEM cross-sectional images of Sample 1, taken at a different portion of the sample than FIGS. 45D and 45E.

As can be seen from FIGS. 45D-45G, the magnesium coating (the region 4501) includes a portion extending laterally over the nucleation inhibiting coating (the region 4503) in a partially overlapping region near the interface of the magnesium coating and the nucleation inhibiting coating. Specifically, the portion of the magnesium coating can be seen as forming an overhang which is not in direct contact with the surface of the nucleation inhibiting coating, thus creating a gap between the magnesium coating and the nucleation inhibiting coating at the interface.

Figure 45H:
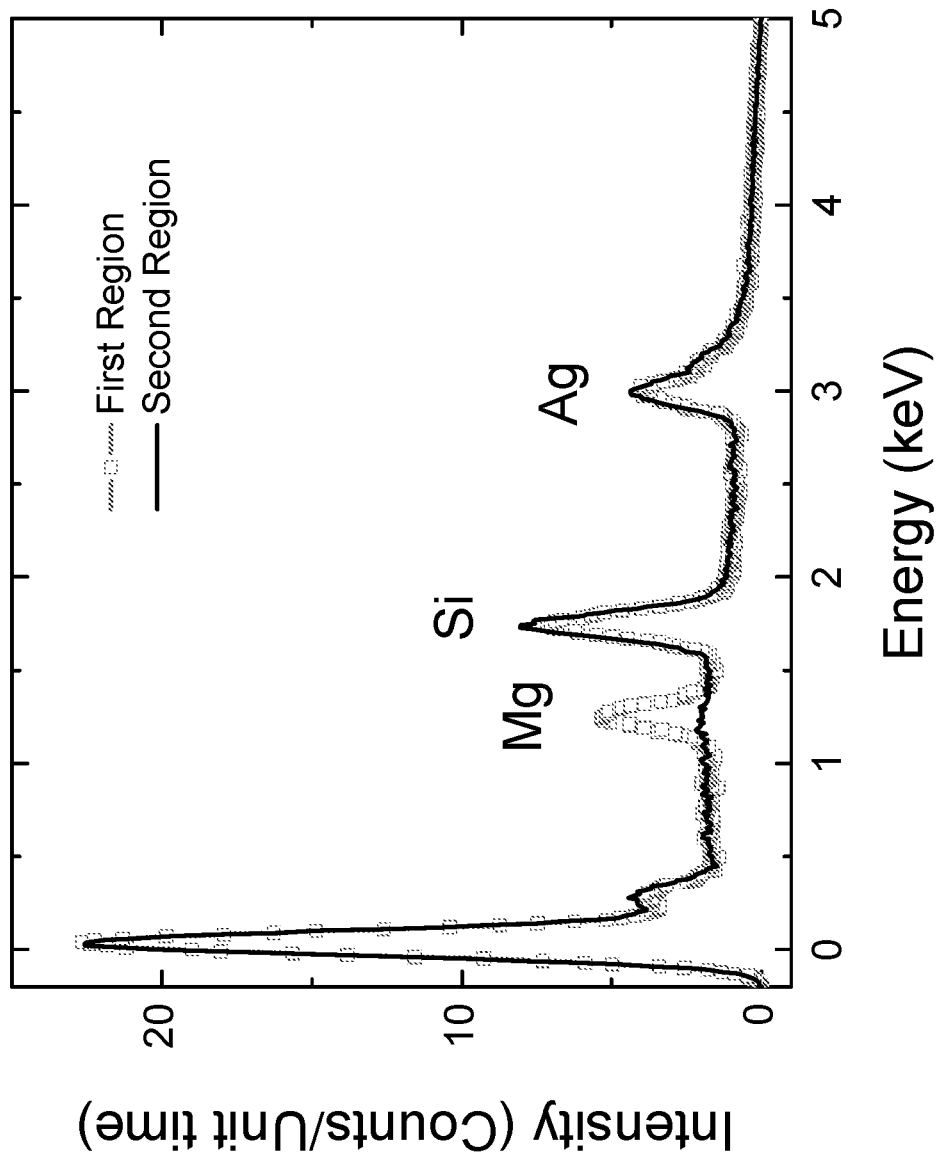
FIG. 45H is a plot showing an EDX spectra taken from the sample of FIG. 45A.

FIG. 45H shows an EDX spectra taken from the first region 4501 and the second region 4503 of Sample 1. As can be seen from the plot of FIG. 45H, a peak corresponding to magnesium is clearly observed in the spectrum taken from the first region 4501, whereas no noticeable peak is detected in the spectrum taken from the second region 4503. The EDX measurements were taken at 5 keV over a sample area of about 2 pmt.

Figure 46A:
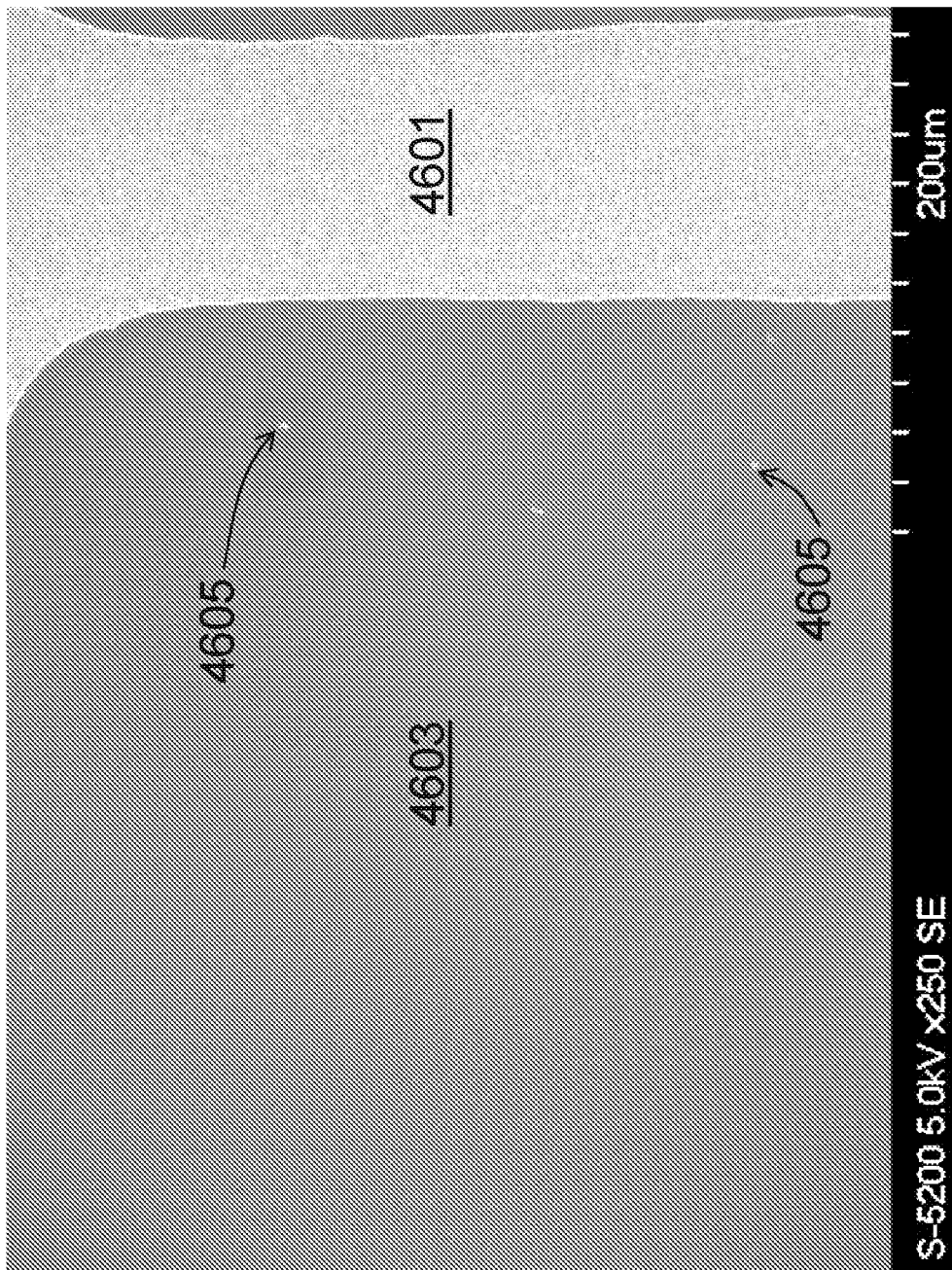
FIG. 46A is a SEM image of a top view of Sample 2.
Figure 46B:
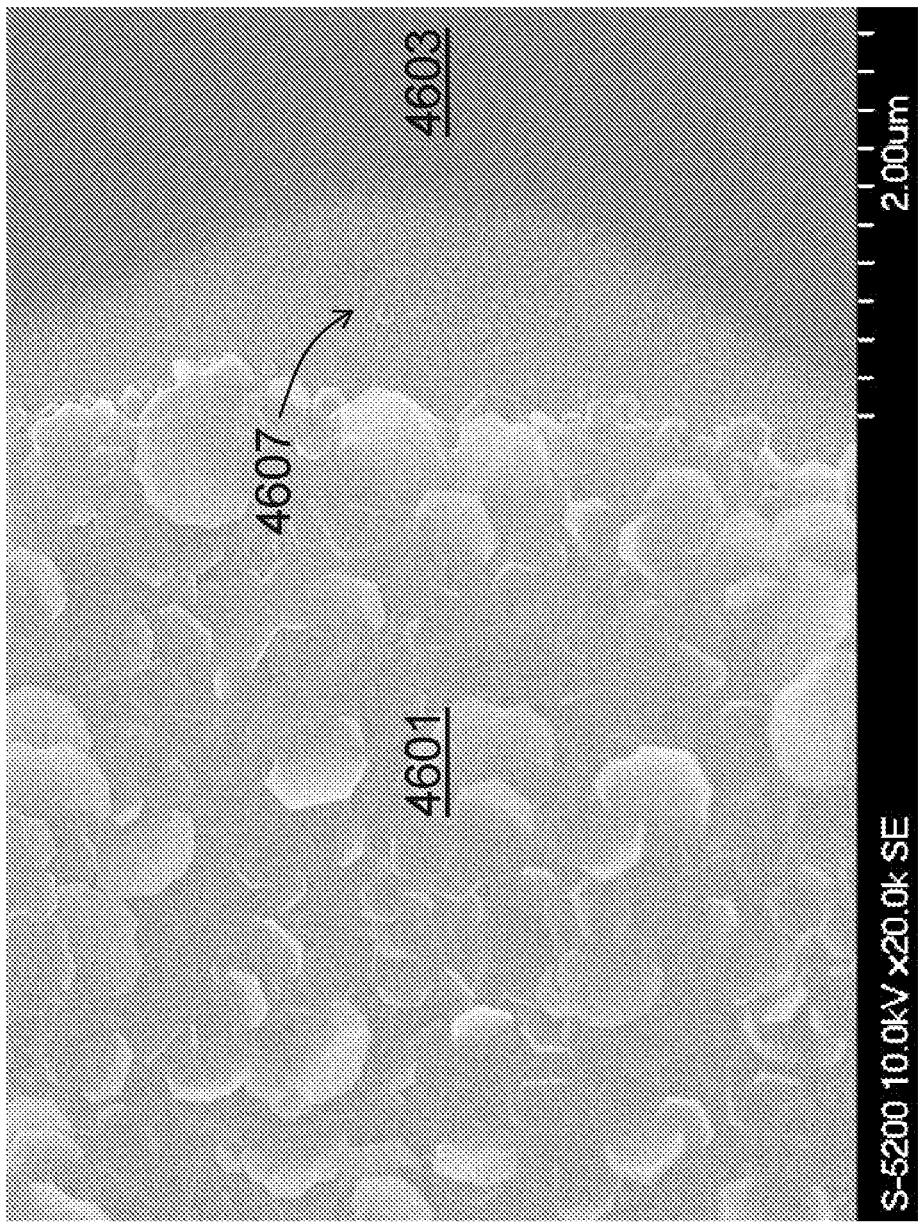
FIG. 46B is a SEM image showing a magnified view of a portion of the sample of FIG. 46A.
Figure 46C:
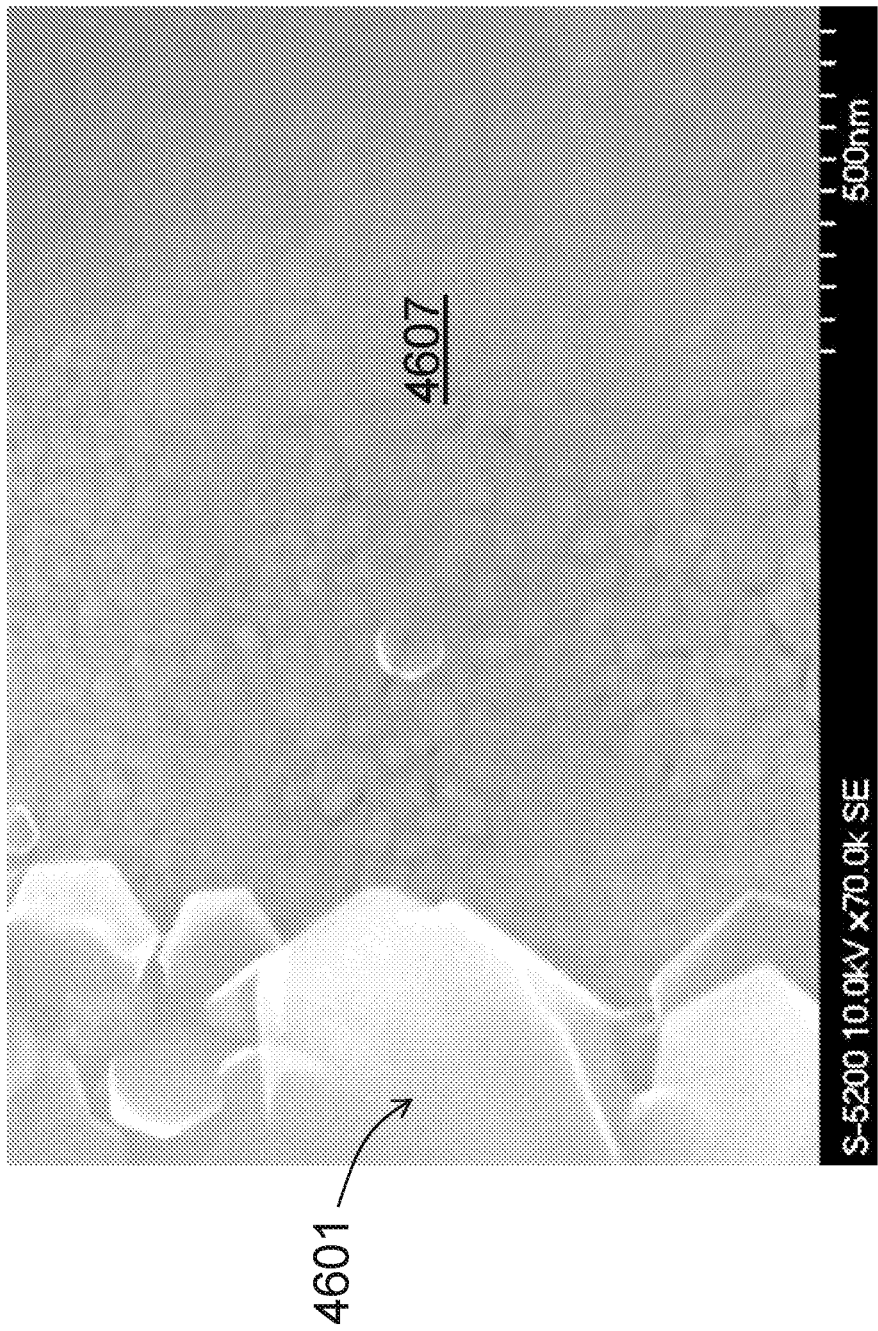
FIG. 46C is a SEM image showing a further magnified view of the sample portion of FIG. 46B.
Figure 46D:
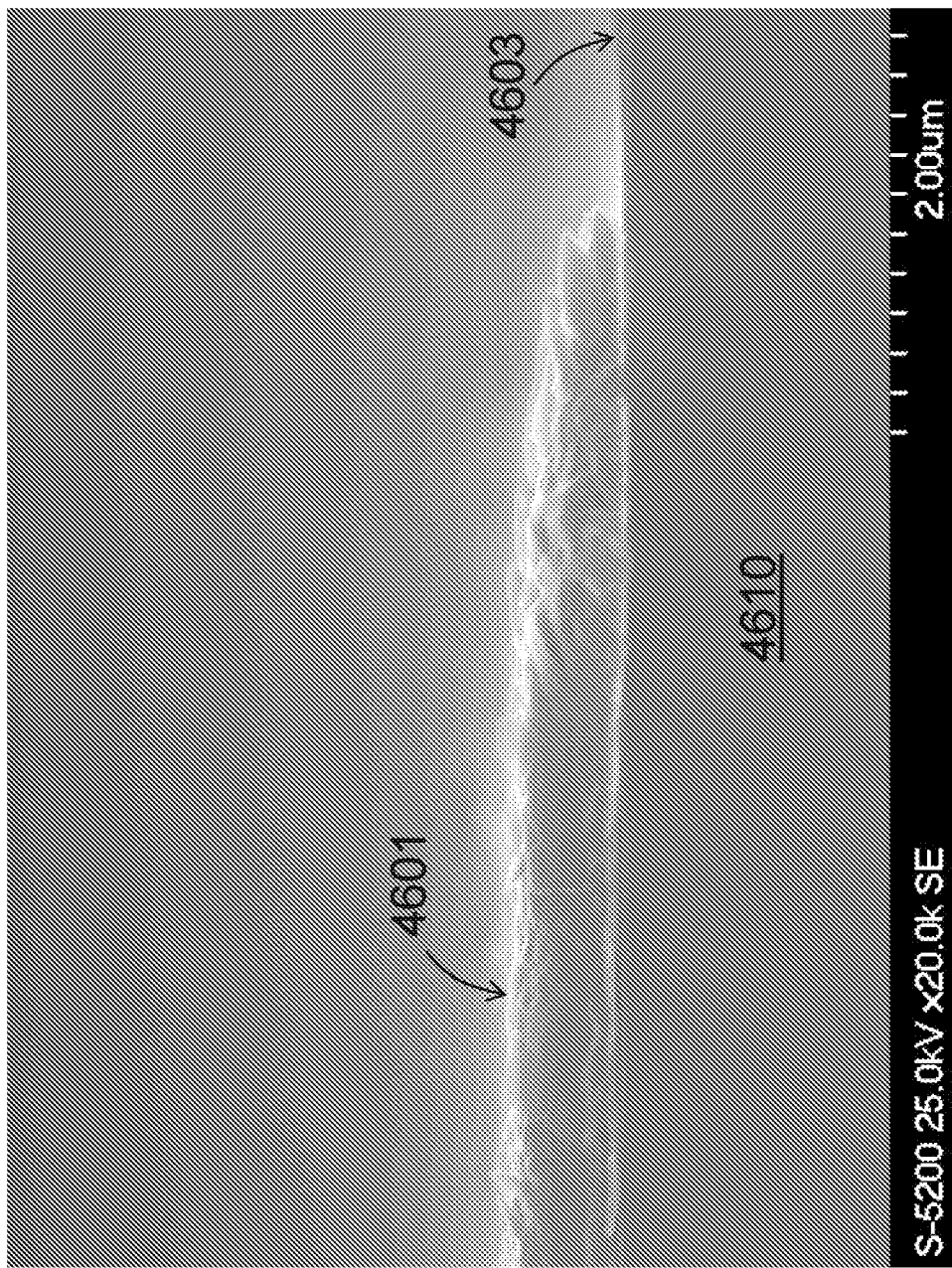
FIG. 46D is a SEM image showing a cross-sectional view of the sample of FIG. 46A.
Figure 46F:
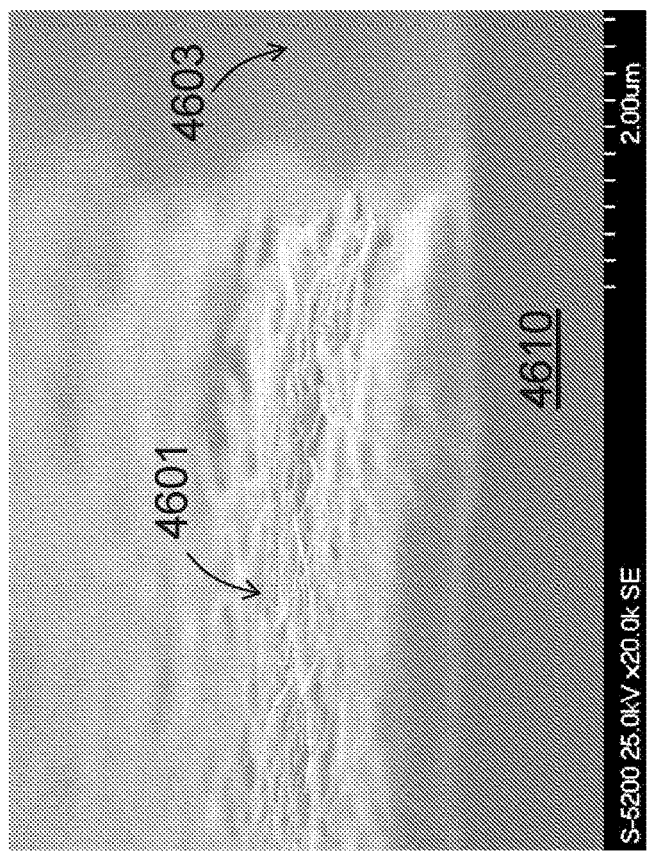
FIGS. 46E and 46F are tilted SEM images showing a surface of the sample of FIG. 46A.
Figure 46E:
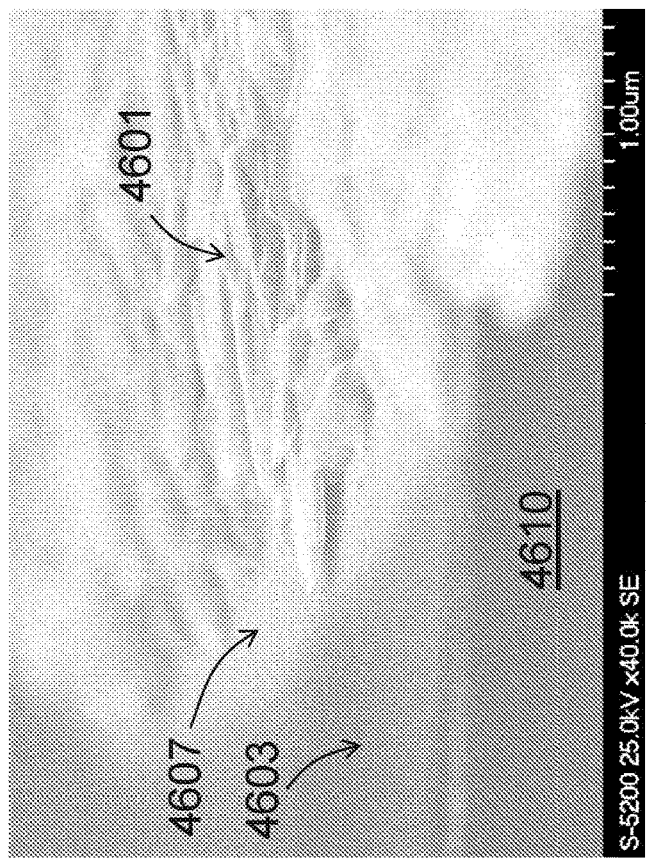

FIG. 46A is a SEM image of a top view of Sample 2. A first region 4601 of the image corresponds to a region over which magnesium has been deposited on top of the exposed silver surface, and a second region 4603 corresponds to a region covered by the nucleation inhibiting coating (TAZ). A magnified image of a portion of FIG. 46A is shown in FIG. 46B, and a further magnified image of a portion of FIG. 46B is shown in FIG. 46C. A cross-sectional profile of the sample is shown in the images of FIGS. 46D, 46E, and 46F, which also shows the substrate 4610. As can be seen in the images of FIGS. 46B-F, there is a relatively thin film or layer of magnesium 4607 deposited near the interface between the magnesium coating (the region 4601) and the TAZ coating (the region 4603). The presence of magnesium in the thin film 4607 was confirmed through EDX measurements. Also, the formation of magnesium-containing islands or clusters 4605 was observed (see FIG. 46A).

Figure 46G:
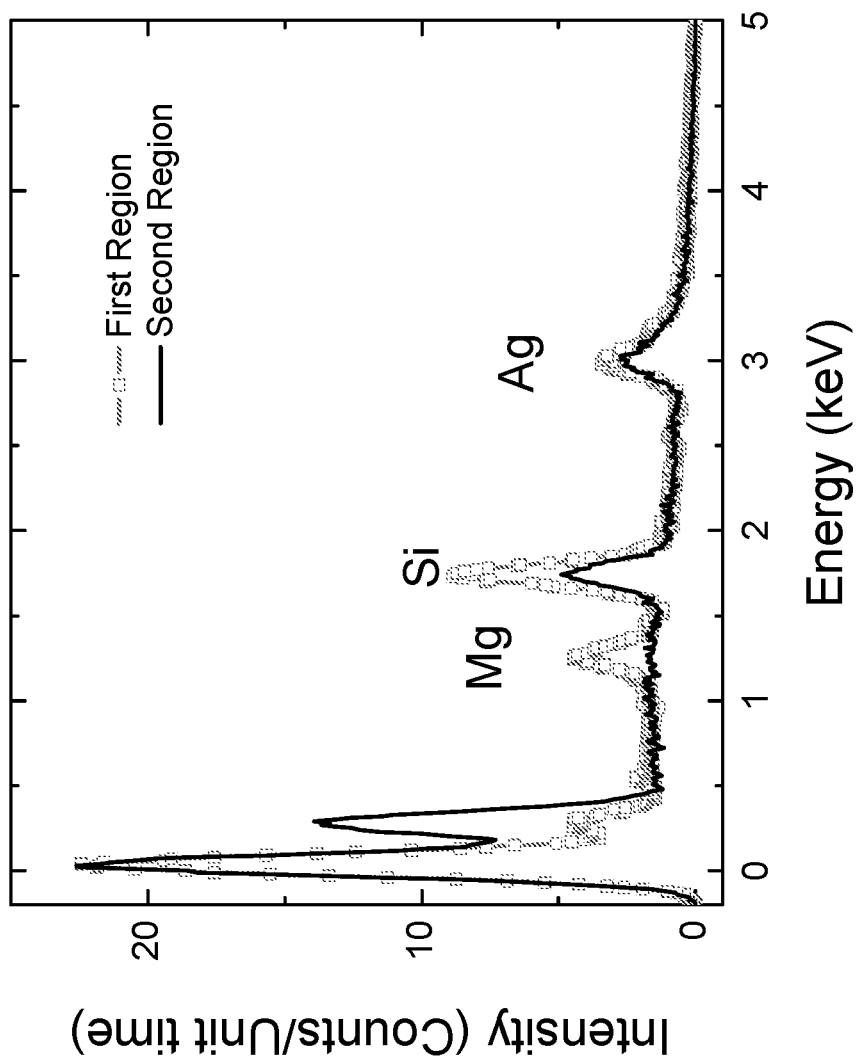
FIG. 46G is a plot showing an EDX spectra taken from the sample of FIG. 46A.

FIG. 46G shows an EDX spectra taken from the first region 4601 and the second region 4603 of Sample 2. As can be seen from the plot of FIG. 46G, a peak corresponding to magnesium is clearly observed in the spectrum taken from the first region 4601, whereas no noticeable peak is detected in the spectrum taken from the second region 4603. The EDX measurements were taken at 5 keV over a sample area of about 2 pmt.

Figure 46H:
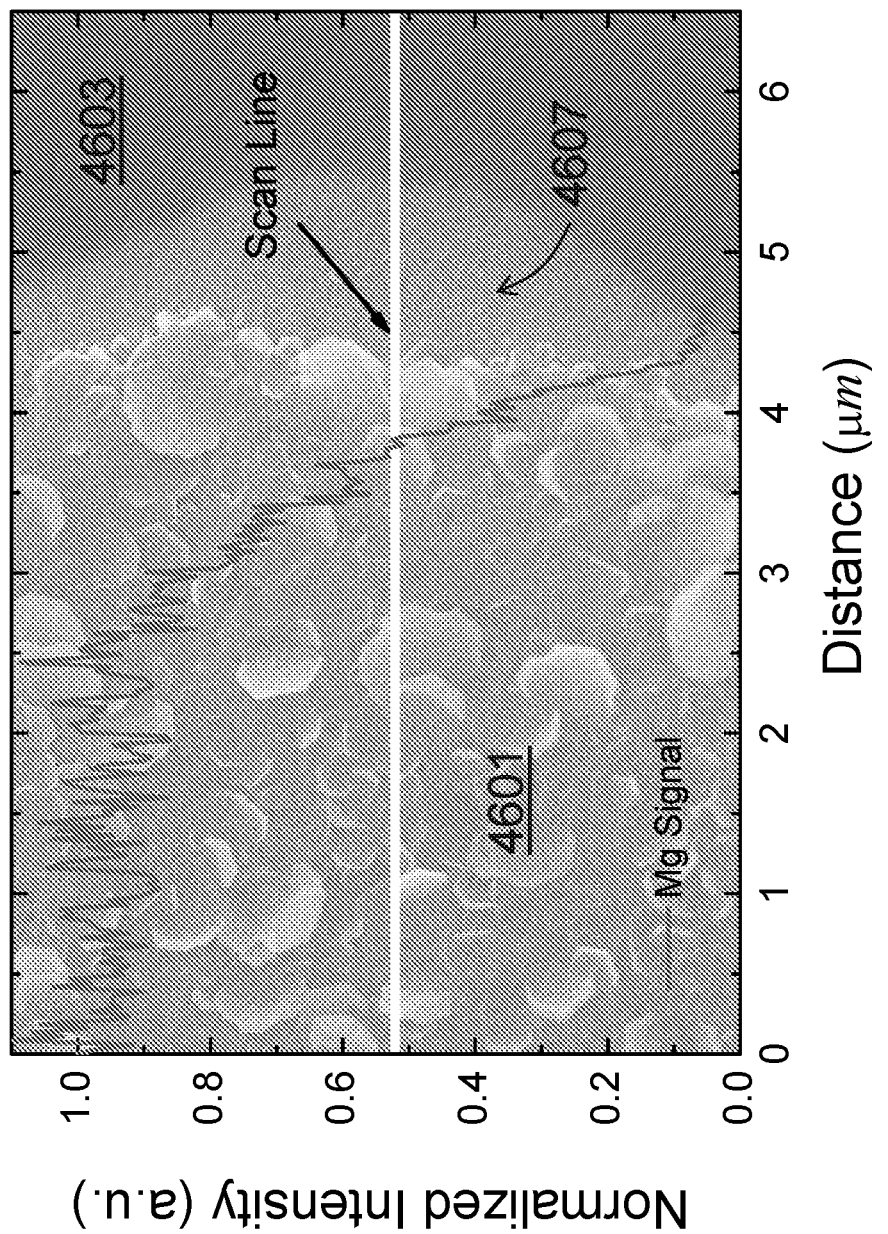
FIG. 46H shows a magnesium EDX spectrum overlaid on top of an SEM image showing a corresponding portion of the sample from which the spectrum was obtained.

FIG. 46H shows a linear EDX scan of the magnesium spectrum taken along a scan line of Sample 2. The EDX spectrum is overlaid on top of the corresponding SEM image to show the portion of the sample from which the EDX spectrum was obtained. As can be seen, the intensity of the magnesium spectrum begins to decrease at about 1.7 µm from the interface between the first region 4601 and the thin film 4607. This observation is consistent with the cross-sectional profile observed for the sample (e.g., FIG. 46D), which shows a thickness of the magnesium coating gradually decreasing or tapering near the interface.

Example 2

To measure properties of various materials for use as a nucleation inhibiting coating or a nucleation promoting coating, a series of experiments were conducted using a set of quartz crystal microbalances (QCMs).

As will be understood, a QCM can be used to monitor a rate of deposition in a thin film deposition process. Briefly, such monitoring is conducted by measuring a change in frequency of a quartz crystal resonator caused by addition or removal of a material on a surface of the resonator.

Figure 47:
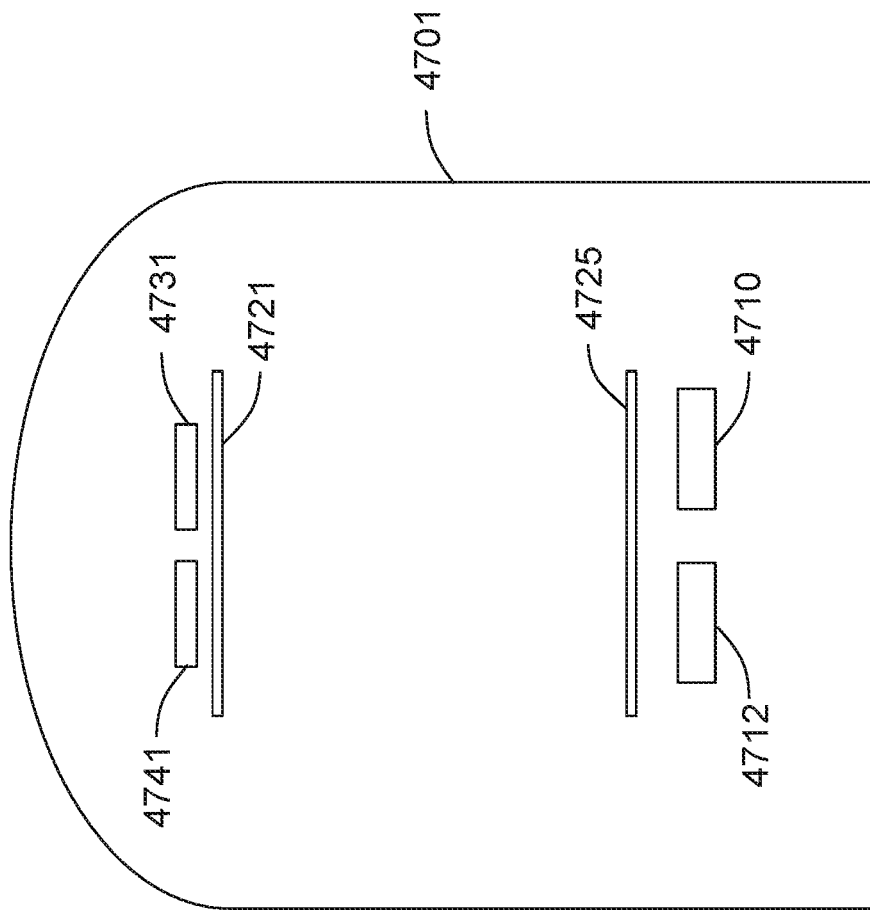
FIG. 47 is a schematic diagram illustrating a chamber set up for conducting deposition experiments using quartz crystal microbalances (QCMs)

FIG. 47 is a schematic diagram illustrating an experimental set-up for measuring a deposition profile of magnesium on surfaces of QCMs. As illustrated, an evaporation chamber 4701 includes a first evaporation source 4710 and a second evaporation source 4712. A pair of QCMs 4731 and 4741 are positioned inside the chamber 4701 with a resonator surface of each of the QCMs 4731 and 4741 facing towards the sources 4710 and 4712. A sample shutter 4721 and a source shutter 4725 are disposed between the QCMs 4731 and 4741 and the evaporation sources 4710 and 4712. The sample shutter 4721 and the source shutter 4725 are moveable shutters adapted to control a flux of vapor incident on the QCMs 4731 and 4741 and the flux of vapor exiting from the sources 4710 and 4712, respectively.

In the illustrated example set up, the first QCM 4731, which will also be referred to herein as a "reference QCM", serves as a baseline against which a deposition profile of magnesium on the second QCM 4741, which will also be referred to herein as a "sample QCM", is compared. Optically polished quartz crystals obtained from LapTech Precision Inc. (part number: XL1252; frequency: 6.000 MHz; AT1; center: 5.985 MHz; diameter: 13.97 mm±3 mm; optically polished) were used as the reference QCM and the sample QCM in each experiment.

Each experiment was conducted as follows. First, the reference QCM 4731 and the sample QCM 4741 were positioned inside the evaporation chamber 4701 as illustrated in FIG. 47. The chamber 4701 was then pumped down until the chamber pressure was below about $10^{-5}$ Pa. The sample shutter 4721 was then actuated such that the resonator surfaces of both the reference QCM 4731 and the sample QCM 4741 were masked. The first evaporation source 4710 was then initiated to start evaporation of a nucleation promoting or inhibiting material (also referred to as a "nucleation modifying material" herein). Once a stable evaporation rate was achieved, the sample shutter 4721 was moved such that the resonator surface of the sample QCM 4741 became exposed to the vapor flux while keeping the surface of the reference QCM 4731 unexposed, thus allowing the nucleation modifying material to be deposited on the surface of the sample QCM 4741. Upon depositing a desired layer thickness of the nucleation modifying material on the surface of the sample QCM 4741, the source shutter 4725 was actuated to block the vapor flux exiting the first source 4710, thus preventing further deposition. The first source 4710 was then shut off.

Next, the second evaporation source 4712 was initiated to start evaporation of magnesium. The shutter 4721 was used to cover the QCMs 4731 and 4741 until a stable deposition rate was reached. Once the stable deposition rate was reached, the shutter 4721 was actuated to uncover both the modified surface of the sample QCM 4741 and the surface of the reference QCM 4731, such that magnesium vapor was incident on the surfaces of both QCMs 4731 and 4741. The resonant frequencies of the QCMs 4731 and 4741 were monitored to determine the deposition profiles of magnesium on each of the QCMs 4731 and 4741.

Various nucleation modifying materials, including those that can be used to form a nucleation inhibiting coating, were deposited on the resonator surface of the sample QCM 4741 to form a nucleation modifying coating thereon. By repeating the above experimental procedure using the chamber configuration illustrated in FIG. 47 for each nucleation modifying material, the deposition rate of magnesium on various surfaces was analyzed. The following materials were used to form a nucleation modifying coating: 3-(4-biphenyl)-4-phenyl-5-tert-butylphenyl-1,2,4-triazole (TAZ); aluminum (III) bis(2-methyl-8-quninolinato)-4-phenylphenolate (BAlq); 2-(4-(9,10-di(naphthalene-2-yl)anthracene-2-yl)phenyl)-1-phenyl-1H-benzo-[D]imidazole (LG201); 8-hydroxyquinoline lithium (Liq); and N(diphenyl-4-yl)9,9-dimethyl-N-(4(9-phenyl-9H-carbazol yl)phenyl)-9H-fluorene-2-amine (HT211).

Figure 57:
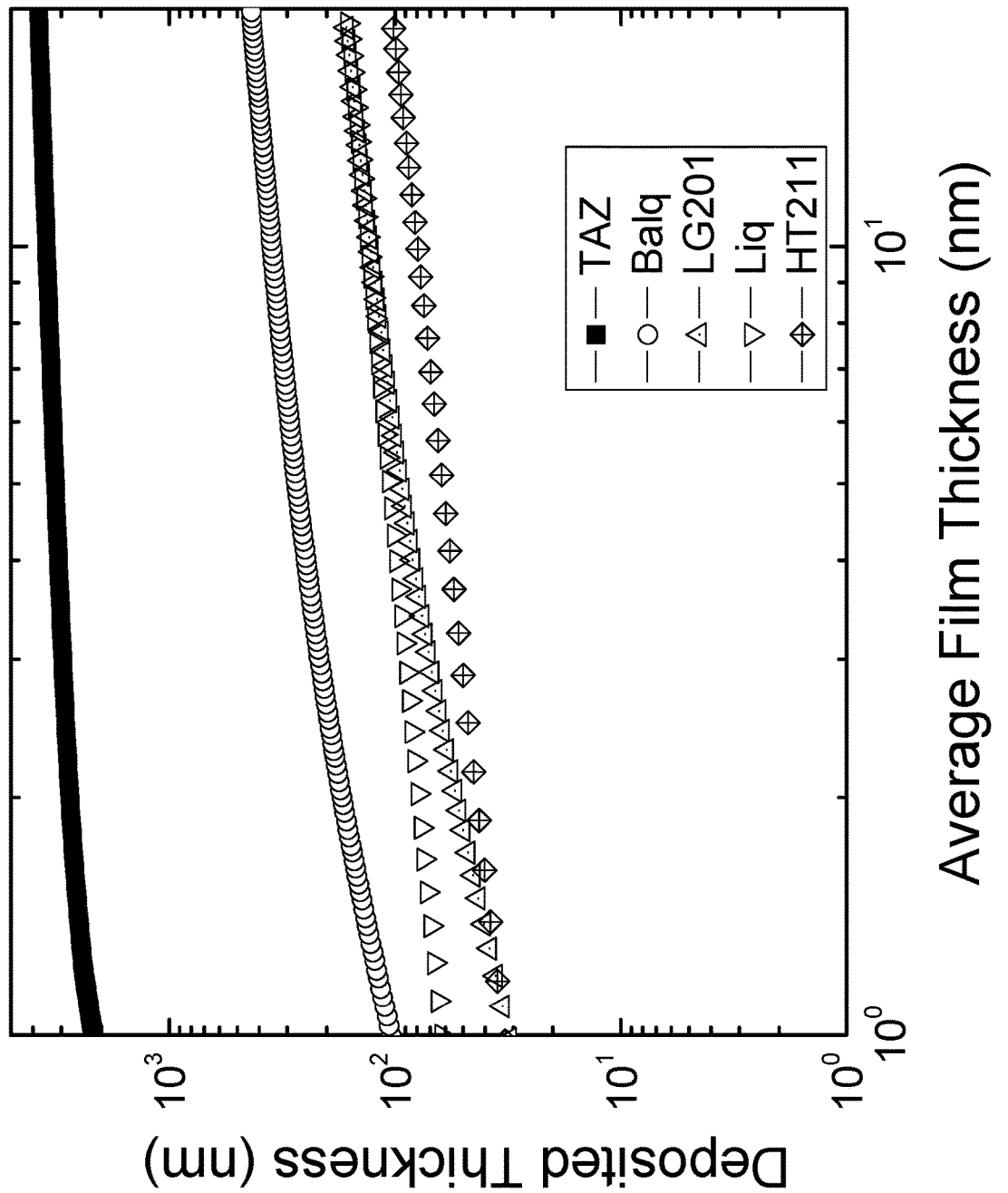
FIG. 57 is a plot showing a layer thickness of magnesium deposited on a reference QCM surface versus a layer thickness of magnesium deposited on a sample QCM surface covered with various nucleation modifying coatings.

FIG. 57 is a log-log plot showing a layer thickness of magnesium deposited on the reference QCM surface (reference layer thickness, or "deposited thickness" as labeled in FIG. 57) against a layer thickness of magnesium deposited on the sample QCM surface (sample layer thickness, or "average film thickness" as labeled in FIG. 57). In each case, the reference QCM surface was pre-coated with substantially pure silver prior to conducting the experiments.

Based on the plot of FIG. 57, the layer thicknesses of magnesium deposited on both QCM surfaces and thus the deposition rate of magnesium as a result of exposing the surfaces to the same magnesium vapor flux can be determined. In particular, by comparing the deposition rate of magnesium on the sample QCM surface to that on the reference QCM surface during the formation of a relatively thin layer of magnesium on the sample QCM surface (namely, during initial stages of deposition of up to 1 nm or 10 nm in layer thickness), the nucleation inhibiting properties of a coating present on the sample QCM surface may be determined. For ease of discussion, the layer thickness of magnesium deposited on the sample QCM surface will be referred to as the sample layer thickness, and the layer thickness of magnesium deposited on the reference QCM surface will be referred to as the reference layer thickness.

For certain experiments, the reference layer thickness corresponding to the sample layer thickness at 1 nm and 10 nm for various samples is summarized in Table 4 below. Specifically, the reference layer thickness provided in Table 4 corresponds to the layer thickness of magnesium deposited on the reference QCM surface in the same time period for a 1 nm or 10 nm layer thickness to be deposited on the sample QCM surface for each sample. Organic materials were deposited at a deposition rate of about 1 Å/sec at a vacuum pressure of about $10^{-5}$ Pa. Magnesium was deposited at a deposition rate of about 2 Å/sec at a source temperature of about 520-530° C. and a vacuum pressure of about $10^{-5}$ Pa.

TABLE 4

Summary of results of the sample layer thickness and corresponding reference layer thickness

| Nucleation Modifying Material | Thickness of Mg on sample QCM surface (nm) | Thickness of Mg on reference QCM surface (nm) |
|---|---|---|
| TAZ | 1 | 2158 |
| BAlq | 1 | 104 |
| LG201 | 1 | 31 |
| Liq | 1 | 62 |
| HT211 | 1 | 33 |

Based on the above, it can be seen that the reference layer thickness which was deposited when the sample layer thickness of 1 nm was reached varied substantially depending on the nucleation modifying material covering the sample QCM surface. A threshold sample layer thickness of 1 nm was selected in this example to determine the relative deposition rates during the initial stage of film formation on the sample QCM surface. It was observed that, since the reference QCM surface was pre-coated with silver, the deposition rate of magnesium on the reference QCM surface remained relatively constant.

A relatively thick coating of magnesium in excess of 2000 nm was deposited on the reference QCM before the sample layer thickness of 1 nm was reached for the sample QCM coated with TAZ. A reference layer thickness of 104 nm was deposited before the sample layer thickness of 1 nm was reached for the sample QCM coated with BAlq. However, a relatively thin coating of magnesium with a layer thickness less than 62 nm was deposited on the reference QCM before the threshold thickness was reached for the sample QCMs coated with LG201, Liq, or HT211.

As will be appreciated, a greater selectivity can generally be achieved during conductive coating deposition by using a nucleation modifying coating exhibiting a relatively high reference layer thickness, and thus a relatively low initial deposition rate and sticking probability. For example, a nucleation modifying coating exhibiting a high reference layer thickness may be an effective nucleation inhibiting coating, and may be used to cover region(s) of a target surface, such that when the target surface is exposed to magnesium vapor flux, magnesium selectively forms over uncovered region(s) of the target surface, with a surface of the nucleation inhibiting coating remaining substantially free of or substantially uncovered by magnesium. For example, a nucleation modifying coating exhibiting a reference layer thickness of at least or greater than about 80 nm at a threshold sample layer thickness of 1 nm may be used as a nucleation inhibiting coating. For example, a nucleation modifying coating exhibiting a reference layer thickness of at least or greater than about 100 nm, at least or greater than about 200 nm, at least or greater than about 500 nm, at least or greater than about 700 nm, at least or greater than about 1000 nm, at least or greater than about 1500 nm, at least or greater than about 1700 nm, or at least or greater than about 2000 nm at 1 nm threshold thickness may be used as a nucleation inhibiting coating. In other words, an initial deposition rate of magnesium on the reference surface may be at least or greater than about 80 times, at least or greater than about 100 times, at least or greater than about 200 times, at least or greater than about 500 times, at least or greater than about 700 times, at least or greater than about 1000 times, at least or greater than about 1500 times, at least or greater than about 1700 times, or at least or greater than about 2000 times an initial deposition rate of magnesium on a surface of the nucleation inhibiting coating.

Figure 58:
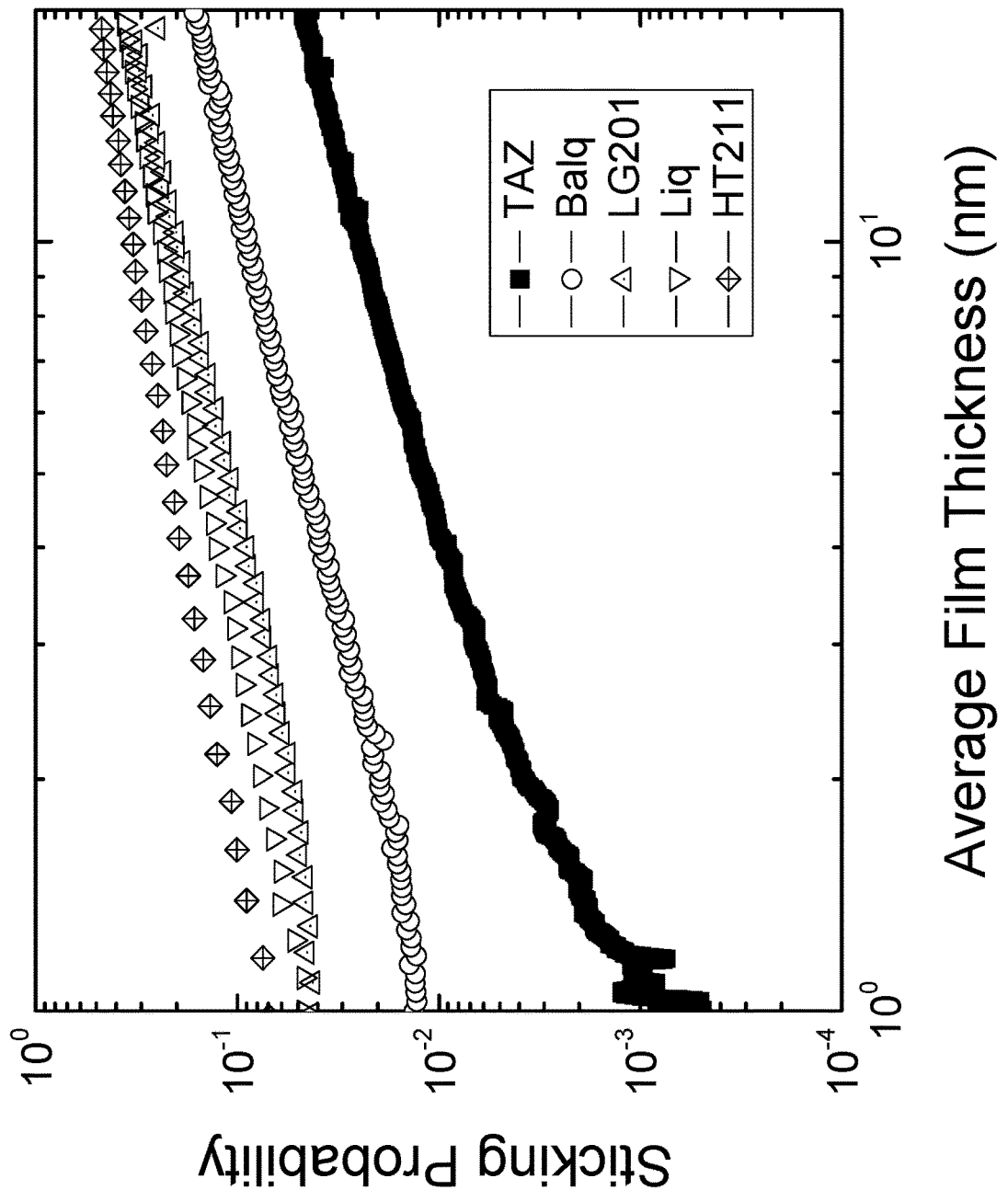
FIG. 58 is a plot showing a sticking probability of magnesium vapor on a sample QCM surface versus a layer thickness of magnesium deposited on the sample QCM surface covered with various nucleation modifying coatings.

FIG. 58 is a log-log plot of sticking probability of magnesium vapor on the sample QCM surface versus a layer thickness of magnesium deposited on the sample QCM surface.

The sticking probability was derived based on the following equation:

$$S = \frac{N_{ads}}{N_{total}}$$

wherein $N_{ads}$ is a number of adsorbed monomers that are incorporated into a magnesium coating on the surface of the sample QCM, and $N_{total}$ is a total number of impinging monomers on the surface, which was determined based on monitoring the deposition of magnesium on the reference QCM.

As can be seen from the plot of FIG. 58, the sticking probability generally increases as more magnesium is deposited on the surface. For the purpose of achieving selective deposition of a magnesium coating, a nucleation inhibiting coating exhibiting a relatively low initial sticking probability (e.g., a low sticking probability during an initial deposition stage) is desirably used. More specifically, an initial sticking probability of this example refers to the sticking probability measured upon depositing an amount of magnesium corresponding to forming a close-packed magnesium layer with an average thickness of 1 nm on a surface of a nucleation inhibiting coating. The sticking probability measured upon deposition of 1 nm layer thickness of magnesium on various nucleation inhibiting coating surfaces are summarized in Table 5 below.

TABLE 5

Summary of results of sticking probability

| Nucleation Inhibiting Material | Sticking probability upon deposition of 1 nm of Mg |
|---|---|
| TAZ | <0.001 |
| BAlq | 0.013 |
| LG201 | 0.042 |
| Liq | 0.045 |
| HT211 | 0.064 |

Based on the experiments, coatings exhibiting an initial sticking probability of no greater than or less than about 0.03 (or 3%) with respect to magnesium vapor may act as a nucleation inhibiting coating. As would be understood, nucleation inhibiting coatings with lower initial sticking probability may be more desirable for some applications, such as for achieving deposition of a relatively thick magnesium coating. For example, coatings with an initial sticking probability of no greater than or less than about 0.02, no greater than or less than about 0.01, no greater than or less than about 0.08, no greater than or less than about 0.005, no greater than or less than about 0.003, no greater than or less than about 0.001, no greater than or less than about 0.0008, no greater than or less than about 0.0005, or no greater than or less than about 0.0001 may be used as a nucleation inhibiting coating. For example, such nucleation inhibiting coating may include those formed by depositing BAlq and/or TAZ.

Example 3

In order to characterize a correlation between a lateral growth of a magnesium coating near interfaces with adjacent coatings and a vertical growth of the magnesium coating, a series of samples with varying magnesium and TAZ layer thicknesses were prepared.

The samples were prepared by first depositing about 30 nm of silver over a silicon substrate using thermal deposition. A nucleation inhibiting coating was then selectively deposited on regions of the silver surface using a shadow mask. In all of the samples, 3-(4-biphenyl)-4-phenyl-5-tert-butylphenyl-1,2,4-triazole (TAZ) was used to form the nucleation inhibiting coating. Once the nucleation inhibiting coating was deposited, substantially pure magnesium (about 99.99% purity) was deposited using open mask deposition such that both an exposed silver surface and a nucleation inhibiting coating surface were subjected to an evaporated magnesium flux during the open mask deposition. All depositions were conducted under vacuum (about $10^{-4}$ to about $10^{-6}$ Pa). Magnesium was deposited at a rate of about 2 Å/s.

Figure 49:
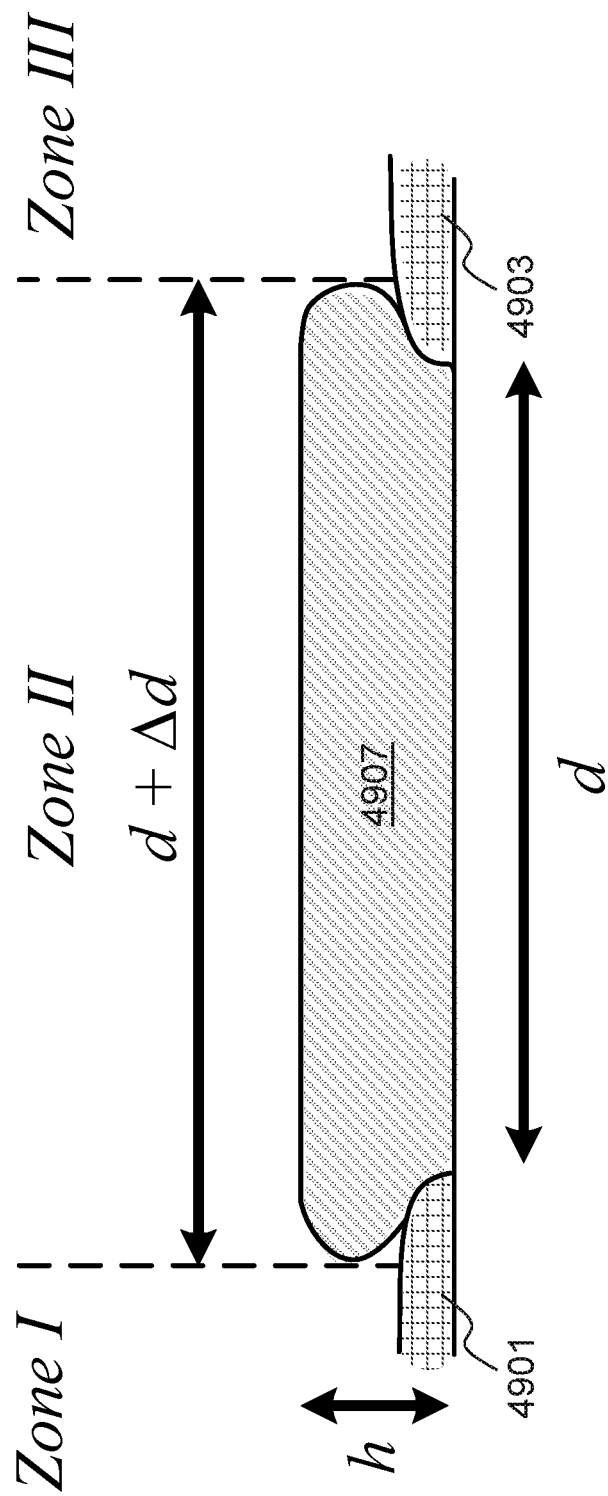
FIG. 49 is a schematic illustration of a magnesium coating deposited between portions of a nucleation inhibiting coating.

FIG. 49 is a schematic diagram illustrating the samples that were prepared. As shown, portions 4901 and 4903 of the nucleation inhibiting coating were selectively deposited on regions of the silver surface, and the magnesium coating 4907 was deposited between the portions 4901 and 4903. For ease of discussion, the silicon substrate and the silver layer have been omitted from the diagram of FIG. 49. A lateral distance of the exposed silver surface located between the portions 4901 and 4903 of the nucleation inhibiting coating is shown as d, and a width of the magnesium coating 4907 is shown as d+Δd. In this way, a lateral growth distance of the magnesium coating 4907 can be determined by subtracting the lateral distance of the exposed silver surface from the width of the magnesium coating 4907. Both d and d+Δd were measured by conducting an analysis of top view SEM images of the samples. The layer thickness of magnesium, h, was monitored using a quartz crystal microbalance (QCM) during the deposition process.

The lateral growth distance (Δd) measured for the samples with varying magnesium layer thicknesses (h) and nucleation inhibiting layer thicknesses are summarized in Table 6 below. The measurement accuracy of Δd is about 0.5 μm.

TABLE 6

Lateral growth distance of Mg for various Mg and TAZ layer thicknesses

| h (μm) | Δd (μm) (TAZ 10 nm) | Δd (μm) (TAZ 100 nm) |
|---|---|---|
| 0.25 | <0.5 | <0.5 |
| 0.75 | 2.5 | <0.5 |
| 1.5 | 3.5 | — |

As can be observed from the above results, no detectable amount of lateral growth was observed in the samples prepared with a relatively thick TAZ coating. Specifically, no lateral growth was detected for the samples prepared with 100 nm of TAZ nucleation inhibiting coating and 0.25 μm and 0.75 μm of magnesium coating.

For the samples prepared with a relatively thin (10 nm layer thickness) TAZ coating, no lateral growth was detected for the sample with 0.25 μm thick magnesium coating. However, for the samples prepared with thicker magnesium coatings, lateral growth of magnesium was observed. Specifically, the sample prepared with 10 nm thick TAZ nucleation inhibiting coating and 0.75 μm thick magnesium coating exhibited lateral magnesium growth of about 2.5 μm, and the sample prepared with 10 nm thick TAZ nucleation inhibiting coating and 1.5 μm thick magnesium coating exhibited lateral growth of about 3.5 μm.

Example 4

A sample was prepared using another nucleation inhibiting coating including BAlq.

Specifically, the sample was fabricated according to the following structure: silicon base substrate/LG201 (40 nm)/Mg:Ag (20 nm)/BAlq (500 nm)/Mg (300 nm). Specifically, about 40 nm of 2-(4-(9,10-di(naphthalene-2-yl)anthracene-2-yl)phenyl)-1-phenyl-1H-benzo-[D]imidazole (LG201) was deposited on a silicon substrate, followed by about 20 nm of Mg:Ag (including Mg:Ag in about 1:9 proportion by volume). The nucleation inhibiting coating in the form of about 500 nm of aluminum (III) bis(2-methyl-8-quninolinato)-4-phenylphenolate (BAlq) was then selectively deposited over regions of the Mg:Ag surface. Once the nucleation inhibiting coating was deposited, substantially pure magnesium (about 99.99% purity) was deposited using open mask deposition such that both an exposed Mg:Ag surface and a nucleation inhibiting coating surface were subjected to an evaporated magnesium flux during the open mask deposition. All depositions were conducted under vacuum (about $10^{-4}$ to about $10^{-6}$ Pa). The magnesium coating was deposited at rate of about 3.5 Å/s.

Figure 50A:
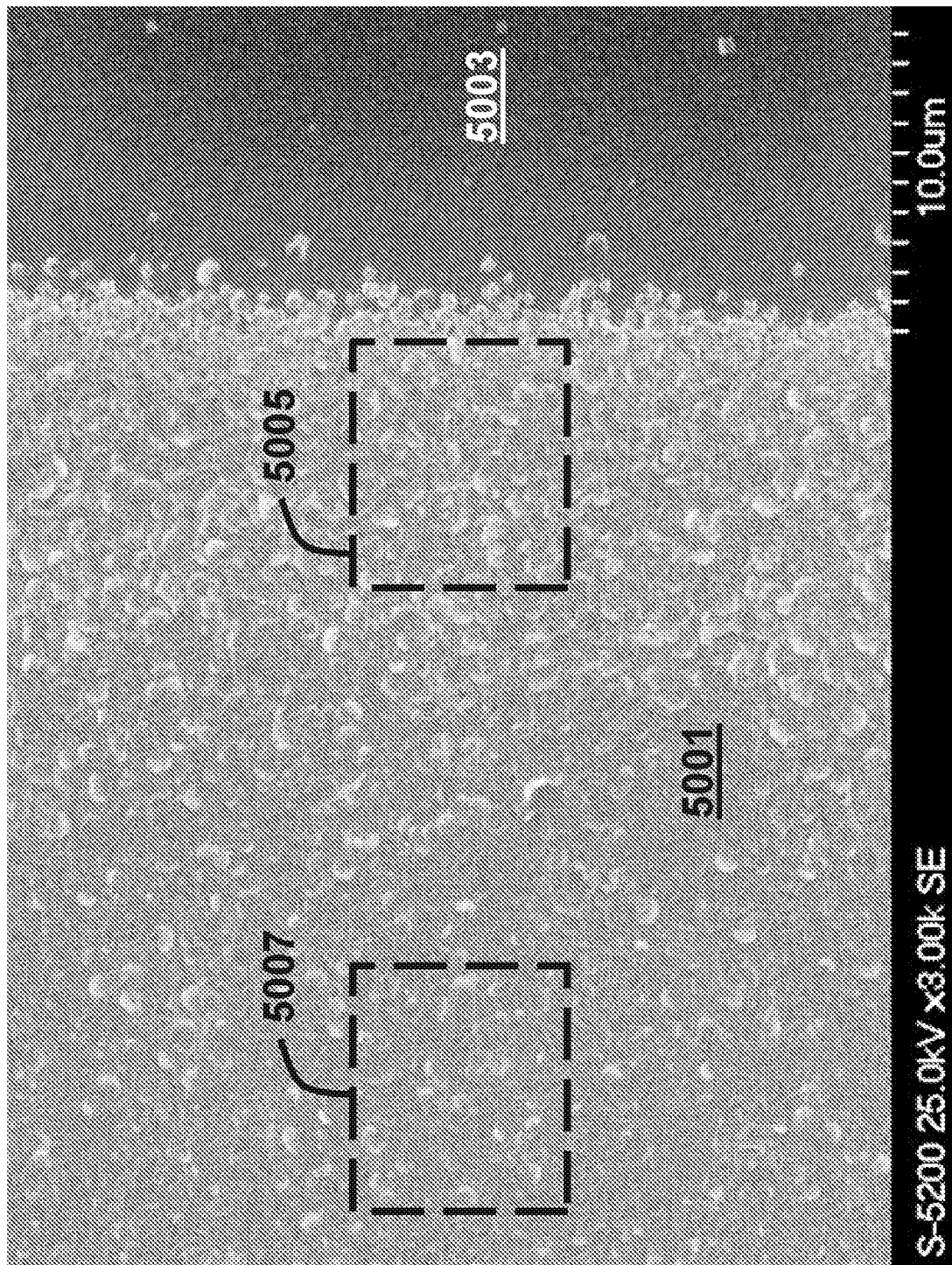
FIG. 50A is a SEM image showing a top view of a sample fabricated using a BAlq nucleation inhibiting coating.
Figure 50B:
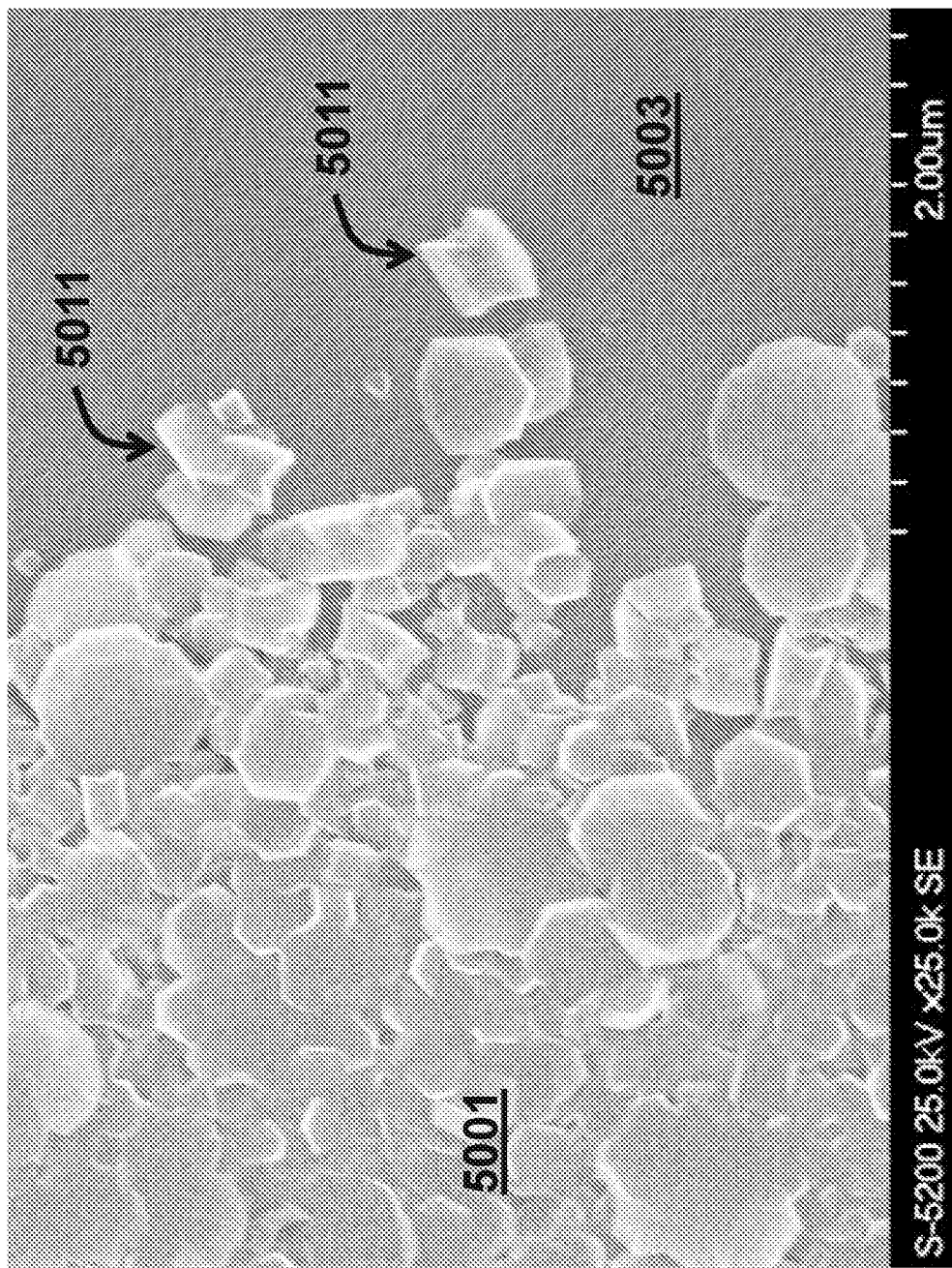
FIG. 50B is a SEM image showing a magnified portion of the sample of FIG. 50A.
Figure 50C:
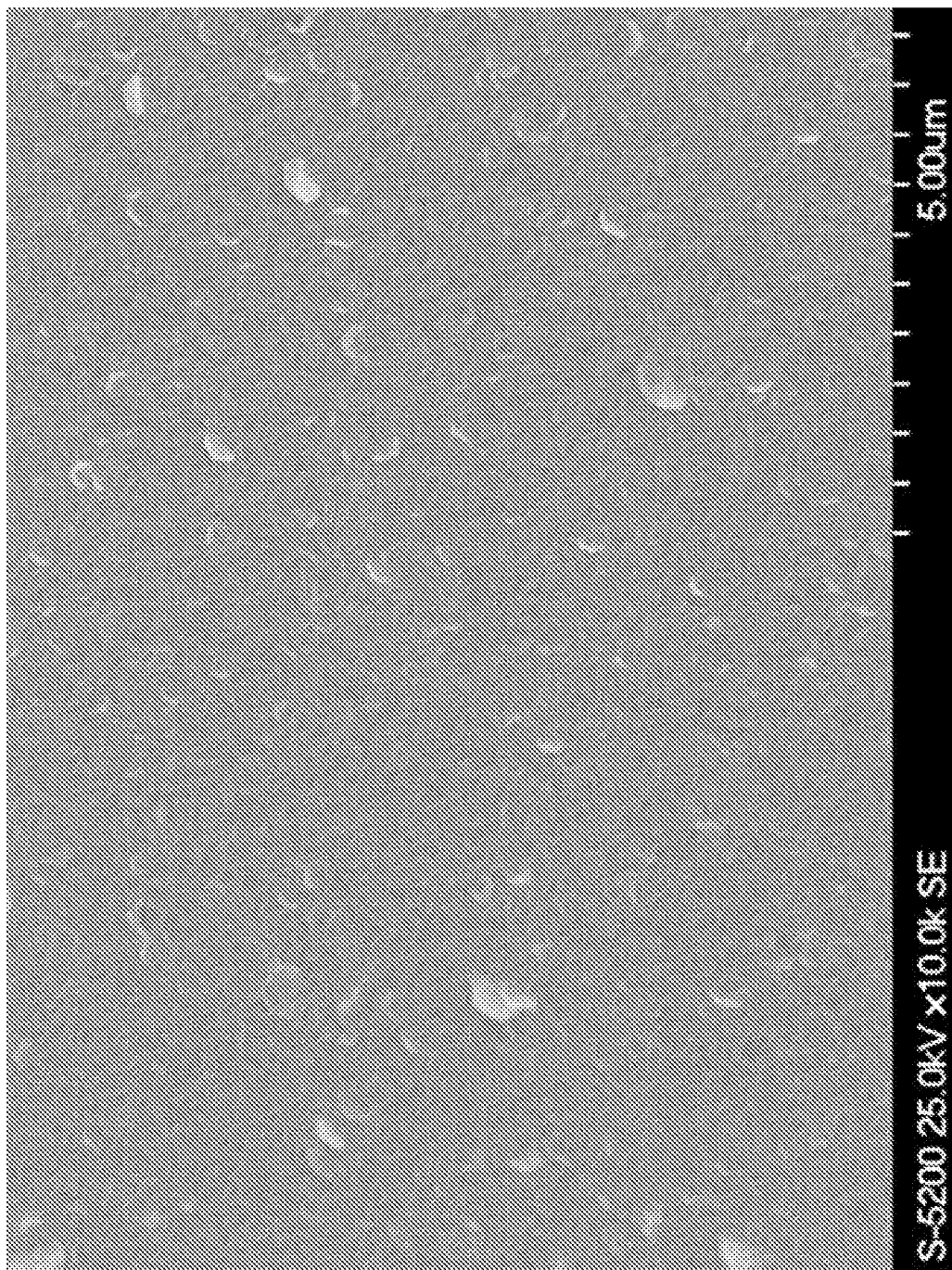
FIGS. 50C and 50D are SEM images showing magnified portions of the sample of FIG. 50A.
Figure 50D:
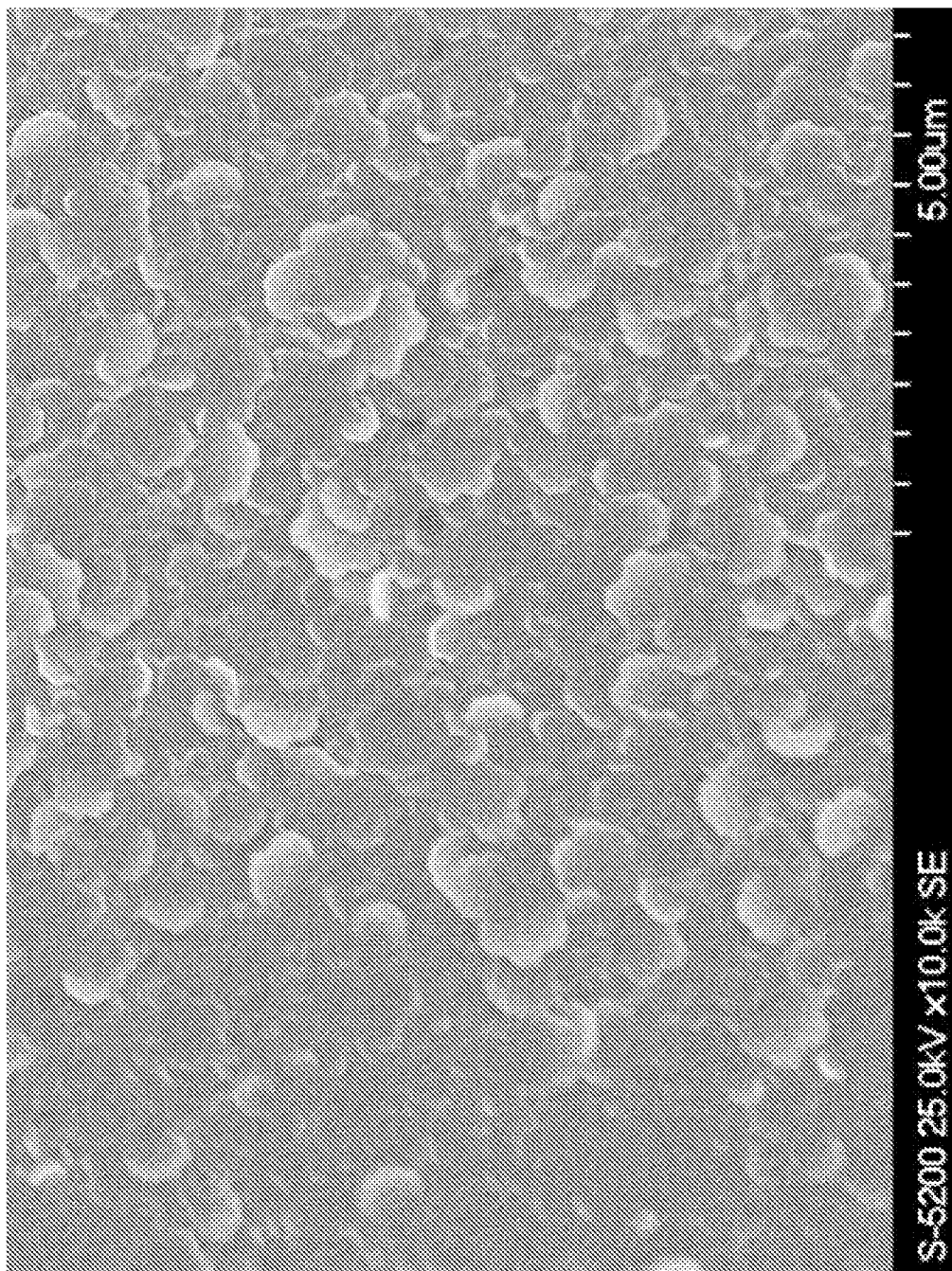

FIG. 50A is a SEM image of a top view of the sample prepared using the BAlq nucleation inhibiting coating. A first region 5003 corresponds to a region where the BAlq coating was present and thus no significant amount of magnesium was deposited, and a second region 5001 corresponds to a region where magnesium was deposited. FIGS. 50C and 50D show a magnified view of regions 5007 and 5005, respectively. FIG. 50B shows a magnified view of an interface between the first region 5003 and the second region 5001.

As can be seen in FIG. 50B, there were a number of islands 5011 formed near the interface. Specifically, the islands 5011 are generally disconnected magnesium-containing clusters which form on the surface of the nucleation inhibiting coating. For example, it is postulated that islands may include magnesium and/or magnesium oxide.

FIG. 50C shows the magnified view of the region 5007 in FIG. 50A, which is a region representative of a "bulk" of the magnesium coating formed by the process. FIG. 50D shows the magnified view of the region 5005, which is near the interface between the first region 5003 and the second region 5001. As can be seen, a morphology of the magnesium coating near the interface differs from that in the bulk of the coating.

Figure 50E:
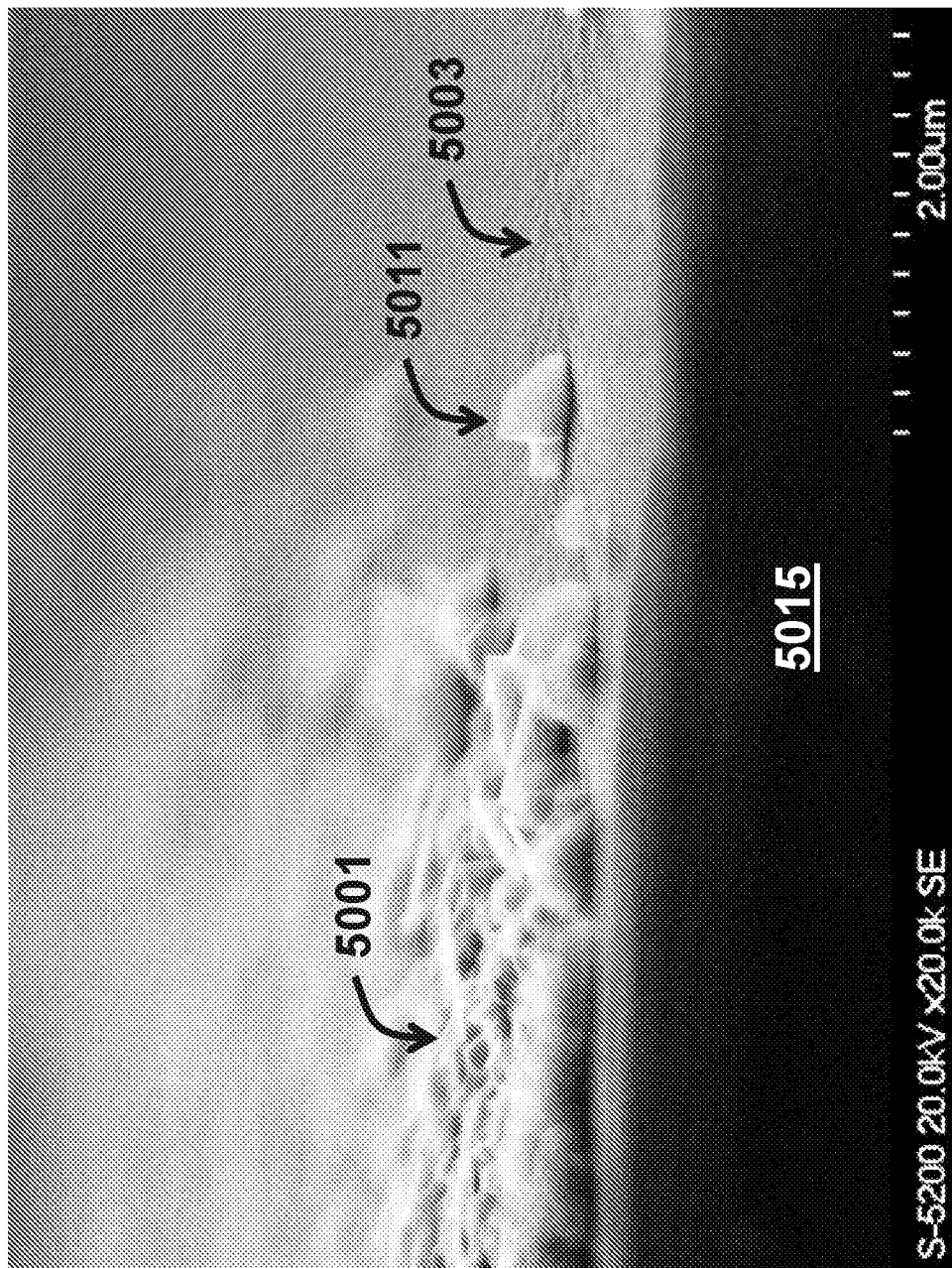
FIG. 50E is a tilted SEM image showing a surface of the sample of FIG. 50A.

FIG. 50E further shows a cross-sectional SEM image of the sample, where the islands 5011 are shown on the surface of the nucleation inhibiting coating.

Example 5 (Comparative Example A)

A comparative sample was prepared to characterize a structure formed using a material exhibiting relatively poor nucleation inhibiting properties (e.g., a nucleation inhibiting coating exhibits a relatively high initial sticking coefficient for magnesium vapor).

The comparative sample was fabricated according to the following structure: silicon base substrate/LG201 (40 nm)/Mg:Ag (20 nm)/HT211 (500 nm)/Mg (300 nm). Specifically, about 40 nm of 2-(4-(9,10-di(naphthalene-2-yl)anthracene-2-yl)phenyl)-1-phenyl-1H-benzo-[D]imidazole (LG201) was deposited on a silicon substrate, followed by about 20 nm of Mg:Ag (about 1:9 by volume). The nucleation inhibiting coating in the form of about 500 nm of N(diphenyl-4-yl)9,9-dimethyl-N-(4(9-phenyl-9H-carbazol-3-yl)phenyl)-9H-fluorene-2-amine (HT211) was then selectively deposited over regions of the Mg:Ag surface. Once the nucleation inhibiting coating was deposited, substantially pure magnesium (about 99.99% purity) was deposited using open mask deposition such that both an exposed Mg:Ag surface and a nucleation inhibiting coating surface were subjected to an evaporated magnesium flux during the open mask deposition. All depositions were conducted under vacuum (about $10^{-4}$ to about $10^{-6}$ Pa). The magnesium coating was deposited at rate of about 3.5 Å/s.

Figure 51A:
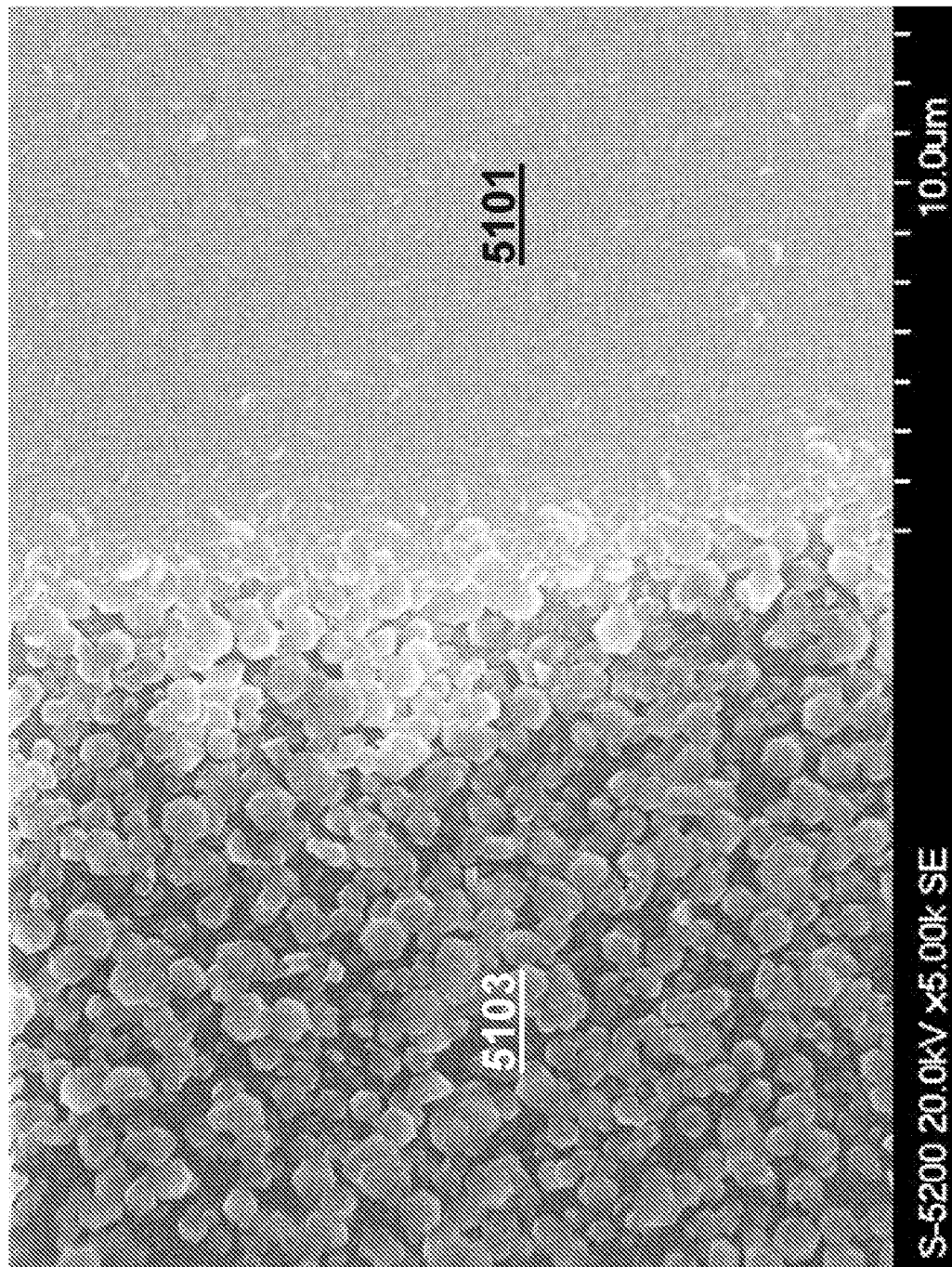
FIG. 51A is a SEM image showing a top view of a comparative sample fabricated using a HT211 nucleation inhibiting coating.

FIG. 51A shows a top view SEM image of the comparative sample, where a first region 5103 corresponds to a region over which the nucleation inhibiting coating in the form of HT211 was deposited, and a second region 5101 corresponds to a region where the magnesium coating was formed. As can be seen, a significant amount of magnesium in the first region 5103 can be clearly observed.

Figure 51B:
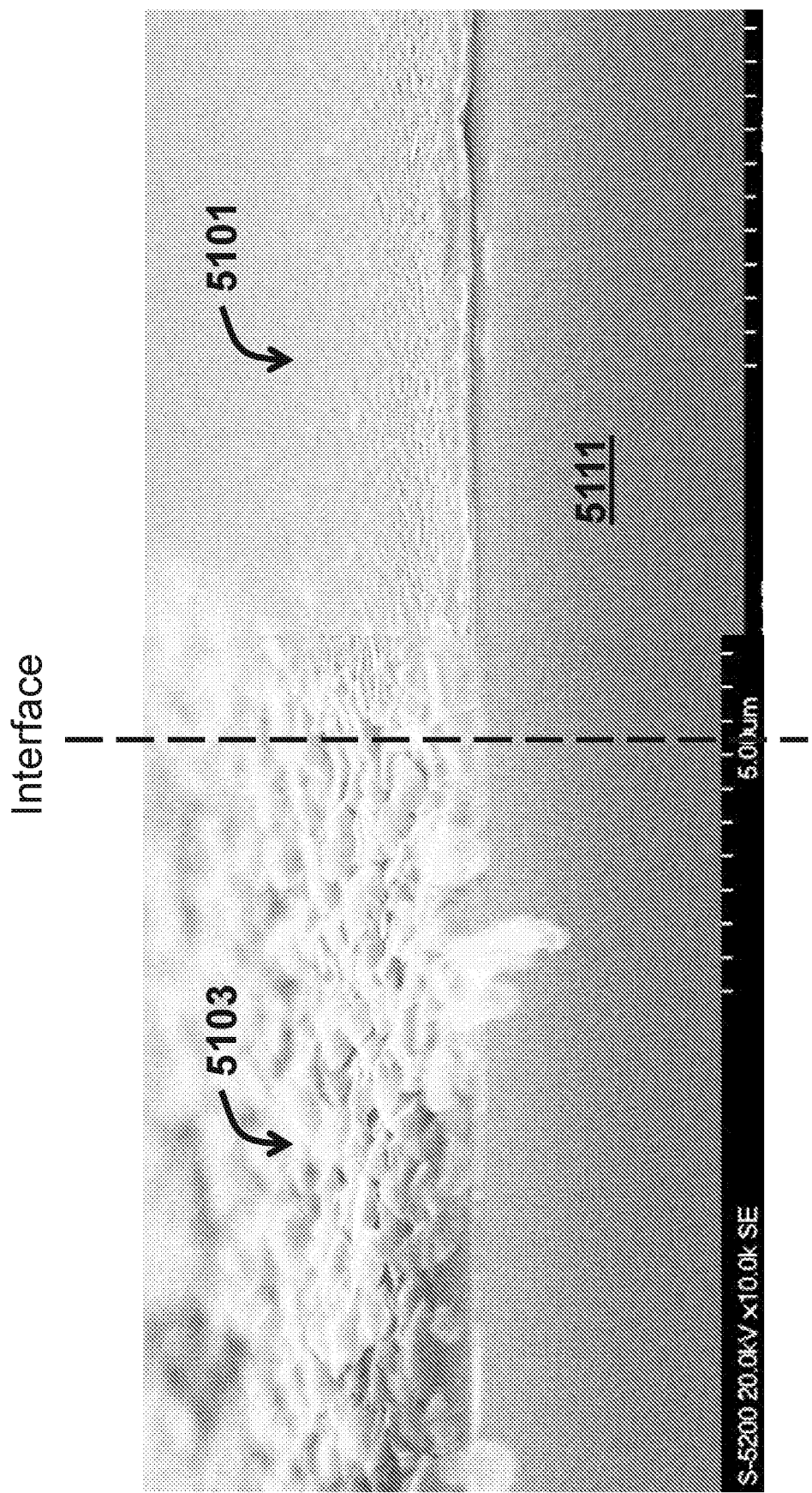
FIG. 51B is a cross-sectional SEM image of the comparative sample of FIG. 51A.

FIG. 51B shows a cross-sectional SEM image of the comparative sample. An approximate interface between the first region 5103 and the second region 5101 is indicated using a dotted line.

Example 6 (Comparative Example B)

Another comparative sample was prepared to determine a profile of a magnesium coating deposited on a surface using a shadow mask technique.

The comparative sample was fabricated by depositing about 30 nm layer thickness of silver on top of a silicon wafer, followed by shadow mask deposition of about 800 nm layer thickness of magnesium. Specifically, the shadow mask deposition was configured to allow certain regions of the silver surface to be exposed to a magnesium flux through a shadow mask aperture while masking other regions of the silver surface. Magnesium was deposited at a rate of about 2 Å/s.

Figure 52A:
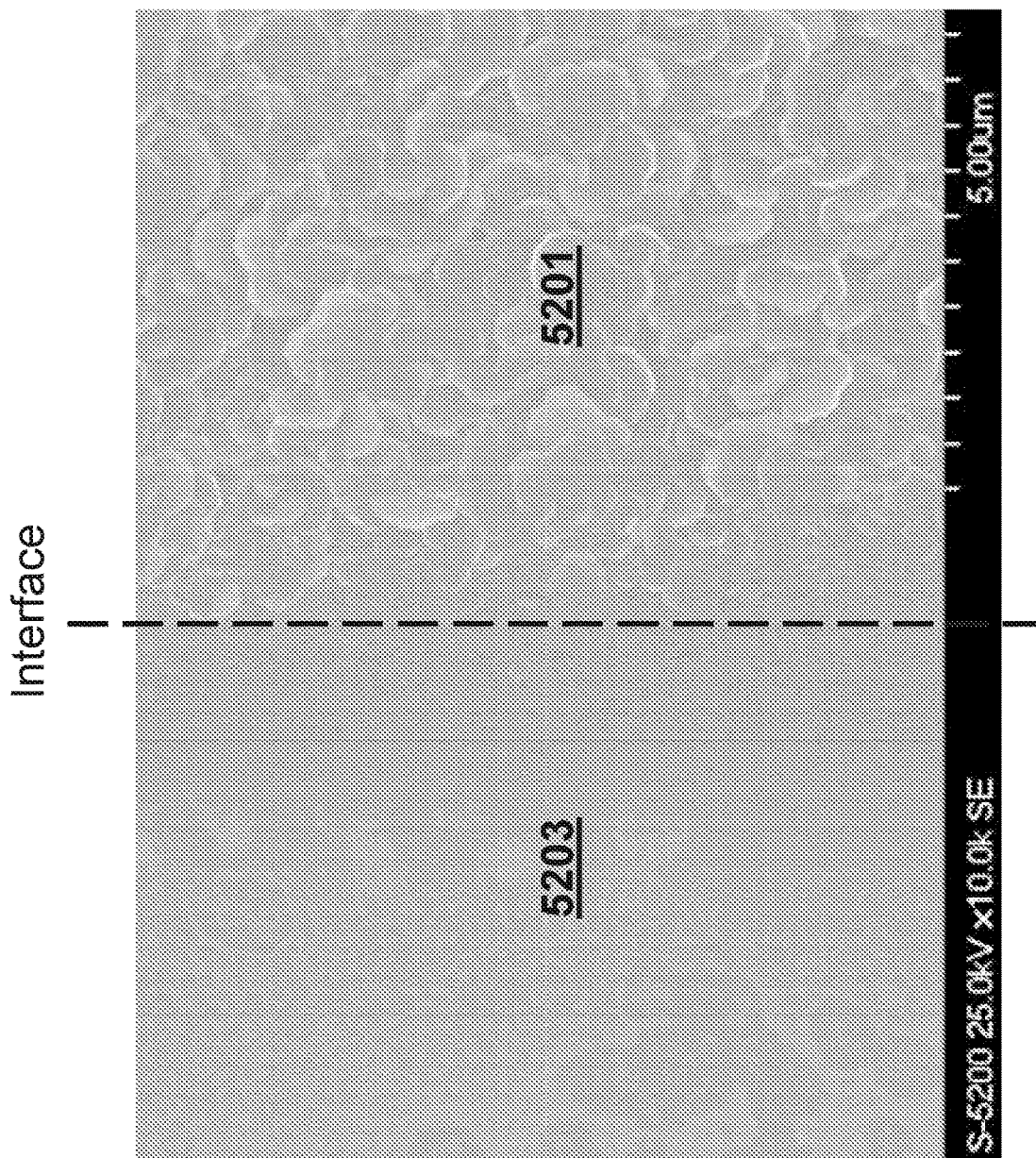
FIG. 52A is a SEM image showing a top view of a comparative sample fabricated using shadow mask deposition.

FIG. 52A is a top view of a SEM image of the comparative sample. An approximate interface is shown using a dotted line in FIG. 52A. A first region 5203 corresponds to the masked region, and a second region 5201 corresponds to the exposed region over which a magnesium coating was deposited.

Figure 52B:
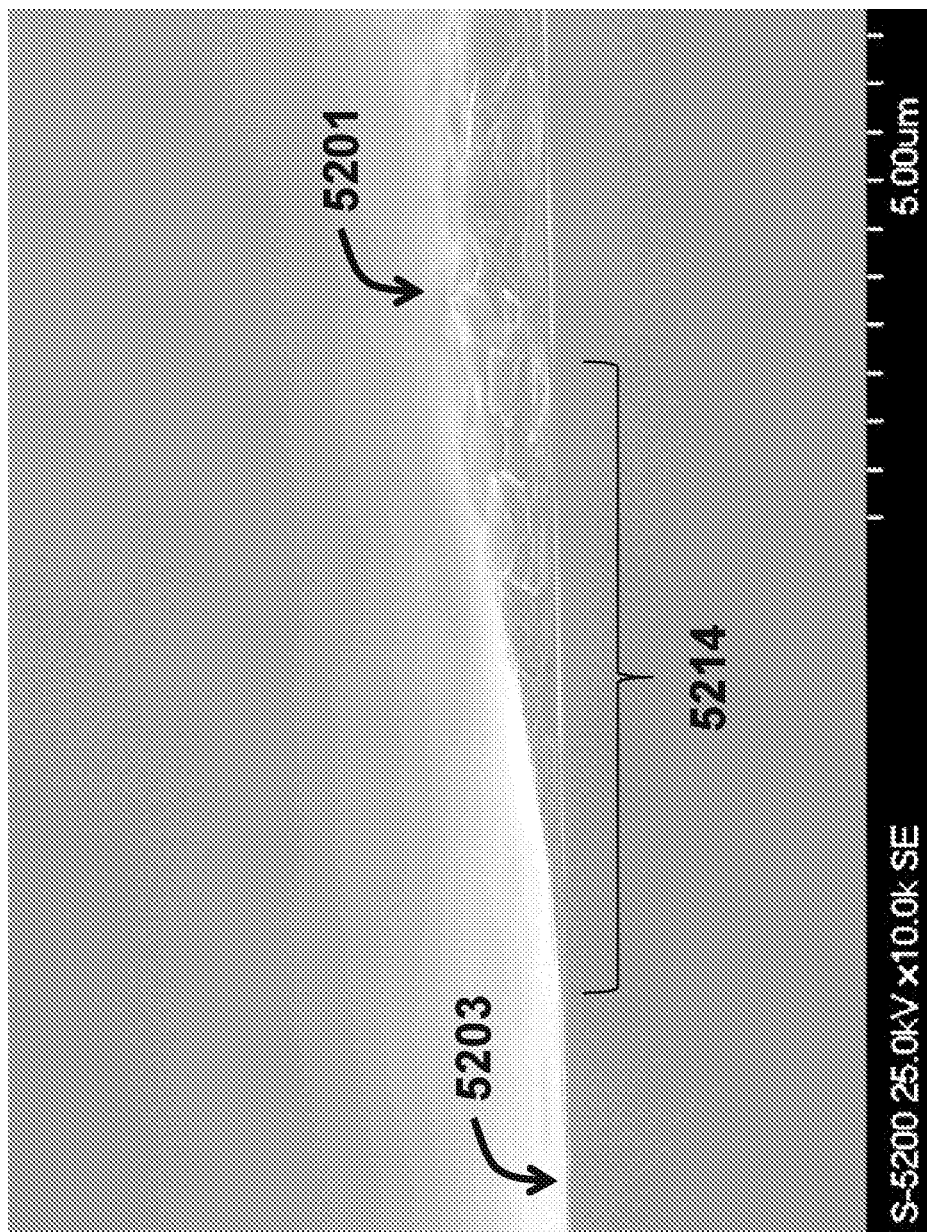
FIG. 52B is a cross-sectional SEM image of the comparative sample of FIG. 52A.

FIG. 52B is a cross-sectional SEM image of the comparative sample. As can be seen in FIG. 52B, the magnesium coating deposited over the second region 5201 includes a relatively long (about 6 μm) tapering or tail portion 5214 where a thickness of the portion 5214 gradually tapers.

Example 7 (Comparative Example C)

To characterize an effect of deposition rate on a nucleation inhibiting property of a nucleation inhibiting coating including HT211, a series of comparative samples with varying layer thicknesses of HT211 were fabricated.

Specifically, the samples were fabricated by depositing about 10 nm layer thickness of HT211 over an entire surface of a glass substrate, followed by open mask deposition of magnesium. Various evaporation rates were used to deposit a magnesium coating; however in preparing each sample, a deposition time was adjusted accordingly to obtain a reference layer thickness of magnesium of either about 100 nm or about 1000 nm.

As used in this example, a reference layer thickness refers to a layer thickness of magnesium that is deposited on a reference surface exhibiting a high initial sticking coefficient (e.g., a surface with an initial sticking coefficient of about or close to 1.0). For example, the reference surface may be a surface of a QCM positioned inside a deposition chamber for the purpose of monitoring a deposition rate and the reference layer thickness. In other words, the reference layer thickness does not indicate an actual thickness of magnesium deposited on a target surface (e.g., a surface of the nucleation inhibiting coating), but rather refers to the layer thickness of magnesium that is deposited on the reference surface.

Figure 53:
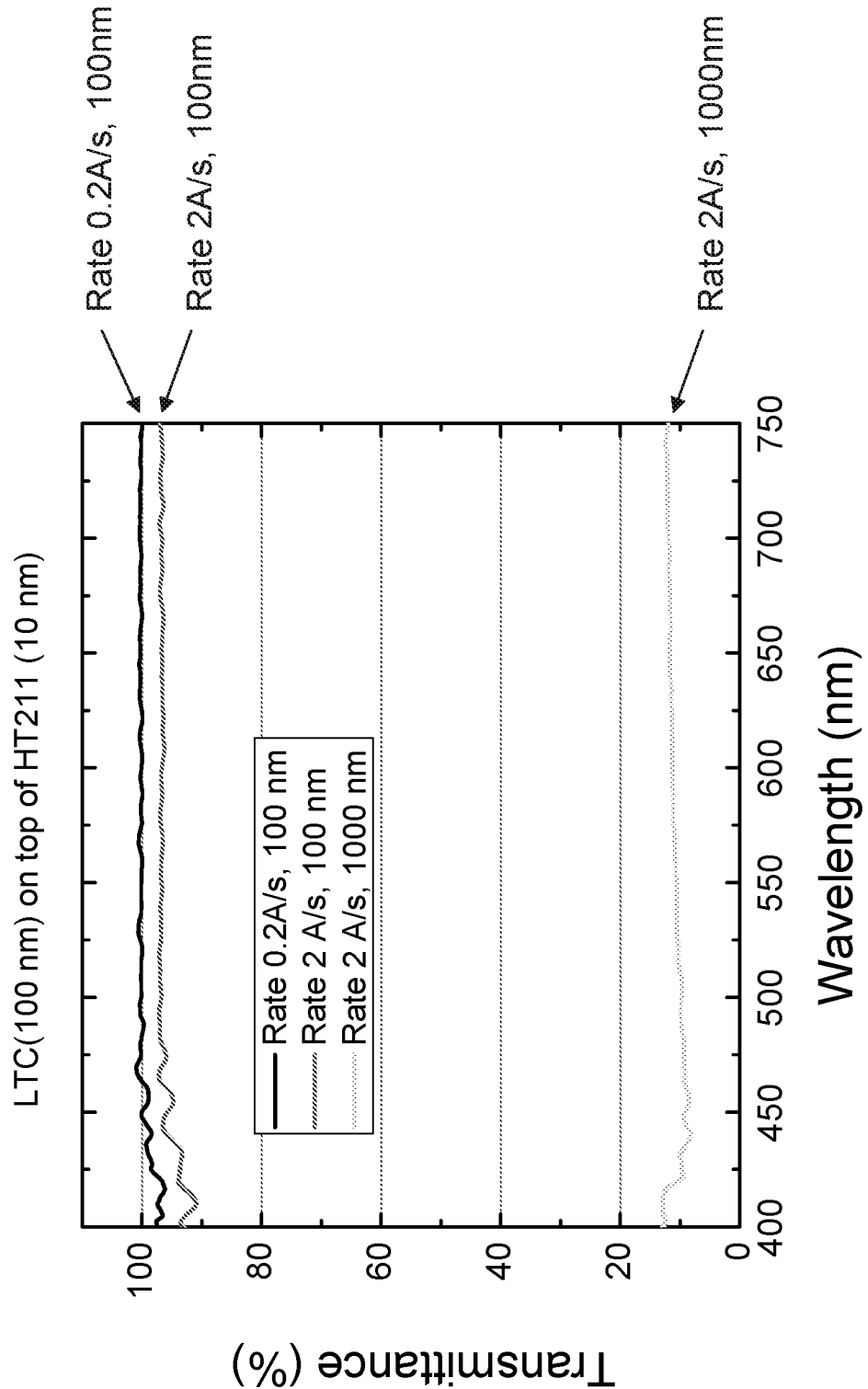
FIG. 53 is a plot of transmittance versus wavelength for comparative samples fabricated with HT211 nucleation inhibiting coatings deposited at various deposition rates.

FIG. 53 shows a plot of transmittance versus wavelength for various samples fabricated using various deposition rates and associated reference layer thicknesses. Based on the transmittance data, it can be seen that a sample with a relatively low magnesium reference layer thickness of about 100 nm, which was deposited at a low deposition rate of about 0.2 Å/s, exhibited the highest transmittance. However, when a sample with substantially identical reference layer thickness was deposited at a higher deposition rate of about 2 Å/s, the transmittance was lower across an entire measured spectrum. The lowest transmittance was detected for a sample with a relatively high magnesium reference layer thickness of about 1000 nm deposited using a relatively high rate of about 2 Å/s.

It is postulated that the reduced transmittance observed in the blue region (about 400-475 nm) of the spectrum for all three samples may be attributed to absorption by magnesium oxide, which may be present in the samples due to oxidation of the deposited magnesium.

Example 8

In order to characterize an effect of using various materials to form a nucleation inhibiting coating, a series of samples were prepared using different materials to form the nucleation inhibiting coating.

The samples were fabricated by depositing about 10 nm layer thickness of the nucleation inhibiting coating on top of a glass substrate surface. The samples were then subjected to open mask deposition of magnesium. For each of the samples, magnesium was deposited at a rate of about 2 Å/s until a reference layer thickness of about 1000 nm was reached.

Figure 54:
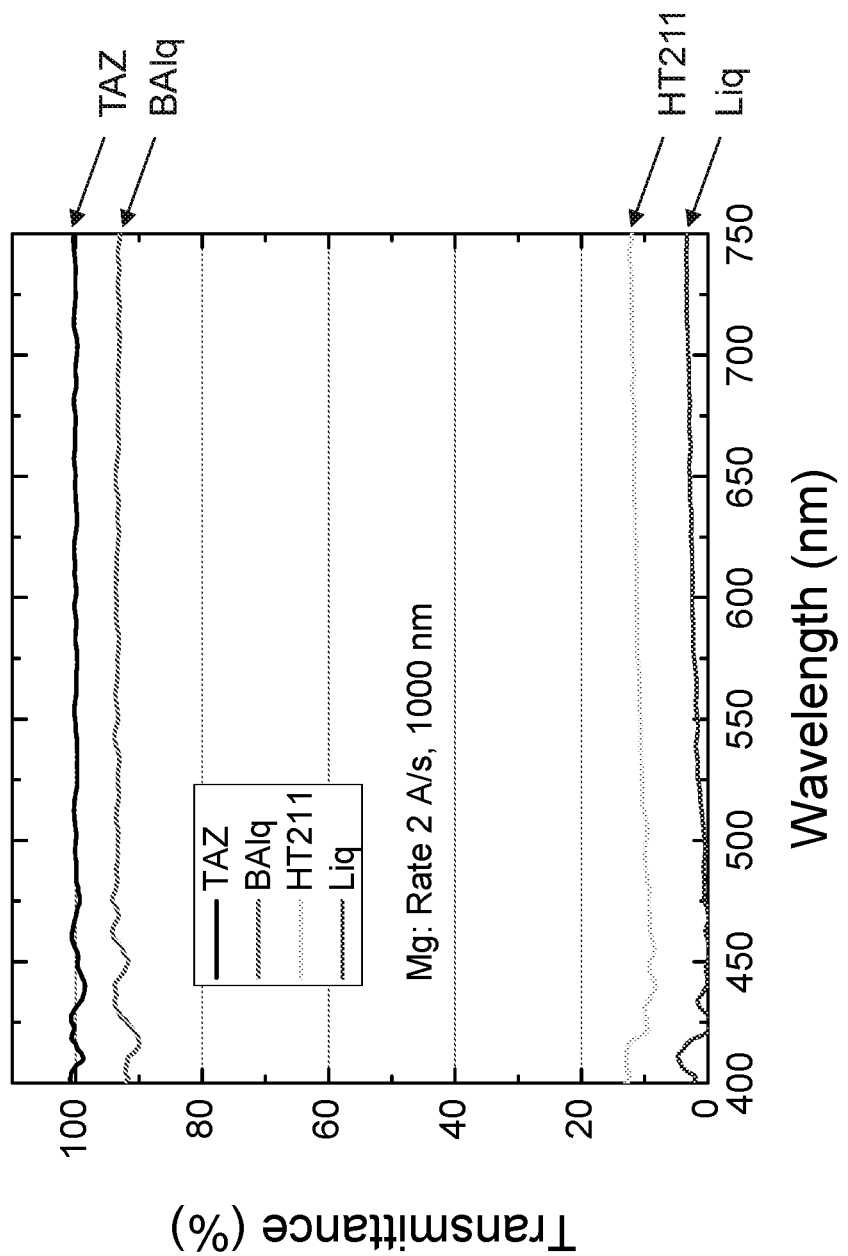
FIG. 54 is a plot of transmittance versus wavelength for samples fabricated with various nucleation inhibiting coatings.

FIG. 54 is a plot of transmittance versus wavelength for the samples fabricated with various materials. As can be seen, the sample fabricated with TAZ exhibited the highest transmittance, followed by BAlq. Both samples fabricated with HT211 and Liq were found to exhibit substantially lower transmittance compared to those prepared with TAZ and BAlq, due to a greater amount of magnesium being deposited on surfaces of HT211 and Liq.

Example 9

A series of samples were prepared to assess an effect of providing an auxiliary electrode according to an example embodiment.

A first reference sample was prepared by depositing a layer of Mg:Ag on a substrate surface to replicate a typical common cathode used in a top-emission AMOLED display device.

Figure 55:
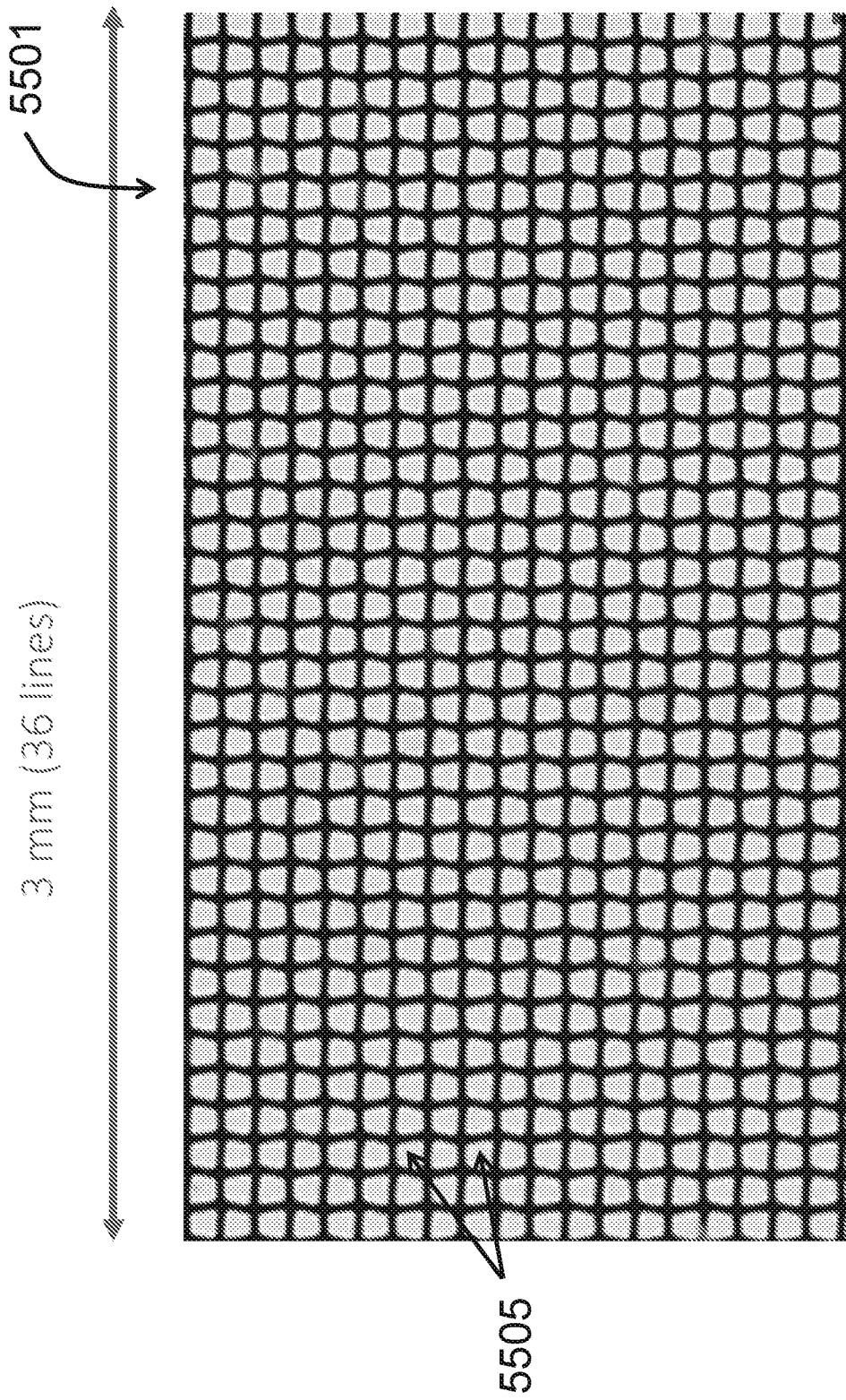
FIG. 55 is a top view showing a pattern of an auxiliary electrode according to one example embodiment.

A second reference sample was prepared by selectively depositing an auxiliary electrode in the form of a repeating grid on top of a non-conducting substrate surface. A pattern of the auxiliary electrode is shown in FIG. 55. Specifically, the auxiliary electrode 5501 includes a plurality of apertures 5505 formed therein, such that if the auxiliary electrode 5501 is fabricated on an AMOLED device, each aperture 5505 would substantially correspond to an emissive region (e.g., a pixel or subpixel) of the device with the auxiliary electrode 5501 being deposited on a non-emissive region (e.g., an inter-pixel or inter-subpixel region). An average width or size of each aperture 5505 was about 70 μm, and a width of each strip or segment of the auxiliary electrode 5501 was about 15-18 μm. The auxiliary electrode 5501 was formed using substantially pure (about 99.99% purity) magnesium.

An evaluation sample was prepared by depositing an auxiliary electrode (under the conditions used for the second reference sample) on top of the Mg:Ag layer of the first reference sample. Specifically, a nucleation inhibiting coating was selectively deposited on top of the Mg:Ag layer using a shadow mask, and a resulting patterned surface was then exposed to magnesium vapor to selectively deposit the magnesium auxiliary electrode to result in a similar pattern as shown in FIG. 55.

Sheet resistances of the samples were measured, and results of the measurements are summarized in Table 7 below.

TABLE 7

| | First Reference Sample | Second Reference Sample | Evaluation Sample |
|---|---|---|---|
| Sheet resistance measurements | | | |
| Sheet Resistance (ohm/sq) | 22.3 | 0.13 | 0.1 |

As shown in the table above, the first reference sample (Mg:Ag layer) was found to exhibit a relatively high sheet resistance of about 22.3 Ω/sq. The second reference sample and the evaluation sample were found to have substantially lower sheet resistances of about 0.13 Ω/sq and about 0.1 Ω/sq, respectively. Accordingly, it was confirmed that, by providing an auxiliary electrode according to the example embodiment in electrical connection with a thin film conductor (e.g., a common cathode), the sheet resistance of the thin film conductor may be substantially reduced.

As used herein, the terms "substantially," "substantial," "approximately," and "about" are used to denote and account for small variations. When used in conjunction with an event or circumstance, the terms can refer to instances in which the event or circumstance occurs precisely, as well as instances in which the event or circumstance occurs to a close approximation. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

In the description of some embodiments, a component provided "on" or "over" another component, or "covering" or which "covers" another component, can encompass cases where the former component is directly on (e.g., in physical contact with) the latter component, as well as cases where one or more intervening components are located between the former component and the latter component.

Additionally, amounts, ratios, and other numerical values are sometimes presented herein in a range format. It can be understood that such range formats are used for convenience and brevity, and should be understood flexibly to include not only numerical values explicitly specified as limits of a range, but also all individual numerical values or sub-ranges encompassed within that range as if each numerical value and sub-range is explicitly specified.

Although the present disclosure has been described with reference to certain specific embodiments, various modifications thereof will be apparent to those skilled in the art. Any examples provided herein are included solely for the purpose of illustrating certain aspects of the disclosure and are not intended to limit the disclosure in any way. Any drawings provided herein are solely for the purpose of illustrating certain aspects of the disclosure and may not be drawn to scale and do not limit the disclosure in any way. The scope of the claims appended hereto should not be limited by the specific embodiments set forth in the above description, but should be given their full scope consistent with the present disclosure as a whole. The disclosures of all documents recited herein are incorporated herein by reference in their entirety.

The invention claimed is:

1. An opto-electronic device comprising:
   a nucleation inhibiting coating (NIC) disposed in a first portion of a lateral aspect of the device; and
   a conductive coating comprising a deposited material and disposed in a second portion of the lateral aspect of the device;
   wherein:
   the first portion is substantially devoid of a closed coating of the deposited material;
   the second portion is substantially devoid of the NIC; and
   the NIC comprises a compound comprising a core moiety and a terminal moiety bonded to the core moiety, the core moiety further comprising a nitrogen atom.

2. The opto-electronic device of claim 1, wherein the core moiety comprises a heterocyclic moiety.

3. The opto-electronic device of claim 2, wherein the heterocyclic moiety is a triazole moiety.

4. The opto-electronic device of claim 1, wherein the core moiety further comprises a phosphorus atom.

5. The opto-electronic device of claim 1, wherein the terminal moiety comprises at least one of: fluorine, and a fluorine-containing moiety.

6. The opto-electronic device of claim 5, wherein the fluorine-containing moiety comprises fluoroalkyl.

7. The opto-electronic device of claim 6, wherein the fluoroalkyl is selected from one of: trifluoromethyl, fluoromethyl, bifluoromethyl, trifluoromethyl, fluoroethyl, and polyfluoroethyl.

8. The opto-electronic device of claim 5, wherein the fluorine-containing moiety is selected from one of: fluorophenyl, difluorophenyl, trifluorophenyl, polyfluorophenyl, fluorobiphenylyl, difluorobiphenylyl, trifluorobiphenylyl, and polyfluorobiphenylyl.

9. The opto-electronic device of claim 1, wherein the terminal moiety comprises one of: a biphenylyl moiety, a phenyl moiety, a fluorene moiety, and a phenylene moiety.

10. The opto-electronic device of claim 9, wherein the terminal moiety comprises a phenyl moiety substituted by at least one substituent group independently selected from at least one of: deutero, fluoro, alkyl, cycloalkyl, silyl, and fluoroalkyl.

11. The opto-electronic device of claim 10, wherein the at least one substituent group is selected from at least one of: methyl, ethyl, t-butyl, fluoromethyl, bifluoromethyl, trifluoromethyl, fluoroethyl, and polyfluoroethyl.

12. The opto-electronic device of claim 9, wherein the terminal moiety comprises a biphenylyl moiety substituted by at least one substituent group independently selected from at least one of: deutero, fluoro, alkyl, cycloalkyl, arylalkyl, silyl, aryl, heteroaryl, and fluoroalkyl.

13. The opto-electronic device of claim 12, wherein the at least one substituent group is selected from at least one of: methyl, ethyl, t-butyl, trifluoromethyl, phenyl, methylphenyl, dimethylphenyl, trimethylphenyl, t-butylphenyl, biphenylyl, methylbiphenylyl, dimethylbiphenylyl, trimethylbiphenylyl, t-butylbiphenylyl, fluorophenyl, difluorophenyl, trifluorophenyl, polyfluorophenyl, fluorobiphenylyl, difluorobiphenylyl, trifluorobiphenylyl, and polyfluorobiphenylyl.

14. The opto-electronic device of claim 9, wherein the compound comprises at least one additional terminal moiety, each of which has a molecular weight that is no more than 2 times a molecular weight of the terminal moiety.

15. The opto-electronic device of claim 1, wherein the terminal moiety is bonded to the core moiety via a linker.

16. The opto-electronic device of claim 15, wherein the linker is selected from at least one of: an oxygen atom, a sulfur atom, a cyclic hydrocarbon moiety, and an acyclic hydrocarbon moiety.

17. The opto-electronic device of claim 1, wherein the opto-electronic device comprises at least one emissive region and at least one non-emissive region.

18. The opto-electronic device of claim 17, wherein:
the conductive coating comprises a first part and a second part, the first part of the conductive coating covering the second portion, and the second part of the conductive coating partially overlapping the NIC; and
the second part of the conductive coating is spaced from the NIC by a gap.

19. The opto-electronic device of claim 18, wherein:
the conductive coating further comprises a third part disposed between the first part of the conductive coating and the second part of the conductive coating; and
the third part of the conductive coating is in contact with the NIC.

20. The opto-electronic device of claim 18, wherein:
the conductive coating further comprises a third part in contact with the NIC; and
the third part of the conductive coating comprises at least one island on a surface of the NIC.

21. The opto-electronic device of claim 18, wherein:
the NIC is disposed in the at least one emissive region; and
the first part of the conductive coating is disposed in the non-emissive region.

22. The opto-electronic device of claim 20, wherein the at least one island is disposed in the at least one emissive region.

23. The opto-electronic device of claim 20, wherein:
the non-emissive region comprises a transmissive region; and
the NIC is disposed in the transmissive region.

24. The opto-electronic device of claim 23, wherein the at least one island is disposed in the transmissive region.

* * * * *